United States Patent
Yam et al.

(10) Patent No.: US 12,116,378 B2
(45) Date of Patent: Oct. 15, 2024

(54) TRANSITION METAL LUMINESCENT COMPLEXES AND METHODS OF USE

(71) Applicant: The University of Hong Kong, Hong Kong (HK)

(72) Inventors: Vivian Wing-Wah Yam, Hong Kong (HK); Yip-Sang Wong, Hong Kong (HK); Man-Chung Tang, Hong Kong (HK); Mei-Yee Chan, Hong Kong (HK)

(73) Assignee: THE UNIVERSITY OF HONG KONG, Hong Kong (CN)

( * ) Notice: Subject to any disclaimer, the term of this patent is extended or adjusted under 35 U.S.C. 154(b) by 491 days.

(21) Appl. No.: 16/707,871

(22) Filed: Dec. 9, 2019

(65) Prior Publication Data

US 2020/0172562 A1    Jun. 4, 2020

Related U.S. Application Data

(63) Continuation-in-part of application No. 16/702,864, filed on Dec. 4, 2019.

(Continued)

(51) Int. Cl.
*C07F 15/04* (2006.01)
*H10K 85/30* (2023.01)
(Continued)

(52) U.S. Cl.
CPC ............ *C07F 15/04* (2013.01); *H10K 85/331* (2023.02); *H10K 85/341* (2023.02); *H10K 50/11* (2023.02); *H10K 2101/10* (2023.02)

(58) Field of Classification Search
CPC .. C07F 15/04; H01L 51/0084; H01L 51/5016; H01L 51/0083
See application file for complete search history.

(56) References Cited

U.S. PATENT DOCUMENTS 3,771,964 A    11/1973    Fader
4,303,409 A    12/1981    Ogawa
(Continued)

FOREIGN PATENT DOCUMENTS

CN    1381545        11/2002
CN    1894269 A    1/2007
(Continued)

OTHER PUBLICATIONS

Arrigoni, et al., "Ascorbic Acid: Much More Than Just an Antioxidant", Biochim. Biophys. Acta, Gen. Subj., 1569:1-9 (2002).
(Continued)

*Primary Examiner* — Ermias T Woldegeorgis
(74) *Attorney, Agent, or Firm* — PABST PATENT GROUP LLP

(57) ABSTRACT

Described herein are transition metal complexes containing nickel(II), as the central metal atom, and tridentate and tetradentate ligands. The transition metal complexes also include an ancillary ligand with strong σ-donating properties. The ancillary ligand enhances the luminescence by increasing the chances of populating the emissive state. The transition metal complexes are emissive at room temperature and/or low temperature in various media, rendering them useful as light-emitting materials for OLEDs.

36 Claims, 4 Drawing Sheets

Related U.S. Application Data

(60) Provisional application No. 62/793,570, filed on Jan. 17, 2019, provisional application No. 62/775,195, filed on Dec. 4, 2018.

(51) Int. Cl.
  H10K 50/11    (2023.01)
  H10K 101/10   (2023.01)

(56) References Cited

U.S. PATENT DOCUMENTS

| | | | |
|---|---|---|---|
| 5,709,854 | A | 1/1998 | Griffith-Cima |
| 6,129,761 | A | 10/2000 | Hubbell |
| 6,153,399 | A | 11/2000 | Fujishiro |
| 6,858,229 | B1 | 2/2005 | Hubbell |
| 7,553,560 | B2 | 6/2009 | Lamansky |
| 7,598,546 | B1 | 10/2009 | Chou |
| 2002/0034656 | A1 | 3/2002 | Thompson et al. |
| 2002/0117662 | A1 | 8/2002 | Nii |
| 2002/0179885 | A1* | 12/2002 | Che ............. C07F 15/0033 428/917 |
| 2005/0123751 | A1 | 6/2005 | Tsutsui |
| 2005/0214576 | A1 | 9/2005 | Lamansky |
| 2006/0091378 | A1 | 5/2006 | Yam |
| 2007/0074971 | A1 | 4/2007 | Atkinson |
| 2008/0036373 | A1 | 2/2008 | Itoh et al. |
| 2009/0206735 | A1 | 8/2009 | Yersin et al. |
| 2013/0228758 | A1* | 9/2013 | Yam ............... G06Q 50/02 546/4 |
| 2015/0194616 | A1 | 7/2015 | Li et al. |
| 2018/0194790 | A1 | 7/2018 | Li |
| 2020/0176691 | A1 | 6/2020 | Yam et al. |
| 2023/0165135 | A1 | 5/2023 | Tang et al. |
| 2024/0023360 | A1 | 1/2024 | Mao et al. |
| 2024/0049591 | A1 | 2/2024 | Lo et al. |
| 2024/0083931 | A1 | 3/2024 | Lo et al. |
| 2024/0124494 | A1 | 4/2024 | Che et al. |

FOREIGN PATENT DOCUMENTS

| | | | |
|---|---|---|---|
| CN | 101059474 | | 10/2007 |
| CN | 100510704 | | 1/2008 |
| CN | 101587094 | | 11/2009 |
| CN | 101667626 | A | 3/2010 |
| CN | 102227438 | A | 10/2011 |
| CN | 102532003 | | 7/2012 |
| CN | 102564963 | | 7/2012 |
| CN | 102666560 | A | 9/2012 |
| CN | 102971396 | A | 3/2013 |
| CN | 103399056 | | 11/2013 |
| CN | 103604849 | | 2/2014 |
| CN | 104267013 | | 1/2015 |
| CN | 104334681 | | 2/2015 |
| CN | 107074895 | A | 8/2017 |
| CN | 109841759 | A | 6/2019 |
| CN | 111320613 | A | 6/2020 |
| CN | 111662334 | A | 9/2020 |
| DE | 4304728 | | 8/1994 |
| EP | 1606631 | | 12/2005 |
| JP | 11326207 | | 11/1999 |
| WO | 2004083868 | | 9/2004 |
| WO | 2005118606 | | 12/2005 |
| WO | 2009021907 | | 2/2009 |
| WO | WO-2012102243 | A1* | 8/2012 ........... H01L 51/504 |
| WO | WO-2013161515 | A1* | 10/2013 ........... C09K 11/06 |
| WO | 2014041465 | | 3/2014 |
| WO | WO-2014128843 | A1* | 8/2014 ........... H01L 51/5228 |
| WO | WO-2014203385 | A1* | 12/2014 ........... H01L 51/448 |
| WO | 2015099546 | | 7/2015 |
| WO | 2019015658 | A1 | 1/2019 |
| WO | 2019079505 | A1 | 4/2019 |

OTHER PUBLICATIONS

Au, et al., "High-efficiency Green Organic Light-Emitting Device Utilizing Phosporescent Bis-Cyclometalated alkynylgold (III) Complexes", J. Am. Chem. Soc. 132:14273 (2010).

Au-Yeung, et al., "Molecular imaging of labile iron(II) pools in living cells with a turn-on fluorescent probe", J. Am. Chem. Soc., 135(40):15165-73 (2013).

Cheng, et al., "Structurally robust phosphorescent [Pt(ONCN)] emitters for high performance organic light-emitting devices with power efficiency up to 126 Im W-1 and external quantum efficiency over 20%†", Chem. Sci., 5:4819-4830 (2014).

Chow, et al., "Luminescent Palladium (II) Complexes with $_{TT}$ ☐Extended Cyclometalated [R—CNN—R'] and Pentafluorophenylacetylide Ligands: Spectroscopic, Photophysical, and Photochemical Properties", Chem. Asian. J., 9:534 (2013).

Garcia, et al., "Cleavage of carbon-Carbon Bonds in Aromatic Nitriles Using Nickel", J. Am. Chem. Soc., 124(32):9547-9555 (2002).

Gómez-Benítez, et al., "High yield thiolation of iodobenzene catalyzed by the phosphinite nickel PCP pincer complex: [NiCl{C6H3-2,6-(OPPh2)2}]", Tetrahedron Lett., 47:5059-5062 (2006).

Ishii, et al., "Phthalocyanine-based fluorescence probes for detecting ascorbic acid: phthalcyaninatosilicon covalently linked to TEMPO radicals", Chem. Commun., 47:4932-4 (2011).

Kennedy, et al., "Carbohydrate Functionalization of Silver Nanoparticles Modulates Cytotoxicity and Cellular Uptake", Journal of Nanobiotechnology, 12:59 (2014).

Klein, et al., "The cyclometalated nickel complex [(Phbpy)NiBr] (Phbpy-= 2,2'-bipyridine-6-phen-2-yl)—Synthesis, spectroscopic and electrochemical studies", J. Organomet. Chem., 774:86-93 (2014).

Kui, et al., "Robust Phosphorescent platinum (II) Complexes With Tetradentate ÔŃĊŃLigands: High Efficiency OLEDs With Excellent Efficiency Stability", Chem. Comm. 49, 1497 (2013).

Li, et al., "Activation of "Inert" Alkenyl/Aryl C—O Bond and Its Application in Cross-Coupling Reactions", Eur. Chem. J., 17:1728-1759 (2011).

Liu, et al., "Switch-on Fluorescent Sensing of Ascorbic Acid in Food Samples Based on Carbon Quantum Dots-Mno2 Probe", J. Agric. Food Chem., 64:371-380 (2016).

Liu, et al., "Organometallic Half-Sandwich Iridium Anticancer Complexes", J. Med. Chem., 54:3011-3026 (2011).

Liu, et al., "Interactions of nitroxide radicals with dendrimer-entrapped Au8-clusters: a fluorescent nanosensor for intracellular imaging of ascorbic acid", J. Mater. Chem. B, 3:191-7 (2015).

Ma, et al., "Antoagonizing STAT3 Dimerization With a Rhodium(III) Complex", Angew. Chem. Int. Ed., 53:9178-9182 (2014).

Maity, et al., "Reaction-based probes for Co(II) and Cu(I) with dual output modes: fluorescence live cell imaging", RSC Adv., 3:16788-94 (2013).

Mesganaw, et al., "Ni-and Fe-Catalyzed Cross-Coupling Reactions of Phenol Derivatives", Org. Process Res. Dev., 17(1):29-39 (2013).

Munoz-Rodriguez, et al., "Direct Luminescence Behaviour From Differential Interactions in Dinuclear Pt, Au, and Mixed Pt-Au Complexes Built on a Xanthene Scaffold", Chem. Commun., 48:5980-5982 (2012).

Novakova, et al., "HPLC Methods for Simultaneous Determination of Ascorbic and Dehydroascorbic Acids", TrAC Trends in Analytical Chemistry, 27(10):942-958 (2008).

Padayatty, et al., "Vitamin C as an Antioxidant: Evaluation of Its Role in Disease Prevention", J. Am. Coll. Nutr., 22(1):18-35 (2003).

Park, et al., "Synthesis Of Benzothiazoles Through Copper-Catalyzed One-Pot Three-Component Reactions With Use of Sodium Hydrosulfide as a Sulfur Surrogate", Eur. J. Org. Chem., 2012:1984-1993 (2012).

Pastore, et al., "Characterization of dehydroascorbic Acid solutions by liquid Chromatography/Mass Spectrometry", Rapid Commun. Mass. Spectrom., 15(22):2051-2057 (2001).

Rappsilber, "Protocol for Micro-Purification, Enrichment, Pre-Fractionation and Storage of Peptides for Proteomics Using Stage Tips", Nat. Protoc., 2:1896 (2007).

Shields, et al., "Long-Lived Charge-Transfer States of Nickel (II) Aryl halide Complexes facilitate Bimolecular Photoinduced Electron Transfer", J. Am. Chem. Soc., 140:3035-3039 (2018).

(56) References Cited

OTHER PUBLICATIONS

Smirnoff, et al., "Ascorbic Acid in Plants: Biosynthesis and Function", Crit. Rev. Plant Sci., 19:267-290 (2000).
Song, et al., "Background-free in-vivo Imaging of Vitamin C using Time-gateable Responsive Probe", Scientific Reports, 5:14194 (2015).
Soro, et al., "Synthesis of the First C-2 Cyclopalladated Derivatives of 1, 3-Bis(2-pyridyl)benzene. Crystal Structures of [Hg(N—C—N)Cl], [Pd(N—C—N)Cl], and [Pd2(N—C—N)2(µ-OAc)]2[Hg2Cl6]. Catalytic Activity in the Heck Reaction", Organometallics, 24:53-61 (2005).
Tam, et al., "A Luminescent Cyclometalated platinum (II) Complex and its green Organic Light Emitting Device With High Device Performance", Chem. Commun. 47, 3383 (2011).
Tang, et al., "Bipolar gold (III) Complexes for Solution-Processable Organic Light-Emitting Devices With a Small Efficiency Roll-Off", J. Am. Chem. Soc. 136, 17861 (2014b).
Tang, et al., "Dendritic Luminescent gold (III) Complexes for Highly Efficient Solution-Processable Organic light-Emitting Devices", Angew. Chem. Int. Ed. 52, 446 (2013).
Tang, et al., "Light-Emitting Electrochemical Cells: a Review on Recent Progress", Top. Curr. Chem., 4:374 (2016).
Tang, et al., "Saturated Red-Light-Emitting gold (III) Triphenylamine Dendrimers for Solution-Processable Organic Light-Emitting Devices", Chem. Eur. J. 20, 15233 (2014a).
Tasker, et al., "Recent Advances in homogeneous nickel Catalysis", Nature, 509(7500):299-309 (2014).
Teske, et al., "The eIF2 Kinase PERK and the Integrated Stress Response Facilitate Activation of ATF6 During Endoplasmic Reticulum Stress", Mol. Biol. Cell, 22(22): 4390-4405 (2011).
Tobisu, et al., "Nickel-catalyzed Suzuki-Miyaura Reaction of Aryl Fluorides", J. Am. Chem. Soc., 133(48):19505-19511 (2011).
Turner, "Luminescent cyclometalated platinum and palladium complexes with novel photophysical properties", A Dissertation Presented in Partial fulfillment of the requirements for the Degree Doctor of Philosophy, (2014).
Vislisel, et al., "A simple and sensitive assay for ascorbate using a plate reader", Anal. Biochem., 365(1):31-9 (2007).
Wang, et al., "Role of the Unfolded Protein Response Regulator GRP78/BiP in Development, Cancer, and Neurological Disorders", Antioxid. Redox Signal., 11(9):2307-2316 (2009).
Wong, et al., "A Class of Luminescent Cyclometalated alkynylgold(III) Complexes: Synthesis, Characterization, and Electrochemical, Photophysical, and Computational Studies of [Au(C≡N═C)(C Triple Bond C—R)] (C≡N═C = kappa(3)C,N,C Bis-Cyclometalated 2,6-diphenylpyridyl)",J. Am. Chem. Soc. 129, 4350 (2007).
Wong, et al., "A Novel Class of Phosphorescent gold (III) Alkynyl Based Organic light-Emitting Devices With Tunable Colour", Chem. Commun., 2906 (2005).
Wong, et al., "Versatile Synthesis of Luminescent Tetradentate Cyclometalated Alkynylgold(III) Complexes and Their Application in Solution-Processable Organic Light-Emitting Devices", Angew. Chem. Int. Ed. 56:302-305 (2017).
Yam, et al., Luminescent gold (III) Alkynyl Complexes: Synthesis, Structural characterization, and Luminescence Properties, Angew. Chem. Int. Ed. 44:3107 (2005).
Yang, et al., "Stable luminescent iridium (iii) complexes with bis(N-heterocyclic carbene) ligands: photo-stability, excited state properties, visible-light-driven radical cyclization and CO2 reduction, and cellular imaging", Chemical Science, 7:3123-3136 (2016).
Zhong, et al., "An Iridium (iii)-Based Irreversible Protein-Proetin Interaction Inhibitor of brd4 as a Potent Anticancer Agent", Chemical Science, 6:5400-5408 (2015).
Zhou, et al., "Cross-couplings of Unactivated Secondary alkyl Halides: Room-Temperature Nickel-Catalyzed Negishi Reactions of Alkyl Bromides and Iodides", J. Am. Chem. Soc., 125: 14726-7 (2003).
Cheng, et al., "Structurally robust phosphorescent [Pt(ONCN )] emitters for high performance organic light-emitting devices with power efficiency up to 126 lm W$^{-1}$ and external quantum efficiency over 20%†", Chem. Sci., 5:4819-4830 (2014).
Chow, et al., "Luminescent Palladium (II) Complexes with π-Extended Cyclometalated [R—CNN—R'] and Pentafluorophenylacetylide Ligands: Spectroscopic, Photophysical, and Photochemical Properties", Chem. Asian. J., 9:534 (2013).
Soro, et al., "Synthesis of the First C-2 Cyclopalladated Derivatives of 1, 3-Bis(2-pyridyl)benzene. Crystal Structures of [Hg(N—C—N)Cl], [Pd(N—C—N)Cl], and [Pd2(N—C—N)2(µ-OAc)]2[Hg2Cl6]. Catalytic Activity in the Heck Reaction", Organometallics, 24:53-61 (2005).
International Search Report received for PCT Patent Application No. PCT/CN2021/127397, mailed on Jan. 25, 2022, 3 pages.
"International Search Report received for PCT Patent Application No. PCT/CN2022/096225, mailed on Sep. 8, 2022", 3 pages.
International Search Report received for PCT Patent Application No. PCT/CN2022/096226, mailed on Sep. 8, 2022, 3 pages.
International Search Report received for PCT Patent Application No. PCT/CN2022/096294, mailed on Sep. 7, 2022, 4 pages.
Leopold , et al., "Binuclear CC* Cyclometalated Platinum(II) NHC Complexes with Bridging Amidinate Ligands", Angew Chem Int Ed Engl., vol. 55, No. 51, Dec. 19, 2016, pp. 15779-15782.
Pinter , et al., "Metallophilic Interactions in Bimetallic Cyclometalated Platinum(II) N-Heterocyclic Carbene Complexes", European Journal of Inorganic Chemistry, vol. 2021, No. 30, Aug. 13, 2021, pp. 3104-3107.
Pinter , et al., "Photophysical Properties of Phosphorescent Mono- and Bimetallic Platinum(II) Complexes with CC* Cyclometalating NHC Ligands", Organometallics, vol. 40, No. 4, Feb. 8, 2021, pp. 557-563.
Wang , et al., "Near-Infrared Emission Induced by Shortened Pt-Pt Contact: Diplatinum(II) Complexes with Pyridyl Pyrimidinato Cyclometalates", Inorg Chem., vol. 58, No. 20, Oct. 21, 2019, pp. 13892-13901.

* cited by examiner

TRANSITION METAL LUMINESCENT COMPLEXES AND METHODS OF USE

CROSS-REFERENCE TO RELATED APPLICATIONS

This application is a continuation-in-part of U.S. application Ser. No. 16/702,864, filed Dec. 4, 2019, which claims benefit of U.S. Provisional Application No. 62/775,195, filed Dec. 4, 2018, and U.S. Provisional Application No. 62/793,570, filed Jan. 17, 2019. Application No. 62/775,195, filed Dec. 4, 2018, and Application No. 62/793,570, filed Jan. 17, 2019, are hereby incorporated herein by reference in their entirety.

FIELD OF THE INVENTION

The disclosed invention is generally in the field of transition metal luminescent complexes, particularly luminescent nickel(II) complexes containing cyclometalating tridentate and tetradentate ligands, and their use in organic light-emitting devices (OLEDs).

BACKGROUND OF THE INVENTION

Transition metal complexes have gained significant interest in commercial and academic settings as molecular probes, catalysts, and luminescent materials. As luminescent materials, transition metal complexes are increasingly being explored as potential alternatives to pure organic-based materials due to their potential for improved luminescence efficiency compared to pure organic-based materials.

Square planar $d^8$ platinum(II) complexes have been considered as one of the most important classes of phosphorescent materials [Tang, M.-C.; Chan, A. K.-W.; Chan, M.-Y.; Yam, V. W.-W. Top. Curr. Chem. 4, 374 (2016)]. A benchmark complex is the 2,3,7,8,12,13,17,18-octaethyl-21H,23H-porphyrin platinum(II) [Pt(OEP)] complex serving as phosphorescent dopant for organic light-emitting devices (OLEDs) first demonstrated by Thompson and Forrest in 1998 [Baldo, M. A.; O'Brien, D. F.; You, A.; Shoustikov, A.; Sibley, S.; Thompson, M. E.; Forrest, S. R. Nature 395, 151 (1998)]. Of particular interest are cyclometalated platinum (II) complexes. Constable and co-workers first reported the coordination of 6-phenyl-2,2'-bipyridine (phbpy) to platinum(II) metal center as tridentate C^N^N ligand [Constable, E. C.; Henney, R. P. G.; Leese, T. A.; Tocher, D. A. J. Chem. Soc. Dalton. Trans. 443 (1990)]. After that, the same group reported a related series of cyclometalated platinum(II) complexes with 6-(2-thienyl)-2,2'-bipyridine as the C^N^N tridentate ligand, [Pt(thbipy)X] (thbipy=6-(2-thienyl)-2,2'-bipyridine and X=Cl, P(O)(OMe)$_2$ or acetylacetone) [Constable, E. C.; Henney, R. P. G.; Raithby, P. R.; Sousa, L. R. J. Chem. Soc. Dalton. Trans. 2251 (1992)]. The luminescent properties of this system were further explored by Che and co-workers [Lai, S.-W.; Chan, M. C.-W.; Cheung, T.-C.; Peng, S.-M.; Che, C.-M. Inorg. Chem. 38, 4046 (1999)]. In addition to tridentate C^N^N ligand, cyclometalated platinum(II) complexes of 1,3-dipyridylbenzene (N^C^N) were first demonstrated by Cárdenas and co-workers [Cárdenas, D. J.; Echavarren, A. M.; de Arellano, M. C. R. Organometallics 18, 3337 (1999)]. This class of complexes emitted strongly in degassed dichloromethane at room temperature, achieving a high photoluminescence quantum yield (PLQY) of 68%. Recently, Yam and co-workers reported a new class of luminescent cyclometalated platinum(II) complexes with 2,6-bis(N-alkylbenzimidazol-2'-yl)benzene as the N^C^N ligand and demonstrated an intense green emission with PLQY of 19% in dichloromethane solution and 45% in solid-state thin film [Tam, A. Y.-Y.; Tsang, D. P.-K.; Chan, M.-Y.; Zhu, N.; Yam V. W.-W. Chem. Commun. 47, 3383 (2011)]. Multilayer phosphorescent OLEDs (PHOLEDs) based on this complex exhibited bright green electroluminescence (EL) with high current efficiencies (CEs) of up to 38.9 cd A$^{-1}$ and external quantum efficiencies (EQEs) of up to 11.5% [Tam, A. Y.-Y.; Tsang, D. P.-K.; Chan, M.-Y.; Zhu, N.; Yam V. W.-W. Chem. Commun. 47, 3383 (2011)]. Taking their coordination-unsaturated nature with square-planar structure as well as their huge synthetic versatility, various $d^8$ platinum(II) complexes with monodentate, bidentate, tridentate, and tetradentate ligands have been reported, where their emission energies have spanned the entire visible spectrum from blue to red. Notably, through the coordination of a polydentate ligand to a platinum(II) metal center through the covalent metal-carbon bond, the strong σ-donating carbanion would highly destabilize the $5d_{x^2-y^2}$ orbital, rendering the non-radiative d-d ligand field excited state much higher in energy. This, in turn, leads to the non-radiative pathway being less competitive than the emissive pathway and hence enhances the luminescence of the platinum(II) system.

Although the platinum(II) complexes are known to show rich luminescent properties, transition metal complexes with other isoelectronic $d^8$ transition metal centers are relatively less explored, particularly due to the lack of luminescence at room temperature. The presence of thermally accessible and low-lying d-d ligand-field excited states would quench the luminescence excited state via thermal equilibration or energy transfer. However, introducing strong donor ligands into gold(III), i.e., a $d^8$ complex, improved the luminescent properties of the gold(III) complexes. The coupling of strong σ-donating alkynyl ligands or aryl ligands to gold(III) should render the metal center more electron-rich, with the additional advantage of further raising the energy of the d-d states, which would result in enhanced luminescence by increasing the chances of populating the emissive state. The first demonstration on the design and synthesis of strongly luminescent cyclometalated alkynylgold(III) complexes, [Au(R—C^N(R')^C—R)(C≡C—R)] (R—HC^N^CH=2,6-diphenylpyridine or substituted 2,6-diphenylpyridine; R=alkyl, aryl or substituted aryl; R'=aryl or substituted aryl), at room temperature was carried out by Yam and co-workers [Yam, V. W.-W.; Wong, K. M.-C.; Hung, L.-L.; Zhu, N. Angew. Chem. Int. Ed. 44, 3107 (2005); Wong, K. M.-C.; Hung, L.-L.; Lam, W. H.; Zhu, N.; Yam, V. W.-W. J. Am. Chem. Soc. 129, 4350 (2007); Wong, K. M.-C.; Zhu, X.; Hung, L.-L.; Zhu, N.; Yam, V. W.-W.; Kwok, H. S. Chem. Commun. 2906 (2005)], based on their earlier strategy of introducing strong σ-donating aryl and alkyl ligands to the gold(III) diimine complexes to give room-temperature phosphorescent gold(III) complexes [Yam, V. W. W.; Choi, S. W. K.; Lai, T. F.; Lee, W. K. J. Chem. Soc., Dalton Trans. 1001 (1993)]. Recently, a new class of phosphorescent cyclometalated alkynylgold(III) complexes has been reported [Au, V. K.-M.; Wong, K. M.-C.; Tsang, D. P.-K.; Chan, M. Y.; Yam, V. W.-W. J. Am. Chem. Soc. 132, 14273 (2010)]. The vacuum-deposited OLEDs reached high EQE of 11.5% and CE of 37.4 cd A$^{-1}$. Later on, dendritic gold(III) complexes have been designed and synthesized. The excellent solubilities of these complexes in most of the organic solvents enable the use of solution-processing technique for OLED fabrication [Tang, M.-C.; Tsang, D. P.-K.; Chan, M. M.-Y.; Wong, K. M.-C.; Yam, V. W.-W. Angew. Chem. Int. Ed. 52, 446 (2013); Tang, M.-C.; Chan, C. K.-M.; Tsang, D. P.-K.;

Wong, Y.-C.; Yam, V. W.-W. *Chem. Eur J.* 20, 15233 (2014)]. Bipolar gold(III) complexes with N-phenylbenzimidazole as acceptor and triphenylamine as donor have also been developed [Tang, M.-C.; Tsang, D. P.-K.; Wong, Y.-C.; Chan, M.-Y.; Wong, K. M.-C.; Yam, V. W.-W. *J. Am. Chem. Soc.* 136, 17861 (2014)]. A high EQE of up to 10.0% based on the bipolar system has been achieved together with an extremely small efficiency roll-off value of less than 1% at the practical brightness level of 1000 cd m$^{-2}$. This design strategy can also be applied to generate luminescent palladium(II) complexes. In 1997, Neve and co-workers reported a new palladium(II) complex supported by C^N^N ligands (C^N^N=4'-[4-(dodecyloxy)phenyl]-6'-phenyl-2,2'-bipyridine) [Neve, F.; Crispini, A.; Campagna, S. *Inorg. Chem.* 36, 6150 (1997)]. Such palladium(II) complex showed a weak structureless emission at 490 nm. Recently, Che and co-workers reported a series of palladium(II) complexes [Pd(R—C^N^N—R')X] (R—C^N^N—R'=3-(6'-aryl-2'-pyridinyl)isoquinoline); X=chloride and pentafluorophenylacetylide) [Chow, P.-K.; To, W.-P.; Low, K.-H.; Che, C.-M. *Chem. Asian. J.* 9, 534 (2013)]. The cyclometalated palladium(II) complexes, coordinated with a chloride ligand, were found to be emissive only in the solid state and in glassy solutions at 77 K. On the other hand, with the incorporation of a pentafluorophenylacetylide ligand, the palladium(II) complex displayed strong phosphorescence both in solid state and in solution at room temperature. Besides, the luminescent properties of the metal complexes are closely related to the denticity of the chelating ligands. It appears that for square-planar metal complexes, their thermal stability and rigidity are of great importance in the device performance as well as the operational lifetime. Greater stability as well as a lowering of non-radiative decay rate can be achieved by employing rigid tetradentate ligands to confine the metal center. For example, the first tetradentate platinum(II) metal complex used as emitting materials was [Pt(OEP)] [Baldo, M. A.; O'Brien, D. F.; You, A.; Shoustikov, A.; Sibley, S.; Thompson, M. E.; Forrest, S. R. *Nature* 395, 151 (1998)]. The doped electroluminescent devices based on this emitter showed peak external and internal quantum efficiencies of 4% and 23%, respectively. Recently, rigid tetradentate O^N^C^N platinum(II) complexes were reported to have a photoluminescence quantum yields of 90% and display good thermal stability. Because of these advantages, PHOLEDs with high device efficiency and stability have been achieved with EQE of 18.2% and current efficiency of 66.7 cd A$^{-1}$ [Kui, S. C. F.; Chow, P. K.; Cheng, G. C.; Kwok, C.-C.; Kwong, C. L.; Low, K.-H.; Che, C.-M. *Chem. Comm.* 49, 1497 (2013)]. Apart from the platinum(II) complexes, Yam and co-workers have shown to utilize the post-synthetic ligand modification approach to generate a new class of tetradentate gold(III) complexes, which demonstrated extraordinarily high photoluminescence quantum yields of up to 78% [Wong, B. Y.-W.; Wong, H.-L.; Wong, Y.-C.; Chan, M.-Y.; Yam, V. W.-W. *Angew. Chem. Int. Ed.* 55, 1 (2016)]. These complexes were found to be capable of catalyzing light-induced aerobic oxidative C—H functionalization of amines and light-induced hydrogen production. It should be noted that the complexes described above are based on rare, expensive, and noble transition metals, which limits their widespread use in commercial applications. Thus, the search for more affordable transition metal complexes with potential applications in commercial settings is on-going and remains an unmet need.

Isoelectronic d$^8$ nickel(II) complexes have long been studied for their catalytic properties and are often low-cost replacements for palladium and platinum to catalyze the cross-coupling reactions, such as Suzuki-Miyaura and Negishi reactions [Tasker, S. Z.; Standley, E. A.; Jamison, T. F. *Nature* 509, 299 (2014)]. However, the isoelectronic d$^8$ nickel(II) complexes are found to be non-emissive at room temperature, and only weak emission is found at low temperature in the solid state or in glass [Shields, B. J.; Kudisch, B.; Scholes, G. D.; Doyle, A. G. *J. Am. Chem. Soc.* 140, 3035 (2018); Klein, A.; Rausch, B.; Kaiser, A.; Vogt, N.; Krest, A. *J. Organomet. Chem.* 774, 86 (2014)]. The following examples illustrate the use of nickel(II) complexes in catalysis. Nickel is more electropositive than palladium and platinum, which facilitates the oxidative coupling reaction and allows for the use of cross-coupling electrophiles that would be considerably less reactive under palladium catalysis, such as phenol derivatives [Li, B.-J.; Yu, D.-G.; Sun, C.-L.; Shi, Z.-J. *Eur. Chem. J.* 17, 1728 (2011); Mesganaw, T.; Garg, N. K. *Org. Process Res. Dev.* 17, 29 (2013)], aromatic nitriles [Garcia, J. J.; Brunkan, N. M.; Jones, W. D. *J. Am. Chem. Soc.* 124, 9547 (2002)] or aryl fluorides [Tobisu, M.; Xu, T.; Shimasaki, T.; Chatani, N. *J. Am. Chem. Soc.* 133, 19505 (2011)]. In 2003, Fu and co-workers reported the use of Ni(cod)$_2$ (cod=1,5-cyclooctadiene) together with a neutral tridentate bis(oxazoline) ligand to catalyze the Negishi cross-couplings of primary alkyl halides with alkylzinc reagents, representing the first nickel-catalyzed method for cross-coupling unactivated, β-hydrogen-containing secondary alkyl halides. [Zhou, J.; Fu, G. C. *J. Am. Chem. Soc.* 125, 14726 (2003)]. In 2006, Morales and co-workers reported the design and synthesis of a tridentate phosphinite nickel(II) complex [NiCl{C$_6$H$_3$-2,6-(OPPh$_2$)$_2$}] to catalyze the thiolation of iodobenzene with a broad scope of disulfides in the presence of zinc [Gómez-Benítez, V.; Baldovino-Pantaleón, O.; Herrera-Álvarez, C.; Toscano, R. A.; Morales-Morales, D. *Tetrahedron Lett.* 47, 5059 (2006)]. Despite this interest in the use of nickel(II) complexes for catalysis, the chemistry of cyclometalated nickel(II) is essentially unexplored and underdeveloped, and their luminescence properties are virtually unknown. Notably, nickel (i.e., 1$^{st}$ row transition metal) has the weakest d-d splitting energies when compared to the group 10 analogs including palladium (2$^{nd}$ row transition metal) and platinum (3$^{nd}$ row transition metal). As a result, transition metal complexes that have weak d-d splitting energies comparable to those of nickel(II) complexes are non-emissive, and have been considered unsuitable when designing luminescent transition metal complexes. Accordingly, there remains a need to develop improved and economically efficient transition metal complexes so that OLED-containing products can have improved efficiencies and be more affordable.

Therefore, it is an object of the present invention to provide improved luminescent transition metal complexes.

It is another object of the present invention to provide luminescent transition metal complexes containing a cyclometalating ligand having a denticity of three or higher (such as four), and an ancillary ligand.

It is also an object of the present invention to provide luminescent transition metal complexes containing a d$^6$, d$^7$, or d$^8$ transition metal center surrounded by a cyclometalating ligand having a denticity of three or higher (such as four), and an ancillary ligand.

It is a further object of the present invention to provide luminescent transition metal complexes containing a nickel (II) center surrounded by a cyclometalating ligand having a denticity of three, and an ancillary ligand.

SUMMARY OF THE INVENTION

Described herein are transition metal complexes or compounds containing a central metal atom traditionally known to have weak d-d splitting energies, such as those of nickel (II) complexes. The cyclometalating ligands surrounding the central metal atom typically have a denticity of three or higher. However, the introduction of an ancillary ligand with strong σ-donating properties renders the metal center more electron-rich, with the additional advantage of further raising the energy of the d-d states, which would result in enhanced luminescence by increasing the chances of populating the emissive state. Preferably, the compounds are emissive at room temperature and/or low temperature in various media, rendering them useful as light-emitting materials for OLEDs.

The luminescent compound has the formula:

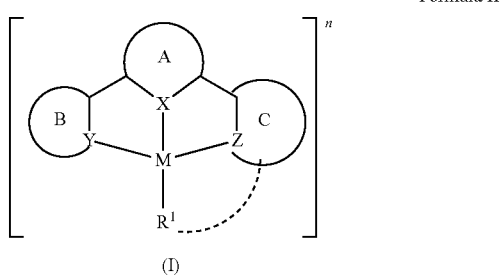

Formula II (I)

wherein:

M is a first-row transition metal (such as scandium, titanium, vanadium, chromium, manganese, iron, cobalt, nickel, copper, and zinc), preferably M is nickel or copper;

X, Y and Z are independently nitrogen or carbon;

A, B, and C are cyclic structure derivatives of phenyl groups, unsubstituted heteroaryl groups, substituted heteroaryl groups, unsubstituted heterocyclic groups, or substituted heterocyclic groups, wherein the dashed line indicates that $R^1$ is optionally linked or unlinked to C, preferably $R^1$ is not linked to C; preferably, rings A, B, and C are independently benzene, phenyl derivatives, unsubstituted heteroaryl, substituted heteroaryl, heteroaryl derivatives, unsubstituted heterocycle, substituted heterocycle, or heterocyclic derivatives (each optionally independently with one or more unsubstituted alkyl, unsubstituted alkenyl, unsubstituted alkynyl, unsubstituted aryl, unsubstituted cycloalkyl, OR, $NR_2$, SR, C(O)R, C(O)OR, C(O)$NR_2$, CN, $CF_3$, $NO_2$, $SO_2$, SOR, $SO_3R$, halo, unsubstituted aryl, substituted aryl, unsubstituted heteroaryl, substituted heteroaryl, or unsubstituted heterocyclic groups, wherein R is independently unsubstituted alkyl, unsubstituted alkenyl, unsubstituted alkynyl, unsubstituted alkyaryl, unsubstituted aryl, or unsubstituted cycloalkyl);

$R^1$ is any carbon or heteroatom donor ligand, halide or pseudohalide, which could be either anionic or neutral. Preferably, $R^1$ is selected from, but not limited to, unsubstituted alkyl, substituted alkyl, unsubstituted aryl, substituted aryl, unsubstituted heteroaryl, substituted heteroaryl, unsubstituted alkynyl, substituted alkynyl, unsubstituted alkoxy, amide, thiolate, phosphide, chloride, bromide, iodide, cyanate, thiocyanate, cyanide, isocyanide or N-heterocyclic carbene; and n is zero, a positive integer or a negative integer.

DETAILED DESCRIPTION OF THE INVENTION

I. Definitions

Figure 1:
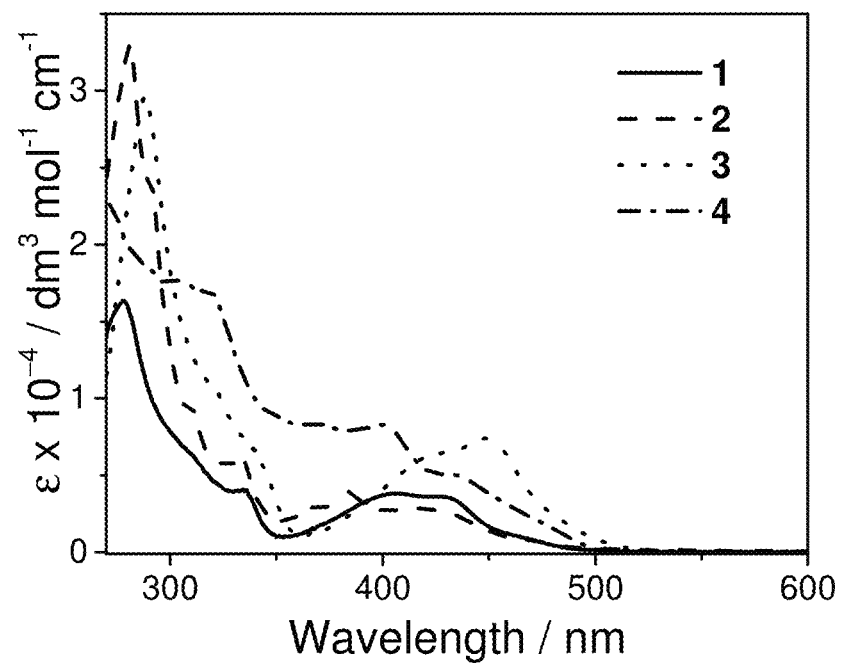
FIG. 1 shows the UV-visible absorption spectra of the compounds of 1, 2, 3, and 4 in dichloromethane at 298 K, in accordance with one or more embodiments herein.

The term "room temperature" refers to a temperature between about 288 K and about 303 K, such as 308 K.

The term "low temperature" refers to a temperature between about 70 K and about 150 K, such as 77 K.

The term "cyclometalating ligand" includes, but is not limited to, 1,3-bis(2-pyridyl)benzene (N^C^N), 1,3-di(pyridin-2-yl)-5-tert-butylbenzene (N^C$^t$Bu^N), 1,3-di(isoquinolinyl)-5-tert-butylbenzene ($N_{(isoquin)}$^C$^t$Bu^$N_{(isoquin)}$), 1,3-di(pyridin-2-yl)-5-phenylbenzene (N^CPh^N), 1,3-difluoro-4,6-di(pyridin-2-yl)benzene (N^$C_6H_2F_2$^N), 1,3-difluoro-4,6-di(4-tert-butylpyridin-2-yl)benzene (N^$C_6H_2F_2$^N), 1,3-di(pyridin-2-yl)-5-(4-isopropylphenyl)benzene (N^C(4-$^i$Pr-$C_6H_4$)^N), 1,3-di(pyridin-2-yl)-5-(4-nitrophenyl)benzene (N^C(4-$NO_2$—$C_6H_4$)^N), 1,3-di(pyridin-2-yl)-5-(4-methoxyphenyl)benzene (Ph-N^C(4-OMe-$C_6H_4$)^N), 1,3-di(pyridin-2-yl)-5-(4-methylphenyl)benzene (N^C(4-Me-$C_6H_4$)^N), 1,3-di(pyridin-2-yl)-5-(4-ethylphenyl)benzene (N^C(4-$C_2H_5$—$C_6H_4$)^N), 1,3-di(pyridin-2-yl)-5-(2,3,4-trimethoxyphenyl)benzene (N^C(2,3,4-OMe-$C_6H_2$)^N), 1,3-di(pyridin-2-yl)-5-(4-tosylphenyl)benzene (N^C(4-OTs-$C_6H_4$)^N), 1,3-di(pyridin-2-yl)-5-(4-dimethylaminophenyl)benzene (N^C(4-$NMe_2$-$C_6H_4$)^N), 1,3-di(pyridin-2-yl)-5-(4-diphenylaminophenyl)benzene (N^C(4-$NPh_2$-$C_6H_4$)^N), 1,3-di(pyridin-2-yl)-5-(4-bromophenyl)benzene (N^C(4-Br—$C_6H_4$)^N), 1,3-di(pyridin-2-yl)-5-(4-chlorophenyl)benzene (N^C(4-Cl—$C_6H_4$)^N), 1,3-di(pyridin-2-yl)-5-(4-fluorophenyl)benzene (N^C(4-F—$C_6H_4$)^N), 1,3-di(pyridin-2-yl)-5-(4-iodophenyl)benzene (N^C(4-I—$C_6H_4$)^N), 1,3-di(pyridin-2-yl)-5-(2,5-dimethylphenyl)benzene (N^C(2,5-$Me_2$-$C_6H_4$)^N), 1,3-di(pyridin-2-yl)-5-(2,3,4,5,6-pentafluorophenyl)benzene (N^C($C_6F_5$)^N), 2-(9-(pyridin-2-yl)-5,6-dihydrobenzo[h]quinolin-2-yl)phenol (N^C^N^O), 2-(7-(tert-butyl)-9-(pyridin-2-yl)-5,6-dihydrobenzo[h]quinolin-2-yl)phenol (N^C$^t$Bu^N^O), 2-(3-(isoquinolin-3-yl)-11,12-dihydrobenzo[c]phenanthridin-6-yl)phenol ($N_{(isoquin)}$^C^$N_{(isoquin)}$^O), 2-(7-phenyl-9-(pyridin-2-yl)-5,6-dihydrobenzo[h]quinolin-2-yl)phenol (N^CPh^N^O), 2-(7-

(4-isopropylphenyl)-9-(pyridin-2-yl)-5,6-dihydrobenzo[h]quinolin-2-yl)phenol (N^C(4-$^i$Pr-C$_6$H$_4$)^N^O), 2-(7-(4-nitrophenyl)-9-(pyridin-2-yl)-5,6-dihydrobenzo[h]quinolin-2-yl)phenol (N^C(4-NO$_2$—C$_6$H$_4$)^N^O), 2-(7-(4-methoxyphenyl)-9-(pyridin-2-yl)-5,6-dihydrobenzo[h]quinolin-2-yl)phenol (N^C(4-OMe-C$_6$H$_4$)^N^O), 2-(9-(pyridin-2-yl)-7-(p-tolyl)-5,6-dihydrobenzo[h]quinolin-2-yl)phenol (N^C(4-Me-C$_6$H$_4$)^N^O), 2-(9-(pyridin-2-yl)-7-(2,3,4-trimethoxyphenyl)-5,6-dihydrobenzo[h]quinolin-2-yl)phenol (N^C(2,3,4-OMe-C$_6$H$_2$)^N^O), 2-(7-(4-(dimethylamino)phenyl)-9-(pyridin-2-yl)-5,6-dihydrobenzo[h]quinolin-2-yl)phenol (N^C(4-NMe$_2$-C$_6$H$_4$)^N^O), 2-(7-(4-(diphenylphosphanyl)phenyl)-9-(pyridin-2-yl)-5,6-dihydrobenzo[h]quinolin-2-yl)phenol (N^C(4-NPh$_2$-C$_6$H$_4$)^N^O), 2-(7-(4-bromophenyl)-9-(pyridin-2-yl)-5,6-dihydrobenzo[h]quinolin-2-yl)phenol (N^C(4-Br—C$_6$H$_4$)^N^O), 2-(7-(4-chlorophenyl)-9-(pyridin-2-yl)-5,6-dihydrobenzo[h]quinolin-2-yl)phenol (N^C(4-Cl—C$_6$H$_4$)^N^O), 2-(7-(4-fluorophenyl)-9-(pyridin-2-yl)-5,6-dihydrobenzo[h]quinolin-2-yl)phenol (N^C(4-F—C$_6$H$_4$)^N^O), 2-(7-(4-iodophenyl)-9-(pyridin-2-yl)-5,6-dihydrobenzo[h]quinolin-2-yl)phenol (N^C(4-I—C$_6$H$_4$)^N^O), 2-(7-(perfluorophenyl)-9-(pyridin-2-yl)-5,6-dihydrobenzo[h]quinolin-2-yl)phenol (N^C(C$_6$F$_5$)^N^O).

"Pseudohalide" includes, but is not limited to, cyanate, thiocyanate and cyanide.

"Alkyl" includes straight and branched chain alkyl groups, as well as cycloalkyl groups with alkyl groups having a cyclic structure. Preferred alkyl groups are those containing between one to eighteen carbon atoms and includes methyl, ethyl, propyl, isopropyl, butyl, isobutyl, tert-butyl, and other similar compounds. In addition, the alkyl group may be optionally substituted with one or more substituents selected from hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, aryether, alkylether, heteroaryether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

It will be understood by those skilled in the art that the moieties substituted on the hydrocarbon chain can themselves be substituted, if appropriate. For instance, the substituents of a substituted alkyl may include halogen, hydroxy, nitro, thiols, amino, azido, imino, amido, phosphoryl (including phosphonate and phosphinate), sulfonyl (including sulfate, sulfonamido, sulfamoyl and sulfonate), and silyl groups, as well as ethers, alkylthios, carbonyls (including ketones, aldehydes, carboxylates, and esters), haloalkyls, —CN and the like. Cycloalkyls can be substituted in the same manner.

"Substituted," as used herein, refers to all permissible substituents of the compounds or functional groups described herein. In the broadest sense, the permissible substituents include acyclic and cyclic, branched and unbranched, carbocyclic and heterocyclic, aromatic and nonaromatic substituents of organic compounds. Illustrative substituents include, but are not limited to, halogens, hydroxyl groups, or any other organic groupings containing any number of carbon atoms, preferably 1-14 carbon atoms, and optionally include one or more heteroatoms such as oxygen, sulfur, or nitrogen grouping in linear, branched, or cyclic structural formats. Representative substituents include alkyl, substituted alkyl, alkenyl, substituted alkenyl, alkynyl, substituted alkynyl, phenyl, substituted phenyl, aryl, substituted aryl, heteroaryl, substituted heteroaryl, halo, hydroxyl, alkoxy, substituted alkoxy, phenoxy, substituted phenoxy, aroxy, substituted aroxy, alkylthio, substituted alkylthio, phenylthio, substituted phenylthio, arylthio, substituted arylthio, cyano, isocyano, substituted isocyano, carbonyl, substituted carbonyl, carboxyl, substituted carboxyl, amino, substituted amino, amido, substituted amido, sulfonyl, substituted sulfonyl, sulfonic acid, phosphoryl, substituted phosphoryl, phosphonyl, substituted phosphonyl, polyaryl, substituted polyaryl, cyclic (such as $C_3$-$C_{20}$ cyclic), substituted cyclic (such as substituted $C_3$-$C_{20}$ cyclic), heterocyclic, substituted heterocyclic, amino acid, poly(lactic-co-glycolic acid), peptide, polypeptide, deuterium, unsubstituted alkylalkynyl, substituted alkylalkynyl, unsubstituted arylalkynyl, substituted arylalkynyl, unsubstituted heteroarylalkynyl, substituted heteroarylalkynyl, trihaloalkyl (trifluoromethyl), unsubstituted heteroarylether, substituted heteroarylether, unsubstituted diarylamino, substituted diarylamino, unsubstituted dialkylamino, substituted dialkylamino, unsubstituted diheteroarylamino, substituted diheteroarylamino, unsubstituted diarylboraneyl, substituted diarylboraneyl, unsubstituted triarylsilyl, substituted triarylsilyl, unsubstituted trialkylsilyl, substituted trialkylsilyl, azo, carbonate ester, ketamine, nitro, nitroso, phosphino, pyridyl, NRR', SR, C(O)R, COOR, C(O)NR, SOR, SOR, and BRR' groups, wherein and R and R' are independently selected from hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, aryether, alkylether, heteroaryether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, and heterocyclic groups. Such alkyl, substituted alkyl, alkenyl, substituted alkenyl, alkynyl, substituted alkynyl, phenyl, substituted phenyl, aryl, substituted aryl, heteroaryl, substituted heteroaryl, halo, hydroxyl, alkoxy, substituted alkoxy, phenoxy, substituted phenoxy, aroxy, substituted aroxy, alkylthio, substituted alkylthio, phenylthio, substituted phenylthio, arylthio, substituted arylthio, cyano, isocyano, substituted isocyano, carbonyl, substituted carbonyl, carboxyl, substituted carboxyl, amino, substituted amino, amido, substituted amido, sulfonyl, substituted sulfonyl, sulfonic acid, phosphoryl, substituted phosphoryl, phosphonyl, substituted phosphonyl, polyaryl, substituted polyaryl, cyclic (such as $C_3$-$C_{20}$ cyclic), substituted cyclic (such as substituted $C_3$-$C_{20}$ cyclic), heterocyclic, substituted heterocyclic, amino acid, poly(lactic-co-glycolic acid), peptide, polypeptide, deuterium, substituted alkylalkynyl, substituted alkylalkynyl, unsubstituted arylalkynyl, substituted arylalkynyl, unsubstituted heteroarylalkynyl, substituted heteroarylalkynyl, trihaloalkyl (trifluoromethyl), unsubstituted heteroarylether, substituted heteroarylether, unsubstituted diarylamino, substituted diarylamino, unsubstituted dialkylamino, substituted dialkylamino, unsubstituted diheteroarylamino, substituted diheteroarylamino, unsubstituted diarylboraneyl, substituted diarylboraneyl, unsubstituted triarylsilyl, substituted triarylsilyl, unsubstituted trialkylsilyl, substituted trialkylsilyl, azo, carbonate ester, ketamine, nitro, nitroso, phosphide, phosphino, and pyridyl groups can be further substituted.

The term "unsubstituted alkenylaryl" as used herein includes an aryl group which has an alkenyl group as a substituent.

The term "substituted alkenylaryl" refers to an alkenylaryl group having one or more substituents replacing one or more hydrogen atoms of the group.

The term "unsubstituted alkynylaryl" as used herein includes an aryl group which has an alkynyl group as a substituent.

The term "substituted alkynylaryl" refers to an alkynylaryl group having one or more substituents replacing one or more hydrogen atoms of the group.

The term "unsubstituted alkylalkenyl" as used herein includes an alkenyl group which has an alkynyl group as a substituent.

The term "substituted alkylalkenyl" refers to an alkylalkenyl group having one or more substituents replacing one or more hydrogen atoms of the group.

The term "unsubstituted arylalkenyl" as used herein includes an alkenyl group has an aryl group as a substituent.

The term "substituted arylalkenyl" refers to an arylalkenyl group having one or more substituents replacing one or more hydrogen atoms of the group.

The term "substituted alkynylalkenyl" refers to an alkynylalkenyl group having one or more substituents replacing one or more hydrogen atoms of the group.

The term "unsubstituted alkynylalkenyl" as used herein includes an alkenyl group which has an alkynyl group as a substituent.

The term "unsubstituted alkylalkynyl" as used herein includes an alkynyl group which has an alkyl group as a substituent.

The term "substituted alkylalkynyl" refers to an alkylalkynyl group having one or more substituents replacing one or more hydrogen atoms of the group.

The term "unsubstituted arylalkynyl" as used herein includes an alkynyl group which has an aryl group as a substituent.

The term "substituted arylalkynyl" refers to an arylalkynyl group having one or more substituents replacing one or more hydrogen atoms of the group.

The term "heteroatom" as used herein includes, but is not limited to, S, O, N, P, Se, Te, As, Sb, Bi, B, Si, Ge, Sn and Pb. Heteroatoms such as nitrogen may have hydrogen substituents and/or any permissible substituents of organic compounds described herein which satisfy the valences of the heteroatoms. It is understood that "substitution" or "substituted" includes the implicit proviso that such substitution is in accordance with permitted valence of the substituted atom and the substituent, and that the substitution results in a stable compound, i.e. a compound that does not spontaneously undergo transformation such as by rearrangement, cyclization, elimination, etc.

The term "alkenyl" as used herein is a hydrocarbon group having, for example, from 2 to 24 carbon atoms and a structural formula containing at least one carbon-carbon double bond. Asymmetric structures such as (AB)C═C(CD) are intended to include both the E and Z isomers. This may be presumed in structural formulae herein wherein an asymmetric alkene is present, or it may be explicitly indicated by the bond symbol C.

The term "alkynyl group" as used herein is a hydrocarbon group having, for example, 2 to 24 carbon atoms and a structural formula containing at least one carbon-carbon triple bond.

The term "aryl" as used herein is any $C_5$-$C_{26}$ carbon-based aromatic group, fused aromatic, fused heterocyclic, or biaromatic ring systems. Broadly defined, "aryl," as used herein, includes 5-, 6-, 7-, 8-, 9-, 10-, 14-, 18-, and 24-membered single-ring aromatic groups, including, but not limited to, benzene, naphthalene, anthracene, phenanthrene, chrysene, pyrene, corannulene, coronene, etc. "Aryl" further encompasses polycyclic ring systems having two or more cyclic rings in which two or more carbons are common to two adjoining rings (i.e., "fused rings") wherein at least one of the rings is aromatic, e.g., the other cyclic ring or rings can be cycloalkyls, cycloalkenyls, cycloalkynyls, aryls and/or heterocycles. The aryl group can be substituted with one or more groups including, but not limited to, alkyl, alkynyl, alkenyl, aryl, halide, nitro, amino, ester, ketone, aldehyde, hydroxy, carboxylic acid, or alkoxy.

The term "substituted aryl" refers to an aryl group, wherein one or more hydrogen atoms on one or more aromatic rings are substituted with one or more substituents including, but not limited to, halogen, azide, alkyl, aralkyl, alkenyl, alkynyl, cycloalkyl, hydroxyl, alkoxy, carbonyl (such as a ketone, aldehyde, carboxyl, alkoxycarbonyl, formyl, or an acyl), silyl, ether, ester, thiocarbonyl (such as a thioester, a thioacetate, or a thioformate), alkoxyl, phosphoryl, phosphate, phosphonate, phosphinate, amino (or quarternized amino), amido, amidine, imine, cyano, nitro, azido, sulfhydryl, imino, alkylthio, sulfate, sulfonate, sulfamoyl, sulfonamido, sulfonyl, heterocyclyl, alkylaryl, haloalkyl (such as CF3, —CH$_2$—CF$_3$, —CCl$_3$), —CN, aryl, heteroaryl, and combinations thereof.

"Heterocycle," "heterocyclic" and "heterocyclyl" are used interchangeably, and refer to a cyclic radical attached via a ring carbon or nitrogen atom of a monocyclic or bicyclic ring containing 3-10 ring atoms, and preferably from 5-6 ring atoms, consisting of carbon and one to four heteroatoms each selected from the group consisting of non-peroxide oxygen, sulfur, and N(Y) wherein Y is absent or is H, O, $C_1$-$C_{10}$ alkyl, phenyl or benzyl, and optionally containing 1-3 double bonds and optionally substituted with one or more substituents. Heterocyclyl are distinguished from heteroaryl by definition. Examples of heterocycles include, but are not limited to piperazinyl, piperidinyl, piperidonyl, 4-piperidonyl, dihydrofuro[2,3-b]tetrahydrofuran, morpholinyl, piperazinyl, piperidinyl, piperidonyl, 4-piperidonyl, piperonyl, pyranyl, 2H-pyrrolyl, 4H-quinolizinyl, quinuclidinyl, tetrahydrofuranyl, 6H-1,2,5-thiadiazinyl. Heterocyclic groups can optionally be substituted with one or more substituents as defined above for alkyl and aryl.

The term "heteroaryl" refers to $C_5$-$C_{26}$-membered aromatic, fused aromatic, biaromatic ring systems, or combinations thereof, in which one or more carbon atoms on one or more aromatic ring structures have been substituted with a heteroatom. Suitable heteroatoms include, but are not limited to, oxygen, sulfur, and nitrogen. Broadly defined, "heteroaryl," as used herein, includes 5-, 6-, 7-, 8-, 9-, 10-, 14-, 18-, and 24-membered single-ring aromatic groups that may include from one to four heteroatoms, for example, pyrrole, furan, thiophene, imidazole, oxazole, thiazole, triazole, tetrazole, pyrazole, pyridine, pyrazine, pyridazine and pyrimidine, and the like. The heteroaryl group may also be referred to as "aryl heterocycles" or "heteroaromatics." "Heteroaryl" further encompasses polycyclic ring systems having two or more rings in which two or more carbons are common to two adjoining rings (i.e., "fused rings") wherein at least one of the rings is heteroaromatic, e.g., the other cyclic ring or rings can be cycloalkyls, cycloalkenyls, cycloalkynyls, aryls, heterocycles, or combinations thereof. Examples of heteroaryl rings include, but are not limited to, benzimidazolyl, benzofuranyl, benzothiofuranyl, benzothiophenyl, benzoxazolyl, benzoxazolinyl, benzthiazolyl, benztriazolyl, benztetrazolyl, benzisoxazolyl, benzisothiazolyl, benzimidazolinyl, carbazolyl, 4aH-carbazolyl, carbolinyl, chromanyl, chromenyl, cinnolinyl, decahydroquinolinyl, 2H,6H-1,5,2-dithiazinyl, furanyl, furazanyl, imidazolidinyl, imidazolinyl, imidazolyl, 1H-indazolyl, indolenyl, indolinyl, indolizinyl, indolyl, 3H-indolyl, isatinoyl, isobenzofuranyl, isochromanyl, isoindazolyl, isoindolinyl, isoindolyl, isoquinolinyl, isothiazolyl, isoxazolyl, methylenedioxyphenyl, naphthyridinyl, octahydroisoquinolinyl, 1,2,3-oxadiazolyl, 1,2,4-oxadiazolyl, 1,2,5-oxadiazolyl, 1,3,4-oxadiazolyl, oxazolidinyl, oxazolyl, oxindolyl, pyrimidinyl, phenanthridinyl, phenanthrolinyl, phenazinyl, phenothiazinyl, phenoxathinyl, phenoxazinyl, phthalazinyl, pteridinyl, purinyl, pyrazinyl, pyrazolidinyl, pyrazolinyl, pyrazolyl, pyridazinyl, pyridooxazole, pyridoimidazole, pyridothiazole, pyridinyl, pyridyl, pyrimidinyl, pyrrolidinyl, pyrrolinyl, pyrrolyl, quinazolinyl, quinolinyl, quinoxalinyl, tetrahydroisoquinolinyl, tetrahydroquinolinyl, tetrazolyl, 1,2,3-thiadiazolyl, 1,2,4-thiadiazolyl, 1,2,5-thiadiazolyl, 1,3,4-thiadiazolyl, thianthrenyl, thiazolyl, thienyl, thienothiazolyl, thienooxazolyl, thienoimidazolyl, thiophenyl and xanthenyl. One or more of the rings can be substituted as defined below for "substituted heteroaryl".

The term "substituted heteroaryl" refers to a heteroaryl group in which one or more hydrogen atoms on one or more heteroaromatic rings are substituted with one or more substituents including, but not limited to, halogen, azide, alkyl, aralkyl, alkenyl, alkynyl, cycloalkyl, hydroxyl, alkoxy, carbonyl (such as a ketone, aldehyde, carboxyl, alkoxycarbonyl, formyl, or an acyl), silyl, ether, ester, thiocarbonyl (such as a thioester, a thioacetate, or a thioformate), alkoxyl, phosphoryl, phosphate, phosphonate, phosphinate, amino (or quarternized amino), amido, amidine, imine, cyano, nitro, azido, sulfhydryl, imino, alkylthio, sulfate, sulfonate, sulfamoyl, sulfonamido, sulfonyl, heterocyclyl, alkylaryl, haloalkyl (such as CF3, —CH$_2$—CF$_3$, —CCl$_3$), —CN, aryl, heteroaryl, and combinations thereof.

The term "substituted alkenyl" refers to alkenyl moieties having one or more substituents replacing one or more hydrogen atoms on one or more carbons of the hydrocarbon backbone. Such substituents include, but are not limited to, halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphoryl, phosphate, phosphonate, phosphinate, amino (or quarternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, and combinations thereof.

The term "substituted alkynyl" refers to alkynyl moieties having one or more substituents replacing one or more hydrogen atoms on one or more carbons of the hydrocarbon backbone. Such substituents include, but are not limited to, halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphoryl, phosphate, phosphonate, phosphinate, amino (or quarternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, and combinations thereof.

The term "cycloalkyl" as used herein is a non-aromatic carbon-based ring composed of at least three carbon atoms. Examples of cycloalkyl groups include, but are not limited to, cyclopropyl, cyclobutyl, cyclopentyl, cyclohexyl, etc. The term "heterocycloalkyl group" is a cycloalkyl group as defined above where at least one of the carbon atoms of the ring is substituted with a heteroatom such as, but not limited to, nitrogen, oxygen, sulphur, or phosphorus.

The term "aralkyl" as used herein is an aryl group having an alkyl, alkynyl, or alkenyl group as defined above attached to the aromatic group. An example of an aralkyl group is a benzyl group.

The term "hydroxyalkyl group" as used herein is an alkyl, alkenyl, alkynyl, aryl, aralkyl, cycloalkyl, halogenated alkyl, or heterocycloalkyl group described above that has at least one hydrogen atom substituted with a hydroxyl group.

The term "alkoxyalkyl group" is defined as an alkyl, alkenyl, alkynyl, aryl, aralkyl, cycloalkyl, halogenated alkyl, or heterocycloalkyl group described above that has at least one hydrogen atom substituted with an alkoxy group described above.

"Carbonyl," as used herein, is art-recognized and includes such moieties as can be represented by the general formula:

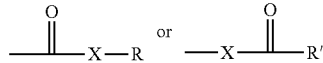

wherein X is a bond, or represents an oxygen or a sulfur, and R represents a hydrogen, a substituted or unsubstituted alkyl, substituted or unsubstituted alkenyl, substituted or unsubstituted alkynyl, substituted or unsubstituted cycloalkyl, substituted or unsubstituted heterocyclyl, substituted or unsubstituted alkylaryl, substituted or unsubstituted arylalkyl, substituted or unsubstituted aryl, or substituted or unsubstituted heteroaryl, —(CH$_2$)$_m$—R", or a pharmaceutical acceptable salt, R' represents a hydrogen, substituted or unsubstituted alkyl, substituted or unsubstituted alkenyl, substituted or unsubstituted alkynyl, substituted or unsubstituted cycloalkyl, substituted or unsubstituted heterocyclyl, substituted or unsubstituted alkylaryl, substituted or unsubstituted arylalkyl, substituted or unsubstituted aryl, or substituted or unsubstituted heteroaryl or —(CH$_2$)$_m$—R"; R" represents a hydroxy group, substituted or unsubstituted carbonyl group, an aryl, a cycloalkyl ring, a cycloalkenyl ring, a heterocycle, or a polycycle; and m is zero or an integer ranging from 1 to 8. Where X is oxygen and R is defines as above, the moiety is also referred to as a carboxyl group. When X is oxygen and R is hydrogen, the formula represents a 'carboxylic acid'. Where X is oxygen and R' is hydrogen, the formula represents a 'formate'. Where X is oxygen and R or R' is not hydrogen, the formula represents an "ester". In general, where the oxygen atom of the above formula is replaced by a sulfur atom, the formula represents a 'thiocarbonyl' group. Where X is sulfur and R or R' is not hydrogen, the formula represents a 'thioester.' Where X is sulfur and R is hydrogen, the formula represents a 'thiocarboxylic acid.' Where X is sulfur and R' is hydrogen, the formula represents a 'thioformate.' Where X is a bond and R is not hydrogen, the above formula represents a 'ketone.' Where X is a bond and R is hydrogen, the above formula represents an 'aldehyde.'

The term "substituted carbonyl" refers to a carbonyl, as defined above, wherein one or more hydrogen atoms in R, R' or a group to which the moiety

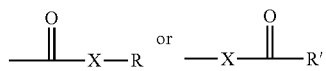

is attached, are independently substituted. Such substituents include, but are not limited to, halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphoryl, phosphate, phosphonate, phosphinate, amino (or quarternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, and combinations thereof.

The term "carboxyl" is as defined above for the formula

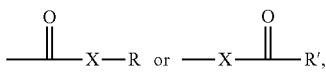

and is defined more specifically by the formula —$R^{iv}$COOH, wherein $R^{iv}$ is an alkyl, alkenyl, alkynyl, cycloalkyl, heterocyclyl, alkylaryl, arylalkyl, aryl, or heteroaryl. In preferred forms, a straight chain or branched chain alkyl, alkenyl, and alkynyl have 30 or fewer carbon atoms in its backbone (e.g., $C_1$-$C_{30}$ for straight chain alkyl, $C_3$-$C_{30}$ for branched chain alkyl, $C_2$-$C_{30}$ for straight chain alkenyl and alkynyl, $C_3$-$C_{30}$ for branched chain alkenyl and alkynyl), preferably 20 or fewer, more preferably 15 or fewer, most preferably 10 or fewer. Likewise, preferred cycloalkyls, heterocyclyls, aryls and heteroaryls have from 3-10 carbon atoms in their ring structure, and more preferably have 5, 6 or 7 carbons in the ring structure.

The term "substituted carboxyl" refers to a carboxyl, as defined above, wherein one or more hydrogen atoms in $R^{iv}$ are substituted. Such substituents include, but are not limited to, halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphoryl, phosphate, phosphonate, phosphinate, amino (or quarternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, and combinations thereof.

The term "phenoxy" is recognized, and refers to a compound of the formula —$OR^v$ wherein $R^v$ is (i.e., —O—$C_6H_5$). One of skill in the art recognizes that a phenoxy is a species of the aroxy genus.

The term "substituted phenoxy" refers to a phenoxy group, as defined above, having one or more substituents replacing one or more hydrogen atoms on one or more carbons of the phenyl ring. Such substituents include, but are not limited to, halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphoryl, phosphate, phosphonate, phosphinate, amino (or quarternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, and combinations thereof.

The terms "aroxy" and "aryloxy," as used interchangeably herein, are represented by —O-aryl or —O-heteroaryl, wherein aryl and heteroaryl are as defined herein.

The terms "substituted aroxy" and "substituted aryloxy," as used interchangeably herein, represent —O-aryl or —O-heteroaryl, having one or more substituents replacing one or more hydrogen atoms on one or more ring atoms of the aryl and heteroaryl, as defined herein. Such substituents include, but are not limited to, halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphoryl, phosphate, phosphonate, phosphinate, amino (or quarternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, and combinations thereof.

The term "alkylthio" refers to an alkyl group, as defined above, having a sulfur radical attached thereto. The "alkylthio" moiety is represented by —S-alkyl. Representative alkylthio groups include methylthio, ethylthio, and the like. The term "alkylthio" also encompasses cycloalkyl groups having a sulfur radical attached thereto.

The term "substituted alkylthio" refers to an alkylthio group having one or more substituents replacing one or more hydrogen atoms on one or more carbon atoms of the alkylthio backbone. Such substituents include, but are not limited to, halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphoryl, phosphate, phosphonate, phosphinate, amino (or quarternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, and combinations thereof.

The term "phenylthio" is art recognized, and refers to —S—$C_6H_5$, i.e., a phenyl group attached to a sulfur atom.

The term "substituted phenylthio" refers to a phenylthio group, as defined above, having one or more substituents replacing a hydrogen on one or more carbons of the phenyl ring. Such substituents include, but are not limited to, halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphoryl, phosphate, phosphonate, phosphinate, amino (or quarternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, and combinations thereof.

"Arylthio" refers to —S-aryl or —S-heteroaryl groups, wherein aryl and heteroaryl as defined herein.

The term "substituted arylthio" represents —S-aryl or —S-heteroaryl, having one or more substituents replacing a hydrogen atom on one or more ring atoms of the aryl and heteroaryl rings as defined herein. Such substituents include, but are not limited to, halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphoryl, phosphate, phosphonate, phosphinate, amino (or quarternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, and combinations thereof.

The terms "amide" or "amido" are used interchangeably, refer to both "unsubstituted amido" and "substituted amido" and are represented by the general formula:

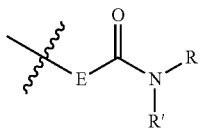

wherein, E is absent, or E is substituted or unsubstituted alkyl, substituted or unsubstituted alkenyl, substituted or unsubstituted alkynyl, substituted or unsubstituted aralkyl, substituted or unsubstituted cycloalkyl, substituted or unsubstituted aryl, substituted or unsubstituted heteroaryl, substituted or unsubstituted heterocyclyl, wherein independently of E, R and R' each independently represent a hydrogen, substituted or unsubstituted alkyl, substituted or unsubstituted alkenyl, substituted or unsubstituted alkynyl, substituted or unsubstituted carbonyl, substituted or unsubstituted cycloalkyl, substituted or unsubstituted heterocyclyl, substituted or unsubstituted alkylaryl, substituted or unsubstituted arylalkyl, substituted or unsubstituted aryl, or substituted or unsubstituted heteroaryl, —(CH$_2$)$_m$—R''', or R and R' taken together with the N atom to which they are attached complete a heterocycle having from 3 to 14 atoms in the ring structure; R''' represents a hydroxy group, substituted or unsubstituted carbonyl group, an aryl, a cycloalkyl ring, a cycloalkenyl ring, a heterocycle, or a polycycle; and m is zero or an integer ranging from 1 to 8. In preferred forms, only one of R and R' can be a carbonyl, e.g., R and R' together with the nitrogen do not form an imide. In preferred forms, R and R' each independently represent a hydrogen atom, substituted or unsubstituted alkyl, a substituted or unsubstituted alkenyl, or —(CH$_2$)$_m$—R'''. When E is oxygen, a carbamate is formed. The carbamate cannot be attached to another chemical species, such as to form an oxygen-oxygen bond, or other unstable bonds, as understood by one of ordinary skill in the art.

The term "sulfonyl" is represented by the formula

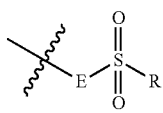

wherein E is absent, or E is alkyl, alkenyl, alkynyl, aralkyl, alkylaryl, cycloalkyl, aryl, heteroaryl, heterocyclyl, wherein independently of E, R represents a hydrogen, substituted or unsubstituted alkyl, substituted or unsubstituted alkenyl, substituted or unsubstituted alkynyl, substituted or unsubstituted amine, substituted or unsubstituted cycloalkyl, substituted or unsubstituted heterocyclyl, substituted or unsubstituted alkylaryl, substituted or unsubstituted arylalkyl, substituted or unsubstituted aryl, or substituted or unsubstituted heteroaryl, —(CH$_2$)$_m$—R''', or E and R taken together with the S atom to which they are attached complete a heterocycle having from 3 to 14 atoms in the ring structure; R''' represents a hydroxy group, substituted or unsubstituted carbonyl group, an aryl, a cycloalkyl ring, a cycloalkenyl ring, a heterocycle, or a polycycle; and m is zero or an integer ranging from 1 to 8. In preferred forms, only one of E and R can be substituted or unsubstituted amine, to form a "sulfonamide" or "sulfonamido." The substituted or unsubstituted amine is as defined above.

The term "substituted sulfonyl" represents a sulfonyl in which E, R, or both, are independently substituted. Such substituents include, but are not limited to, halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphoryl, phosphate, phosphonate, phosphinate, amino (or quarternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, and combinations thereof.

The term "sulfonic acid" refers to a sulfonyl, as defined above, wherein R is hydroxyl, and E is absent, or E is substituted or unsubstituted cycloalkyl, substituted or unsubstituted heterocyclyl, substituted or unsubstituted alkylaryl, substituted or unsubstituted arylalkyl, substituted or unsubstituted aryl, or substituted or unsubstituted heteroaryl.

The term "sulfate" refers to a sulfonyl, as defined above, wherein E is absent, oxygen, alkoxy, aroxy, substituted alkoxy or substituted aroxy, as defined above, and R is independently hydroxyl, alkoxy, aroxy, substituted alkoxy or substituted aroxy, as defined above. When E is oxygen, the sulfate cannot be attached to another chemical species, such as to form an oxygen-oxygen bond, or other unstable bonds, as understood by one of ordinary skill in the art.

The term "sulfonate" refers to a sulfonyl, as defined above, wherein E is oxygen, alkoxy, aroxy, substituted alkoxy or substituted aroxy, as defined above, and R is independently hydrogen, substituted or unsubstituted alkyl, substituted or unsubstituted alkenyl, substituted or unsubstituted alkynyl, substituted or unsubstituted amine, substituted or unsubstituted cycloalkyl, substituted or unsubstituted heterocyclyl, substituted or unsubstituted alkylaryl, substituted or unsubstituted arylalkyl, substituted or unsubstituted aryl, or substituted or unsubstituted heteroaryl, —(CH$_2$)$_m$—R''', R''' represents a hydroxy group, substituted or unsubstituted carbonyl group, an aryl, a cycloalkyl ring, a cycloalkenyl ring, a heterocycle, or a polycycle; and m is zero or an integer ranging from 1 to 8. When E is oxygen, sulfonate cannot be attached to another chemical species, such as to form an oxygen-oxygen bond, or other unstable bonds, as understood by one of ordinary skill in the art.

The term "sulfamoyl" refers to a sulfonamide or sulfonamide represented by the formula

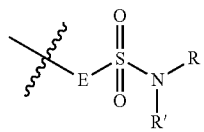

wherein E is absent, or E is substituted or unsubstituted alkyl, substituted or unsubstituted alkenyl, substituted or unsubstituted alkynyl, substituted or unsubstituted aralkyl, substituted or unsubstituted alkylaryl, substituted or unsubstituted cycloalkyl, substituted or unsubstituted aryl, substituted or unsubstituted heteroaryl, substituted or unsubstituted heterocyclyl, wherein independently of E, R and R' each independently represent a hydrogen, substituted or unsubstituted alkyl, substituted or unsubstituted alkenyl, substituted or unsubstituted alkynyl, substituted or unsubstituted carbonyl, substituted or unsubstituted cycloalkyl, substituted or unsubstituted heterocyclyl, substituted or unsubstituted alkylaryl, substituted or unsubstituted arylalkyl, substituted or unsubstituted aryl, or substituted or unsubstituted heteroaryl, —$(CH_2)_m$—R''', or R and R' taken together with the N atom to which they are attached complete a heterocycle having from 3 to 14 atoms in the ring structure; R''' represents a hydroxy group, substituted or unsubstituted carbonyl group, an aryl, a cycloalkyl ring, a cycloalkenyl ring, a heterocycle, or a polycycle; and m is zero or an integer ranging from 1 to 8. In preferred forms, only one of R and R' can be a carbonyl, e.g., R and R' together with the nitrogen do not form an imide.

The term "phosphonyl" is represented by the formula

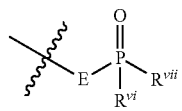

wherein E is absent, or E is substituted or unsubstituted alkyl, substituted or unsubstituted alkenyl, substituted or unsubstituted alkynyl, substituted or unsubstituted aralkyl, substituted or unsubstituted alkylaryl, substituted or unsubstituted cycloalkyl, substituted or unsubstituted aryl, substituted or unsubstituted heteroaryl, substituted or unsubstituted heterocyclyl, wherein, independently of E, $R^{vi}$ and $R^{vii}$ are independently hydrogen, substituted or unsubstituted alkyl, substituted or unsubstituted alkenyl, substituted or unsubstituted alkynyl, substituted or unsubstituted carbonyl, substituted or unsubstituted cycloalkyl, substituted or unsubstituted heterocyclyl, substituted or unsubstituted alkylaryl, substituted or unsubstituted arylalkyl, substituted or unsubstituted aryl, or substituted or unsubstituted heteroaryl, —$(CH_2)_m$—R''', or R and R' taken together with the P atom to which they are attached complete a heterocycle having from 3 to 14 atoms in the ring structure; R''' represents a hydroxy group, substituted or unsubstituted carbonyl group, an aryl, a cycloalkyl ring, a cycloalkenyl ring, a heterocycle, or a polycycle; and m is zero or an integer ranging from 1 to 8.

The term "substituted phosphonyl" represents a phosphonyl in which E, $R^{vi}$ and $R^{vii}$ are independently substituted. Such substituents include, but are not limited to, halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphoryl, phosphate, phosphonate, phosphinate, amino (or quarternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, and combinations thereof.

The term "phosphoryl" defines a phosphonyl in which E is absent, oxygen, alkoxy, aroxy, substituted alkoxy or substituted aroxy, as defined above, and independently of E, $R^{vi}$ and $R^{vii}$ are independently hydroxyl, alkoxy, aroxy, substituted alkoxy or substituted aroxy, as defined above. When E is oxygen, the phosphoryl cannot be attached to another chemical species, such as to form an oxygen-oxygen bond, or other unstable bonds, as understood by one of ordinary skill in the art. When E, $R^{vi}$ and $R^{vii}$ are substituted, the substituents include, but are not limited to, halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphoryl, phosphate, phosphonate, phosphinate, amino (or quarternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, and combinations thereof.

The term "polyaryl" refers to a chemical moiety that includes two or more aryls, heteroaryls, and combinations thereof. The aryls, heteroaryls, and combinations thereof, are fused, or linked via a single bond, ether, ester, carbonyl, amide, sulfonyl, sulfonamide, alkyl, azo, and combinations thereof. When two or more heteroaryls are involved, the chemical moiety can be referred to as a "polyheteroaryl."

The term "substituted polyaryl" refers to a polyaryl in which one or more of the aryls, heteroaryls are substituted, with one or more substituents including, but not limited to, halogen, azide, alkyl, aralkyl, alkenyl, alkynyl, cycloalkyl, hydroxyl, carbonyl (such as a carboxyl, alkoxycarbonyl, formyl, or an acyl), silyl, ether, ester, thiocarbonyl (such as a thioester, a thioacetate, or a thioformate), alkoxyl, phosphoryl, phosphate, phosphonate, phosphinate, amino (or quarternized amino), amido, amidine, imine, cyano, nitro, azido, sulfhydryl, alkylthio, sulfate, sulfonate, sulfamoyl, sulfonamido, sulfonyl, heterocyclyl, alkylaryl, haloalkyl, —CN, aryl, heteroaryl, and combinations thereof. When two or more heteroaryls are involved, the chemical moiety can be referred to as a "substituted polyheteroaryl."

The term "cyclic" refers to a substituted or unsubstituted cycloalkyl, substituted or unsubstituted cycloalkenyl, substituted or unsubstituted cycloalkynyl, substituted or unsubstituted heterocyclyl that, preferably, have from 3 to 20 carbon atoms, as geometric constraints permit. The cyclic structures are formed from single or fused ring systems. The substituted cycloalkyls, cycloalkenyls, cycloalkynyls and heterocyclyls are substituted as defined above for the alkyls, alkenyls, alkynyls and heterocyclyls, respectively.

"Derivative" as relates to a given compound or moiety, refers to another compound or moiety that is structurally similar, functionally similar, or both, to the specified compound or moiety. Structural similarity can be determined using any criterion known in the art, such as the Tanimoto coefficient that provides a quantitative measure of similarity between two compounds based on their molecular descriptors. Preferably, the molecular descriptors are 2D properties such as fingerprints, topological indices, and maximum common substructures, or 3D properties such as overall shape, and molecular fields. Tanimoto coefficients range between zero and one, inclusive, for dissimilar and identical pairs of molecules, respectively. A compound can be considered a derivative of a specified compound, if it has a Tanimoto coefficient with the specified compound between 0.5 and 1.0, inclusive, preferably between 0.7 and 1.0, inclusive, most preferably between 0.85 and 1.0, inclusive. A compound is functionally similar to a specified, if it induces the same effect as the specified compound. "Derivative" can also refer to a modification including, but not limited to, hydrolysis, reduction, or oxidation products, of the compound or moiety. Hydrolysis, reduction, and oxidation reactions are known in the art.

II. Compositions

Described herein are transition metal complexes containing a central metal atom traditionally known to have weak d-d splitting energies. To the best of our knowledge, this work demonstrates for the first time the utilization of luminescent nickel(II) complexes for the fabrication of OLEDs. Typically square planar $d^8$ metal complexes for OLED applications can be synthesized by the incorporation of the tridentate or tetradentate ligands into the $d^8$ metal center. Preferably, the ligand is a cyclometalating ligand, i.e., capable of forming a metal-carbon σ-bond.

It is generally believed that the presence of thermally accessible and low-lying d-d ligand-field excited states in these complexes quench the luminescence of the excited state via thermal equilibration or energy transfer. However, the introduction of an ancillary ligand with σ-donating properties effectively enhances the luminescence of these complexes. The coupling of a σ-donating ligand renders the metal center more electron-rich, with the additional advantage of further raising the energy of the d-d states, which would result in enhanced luminescence by increasing the chances of populating the emissive state. Unlike most of the other square planar nickel(II) complexes that are non-emissive at both low and ambient temperatures, or exhibit luminescence only at low temperatures, the complexes described herein, preferably, are photo-stable, and are emissive at room temperatures, low temperatures, or a combination thereof, in various media, such as solid, liquid, or solution state. As such, the transition metal complexes represent compounds that are useful as light-emitting materials for OLEDs.

A variety of ligand structures and methods of using and making the same are contemplated by the present invention. In certain embodiments, the ligands form coordination complexes with various metal ions, in particular nickel(II).

A. Compounds

Disclosed are Luminescent Organometallic Complexes or Compounds. In Some forms, the luminescent compound has the formula:

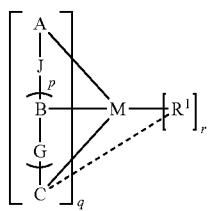

Formula I wherein:
the compound has an overall negative, neutral, or positive charge;
M is a first-row transition metal atom (such as scandium, titanium, vanadium, chromium, manganese, iron, cobalt, nickel, copper, and zinc), preferably M is nickel, copper, iron, or cobalt, most preferably M is nickel;
M has an oxidation state between 0 and +7 inclusive, preferably 0, +1, +2, or +3;
A, B, and C are each independently unsubstituted heteroaryl, substituted heteroaryl, unsubstituted aryl, substituted aryl, unsubstituted polyaryl, substituted polyaryl, unsubstituted polyheteroaryl, substituted polyheteroaryl, substituted $C_3$-$C_{20}$ cycloalkyl, unsubstituted $C_3$-$C_{20}$ cycloalkyl, substituted $C_3$-$C_{20}$ heterocyclyl, unsubstituted $C_3$-$C_{20}$ heterocyclyl, substituted $C_3$-$C_{20}$ cycloalkenyl, unsubstituted $C_3$-$C_{20}$ cycloalkenyl, substituted $C_3$-$C_{20}$ cycloalkynyl, or unsubstituted $C_3$-$C_{20}$ cycloalkynyl, preferably at least one of A, B, and C is a substituted aryl or unsubstituted aryl, and another of A, B, and C is a substituted heteroaryl or unsubstituted heteroaryl, preferably, a bond between at least one of A, B, and C and M is metal-carbon σ-bond; wherein the dashed line indicates that $R^1$ is optionally linked or unlinked to C, preferably $R^1$ is not linked to C;
q is 1 or 2, preferably 1;
p is 1 (tridentate ligand), 2 (tetradentate ligand), or 3 (pentadentate ligand), preferably 1 or 2;
G and J are each independently a bond (single, double, triple bond), absent, oxygen, sulfur, unsubstituted amino, substituted amino, unsubstituted alkylene, substituted alkylene, unsubstituted alkyl, substituted alkyl, substituted carbonyl, unsubstituted carbonyl, substituted carboxyl, unsubstituted carboxyl, substituted amido, unsubstituted amido, substituted sulfonyl, unsubstituted sulfonyl, substituted sulfonic acid, unsubstituted sulfonic acid, substituted phosphoryl, unsubstituted phosphoryl, substituted phosphonyl, or unsubstituted phosphonyl; preferably G and J are each a single bond;
$R^1$ is carbon or heteroatom donor ligand, halide, or pseudohalide, which could be either mono-anionic or neutral, such as unsubstituted heteroaryl (carbazole), substituted heteroaryl, unsubstituted polyaryl, substituted polyaryl, unsubstituted polyheteroaryl, substituted polyheteroaryl, substituted aryl (4-tert-butylphenyl), unsubstituted aryl (phenyl), substituted $C_3$-$C_{20}$ heterocyclyl (substituted $C_3$ heterocyclyl such as 1,3-dimethyl-2,3-dihydro-1H-imidazol-2-yl), unsubstituted $C_3$-$C_{20}$ heterocyclyl (2,3-dihydro-1H-imidazol-2-yl), substituted N-alkylidynearylaminium (2,6-dimethyl-N-methylidynebenezaminium), unsubstituted N-alkylidynearylaminium (2,6-dimethyl-N-ethylidynebenezaminium), unsubstituted arylalkynyl (phenylethynyl), substituted arylalkynyl (4-tert-butyl phenylethynyl), unsubstituted alkyl, substituted alkyl, unsubstituted alkynyl, substituted alkynyl, unsubstituted alkenyl (ethenyl), substituted alkenyl (3,3-dimethylbutenyl, 2-phenylethenyl), unsubstituted arylalkenyl (2-phenylethenyl), substituted arylalkenyl (2-(3,5-di-tert-butylphenyl)ethenyl), unsubstituted heteroaryl (pyridin-4yl), substituted heteroaryl (2,6-dimethylpyridin-4yl), halogen (chlorine, fluorine, bromine, iodine), cyano, substituted cyano, cyanate, isocyanate, thioisocyanate, thiocyanate, substituted amino (N,N-diarylamine such as N,N-diphenylamine), unsubstituted amino, phosphide, substituted phosphino (diarylphosphino such as diphenylphosphino), unsubstituted phosphino, hydroxy, unsubstituted alkoxy, substituted alkoxy, unsubstituted amide, substituted amide, unsubstituted aroxy (phenoxy), substituted aroxy, unsubstituted arylthio (phenylthio), substituted arylthio, unsubstituted arylselenyl (phenylselenyl), substituted arylselenyl, unsubstituted arylsilyl (triarylsilyl such as triphenylsilyl), substituted arylsilyl, unsubstituted arylboranyl (diarylboranyl such as diphenylboranyl), substituted arylboranyl, unsubstituted alkylboranyl, substituted alkylboranyl, unsubstituted boranyl, substituted boranyl, sulfonate (trifluoromethanesulfonate), or N-heterocylic carbene;
r is 0, 1, or 2, preferably r is 1; and optionally wherein substituted means substituted with one or more substituents selected from unsubstituted alkyl, alkyl having one or more alkyl substituents (t-butyl), alkyl having one or more halogen substituents (trifluoromethyl), halogen (chlorine, fluorine, bromine, iodine), unsubstituted aryl (phenyl), aryl having one or more alkyl substituents (2,6-dimethylphenyl, 4-tert-butylphenyl, 3,5-di-tert-butylphenyl), substituted aryl, unsubstituted heteroaryl, substituted heteroaryl, substituted $C_3$-$C_{20}$ cycloalkyl, unsubstituted $C_3$-$C_{20}$ cycloalkyl, substituted $C_3$-$C_{20}$ heterocyclyl, unsubstituted $C_3$-$C_{20}$ heterocyclyl, substituted $C_3$-$C_{20}$ cycloalkenyl, unsubstituted $C_3$-$C_{20}$ cycloalkenyl, substituted $C_3$-$C_{20}$ cycloalkynyl, or unsubstituted $C_3$-$C_{20}$ cycloalkynyl, OR, $NR_2$, SR, C(O)R, C(O)OR, C(O)$NR_2$, CN, $CF_3$, $NO_2$, $SO_2$, SOR, and $SO_3R$, wherein R is independently unsubstituted alkyl, unsubstituted alkenyl, unsubstituted alkynyl, unsubstituted alkylaryl, unsubstituted aryl, unsubstituted $C_3$-$C_{20}$ cycloalkyl, unsubstituted $C_3$-$C_{20}$ heterocyclyl, unsubstituted $C_3$-$C_{20}$ cycloalkenyl, or unsubstituted $C_3$-$C_{20}$ cycloalkynyl.

As shown in Formula I, when $R^1$ is linked to C, the linkage can be a bond (single, double, triple bond), absent, oxygen, sulfur, unsubstituted amino, substituted amino, unsubstituted alkylene, substituted alkylene, unsubstituted alkyl, substituted alkyl, substituted carbonyl, unsubstituted carbonyl, substituted carboxyl, unsubstituted carboxyl, substituted amido, unsubstituted amido, substituted sulfonyl, unsubstituted sulfonyl, substituted sulfonic acid, unsubstituted sulfonic acid, substituted phosphoryl, unsubstituted phosphoryl, substituted phosphonyl, or unsubstituted phosphonyl. Preferably, the linkage between $R^1$ and C is a single bond.

In some forms, the compound has the structure:

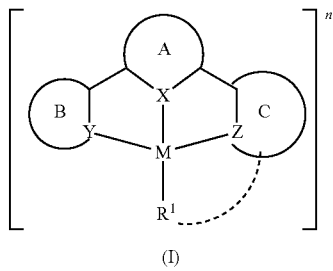

Formula II (I)

wherein:
M is a first-row transition metal (such as scandium, titanium, vanadium, chromium, manganese, iron, cobalt, nickel, copper, and zinc), preferably M is nickel or copper;
X, Y, and Z are independently nitrogen or carbon;
A, B, and C are cyclic structure derivatives of phenyl groups, unsubstituted heteroaryl groups, substituted heteroaryl groups, unsubstituted heterocyclic groups, or substituted heterocyclic groups, wherein the dashed line indicates that $R^1$ is optionally linked or unlinked to C, preferably $R^1$ is not linked to C; preferably, rings A, B, and C are independently benzene, phenyl derivatives, unsubstituted heteroaryl, substituted heteroaryl, heteroaryl derivatives, unsubstituted, heterocycle, substituted heterocycle, or heterocyclic derivatives (each optionally independently with one or more unsubstituted alkyl, unsubstituted alkenyl, unsubstituted alkynyl, unsubstituted aryl, unsubstituted cycloalkyl, OR, $NR_2$, SR, C(O)R, C(O)OR, C(O)$NR_2$, CN, $CF_3$, $NO_2$, $SO_2$, SOR, $SO_3R$, halo, unsubstituted aryl, substituted aryl, unsubstituted heteroaryl, substituted heteroaryl, or unsubstituted heterocyclic groups, wherein R is independently unsubstituted alkyl, unsubstituted alkenyl, unsubstituted alkynyl, unsubstituted alkyaryl, unsubstituted aryl, or unsubstituted cycloalkyl);

$R^1$ is any carbon or heteroatom donor ligand, halide or pseudohalide, which could be either anionic or neutral. Preferably, $R^1$ is selected from, but not limited to, unsubstituted alkyl, substituted alkyl, unsubstituted aryl, substituted aryl, unsubstituted heteroaryl, substituted heteroaryl, unsubstituted polyaryl, substituted polyaryl, alkynyl, substituted alkynyl, alkoxy, amide, thiolate, phosphide, chloride, bromide, iodide, cyanate, thiocyanate, cyanide, isocyanide or N-heterocyclic carbene; and n is zero, a positive integer or a negative integer.

Preferably, the transition metal atom (M) is nickel, cobalt, copper, or iron. More preferably, M is nickel(II), cobalt(I), copper(III), or iron(II). Most preferably, M is nickel(II).

In some forms, M has a $d^6$, $d^7$, or $d^8$ electron configuration, most preferably $d^8$.

In some forms, the M has an oxidation state of +2. In some forms, M has an oxidation state of zero (0). In some forms, M has an oxidation state of +1. In some forms, M has an oxidation state of +3.

In some forms, A, B, and C are independently unsubstituted heteroaryl, substituted heteroaryl, unsubstituted aryl, or substituted aryl.

In some forms, at least one of A, B, and C is six-membered unsubstituted heteroaryl, six-membered substituted heteroaryl, six-membered unsubstituted aryl, or six-membered substituted aryl. In some forms, A, B, and C are independently six-membered unsubstituted heteroaryl, six-membered substituted heteroaryl, six-membered unsubstituted aryl, or six-membered substituted aryl.

In some forms, A, B, and C are each independently unsubstituted heteroaryl, substituted heteroaryl, unsubstituted aryl, substituted aryl, unsubstituted polyheteroaryl, substituted polyaryl, unsubstituted polyheteroaryl, substituted polyheteroaryl, substituted cycloalkyl, unsubstituted cycloalkyl, substituted heterocyclyl, unsubstituted heterocyclyl, substituted cycloalkenyl, unsubstituted cycloalkenyl, substituted cycloalkynyl, or unsubstituted cycloalkynyl, wherein, preferably, a bond between at least one of A, B, and C and M is metal-carbon σ-bond.

In some forms, $R^1$ is unsubstituted heteroaryl (carbazole), substituted heteroaryl, unsubstituted polyaryl, substituted polyaryl, unsubstituted polyheteroaryl, substituted polyheteroaryl, substituted aryl (4-tert-butylphenyl), unsubstituted aryl (phenyl), substituted $C_3$-$C_{20}$ heterocyclyl (substituted $C_3$ heterocyclyl such as 1,3-dimethyl-2,3-dihydro-1H-imidazol-2-yl), unsubstituted $C_3$-$C_{20}$ heterocyclyl (dihydro-1H-imidazol-2-yl), substituted N-alkylidynearylaminium (2,6-dimethyl-N-methylidynebenezaminium), unsubstituted N-alkylidynearylaminium (2,6-dimethyl-N-ethylidyne-benezaminium), unsubstituted arylalkynyl (phenylethynyl), substituted arylalkynyl (4-tert-butyl phenylethynyl), unsubstituted alkenyl (ethenyl), substituted alkenyl (3,3-dimethylbutenyl, 2-phenylethenyl), unsubstituted arylalkenyl (2-phenylethenyl), substituted arylalkenyl (2-(3,5-di-tert-butylphenyl)ethenyl), unsubstituted heteroaryl (pyridin-4yl), substituted heteroaryl (2,6-dimethylpyridin-4yl), halogen (chlorine, fluorine, bromine, iodine), cyano, substituted cyano, cyanate, isocyanate, thioisocyanate, thiocyanate, substituted amino (N,N-diarylamine such as N,N-diphenylamine), unsubstituted amino, phosphide, substituted phosphino (diarylphosphino such as diphenylphosphino), unsubstituted phosphino, hydroxy, unsubstituted aroxy (phenoxy), substituted aroxy, unsubstituted arylthio (phenylthio), substituted arylthio, unsubstituted arylselenyl (phenylselenyl), substituted arylselenyl, unsubstituted arylsilyl (triarylsilyl such as triphenylsilyl), substituted arylsilyl, unsubstituted arylboraneyl (diarylboraneyl such as diphenylboraneyl), substituted arylboraneyl, sulfonate (trifluoromethanesulfonate), or N-heterocylic carbene.

In some forms, $R^1$ is unsubstituted heteroaryl (carbazole), substituted heteroaryl), substituted heteroaryl, unsubstituted polyaryl, substituted polyaryl, substituted polyheteroaryl, substituted polyheteroaryl, substituted aryl (4-tert-butylphenyl), unsubstituted aryl (phenyl), substituted $C_3$-$C_{20}$ heterocyclyl (substituted $C_3$ heterocyclyl such as 1,3-dimethyl-2,3-dihydro-1H-imidazol-2-yl), substituted N-alkylidynearylaminium (2,6-dimethyl-N-methylidynebenezaminium), unsubstituted arylalkynyl (phenylethynyl), substituted arylalkynyl (4-tert-butyl phenylethynyl), unsubstituted alkenyl (ethenyl), substituted alkenyl (3,3-dimethylbutenyl, 2-phenylethenyl), unsubstituted arylalkenyl (2-phenylethenyl), substituted arylalkenyl (2-(3,5-di-tert-butylphenyl)ethenyl), unsubstituted heteroaryl (pyridin-4yl), substituted heteroaryl (2,6-dimethylpyridin-4yl), halogen (chlorine, fluorine, bromine, iodine), cyano, substituted cyano, cyanate, isocyanate, thioisocyanate, thiocyanate, substituted amino (N,N-diarylamine such as N,N-diphenylamine), phosphide, substituted phosphino (diarylphosphino such as diphenylphosphino), hydroxy, unsubstituted aroxy (phenoxy), unsubstituted arylthio (phenylthio), unsubstituted arylselenyl (phenylselenyl), unsubstituted arylsilyl (triarylsilyl such as triphenylsilyl), unsubstituted arylboraneyl (diarylboraneyl such as diphenylboraneyl), or sulfonate (trifluoromethanesulfonate).

In some forms, $R^1$ is unsubstituted heteroaryl (carbazole), substituted heteroaryl, unsubstituted polyaryl, substituted polyaryl, unsubstituted polyheteroaryl, substituted polyheteroaryl, or halogen.

As shown in Formula II, when $R^1$ is linked to C, the linkage can be a bond (single, double, triple bond), absent, oxygen, sulfur, unsubstituted amino, substituted amino, unsubstituted alkylene, substituted alkylene, unsubstituted alkyl, substituted alkyl, substituted carbonyl, unsubstituted carbonyl, substituted carboxyl, unsubstituted carboxyl, substituted amido, unsubstituted amido, substituted sulfonyl, unsubstituted sulfonyl, substituted sulfonic acid, unsubstituted sulfonic acid, substituted phosphoryl, unsubstituted phosphoryl, substituted phosphonyl, or unsubstituted phosphonyl. Preferably, the linkage between $R^1$ and C is a single bond.

In some forms, the compounds display photoluminescence or electroluminescence. In some forms, the compound emits light at room temperature, low temperature, or both. The compound can be in a solid, liquid, glassy, or solution state.

In some forms, photoluminescence properties of the compound can be in a spectral range between 380 nm and 1,050 nm, inclusive.

In some forms, the compound emits light in response to (i) the passage of an electric current or (ii) to an electric field. In some forms, the compound emits light independent of its concentration.

In some forms of the compounds described above encompassed by Formula I or Formula II, C is not linked to $R^1$.

Generally, A, B, and C of Formula I or Formula II of the cyclometalating ligand can be independently unsubstituted heteroaryl, substituted heteroaryl, unsubstituted aryl, substituted aryl, unsubstituted polyaryl, substituted polyaryl, unsubstituted polyheteroaryl, substituted polyheteroaryl, unsubstituted $C_3$-$C_{20}$ cycloalkyl, substituted $C_3$-$C_{20}$ cycloalkyl, unsubstituted $C_3$-$C_{20}$ heterocyclyl, substituted $C_3$-$C_{20}$ heterocyclyl, unsubstituted $C_3$-$C_{20}$ cycloalkenyl, substituted $C_3$-$C_{20}$ cycloalkenyl, unsubstituted $C_3$-$C_{20}$ cycloalkynyl, or substituted $C_3$-$C_{20}$ cycloalkynyl, our preferred substituent groups should be all included. The introduction of an electron-withdrawing group on the pyridine moiety would result in a red shift of the emission band. Conversely, the introduction of an electron-withdrawing group on the phenyl moiety of the cyclometalating ligand would cause a blue shift of the emission band. Similar phenomenon could be observed by using electron-accepting ancillary ligands to modify the excited state properties of the complexes. Such color tuning strategy could also be reflected by complexes 1-269, shown below.

In some forms, the compound has a structure:

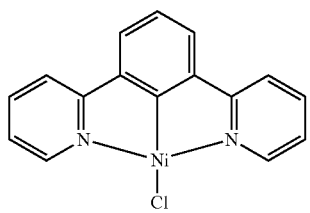
(compound 1)

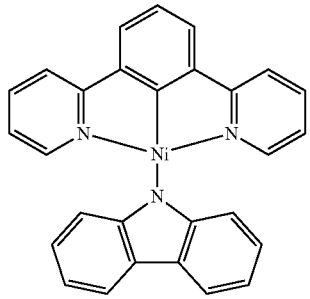
(compound 2)

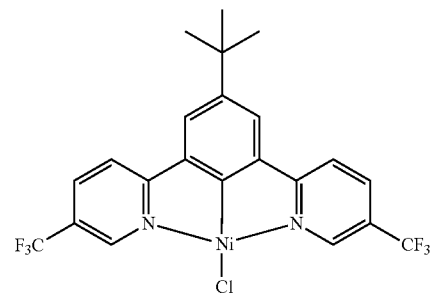
(compound 3)

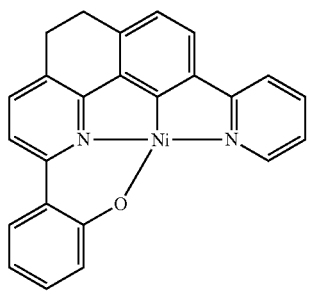
(compound 4)

(compound 5)
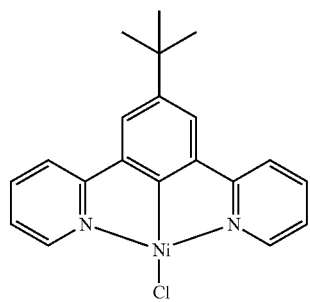
(compound 6)
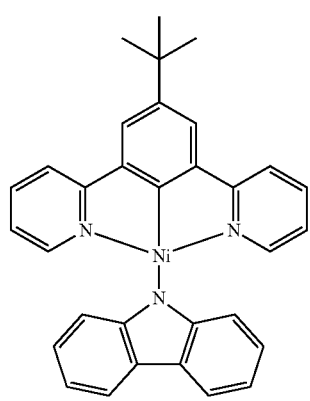
(compound 7)
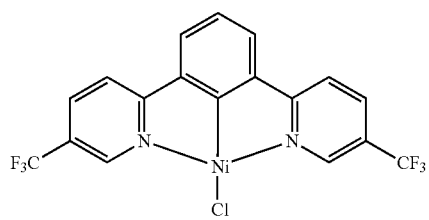
(compound 8)
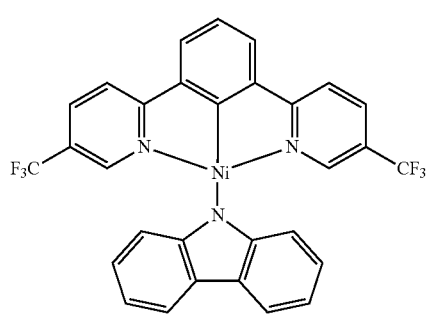
(compound 9)
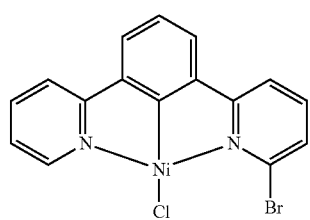
(compound 10)
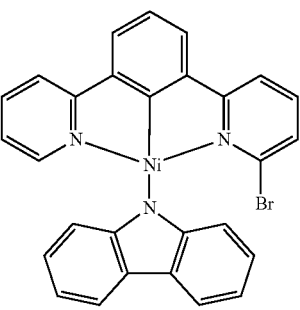
(compound 11)
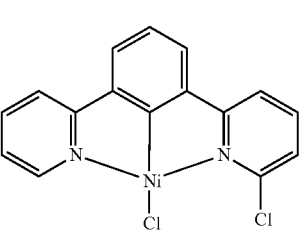
(compound 12)
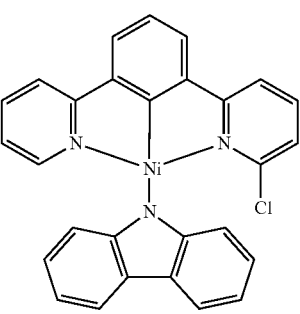
(compound 13)
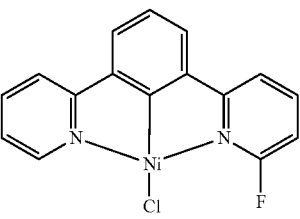
(compound 14)
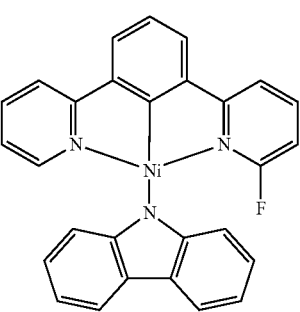

-continued
(compound 15)
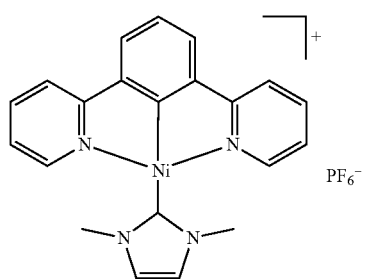
PF$_6^-$
(compound 16)
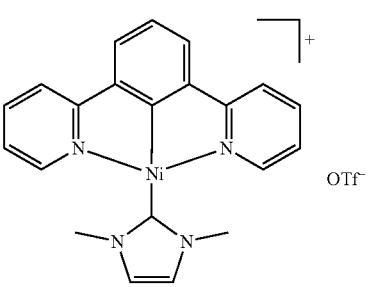
OTf$^-$
(compound 17)
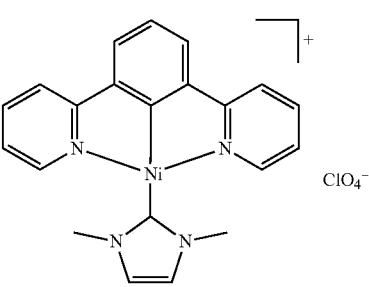
ClO$_4^-$
(compound 18)
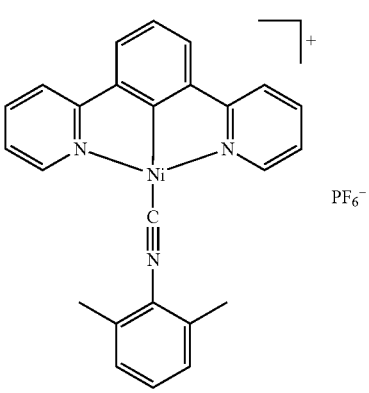
PF$_6^-$
(compound 19)
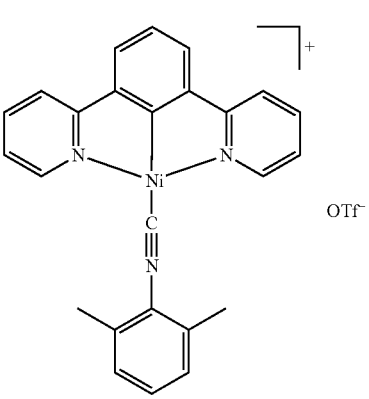
OTf$^-$
-continued
(compound 20)
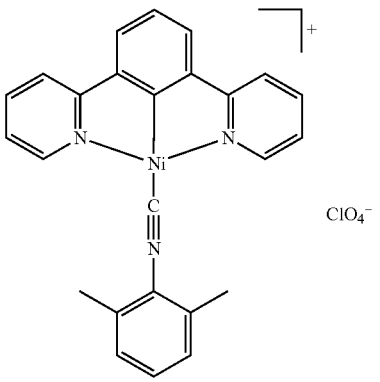
ClO$_4^-$
(compound 21)
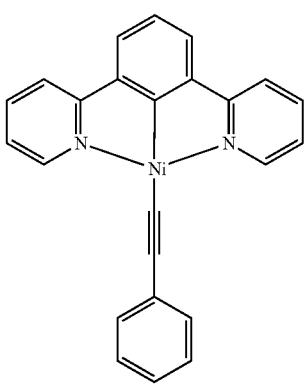
(compound 22)
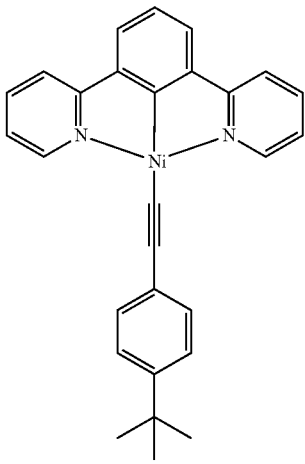
(compound 23)
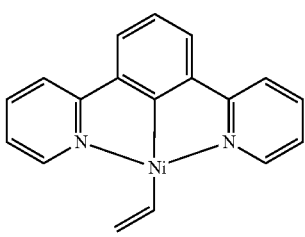

-continued
(compound 24)
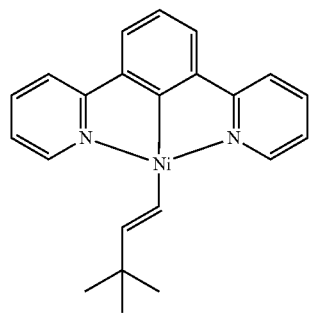
(compound 25)
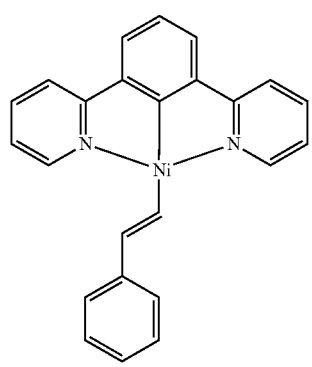
(compound 26)
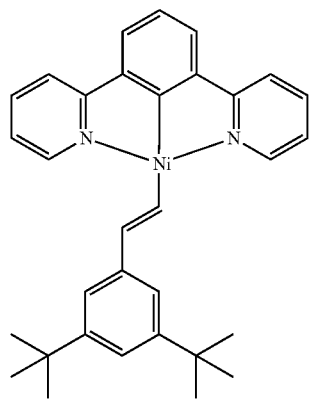
(compound 27)
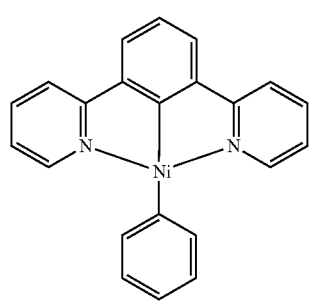
(compound 28)
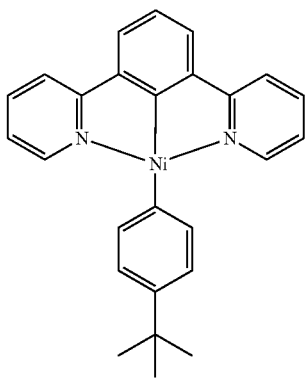
(compound 29)
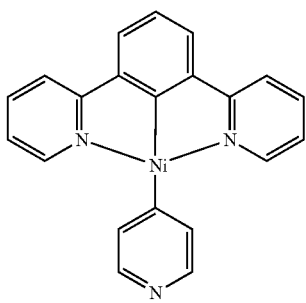
(compound 30)
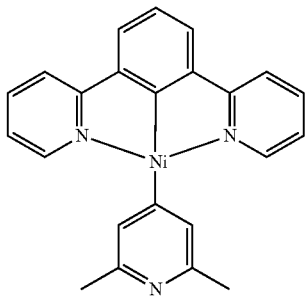
(compound 31)
(compound 32)
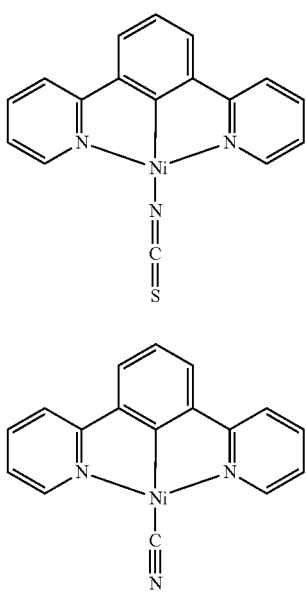

(compound 33)
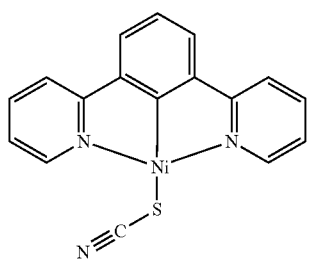
(compound 34)
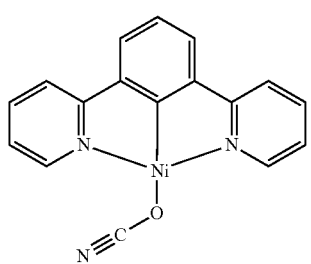
(compound 35)
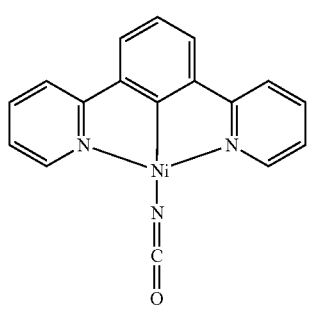
(compound 36)
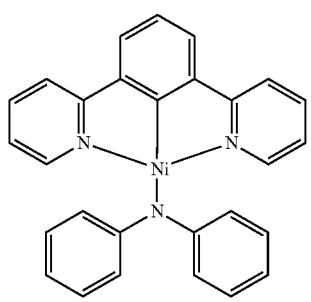
(compound 37)
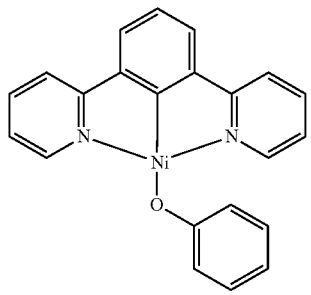
(compound 38)
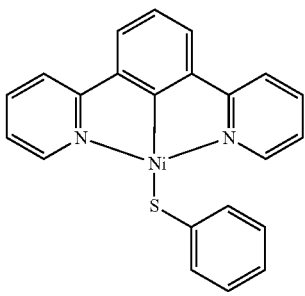
(compound 39)
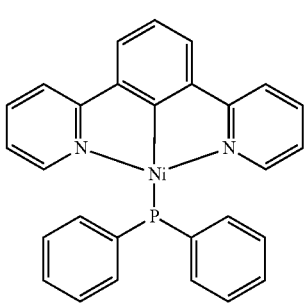
(compound 40)
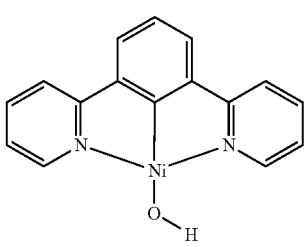
(compound 41)
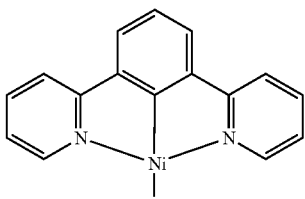
(compound 42)
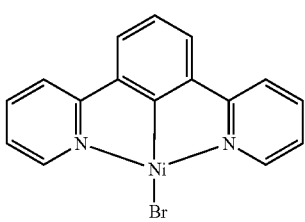
(compound 43)
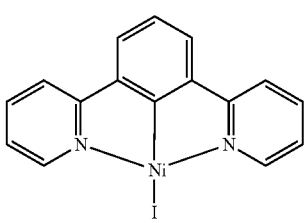

(compound 44)
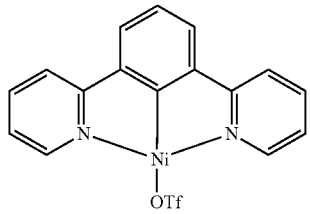
(compound 45)
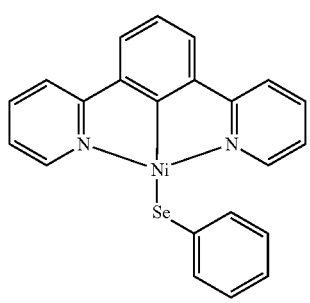
(compound 46)
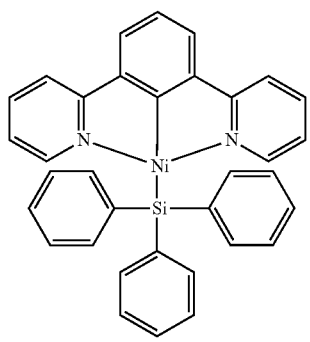
(compound 47)
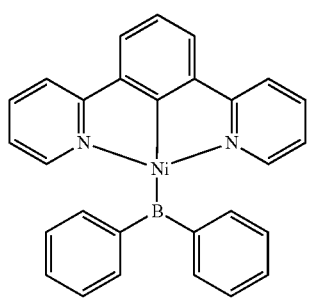
(compound 48)
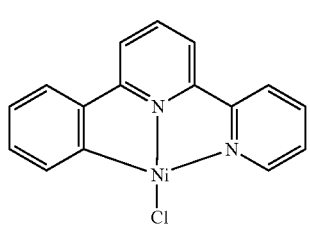
(compound 49)
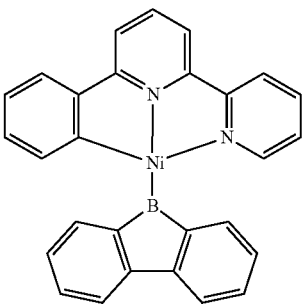
(compound 50)
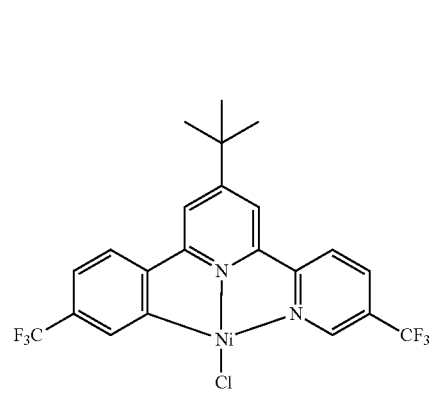
(compound 51)
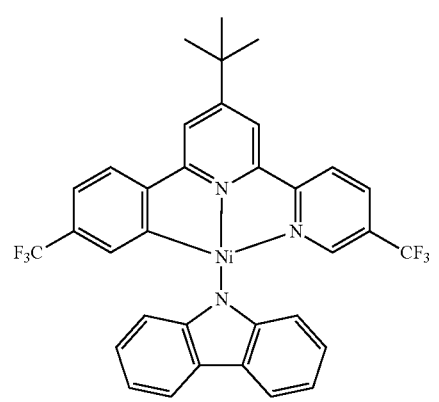
(compound 52)
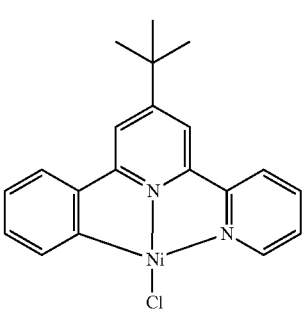

-continued
(compound 53)
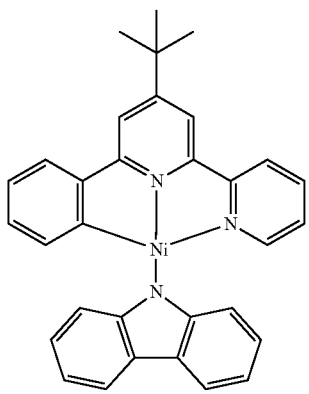
(compound 54)
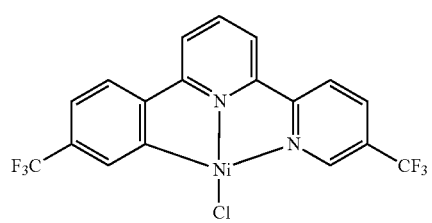
(compound 55)
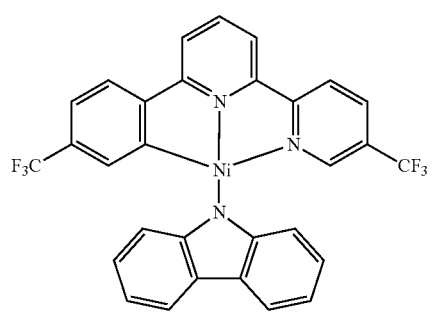
(compound 56)
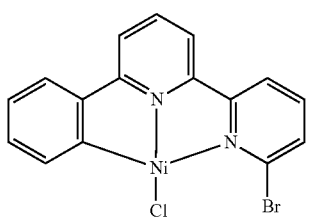
(compound 57)
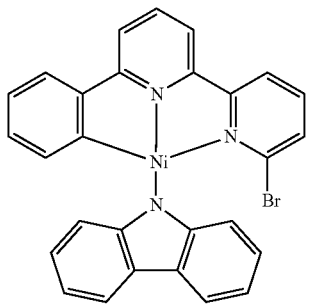
-continued
(compound 58)
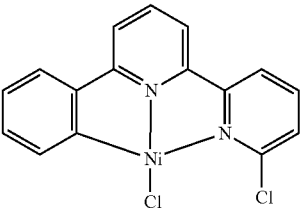
(compound 59)
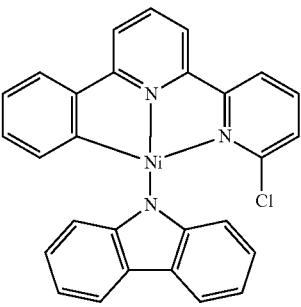
(compound 60)
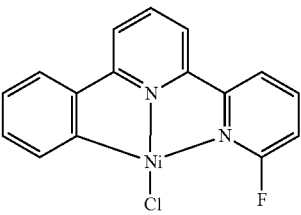
(compound 61)
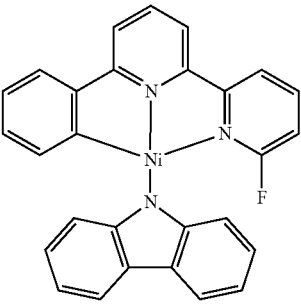
(compound 62)
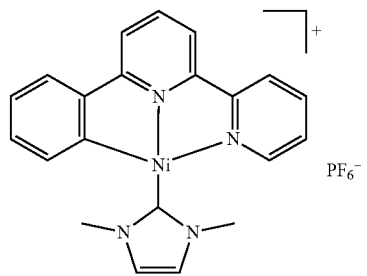
(compound 63)
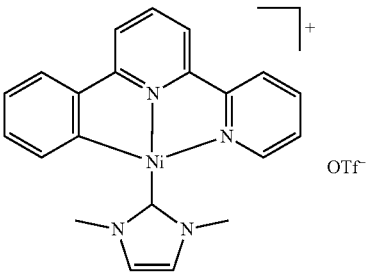

(compound 64) 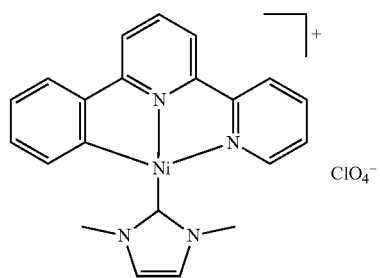 ClO₄⁻
(compound 65) 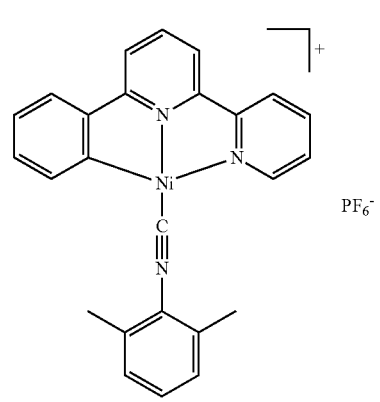 PF₆⁻
(compound 66) 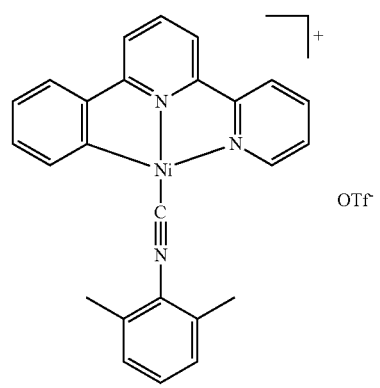 OTf⁻
(compound 67) 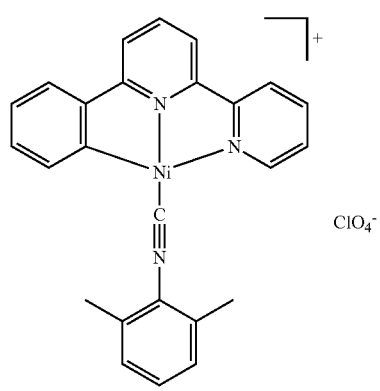 ClO₄⁻
(compound 68) 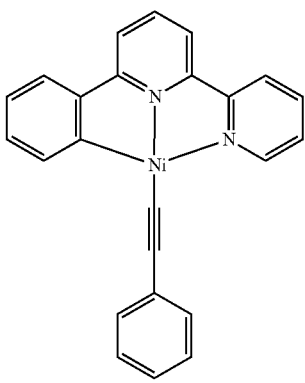
(compound 69) 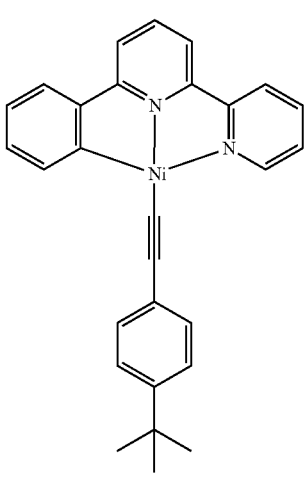
(compound 70) 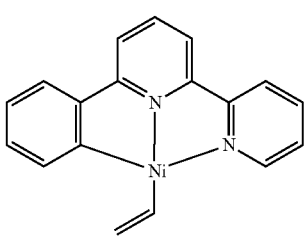
(compound 71) 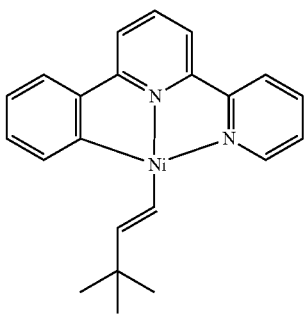

(compound 72)
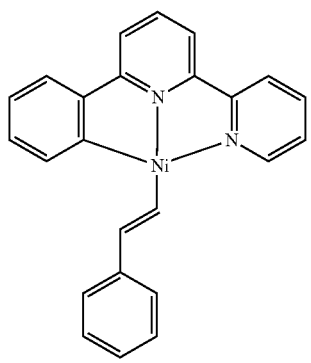
(compound 76)
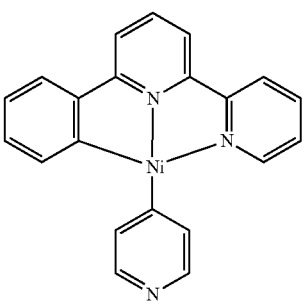
(compound 73)
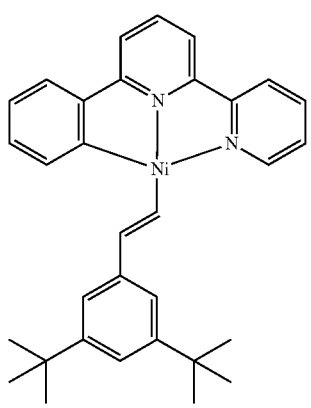
(compound 77)
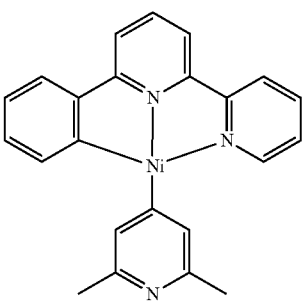
(compound 74)
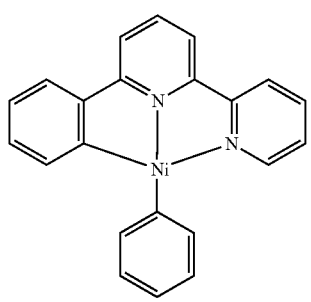
(compound 78)
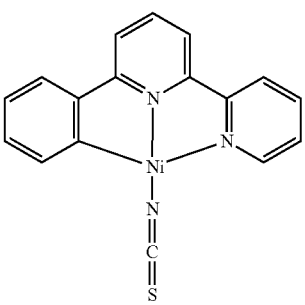
(compound 75)
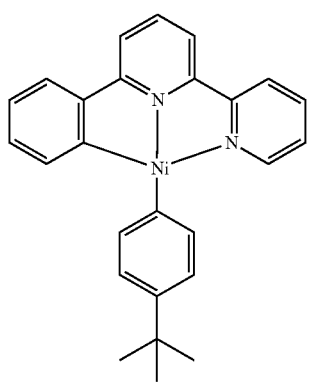
(compound 79)
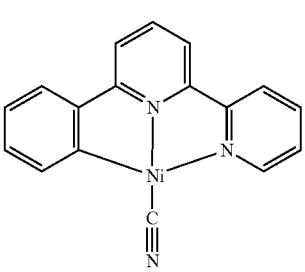
(compound 80)
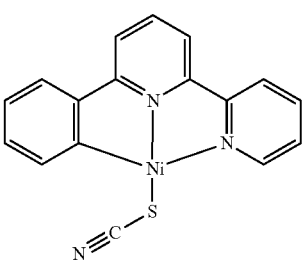

(compound 81)
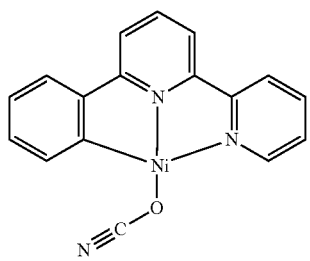
(compound 82)
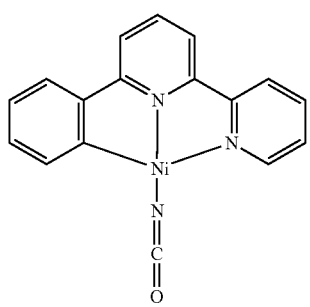
(compound 83)
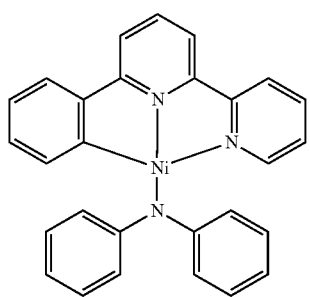
(compound 84)
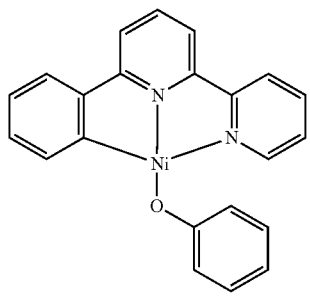
(compound 85)
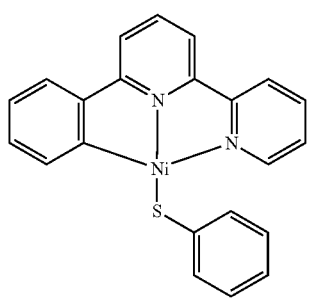
(compound 86)
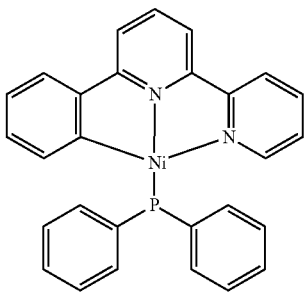
(compound 87)
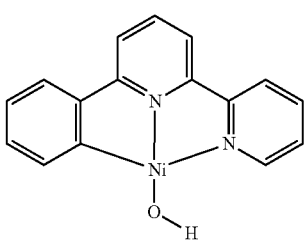
(compound 88)
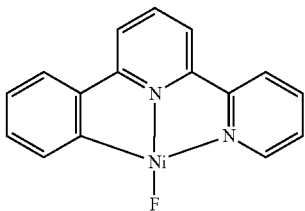
(compound 89)
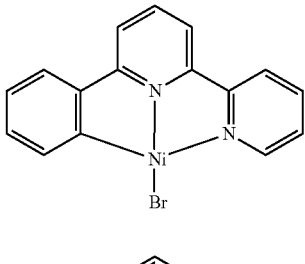
(compound 90)
(compound 91)
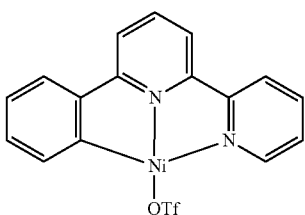

(compound 92)
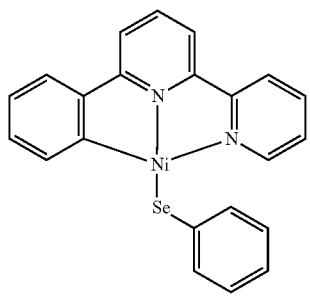
(compound 93)
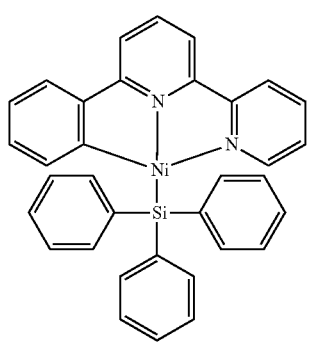
(compound 94)
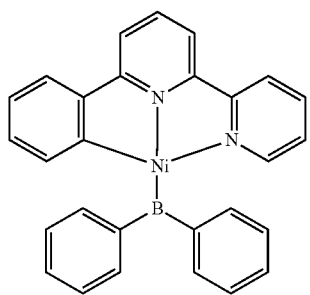
(compound 95)
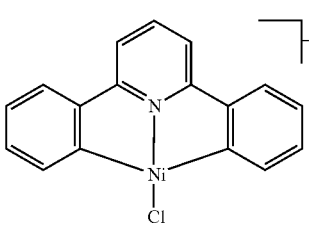
(compound 96)
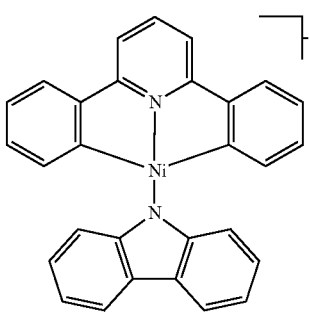
(compound 97)
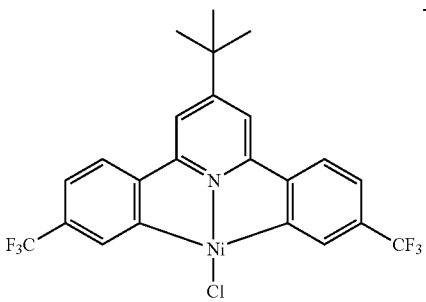
(compound 98)
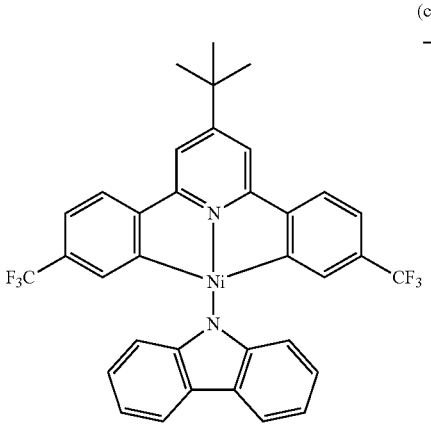
(compound 99)
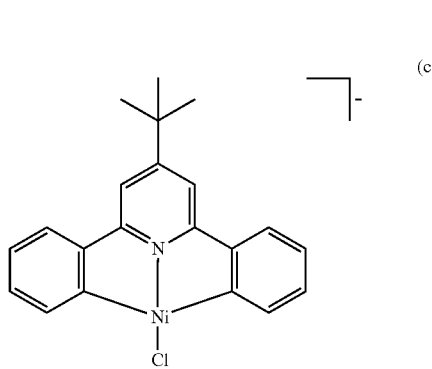
(compound 100)
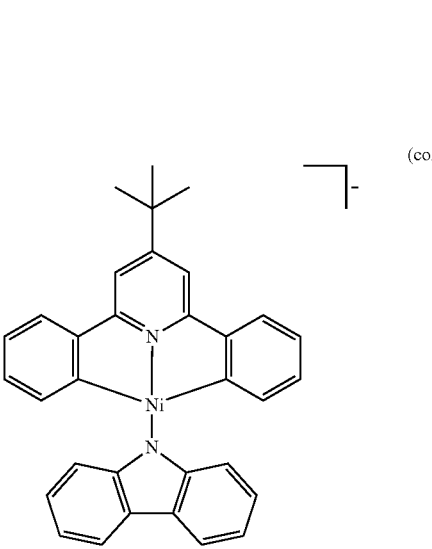

-continued
(compound 101)
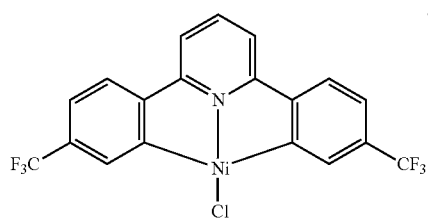
(compound 102)
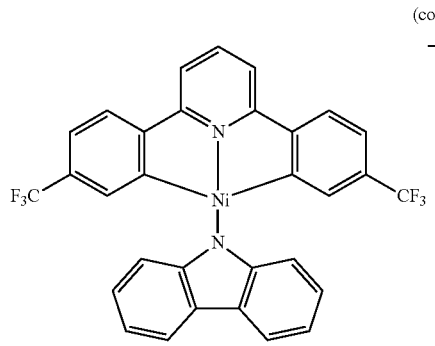
(compound 103)
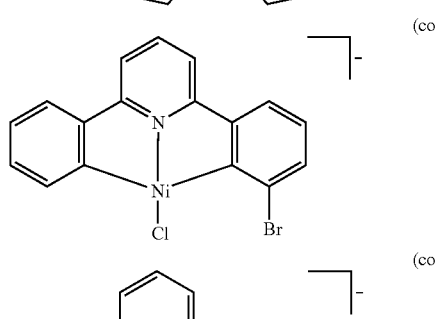
(compound 104)
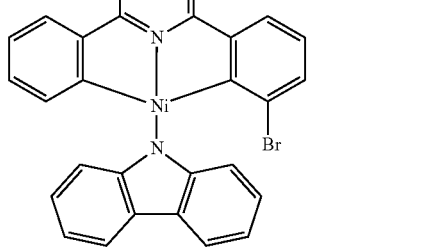
(compound 105)
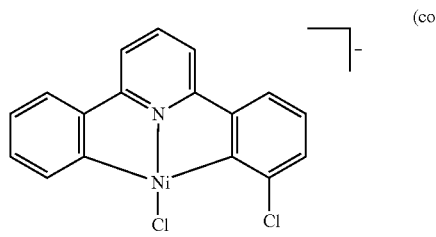
(compound 106)
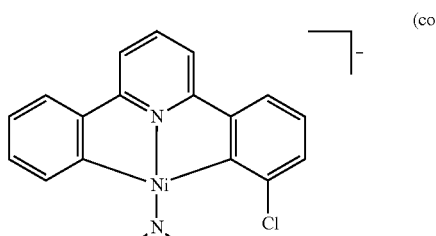
(compound 107)
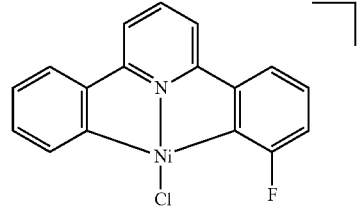
(compound 108)
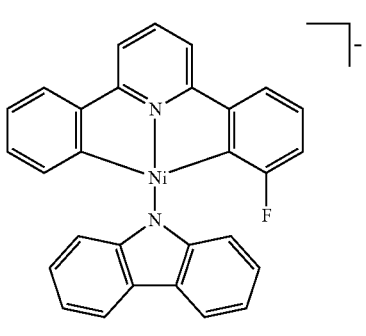
(compound 109)
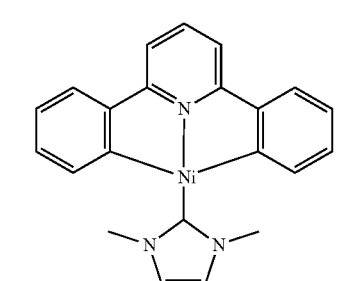
(compound 110)
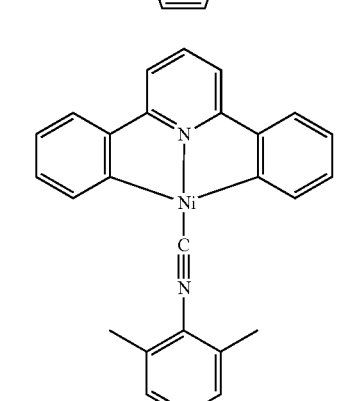
(compound 111)
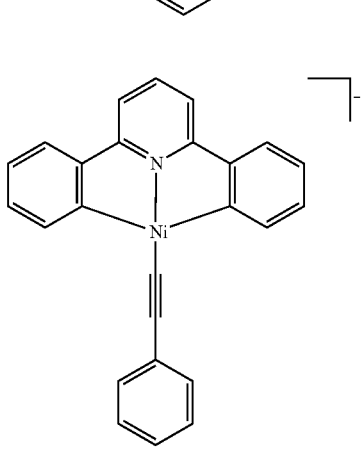

(compound 112)
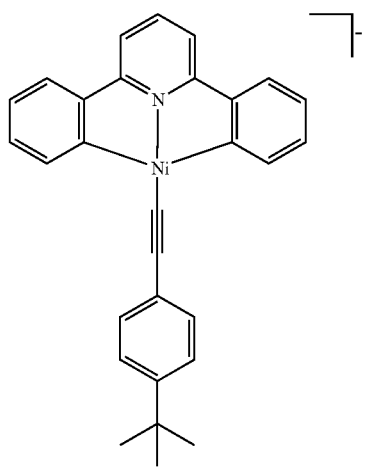
(compound 113)
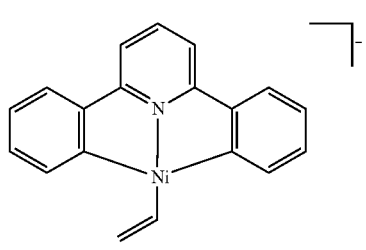
(compound 114)
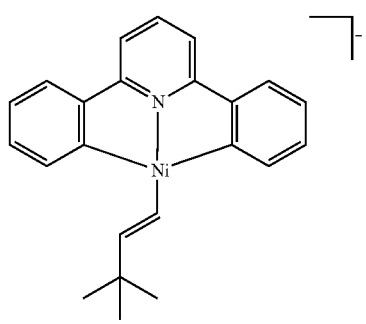
(compound 115)
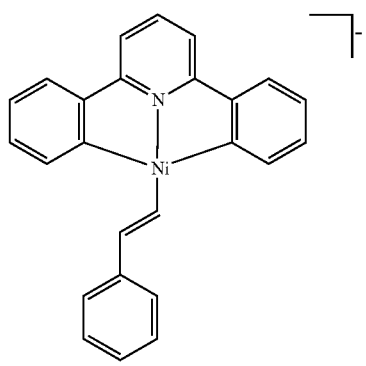
(compound 116)
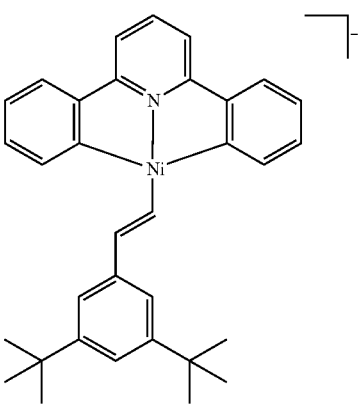
(compound 117)
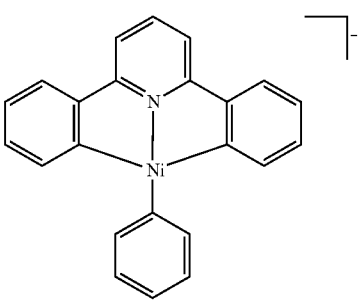
(compound 118)
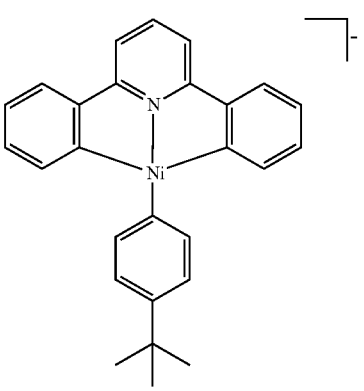
(compound 119)
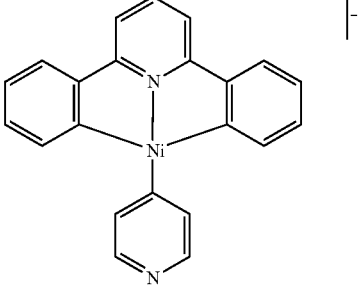

(compound 120)
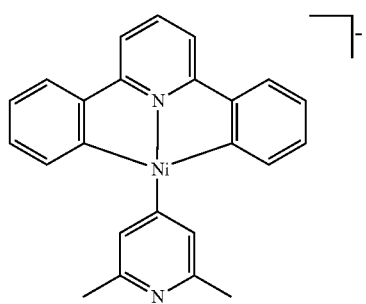
(compound 125)
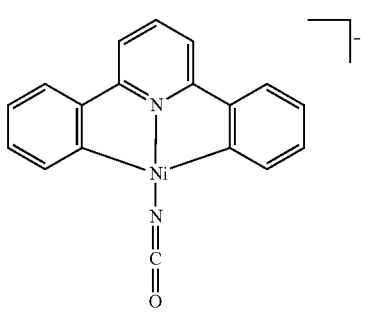
(compound 121)
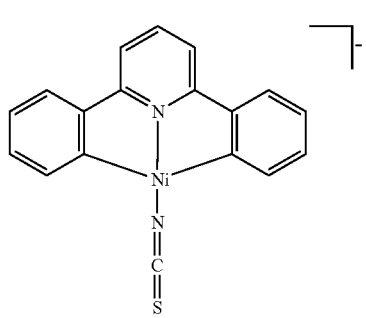
(compound 126)
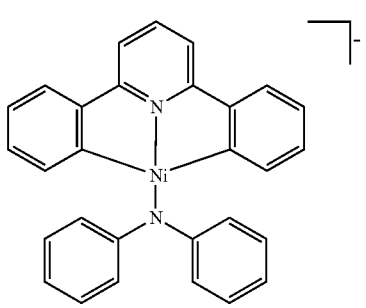
(compound 122)
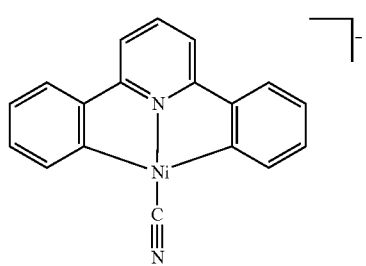
(compound 127)
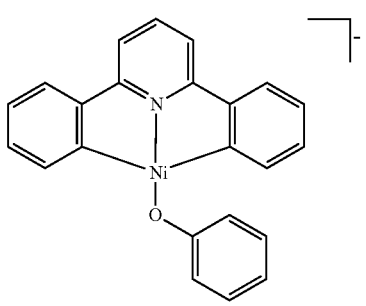
(compound 123)
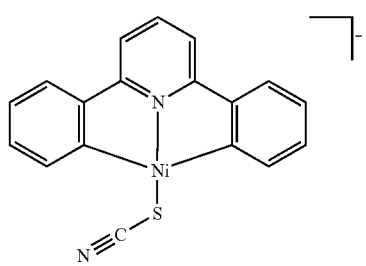
(compound 128)
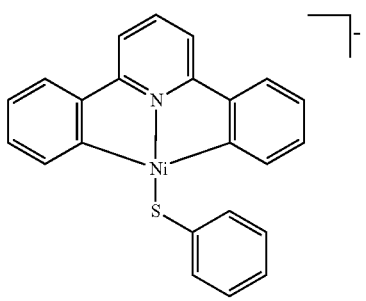
(compound 124)
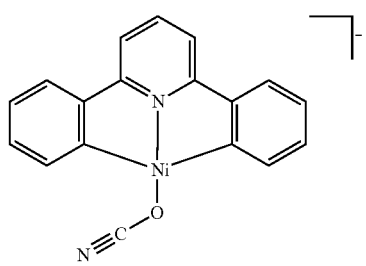
(compound 129)
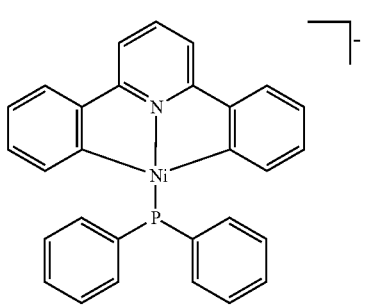

(compound 130)
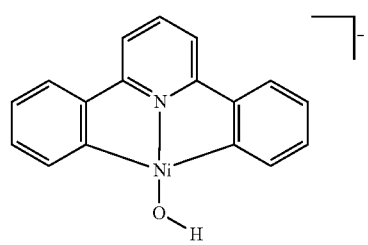
(compound 131)
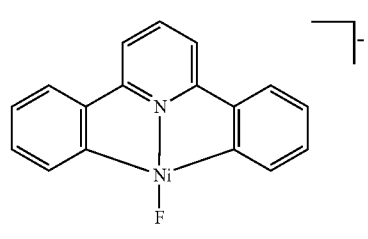
(compound 132)
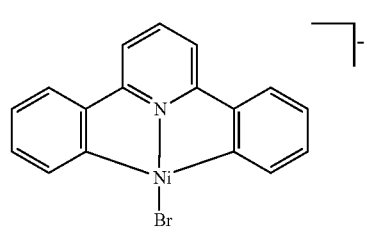
(compound 133)
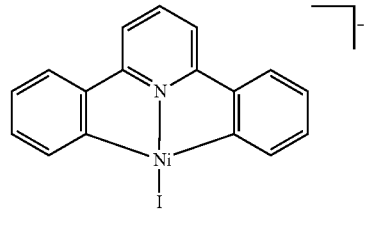
(compound 134)
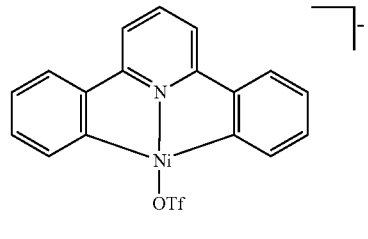
(compound 135)
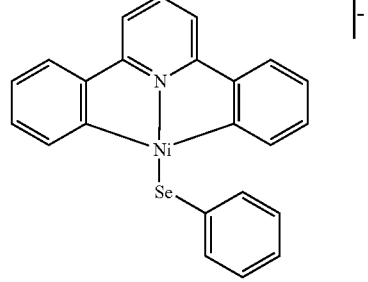
(compound 136)
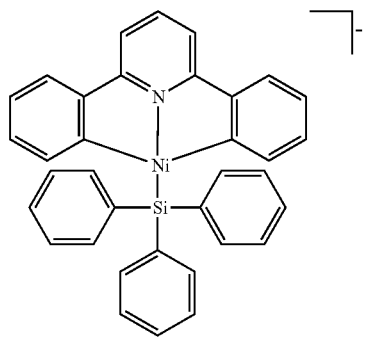
(compound 137)
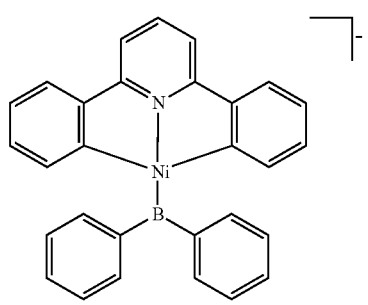
(compound 138)
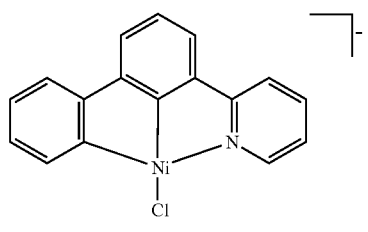
(compound 139)
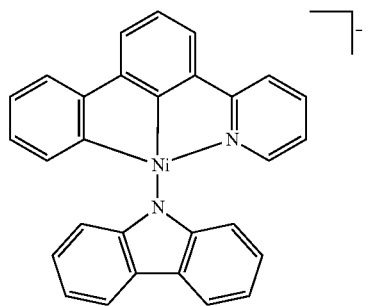
(compound 140)
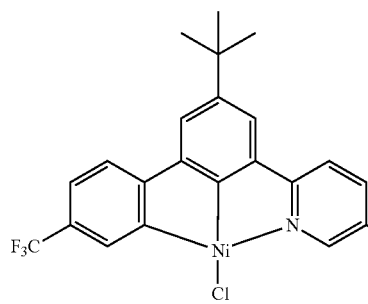

(compound 141)
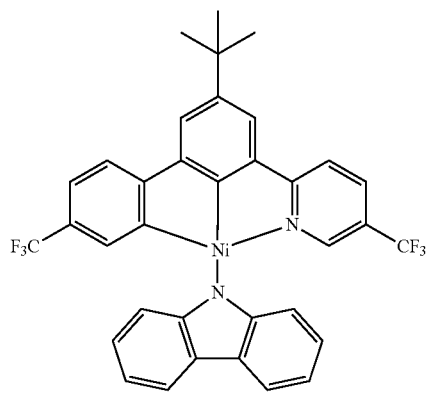
(compound 142)
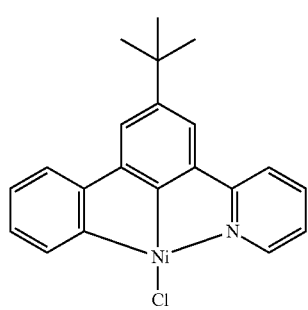
(compound 143)
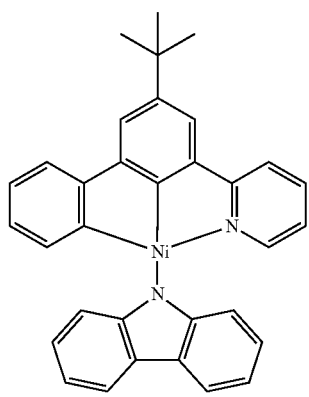
(compound 144)
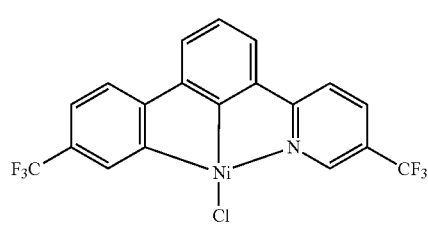
(compound 145)
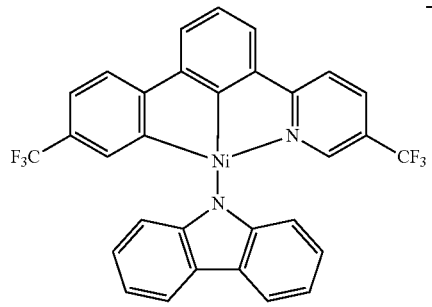
(compound 146)
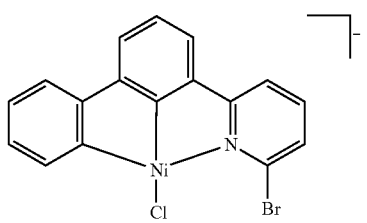
(compound 147)
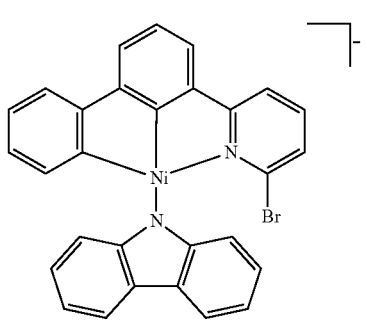
(compound 148)
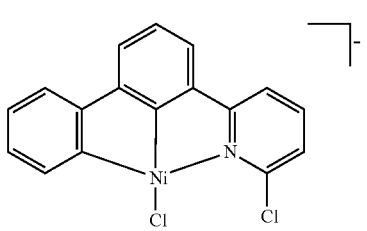
(compound 149)
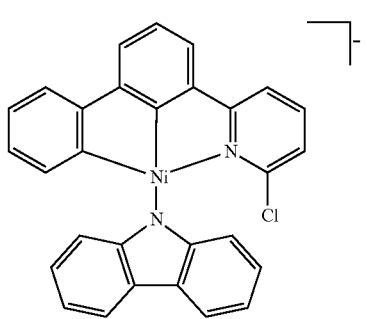

(compound 150)
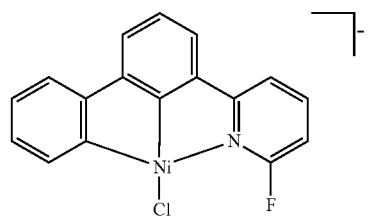
(compound 151)
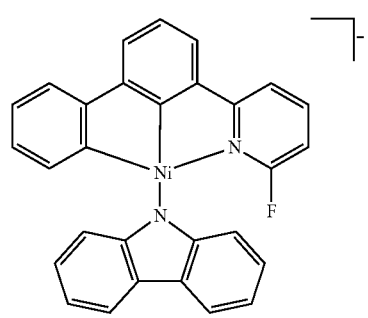
(compound 152)
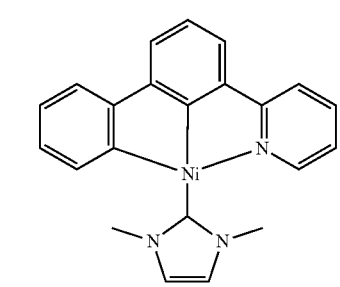
(compound 153)
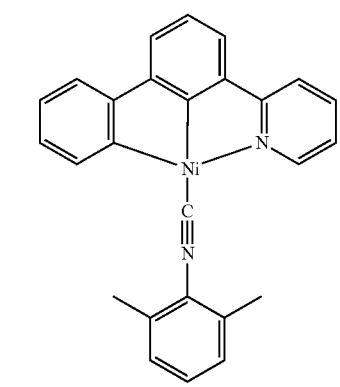
(compound 154)
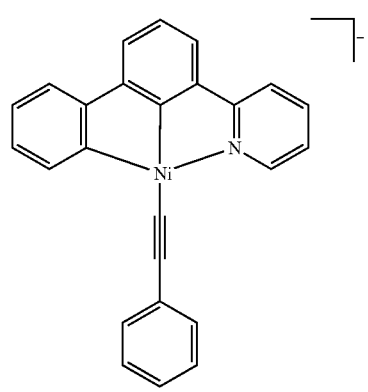
(compound 155)
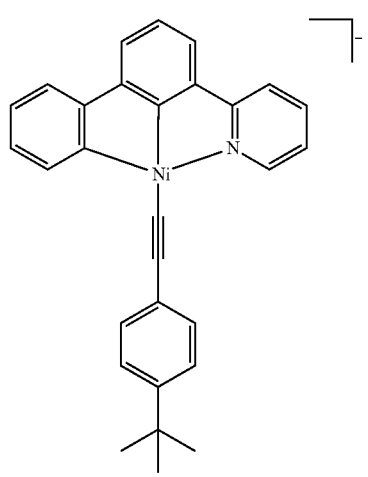
(compound 156)
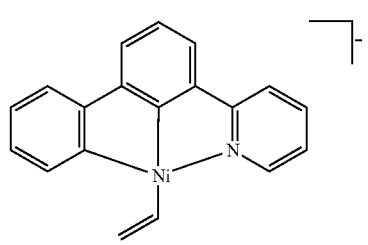
(compound 157)
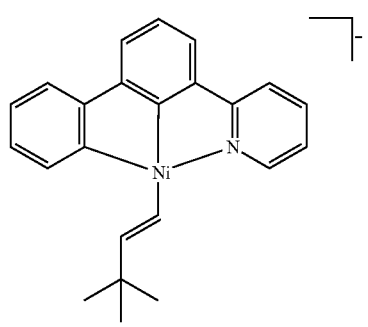
(compound 158)
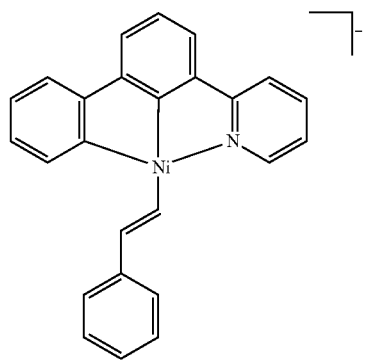

(compound 159)
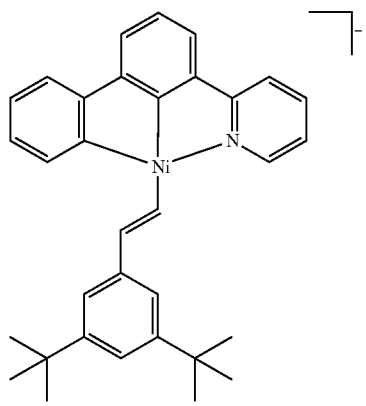
(compound 163)
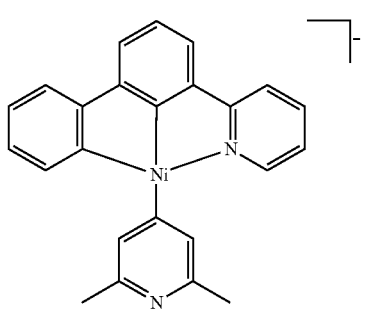
(compound 160)
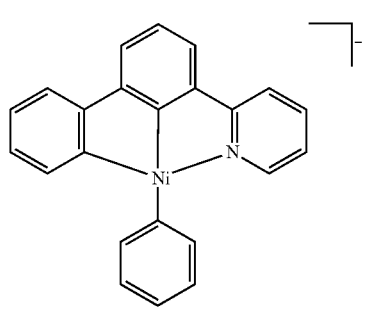
(compound 164)
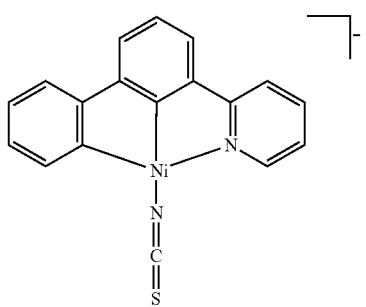
(compound 161)
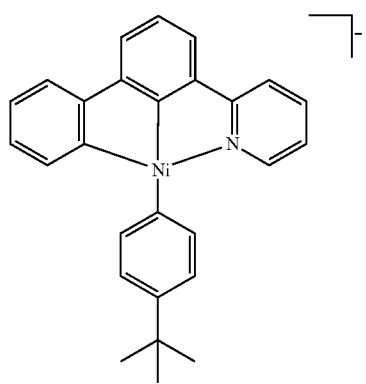
(compound 165)
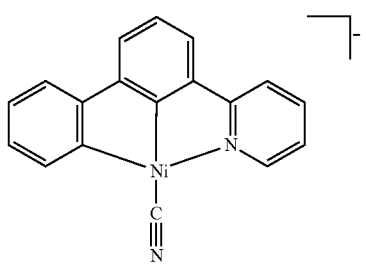
(compound 166)
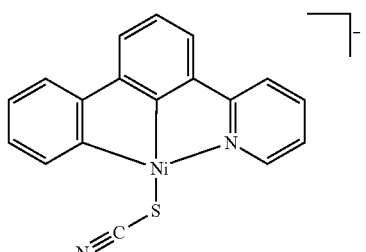
(compound 162)
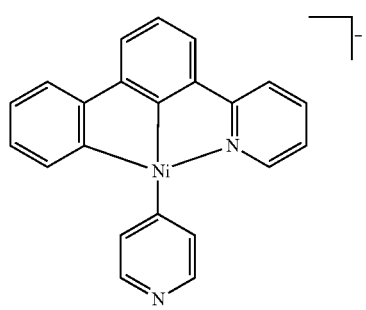
(compound 167)
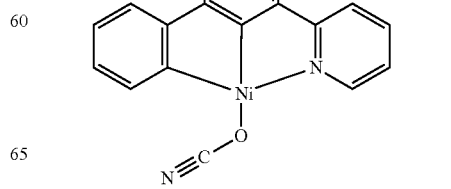

(compound 168)
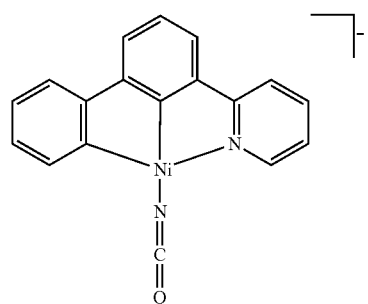
(compound 169)
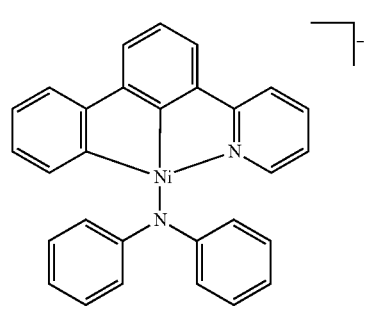
(compound 170)
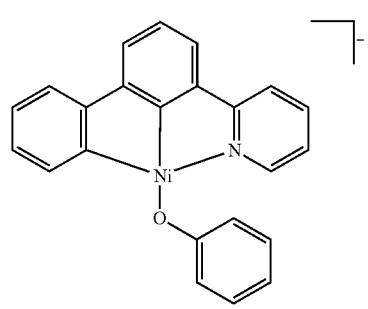
(compound 171)
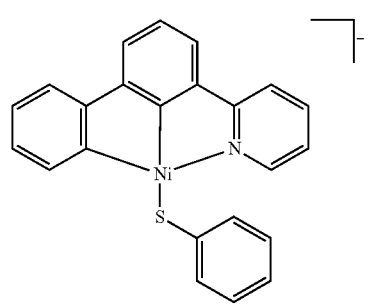
(compound 172)
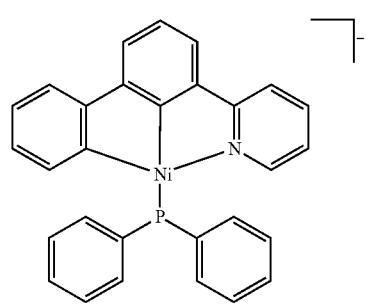
(compound 173)
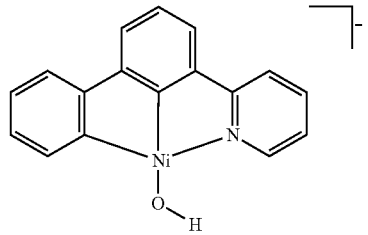
(compound 174)
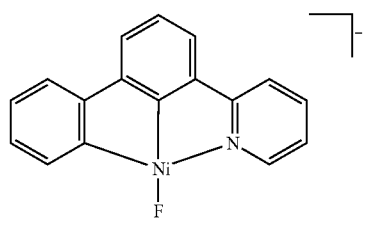
(compound 175)
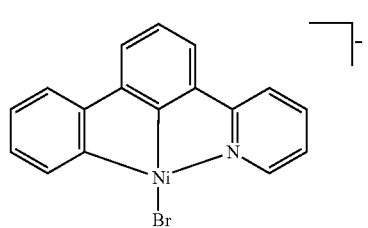
(compound 176)
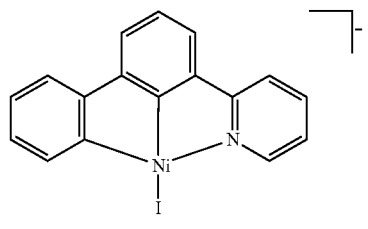
(compound 177)
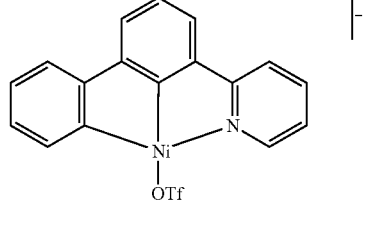
(compound 178)
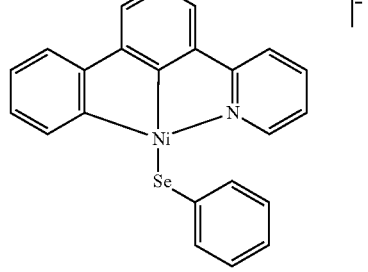

(compound 179)
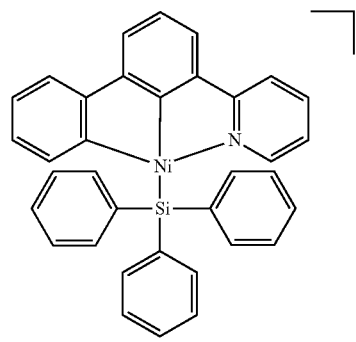
(compound 180)
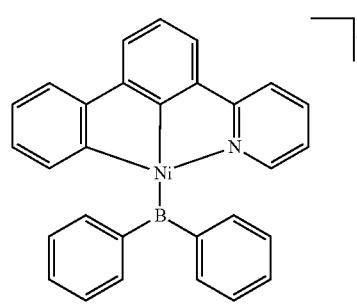
(compound 181)
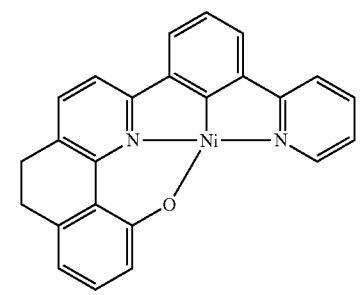
(compound 182)
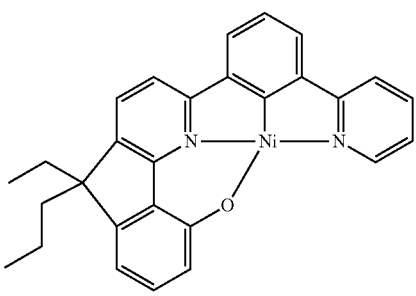
(compound 183)
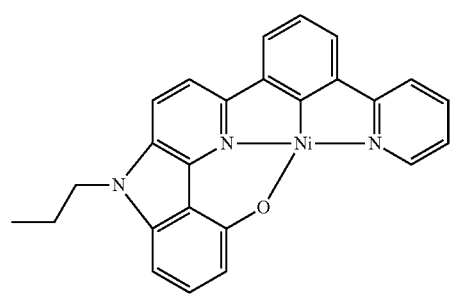
(compound 184)
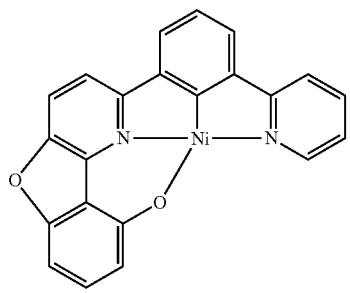
(compound 185)
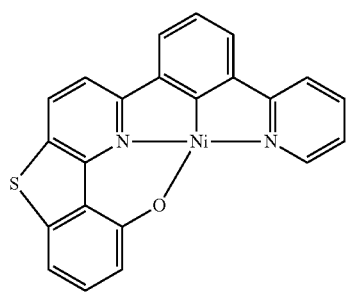
(compound 186)
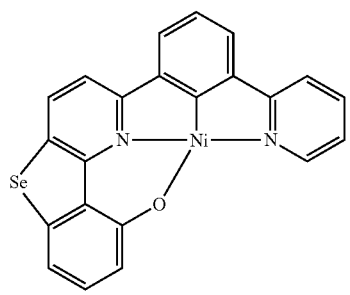
(compound 187)
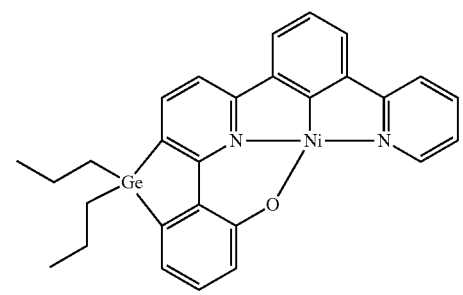
(compound 188)
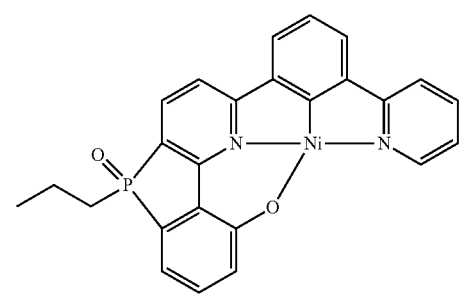

(compound 189)
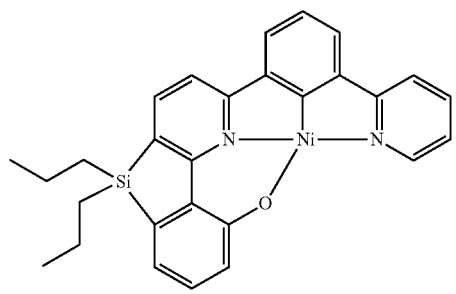
(compound 193)
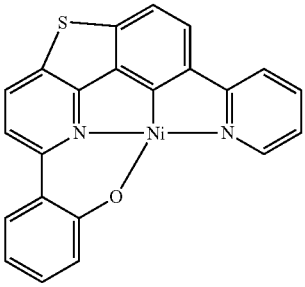
(compound 190)
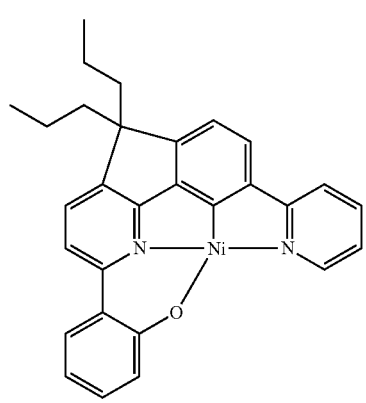
(compound 194)
(compound 191)
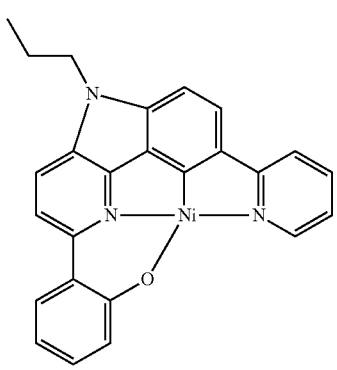
(compound 195)
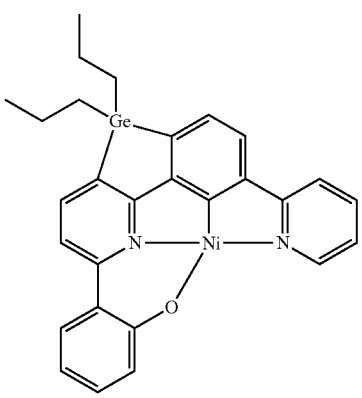
(compound 192)
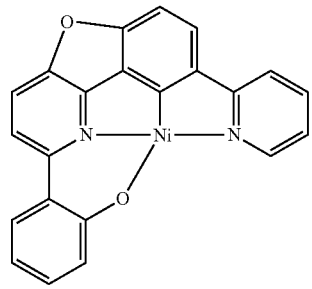
(compound 196)
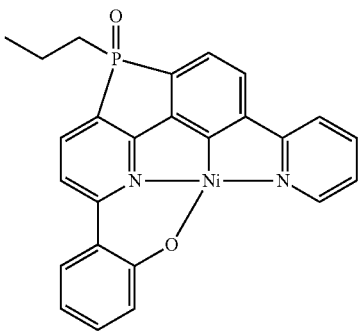

(compound 197)
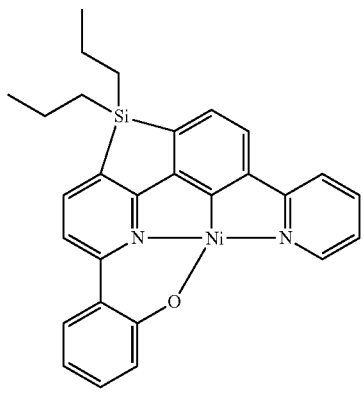
(compound 200)
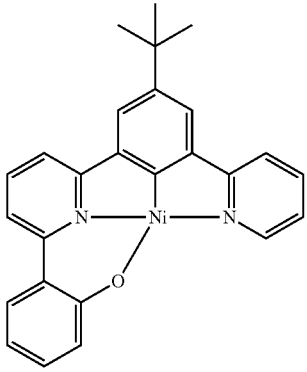
(compound 198)
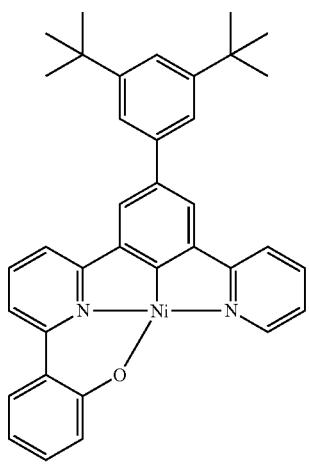
(compound 201)
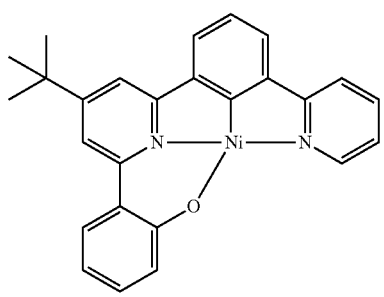
(compound 202)
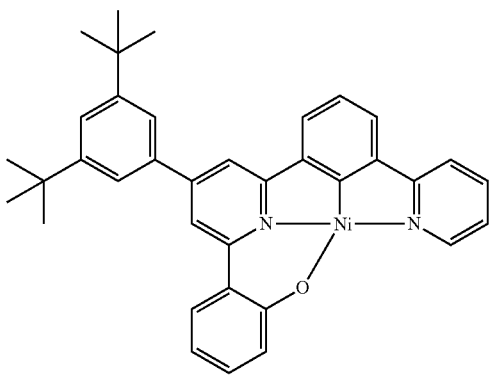
(compound 199)
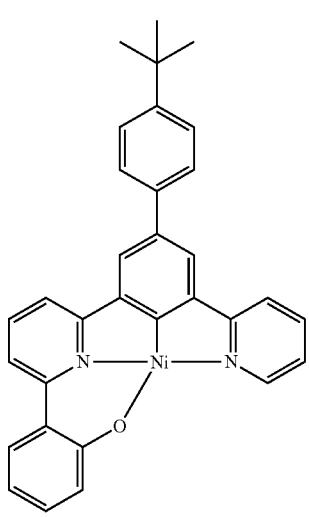
(compound 203)
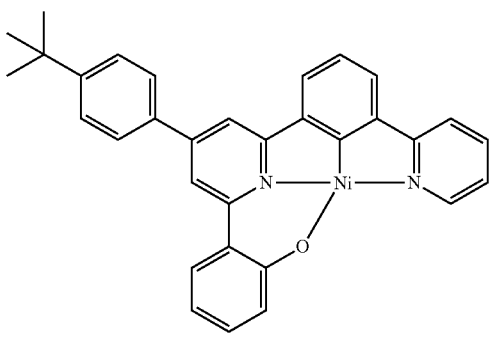

-continued
(compound 204)
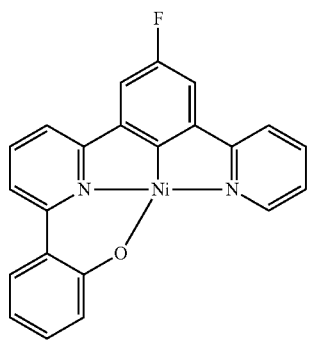
(compound 205)
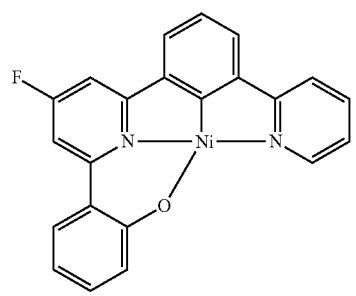
(compound 206)
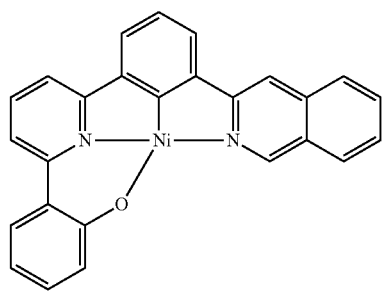
(compound 207)
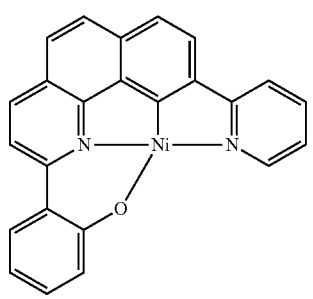
(compound 208)
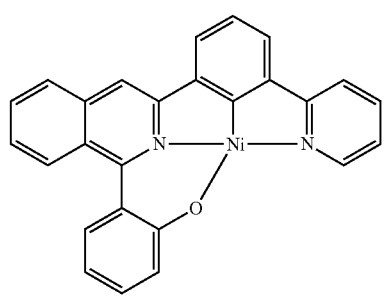
-continued
(compound 209)
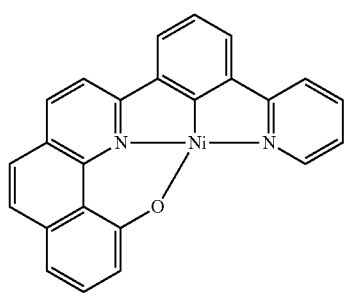
(compound 210)
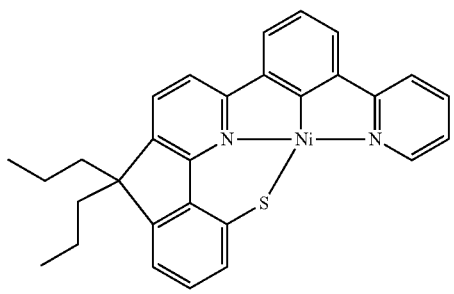
(compound 211)
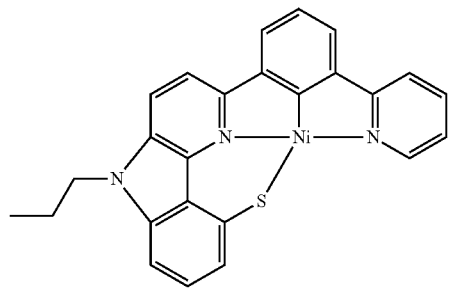
(compound 212)
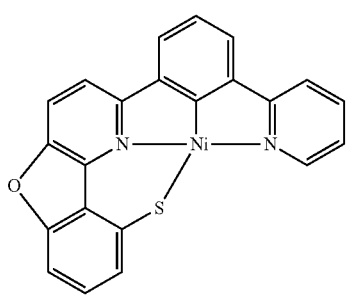
(compound 213)
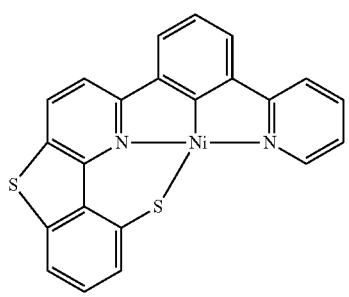

(compound 214)
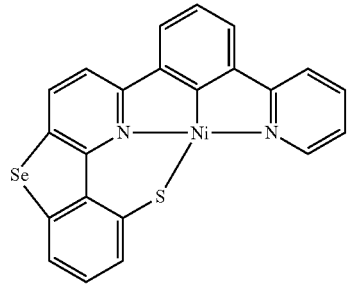
(compound 215)
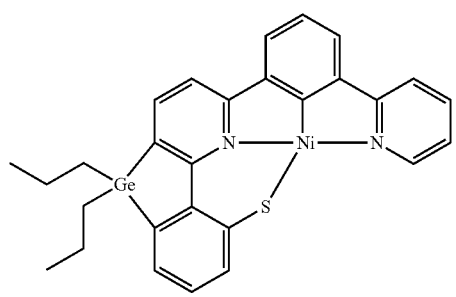
(compound 216)
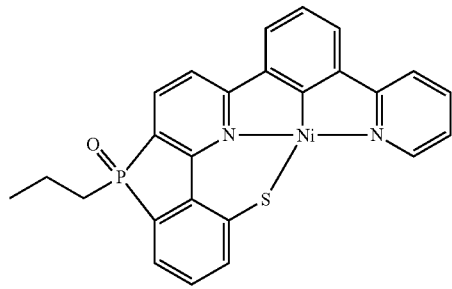
(compound 217)
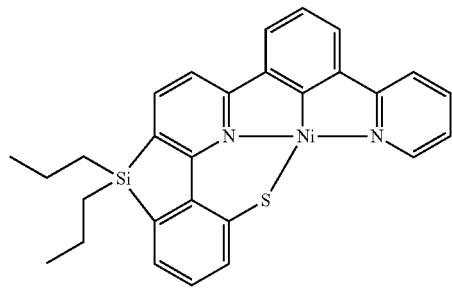
(compound 218)
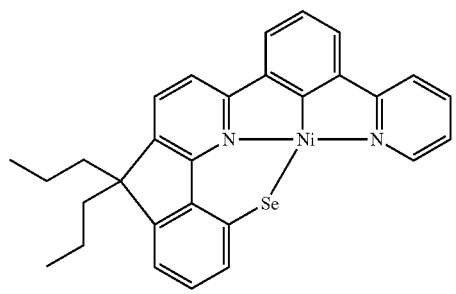
(compound 219)
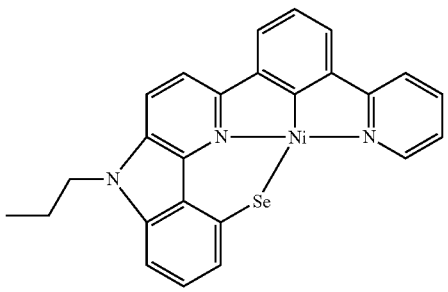
(compound 220)
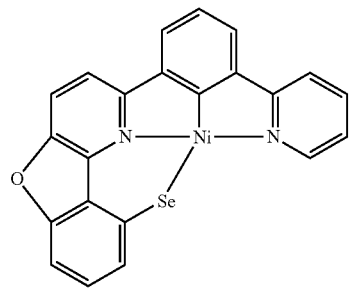
(compound 221)
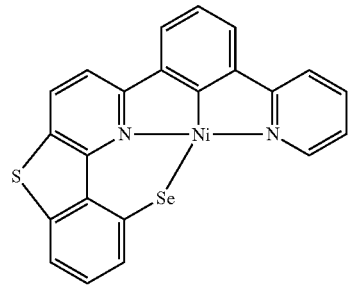
(compound 222)
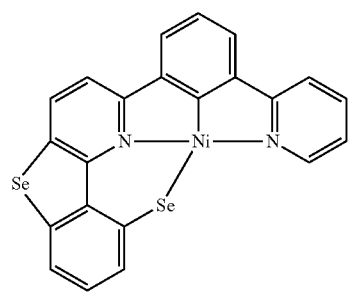
(compound 223)
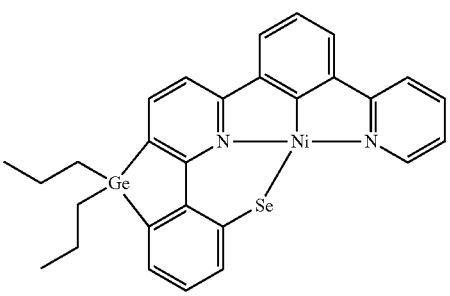

(compound 224)
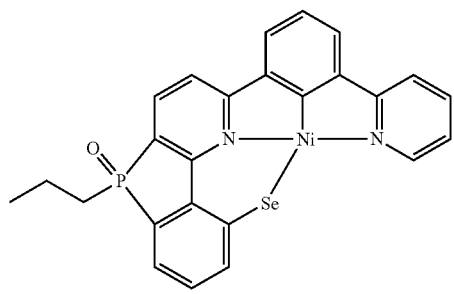
(compound 225)
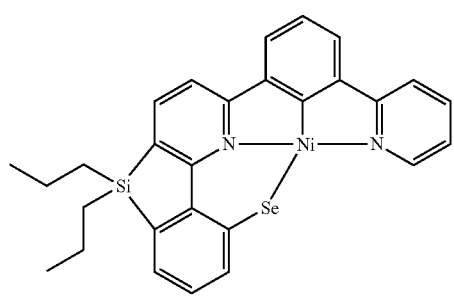
(compound 226)
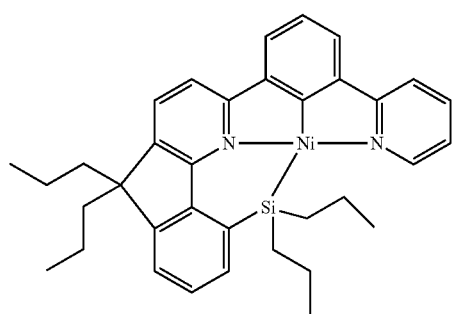
(compound 227)
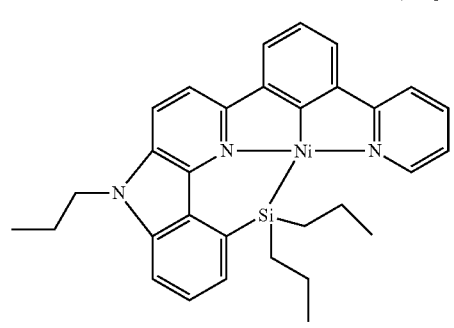
(compound 228)
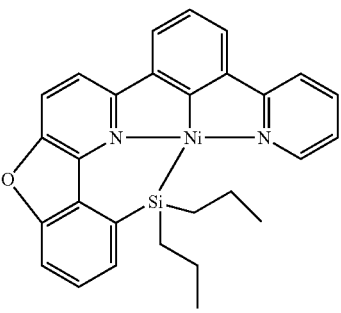
(compound 229)
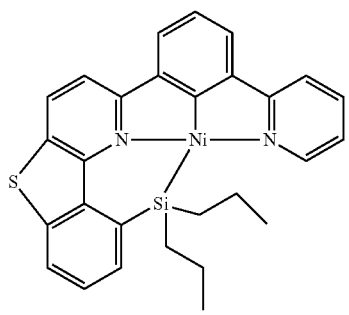
(compound 230)
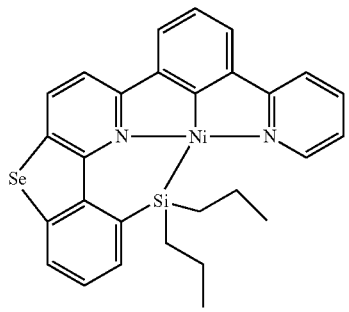
(compound 231)
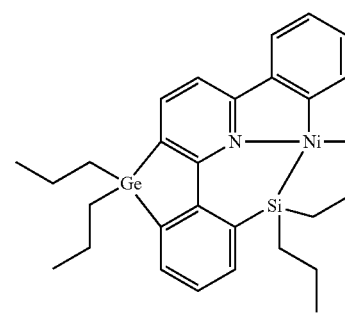
(compound 232)
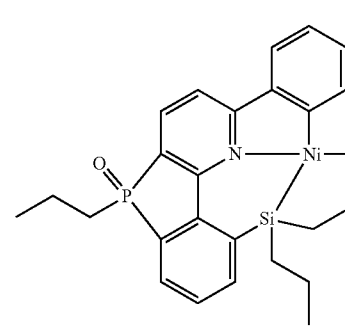
(compound 233)
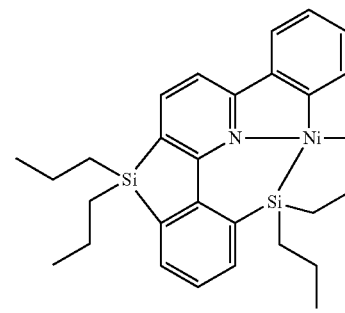

-continued
(compound 234)
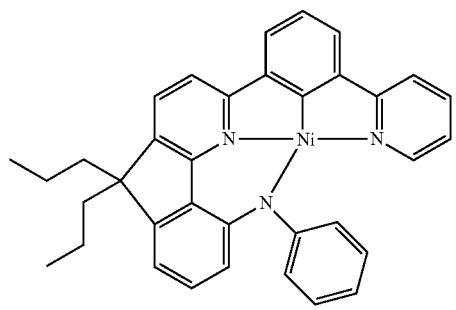
(compound 235)
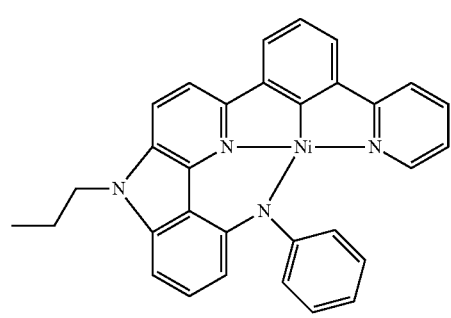
(compound 236)
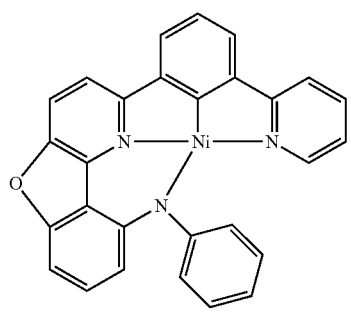
(compound 237)
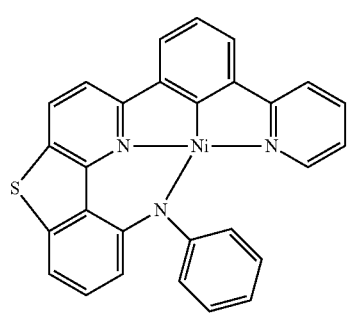
(compound 238)
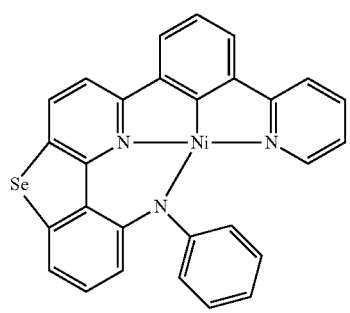
-continued
(compound 239)
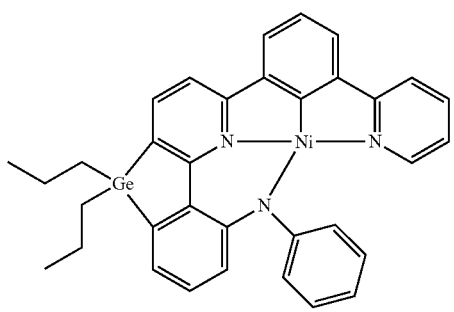
(compound 240)
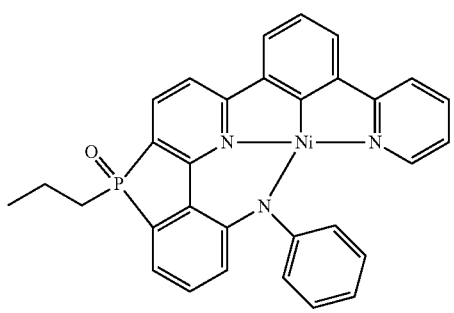
(compound 241)
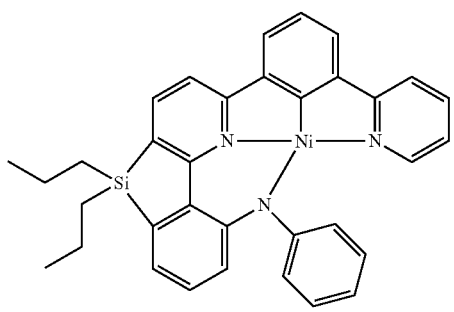
(compound 242)
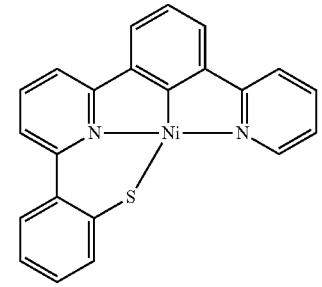
(compound 243)
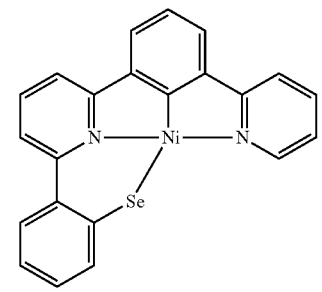

(compound 244)
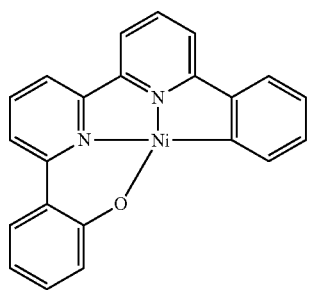
(compound 245)
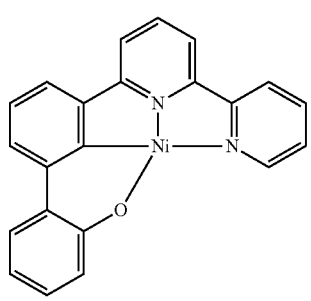
(compound 246)
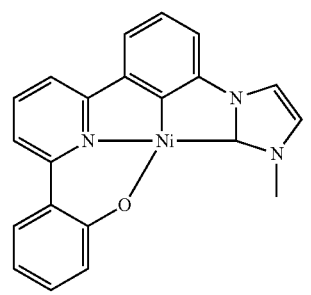
(compound 247)
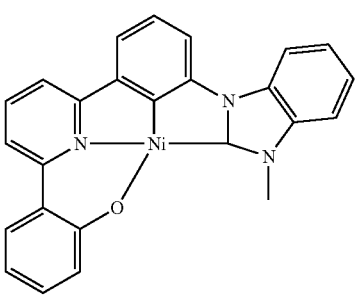
(compound 248)
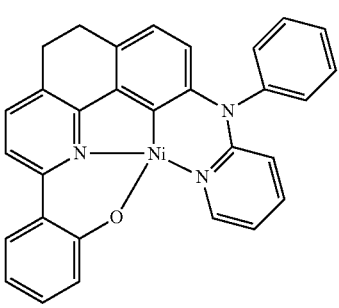
(compound 249)
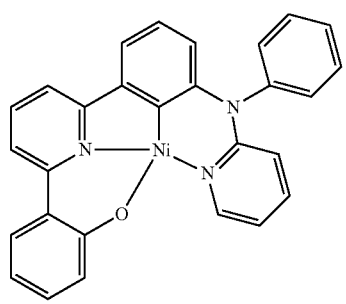
(compound 250)
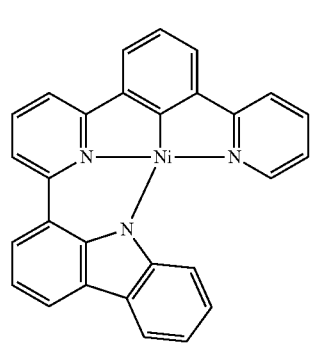
(compound 251)
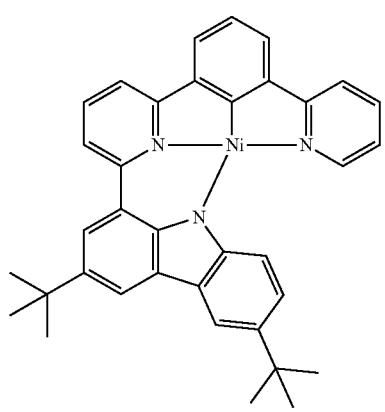
(compound 252)
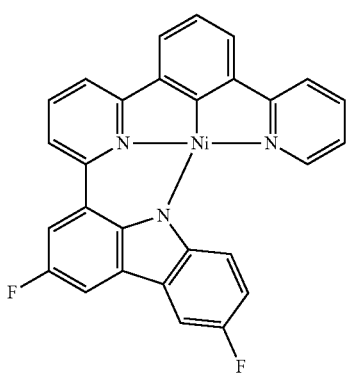

(compound 253)
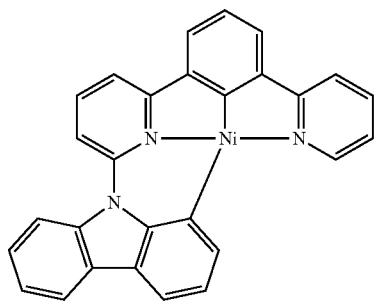
(compound 254)
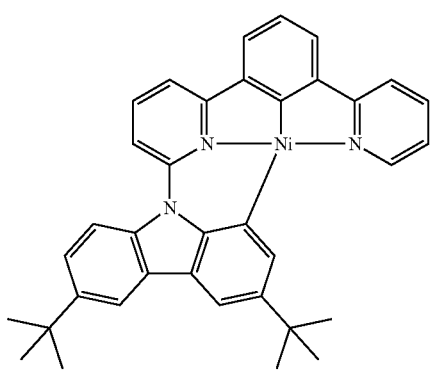
(compound 255)
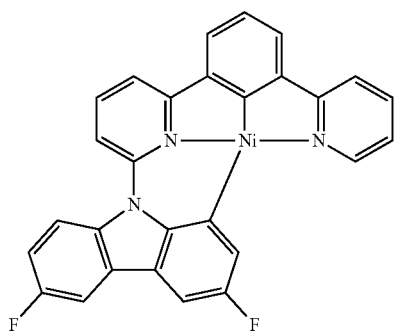
(compound 256)
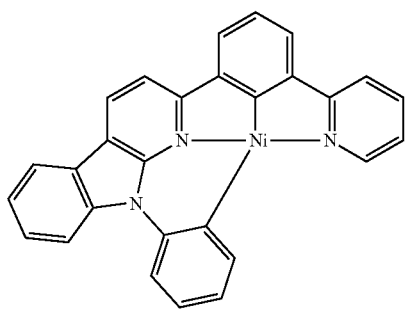
(compound 257)
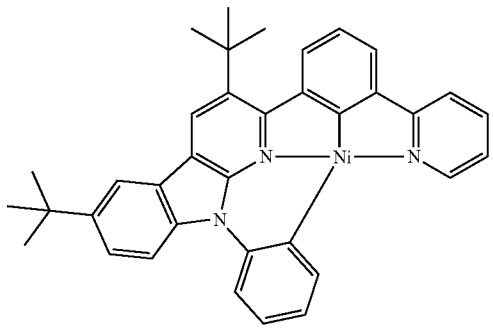
(compound 258)
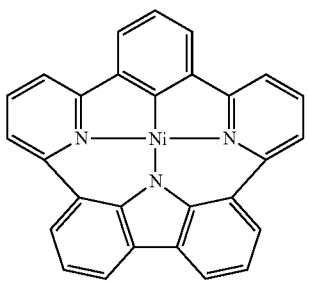
(compound 259)
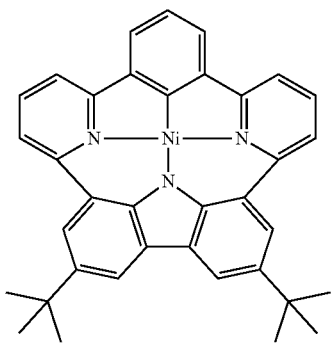
(compound 260)
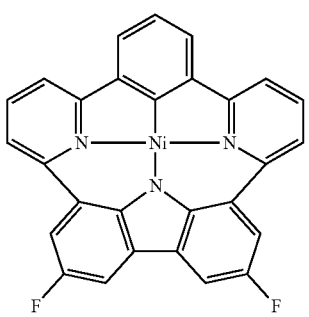

(compound 261)

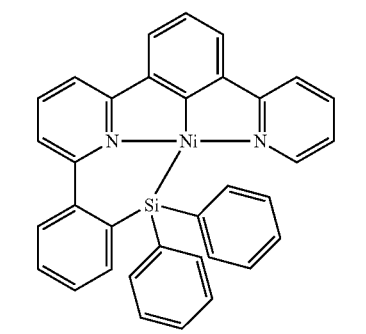

(compound 262)

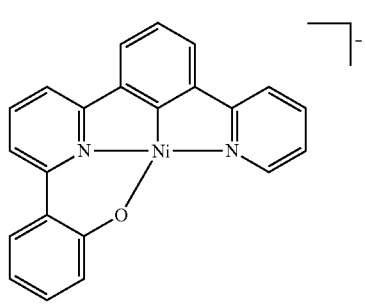

(compound 263)

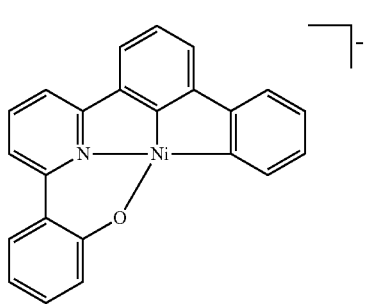

(compound 264)

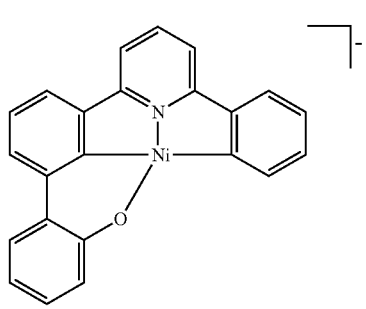

(compound 265)

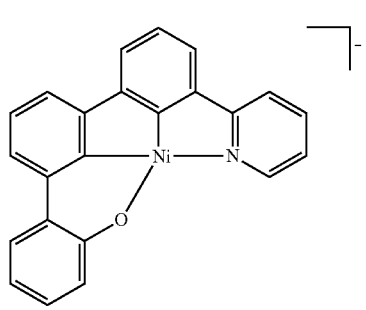

(compound 266)

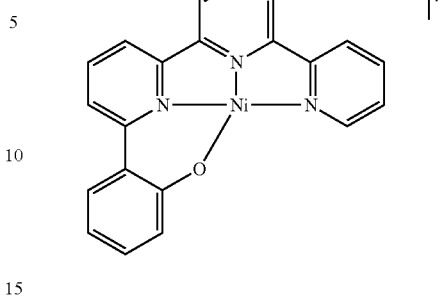

(compound 267)

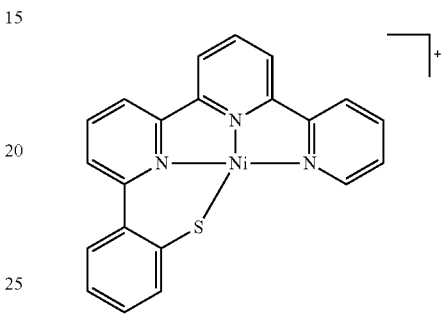

(compound 268)

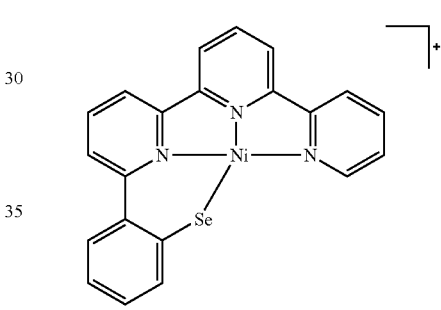

(compound 269)

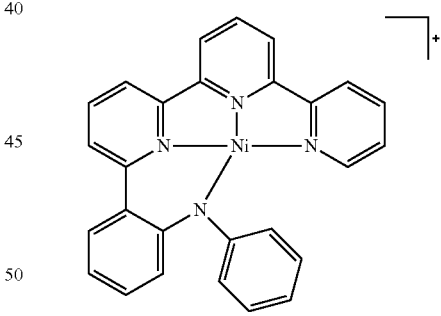

Figure 7:
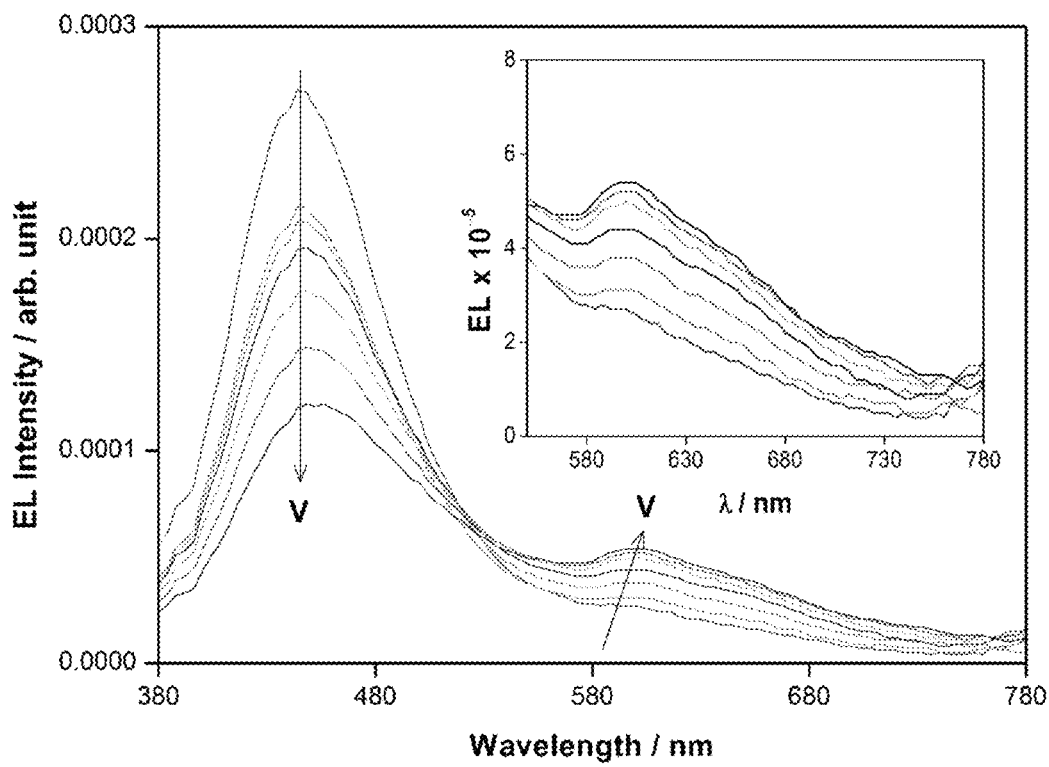
FIG. 7 shows the EL spectrum of a solution-processable OLED with compound 2 doped into MCP as the light-emitting layer in accordance with one or more embodiments herein. Inset: Magnified view of the EL spectrum showing the emission band from compound 2.
Figure 8:
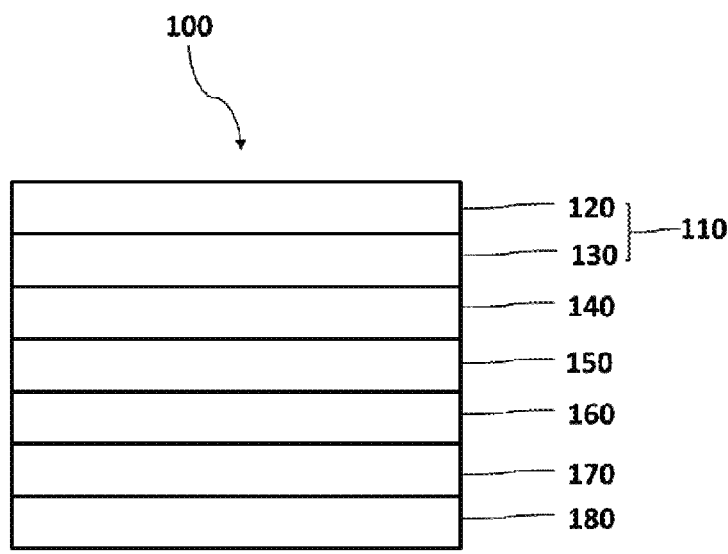
FIG. 8 is a schematic of a light-emitting device. The device contains (i) a cathode 110 including a first layer 120 and a second layer 130; (ii) an electron transporting layer 140; (iii) a carrier confinement layer 150; (iv) a light-emitting layer 160; (v) a hole-transporting layer 170; and (vi) an anode 180.

Also described, are light-emitting devices having an ordered structure containing an anode, a hole-transporting layer, a light-emitting layer, an electron-transporting layer, and a cathode, wherein the light-emitting layer contains a luminescent compound as described above for Formula I. Referring to FIG. 7, the light-emitting device can include (i) a cathode 110 preferably including an aluminum layer 120 and a lithium layer 130; (ii) optionally, an electron transporting layer 140 preferably containing 1,3,5-tri(m-pyridin-3-ylphenyl)benzene; (iii) optionally, a carrier confinement layer 150 preferably containing tris(2,4,6-trimethyl-3-(pyridin-3-yl)phenyl)borane (3TPYMB); (iv) a light-emitting layer 160 preferably containing MCP and any of the luminescent compounds described above for Formula I, such as compound 2; (v) optionally, a hole-transporting layer 170 preferably containing poly(3,4 ethylenedioxythiophene):poly(styrene sulfonate) (PEDOT:PSS); and (vi) an anode 180 preferably containing indium tin oxide-coated glass.

In some forms, the light-emitting device contains an electron-transporting layer and a hole-transporting layer.

In some forms of the light-emitting device, the light-emitting layer is formed by doping the luminescent compound as a dopant into a host compound and the luminescent compound has a percent composition between about 5 wt % and 50 wt %, such as 10 wt %, of the light-emitting layer.

In some forms, the light-emitting layer contains a host compound that is selected from, but is not limited to, MCP, 4,4'-bis(carbazol-9-yl)biphenyl (CBP), 4,4',4''-tris(carbazol-9-yl)-triphenylamine (TCTA), 3-(4-biphenylyl)-4-phenyl-5-tert-butylphenyl-1,2,butylphenyl-1,2,4-triazole (TAZ), p-bis(triphenylsilyl)benzene (UGH2) and diphenyl-4-triphenylsilylphenyl-phosphine oxide (TSPO1). In some forms, the light-emitting layer has a thickness between about 10 nm and 60 nm, such as 30 nm.

In some forms, the hole-transporting layer contains an organic compound that can be, but is not limited to, 4,4'-bis[N-(1-naphthyl)-N-phenylamino]biphenyl (NPB), 4,4'-bis[N-(3-methylphenyl)-N-phenylamino]biphenyl (TPD), 4,4',4''-tris[(3-methylphenyl)phenylamino] triphenylamine (MTDATA), and di-[4-(N,N-ditolyl-amino)phenyl]cyclohexane (TAPC). In addition, polymeric hole-transporting materials can be used including poly(N-vinylcarbazole) (PVK), polythiophene, polypyrrole, polyaniline, and copolymers including PEDOT:PSS. In some forms, the hole-transporting layer has a thickness between about 10 nm and 70 nm, such as 40 nm.

In some forms, the electron-transporting layer contains an organic compound that can be, but is not limited to, 1,3,5-tris(phenyl-2-benzimidazolyl)-benzene (TPBI), 1,3,5-tri[(3-pyridyl)-phen-3-yl] benzene (TmPyPB), bathocuproine (BCP), bathophenanthroline (BPhen) and bis(2-methyl-8-quinolinolate)-4-(phenylphenolate)-aluminum (BAlq), 1,3,5-tri[(3-pyridyl)-phen-3-yl]benzene (TmPyPB),1,3-bis[3,5-di(pyridin-3-yl)-phenyl]benzene (BmPyPhB) and 1,3,5-tris(6-(3-(pyridin-3-yl)phenyl)pyridin-2-yl)benzene (Tm3PyP26PyB). In some forms, the electron-transporting layer has a thickness between about 10 nm and 60 nm, such as 40 nm.

In some forms, the light-emitting device contains a carrier confinement layer inserted between the hole-transporting layer and the light-emitting layer, or between the light-emitting layer and the electron-transporting layer. Preferably, the carrier confinement layer improves the performance of the light-emitting device. In some forms, the carrier confinement layer contains an organic compound that can be, but is not limited to, CBP, TCTA, 3TPYMB, BmPyPhB, and Tm3PyP26PyB. In some forms, the carrier confinement layer has a thickness between about 5 nm and about 50 nm, such as 10 nm.

Preferably, the anode of the light-emitting device contains indium tin oxide-coated glass. Preferably, the cathode of the light-emitting device contains lithium fluoride, aluminium, or a combination thereof. In some forms, the lithium fluoride forms a layer having a thickness between about 0.05 nm and 5 nm, such as 1 nm. In some forms, the aluminium forms a layer having a thickness between about 50 nm and about 250 nm, such as 150 nm.

Every compound within the above definition is intended to be and should be considered to be specifically disclosed herein. Further, every subgroup that can be identified within the above definition is intended to be and should be considered to be specifically disclosed herein. As a result, it is specifically contemplated that any compound or subgroup of compounds can be either specifically included for or excluded from use or included in or excluded from a list of compounds. For example, any one or more of the compounds described herein, with a structure depicted herein, or referred to in the Tables or the Examples herein can be specifically included, excluded, or combined in any combination, in a set or subgroup of such compounds. Such specific sets, subgroups, inclusions, and exclusions can be applied to any aspect of the compositions and methods described here. For example, a set of compounds that specifically excludes one or more particular compounds can be used or applied in the context of compounds per se (for example, a list or set of compounds), compositions including the compound, any one or more of the disclosed methods, or combinations of these. Different sets and subgroups of compounds with such specific inclusions and exclusions can be used or applied in the context of compounds per se, compositions including one or more of the compounds, or any of the disclosed methods. All of these different sets and subgroups of compounds—and the different sets of compounds, compositions, and methods using or applying the compounds—are specifically and individual contemplated and should be considered as specifically and individually described. For example, the following can be specifically included or excluded, as a group or individually, from any compounds per se (for example, a list or set of compounds), compositions including the compound, or any one or more of the disclosed methods, or combinations of these. For example, the compounds of Formula I or Formula II can exclude any of the complexes containing tetradentate ligands described in U.S. Patent Application Publication 2018/0194790 by Li, et al. For example, in some forms of Formula I, wherein p is 1 and C is linked to $R^1$, A, B, C, and $R^1$ are not substituted polyheteroaryl, unsubstituted polyheteroaryl, substituted polyaryl, or unsubstituted polyaryl. In a further example, in some forms of Formula I, wherein p is 1 and C is linked to $R^1$, A, B, C, and $R^1$, and M is cobalt, copper, nickel, manganese, or zinc, $R^1$ are not substituted polyheteroaryl, unsubstituted polyheteroaryl, substituted polyaryl, or unsubstituted polyaryl. As another example, M can exclude $Pt^{2+}$, $Pd^{2+}$, $Ir^{3+}$, and/or $Au^{3+}$. As a further example, any one or combination of first row transition metals can be excluded.

III. Methods of Making

A. Transition Metal Complexes

The transition metal complexes and their ligands described herein can be synthesized using methods known in the art of organic chemical synthesis. For instance, tridentate ligands, N^C^N and 3-$CF_3$—N^C(tBu)^N—$CF_3$-3, and the corresponding precursor compounds, [N^(N^C^N)Cl] and [Ni(3-$CF_3$—N^C(tBu)^N—$CF_3$-3)Cl] can be prepared according by modification of a procedure reported in the literature [Soro, B.; Stoccoro, S.; Minghetti, G.; Zucca, A.; Cinellu, M. A.; Gladiali, S.; Manassero, M.; Sansoni, M. *Organometallics* 1, 53 (2005)]. Further, ligands with a desired denticity (such as tridentate, and tetradentate) can be synthesized following the approached described by Turner, "*Luminescent cyclometalated platinum and palladium complexes with novel photophysical properties*" Diss. 2014 and Cheng, [Cheng, G.; Kui, S. C. F.; Ang, W.-H.; Ko, M.-Y.; Chow, P.-K.; Kwong, C.-L.; Kwok, C.-C.; Ma, C.; Guan, X.; Low, K.-H.; Su, S.-J.; Che, C.-M. *Chem. Sci.* 5, 4819 (2014)]. The target transition metal complex can be synthesized by reacting the corresponding precursor compound with the corresponding ancillary ligand in the presence of a suitable base in an organic solvent. Specific transition metal complexes, such as those containing nickel(II) are disclosed in the Examples.

B. Organic Light-Emitting Devices

Also described are methods of making OLEDs containing one or more transition metal complexes described above for Formula I. A preferred method of making the OLEDs involves vacuum deposition or solution processing techniques such as spin-coating and ink-jet printing. A method of making an OLED including a transition metal complex described herein is disclosed in the Examples.

IV. Methods of Using

Preferably, the transition metal complexes described herein are photo-stable, and are emissive at room temperatures, low temperatures, or a combination thereof. Accordingly, the compounds described herein can be incorporated into OLEDs and used in commercial applications such smart phones, televisions, monitors, digital cameras, tablet computers, and lighting fixtures that usually operate at room temperatures.

The methods, compounds, and compositions herein described are further illustrated in the following examples, which are provided by way of illustration and are not intended to be limiting. It will be appreciated that variations in proportions and alternatives in elements of the components shown will be apparent to those skilled in the art and are within the scope of disclosed forms. Theoretical aspects are presented with the understanding that Applicants do not seek to be bound by the theory presented. All parts or amounts, unless otherwise specified, are by weight.

The disclosed compositions and methods can be further understood through the following numbered paragraphs.

1. A luminescent compound having the formula:

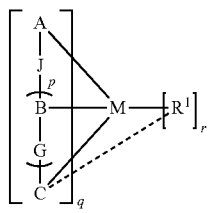

Formula I wherein:
the compound has an overall negative, neutral, or positive charge;
M is a first-row transition metal atom, preferably M is nickel, copper, iron, or cobalt, most preferably M is nickel;
M has an oxidation state between 0 and +7 inclusive, preferably 0, +1, +2, or +3;
A, B, and C are each independently unsubstituted heteroaryl, substituted heteroaryl, unsubstituted aryl, substituted aryl, unsubstituted polyaryl, substituted polyaryl, unsubstituted polyheteroaryl, substituted polyheteroaryl, substituted $C_3$-$C_{20}$ cycloalkyl, unsubstituted $C_3$-$C_{20}$ cycloalkyl, substituted $C_3$-$C_{20}$ heterocyclyl, unsubstituted $C_3$-$C_{20}$ heterocyclyl, substituted $C_3$-$C_{20}$ cycloalkenyl, unsubstituted $C_3$-$C_{20}$ cycloalkenyl, substituted $C_3$-$C_{20}$ cycloalkynyl, or unsubstituted $C_3$-$C_{20}$ cycloalkynyl, preferably at least one of A, B, and C is a substituted aryl or unsubstituted aryl, and another of A, B, and C is a substituted heteroaryl or unsubstituted heteroaryl, preferably, a bond between at least one of A, B, and C and M is metal-carbon σ-bond; wherein the dashed line indicates that $R^1$ is optionally linked or unlinked to C, preferably $R^1$ is not linked to C;
q is 1 or 2, preferably 1;
p is 1 (tridentate ligand), 2 (tetradentate ligand), or 3 (pentadentate ligand), preferably 1 or 2;
G and J are each independently a bond (single, double, triple bond), absent, oxygen, sulfur, unsubstituted amino, substituted amino, unsubstituted alkylene, substituted alkylene, unsubstituted alkyl, substituted alkyl, substituted carbonyl, unsubstituted carbonyl, substituted carboxyl, unsubstituted carboxyl, substituted amido, unsubstituted amido, substituted sulfonyl, unsubstituted sulfonyl, substituted sulfonic acid, unsubstituted sulfonic acid, substituted phosphoryl, unsubstituted phosphoryl, substituted phosphonyl, or unsubstituted phosphonyl; preferably G and J are each a single bond;
$R^1$ is carbon or heteroatom donor ligand, halide, or pseudohalide, which could be either mono-anionic or neutral, such as unsubstituted heteroaryl (carbazole), substituted heteroaryl, unsubstituted polyaryl, substituted polyaryl, unsubstituted polyheteroaryl, substituted polyheteroaryl, substituted aryl (4-tert-butylphenyl), unsubstituted aryl (phenyl), substituted $C_3$-$C_{20}$ heterocyclyl (substituted $C_3$ heterocyclyl such as 1,3-dimethyl-2,3-dihydro-1H-imidazol-2-yl), unsubstituted $C_3$-$C_{20}$ heterocyclyl (2,3-dihydro-1H-imidazol-2-yl), substituted N-alkylidynearylaminium (2,6-dimethyl-N-methylidynebenezaminium), unsubstituted N-alkylidynearylaminium (2,6-dimethyl-N-ethylidynebenezaminium), unsubstituted arylalkynyl (phenylethynyl), substituted arylalkynyl (4-tert-butyl phenylethynyl), unsubstituted alkyl, substituted alkyl, unsubstituted alkynyl, substituted alkynyl, unsubstituted alkenyl (ethenyl), substituted alkenyl (3,3-dimethylbutenyl, 2-phenylethenyl), unsubstituted arylalkenyl (2-phenylethenyl), substituted arylalkenyl (2-(3,5-di-tert-butylphenyl)ethenyl), unsubstituted heteroaryl (pyridin-4yl), substituted heteroaryl (2,6-dimethylpyridin-4yl), halogen (chlorine, fluorine, bromine, iodine), cyano, substituted cyano, cyanate, isocyanate, thioisocyanate, thiocyanate, substituted amino (N,N-diarylamine such as N,N-diphenylamine), unsubstituted amino, phosphide, substituted phosphino (diarylphosphino such as diphenylphosphino), unsubstituted phosphino, hydroxy, unsubstituted alkoxy, substituted alkoxy, unsubstituted amide, substituted amide, unsubstituted aroxy (phenoxy), substituted aroxy, unsubstituted arylthio (phenylthio), substituted arylthio, unsubstituted arylselenyl (phenylselenyl), substituted arylselenyl, unsubstituted arylsilyl (triarylsilyl such as triphenylsilyl), substituted arylsilyl, unsubstituted arylboraneyl (diarylboraneyl such as diphenylboraneyl), substituted arylboraneyl, unsubstituted alkylboranyl, substituted alkylboranyl, unsubstituted boranyl, substituted boranyl, sulfonate (trifluoromethanesulfonate), or N-heterocylic carbene;
r is 0, 1, or 2, preferably r is 1; and optionally wherein substituted means substituted with one or more substituents selected from unsubstituted alkyl, alkyl having one or more alkyl substituents (t-butyl), alkyl having one or more halogen substituents (trifluoromethyl), halogen (chlorine, fluorine, bromine, iodine), unsubstituted aryl (phenyl), aryl having one or more alkyl substituents (2,6-dimethylphenyl, 4-tert-butylphenyl, 3,5-di-tert-butylphenyl), substituted aryl, unsubstituted heteroaryl, substituted heteroaryl, substituted $C_3$-$C_{20}$ cycloalkyl, unsubstituted $C_3$-$C_{20}$ cycloalkyl, substituted $C_3$-$C_{20}$ heterocyclyl, unsubstituted $C_3$-$C_{20}$ heterocyclyl, substituted $C_3$-$C_{20}$ cycloalkenyl, unsubstituted $C_3$-$C_{20}$ cycloalkenyl, substituted $C_3$-$C_{20}$ cycloalkynyl, or unsubstituted $C_3$-$C_{20}$ cycloalkynyl, OR, $NR_2$, SR, C(O)R, C(O)OR, C(O)$NR_2$, CN, $CF_3$, $NO_2$, $SO_2$, SOR, and $SO_3R$, wherein R is independently unsubstituted alkyl, unsubstituted alkenyl, unsubstituted alkynyl, unsubstituted alkylaryl, unsubstituted aryl, unsubstituted $C_3$-$C_{20}$ cycloalkyl, unsubstituted $C_3$-$C_{20}$ heterocyclyl, unsubstituted $C_3$-$C_{20}$ cycloalkenyl, or unsubstituted $C_3$-$C_{20}$ cycloalkynyl, and optionally wherein, (i) when p is 1 and C is linked to $R^1$, A, B, C, and $R^1$ are not substituted polyheteroaryl, unsubstituted polyheteroaryl, substituted polyaryl, or unsubstituted polyaryl; or (ii) when p is 1 and C is linked to $R^1$, A, B, C, and $R^1$, and M is cobalt, copper, nickel, manganese, or zinc, $R^1$ are not substituted polyheteroaryl, unsubstituted polyheteroaryl, substituted polyaryl, or unsubstituted polyaryl.

2. The luminescent compound of paragraph 1 having the formula:

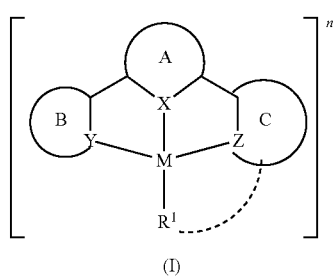

Formula II (I)

wherein:

M is a first-row transition metal (such as scandium, titanium, vanadium, chromium, manganese, iron, cobalt, nickel, copper, and zinc), preferably M is nickel or copper;

X, Y and Z are independently nitrogen or carbon;

A, B, and C are cyclic structure derivatives of phenyl groups, unsubstituted heteroaryl groups, substituted heteroaryl groups, unsubstituted heterocyclic groups, or substituted heterocyclic groups, wherein the dashed line indicates that $R^1$ is optionally linked or unlinked to C, preferably $R^1$ is not linked to C; preferably, rings A, B, and C are independently benzene, phenyl derivatives, unsubstituted heteroaryl, substituted heteroaryl groups, heteroaryl derivatives, unsubstituted heterocycle, substituted heterocycle, or heterocyclic derivatives (each optionally independently with one or more unsubstituted alkyl, unsubstituted alkenyl, unsubstituted alkynyl, unsubstituted aryl, unsubstituted cycloalkyl, OR, $NR_2$, SR, C(O)R, C(O)OR, C(O)$NR_2$, CN, $CF_3$, $NO_2$, $SO_2$, SOR, $SO_3R$, halo, unsubstituted aryl, substituted aryl, unsubstituted heteroaryl, substituted heteroaryl, unsubstituted heterocyclic, or unsubstituted heterocyclic groups, wherein R is independently unsubstituted alkyl, unsubstituted alkenyl, unsubstituted alkynyl, unsubstituted alkyaryl, unsubstituted aryl, or unsubstituted cycloalkyl);

$R^1$ is any carbon or heteroatom donor ligand, halide or pseudohalide, which could be either anionic or neutral, preferably, $R^1$ is selected from, but not limited to, unsubstituted alkyl, substituted alkyl, unsubstituted aryl, substituted aryl, unsubstituted heteroaryl, substituted heteroaryl, unsubstituted polyaryl, substituted polyaryl, unsubstituted alkynyl, substituted alkynyl, unsubstituted alkoxy, amide, thiolate, phosphide, chloride, bromide, iodide, cyanate, thiocyanate, cyanide, isocyanide, or N-heterocyclic carbene; and n is zero, a positive integer, or a negative integer.

3. The luminescent compound of paragraph 1 or 2, wherein M has a $d^6$, $d^7$, or $d^8$ electron configuration.

4. The luminescent compound of any one of paragraphs 1 to 3, wherein M has an oxidation state of 0, 1, +2, or +3, preferably +2.

5. The luminescent compound of any one of paragraphs 1 to 4, wherein M is nickel.

6. The luminescent compound of any one of paragraphs 1 to 5, wherein A, B, and C are each independently unsubstituted heteroaryl, substituted heteroaryl, unsubstituted aryl, substituted aryl, unsubstituted polyheteroaryl, substituted polyheteroaryl, unsubstituted polyaryl, substituted polyaryl, substituted cycloalkyl, unsubstituted cycloalkyl, substituted heterocyclyl, unsubstituted heterocyclyl, substituted cycloalkenyl, unsubstituted cycloalkenyl, substituted cycloalkynyl, or unsubstituted cycloalkynyl, wherein, preferably, a bond between at least one of A, B, and C and M is metal-carbon σ-bond.

7. The luminescent compound of any one of paragraphs 1 to 6, wherein A, B, and C are independently unsubstituted heteroaryl, substituted heteroaryl, unsubstituted aryl, or substituted aryl.

8. The luminescent compound of any one of paragraphs 1 to 7, displaying photoluminescence or electroluminescence.

9. The luminescent compound of any one of paragraphs 1 to 8, having a square-planar geometry.

10. The luminescent compound of any one of paragraphs 1 to 9, wherein the luminescent compound emits light at room temperature, low temperature, or both.

11. The luminescent compound of any one of paragraphs 1 to 10, wherein the compound is in a solid, liquid, glassy, or solution state.

12. The luminescent compound of any one of paragraphs 1 to 11, wherein the luminescent compound has photoluminescent properties in a spectral range between 380 nm and 1050 nm, inclusive.

13. The luminescent compound of any one of paragraphs 1 to 12, wherein the luminescent compound emits light in response to (i) the passage of an electric current or (ii) to an electric field.

14. The luminescent compound of any one of paragraphs 1 to 13, wherein the luminescent compound emits light independent of its concentration.

15. The luminescent compound of any one of paragraphs 1 to 14, wherein C is not linked to $R^1$.

16. The luminescent compound of any one of paragraphs 1 to 15, selected from
(compound 1)
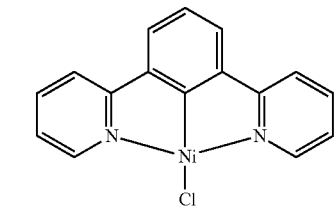
(compound 2)
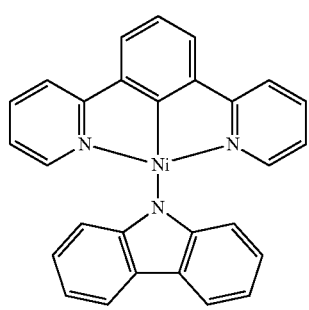
(compound 3)
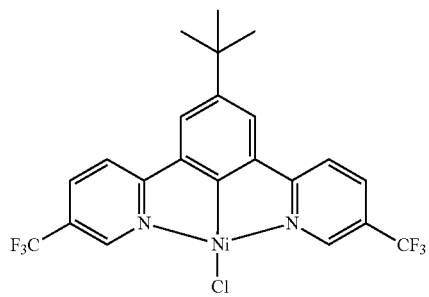
(compound 4)
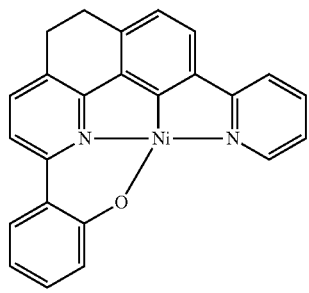
(compound 5)
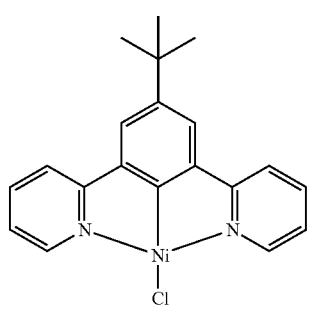
(compound 6)
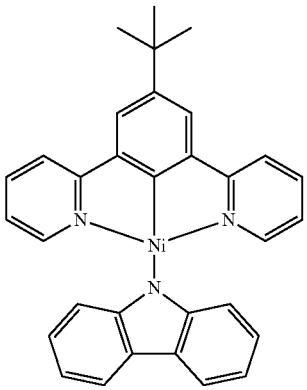
(compound 7)
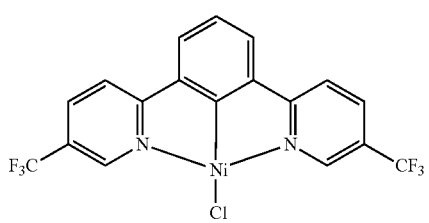
(compound 8)
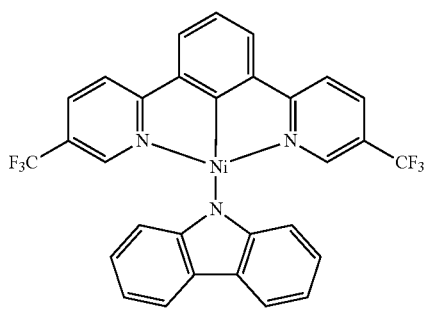
(compound 9)
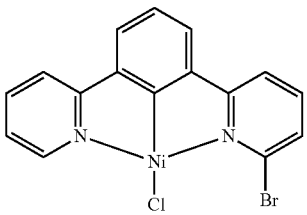
(compound 10)
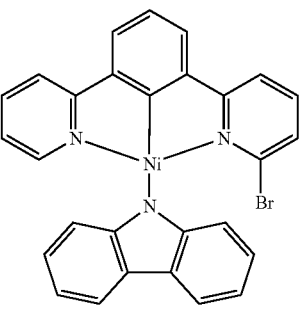

-continued
(compound 11)
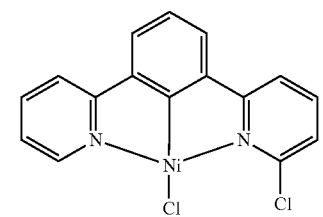
(compound 12)
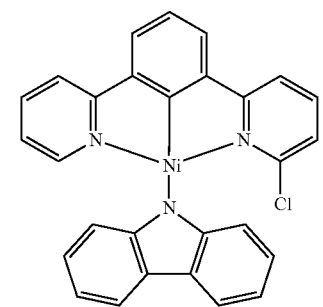
(compound 13)
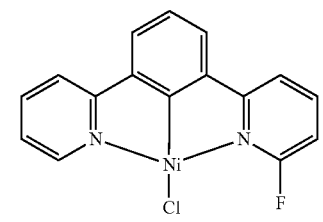
(compound 14)
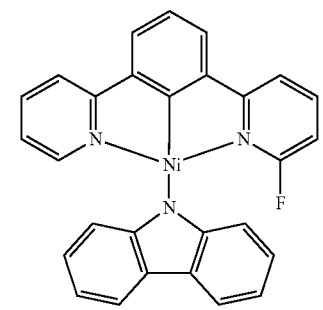
(compound 15)
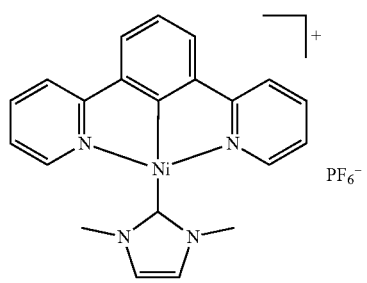
(compound 16)
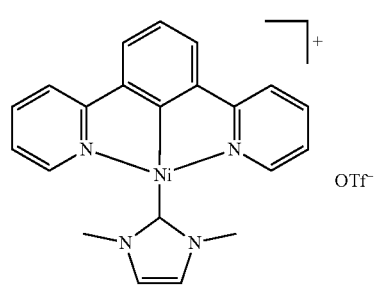
-continued
(compound 17)
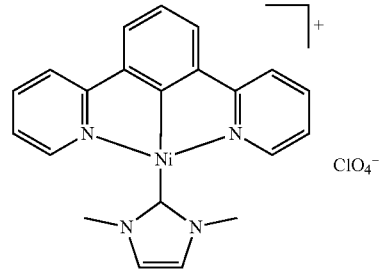
(compound 18)
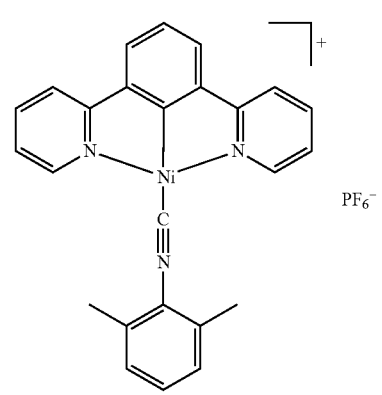
(compound 19)
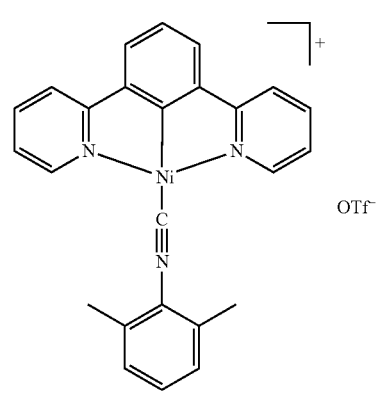
(compound 20)
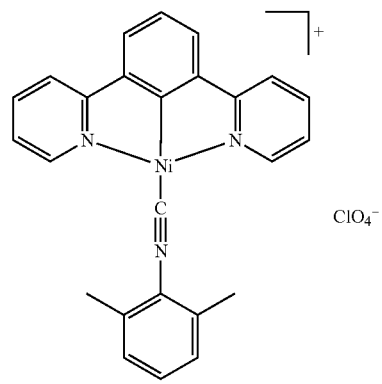

(compound 21)
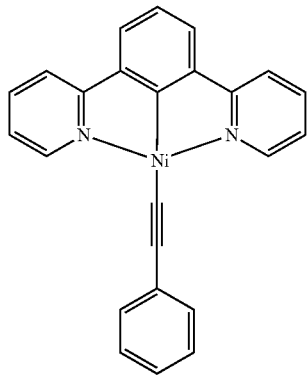
(compound 25)
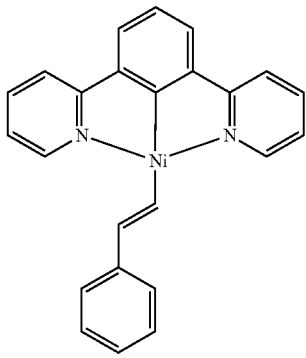
(compound 22)
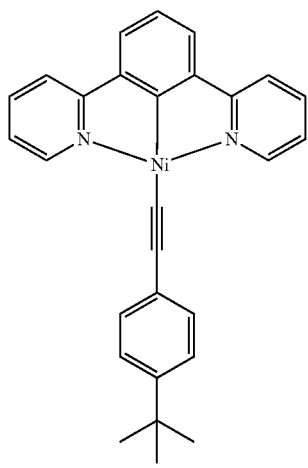
(compound 26)
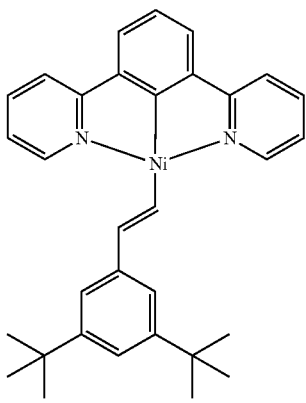
(compound 23)
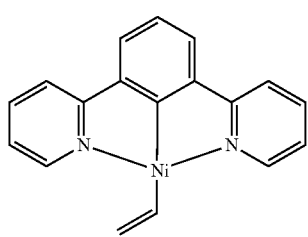
(compound 27)
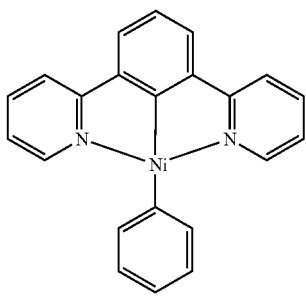
(compound 24)
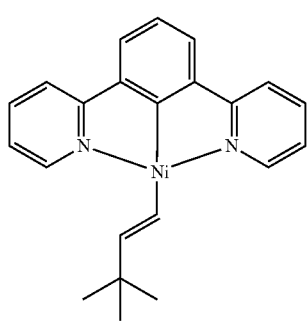
(compound 28)
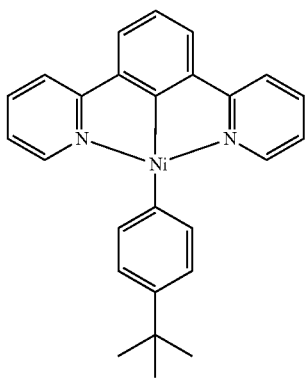

(compound 29)
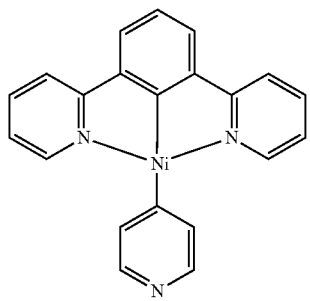
(compound 30)
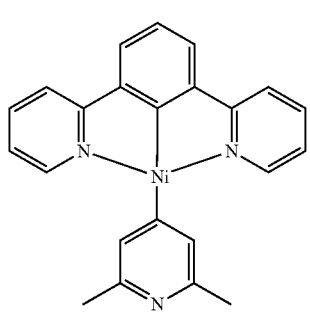
(compound 31)
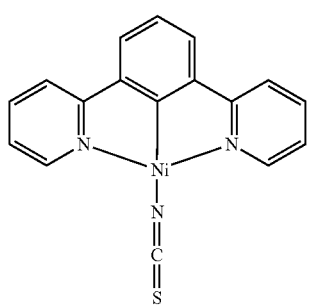
(compound 32)
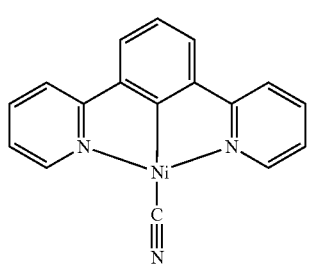
(compound 33)
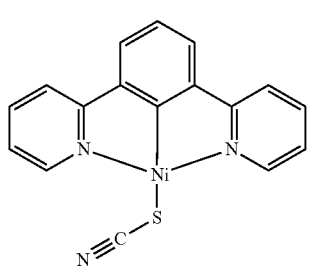
(compound 34)
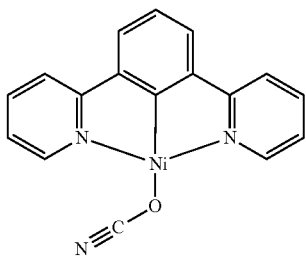
(compound 35)
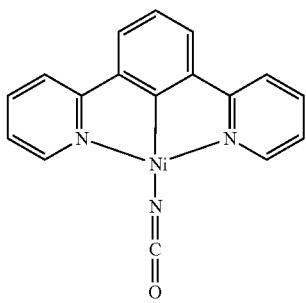
(compound 36)
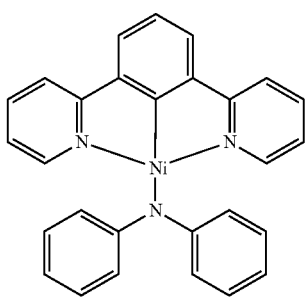
(compound 37)
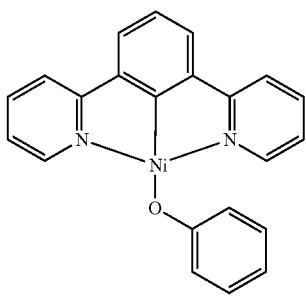
(compound 38)
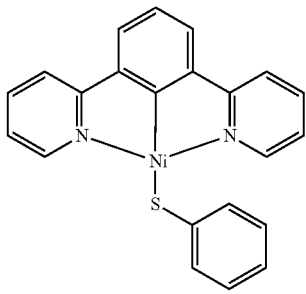

(compound 39)
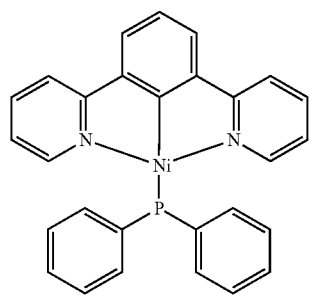
(compound 40)
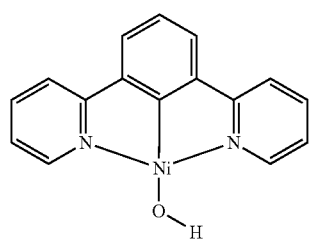
(compound 41)
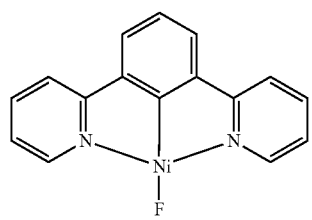
(compound 42)
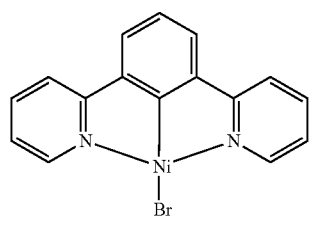
(compound 43)
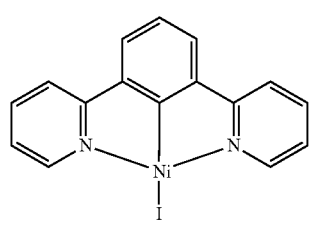
(compound 44)
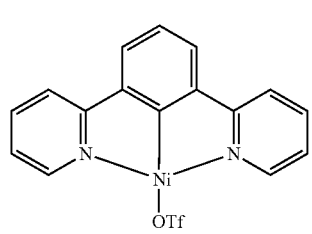
(compound 45)
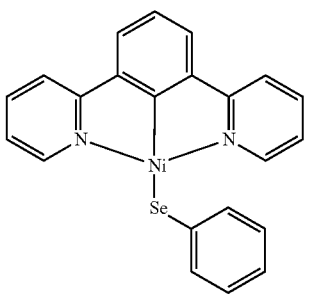
(compound 46)
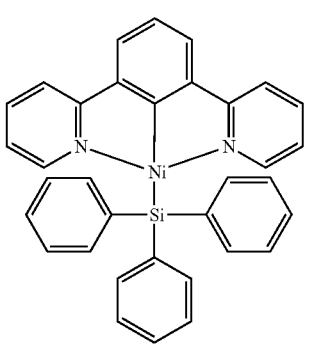
(compound 47)
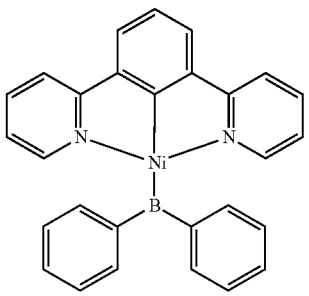
(compound 48)
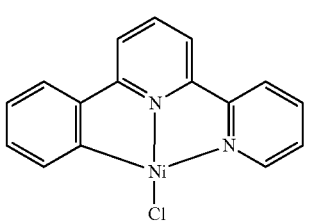
(compound 49)
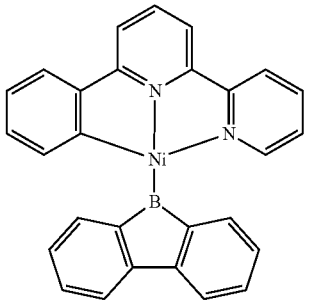

(compound 50)
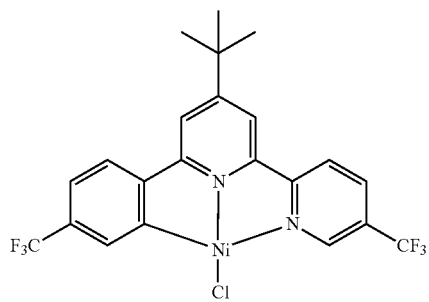
(compound 51)
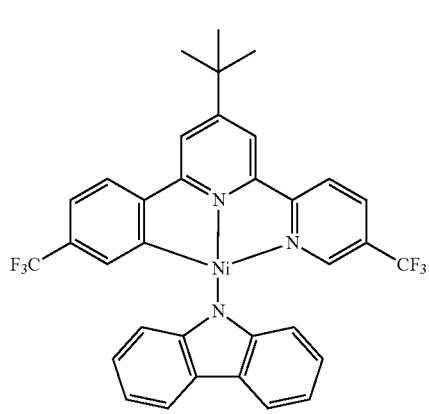
(compound 52)
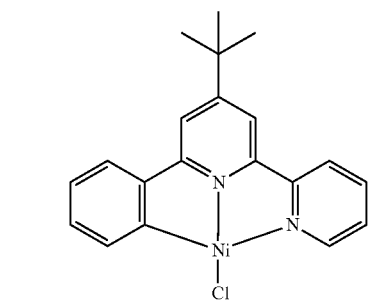
(compound 53)
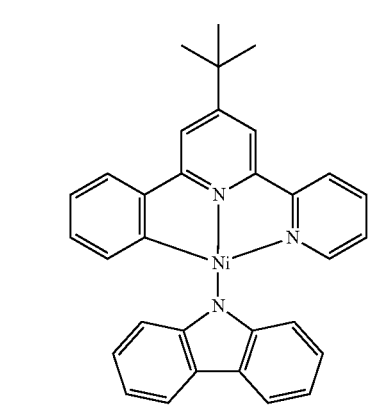
(compound 54)
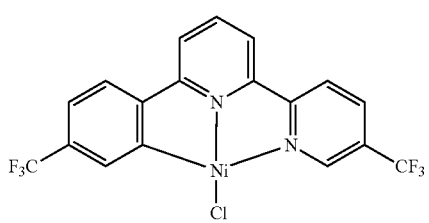
(compound 55)
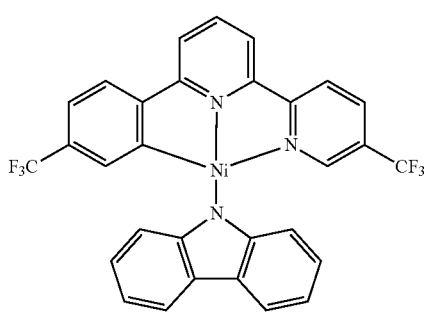
(compound 56)
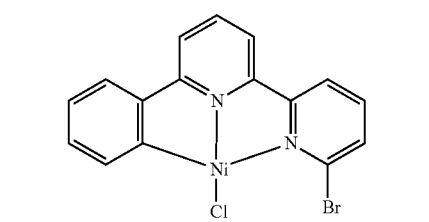
(compound 57)
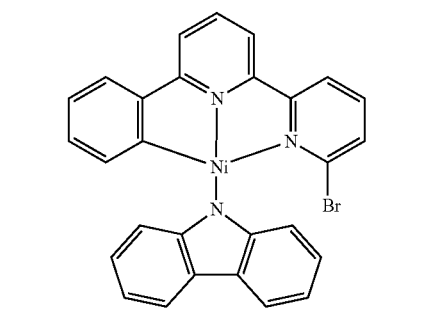
(compound 58)
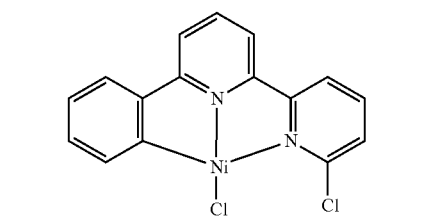
(compound 59)
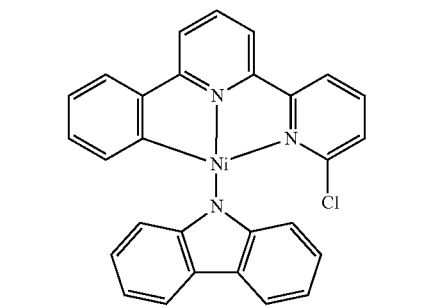

-continued
(compound 60)
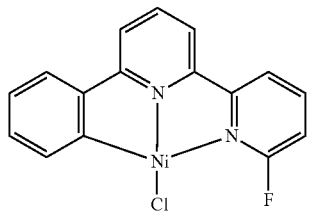
(compound 61)
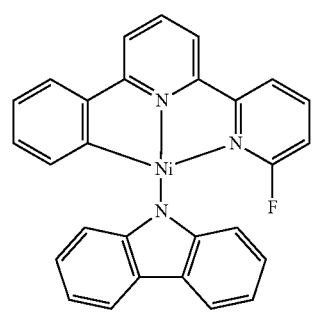
(compound 62)
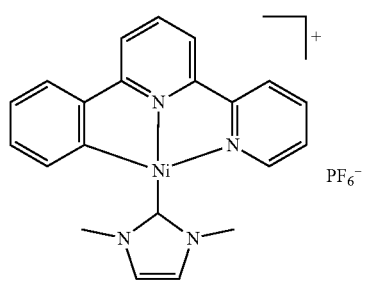
(compound 63)
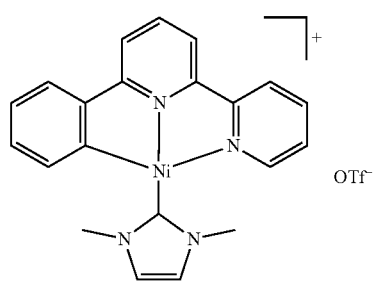
(compound 64)
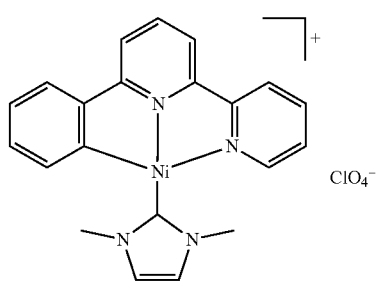
-continued
(compound 65)
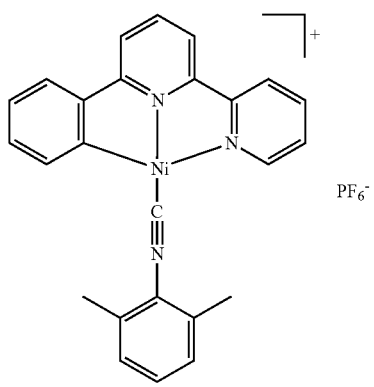
(compound 66)
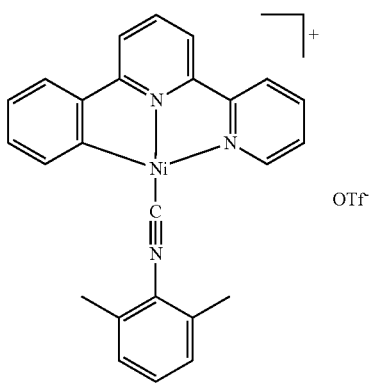
(compound 67)
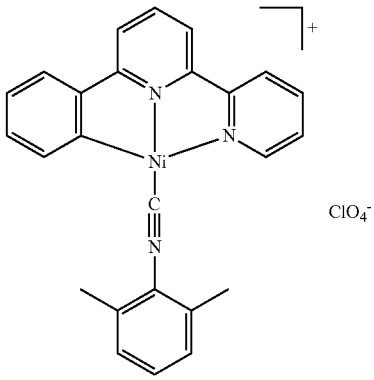
(compound 68)
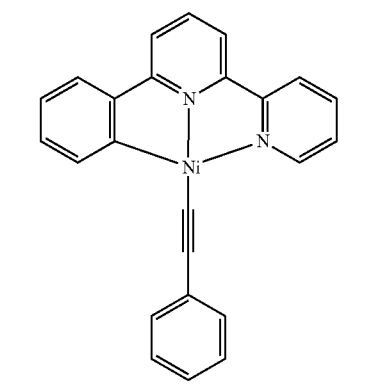

-continued
(compound 69)
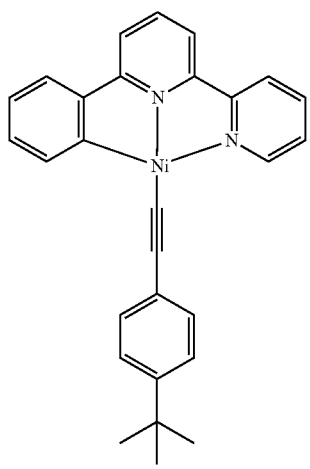
(compound 70)
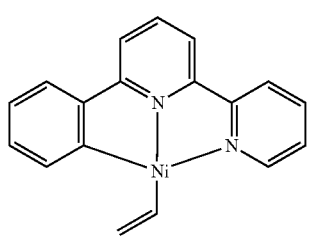
(compound 71)
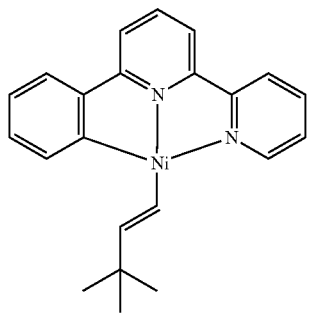
(compound 72)
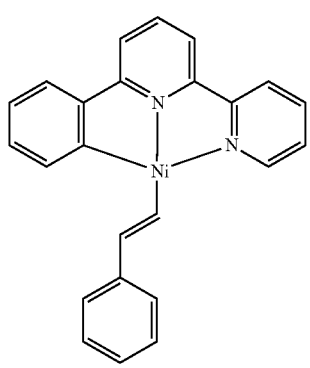
-continued
(compound 73)
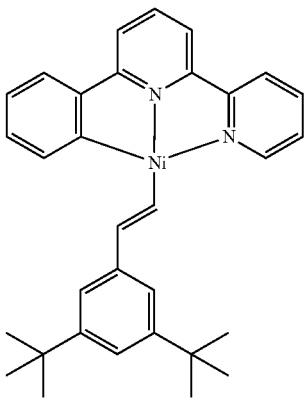
(compound 74)
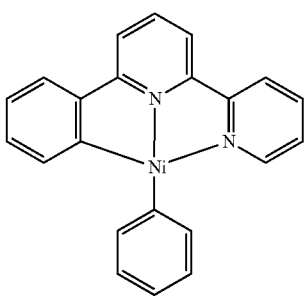
(compound 75)
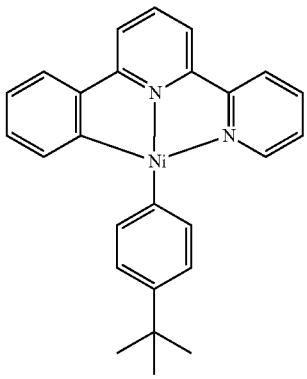
(compound 76)
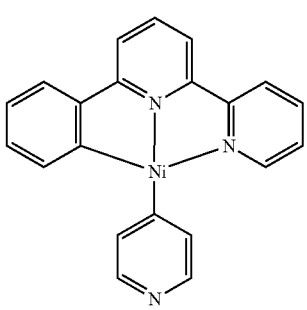

(compound 77)
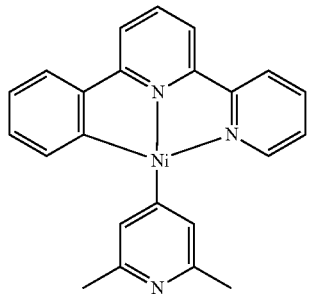
(compound 78)
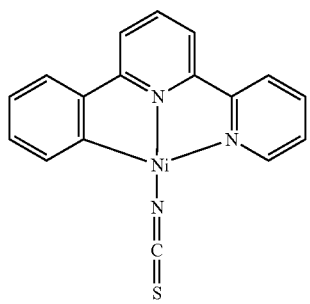
(compound 79)
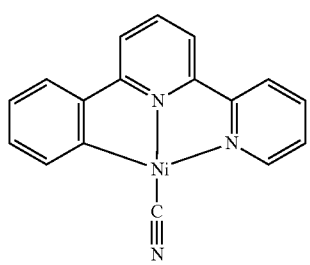
(compound 80)
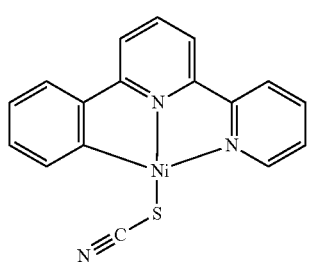
(compound 81)
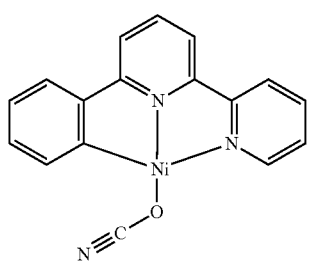
(compound 82)
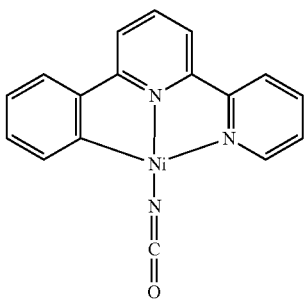
(compound 83)
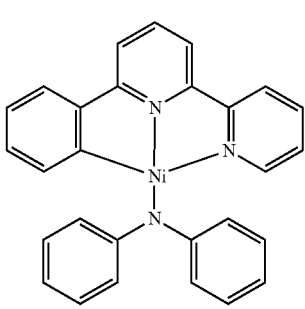
(compound 84)
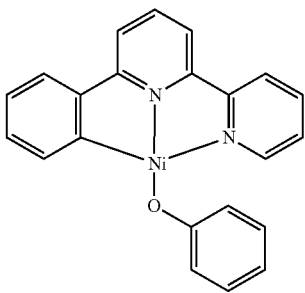
(compound 85)
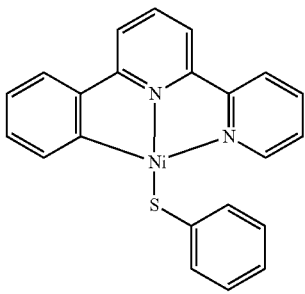
(compound 86)
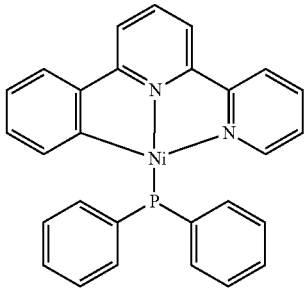

-continued
(compound 87)
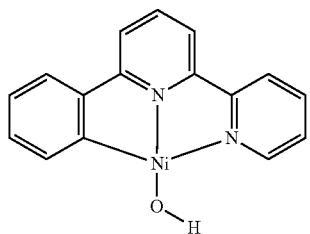
(compound 88)
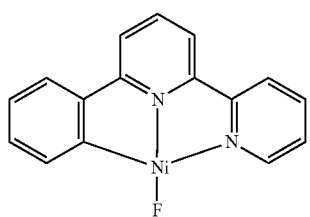
(compound 89)
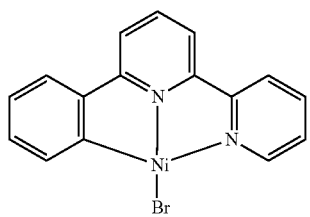
(compound 90)
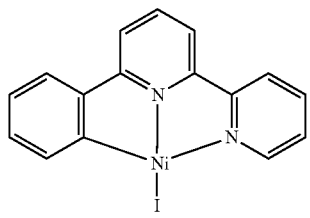
(compound 91)
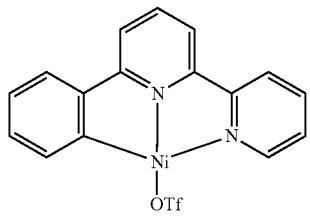
(compound 92)
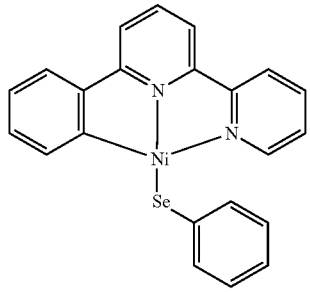
-continued
(compound 93)
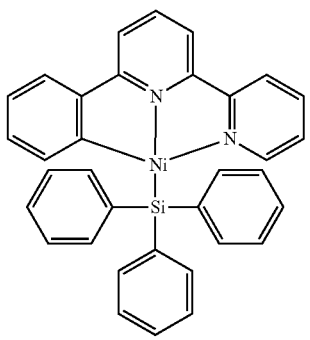
(compound 94)
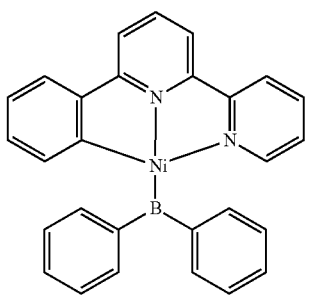
(compound 95)
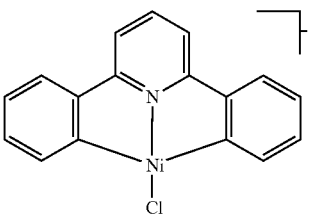
(compound 96)
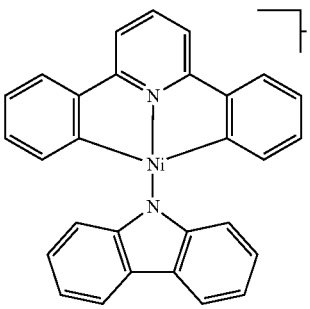
(compound 97)
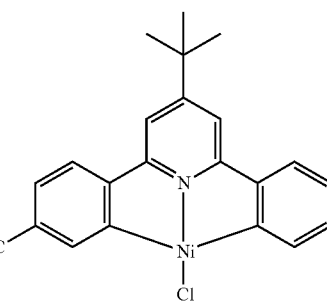

-continued
(compound 98)
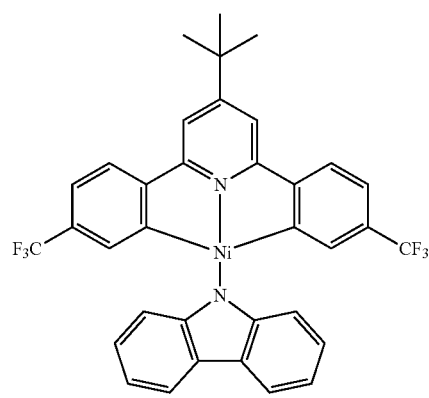
(compound 99)
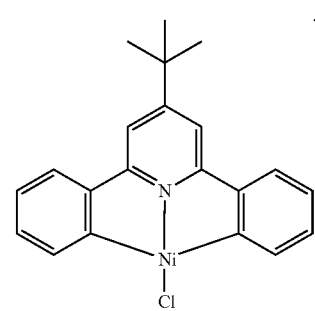
(compound 100)
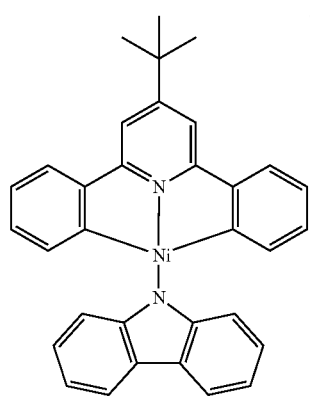
(compound 101)
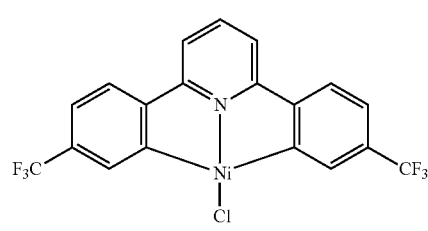
(compound 102)
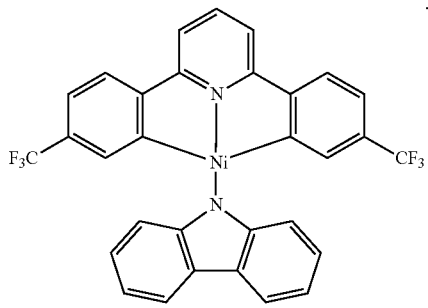
(compound 103)
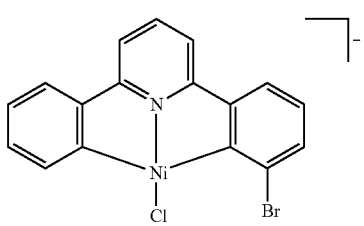
(compound 104)
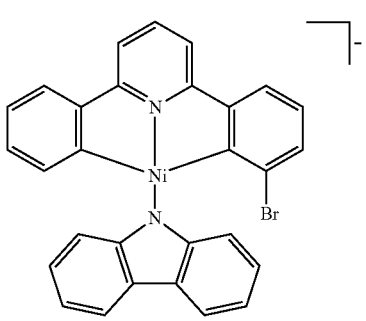
(compound 105)
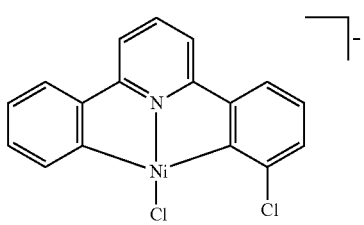
(compound 106)
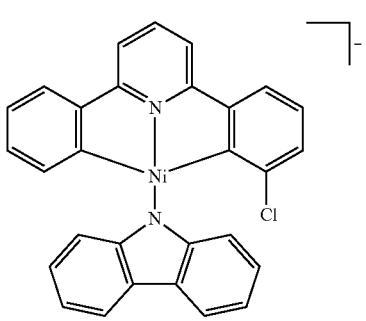
(compound 107)
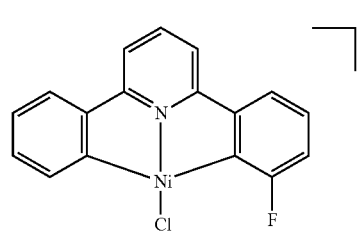

-continued
(compound 108)
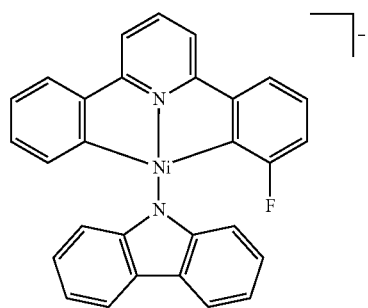
(compound 109)
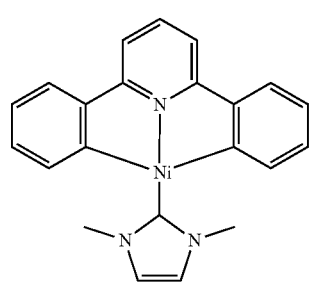
(compound 110)
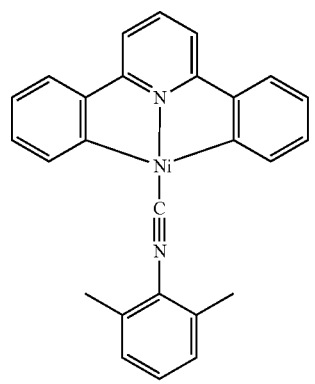
(compound 111)
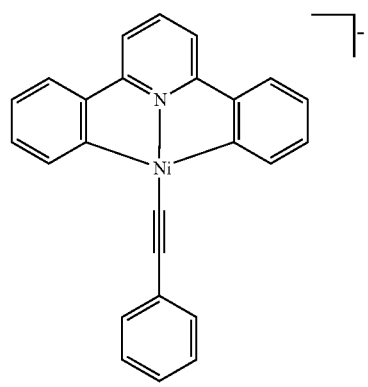
-continued
(compound 112)
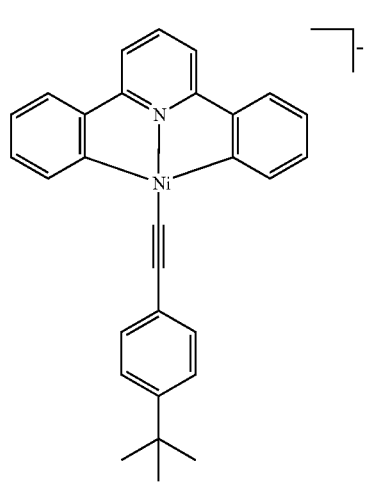
(compound 113)
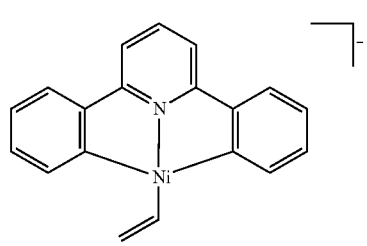
(compound 114)
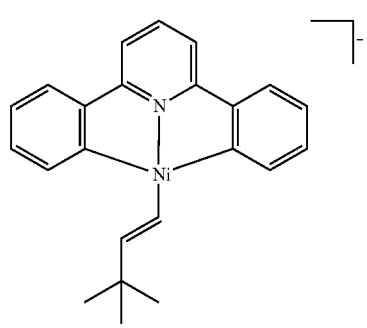
(compound 115)
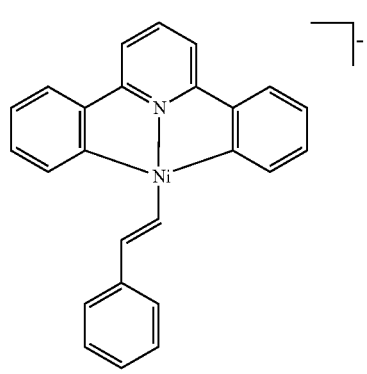

(compound 116)
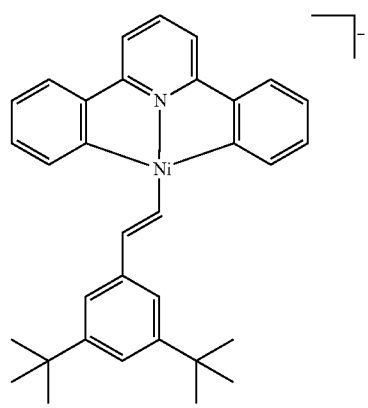
(compound 117)
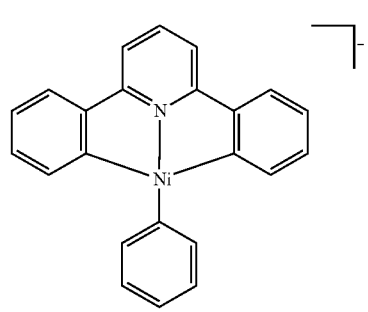
(compound 118)
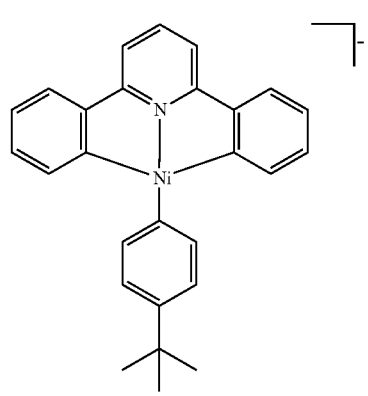
(compound 119)
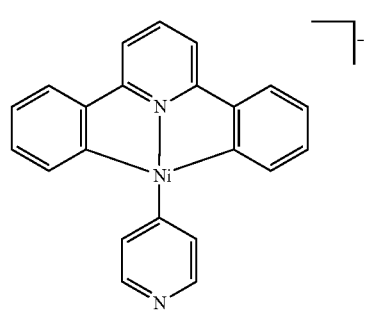
(compound 120)
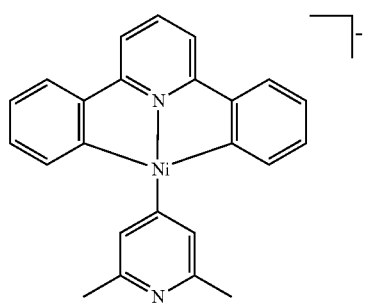
(compound 121)
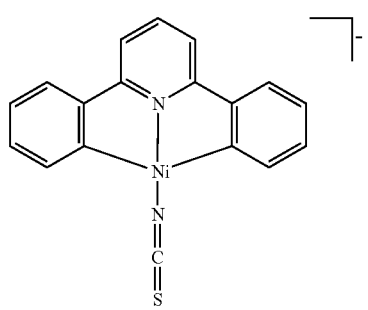
(compound 122)
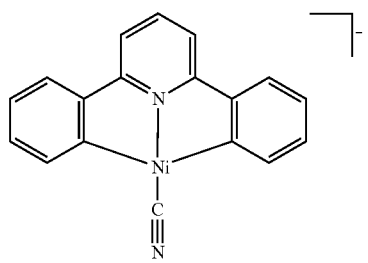
(compound 123)
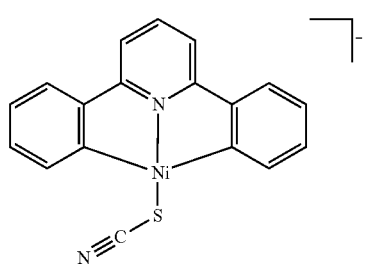
(compound 124)

(compound 125)
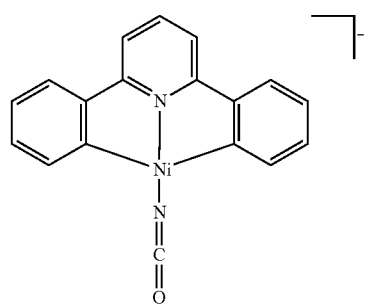
(compound 126)
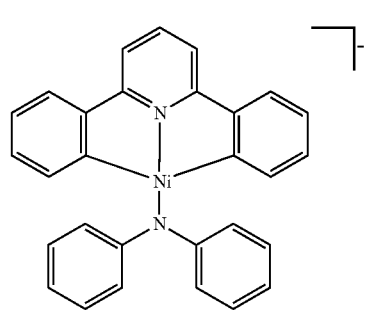
(compound 127)
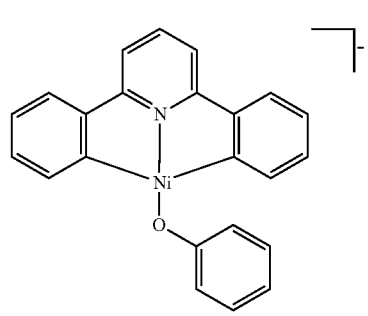
(compound 128)
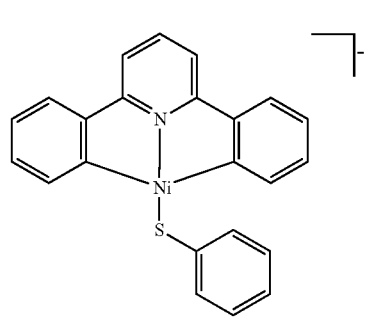
(compound 129)
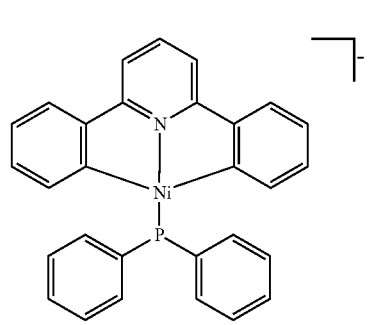
(compound 130)
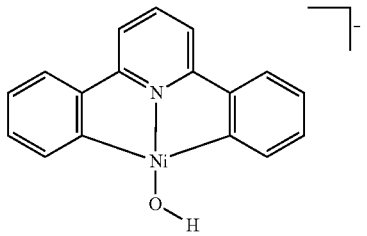
(compound 131)
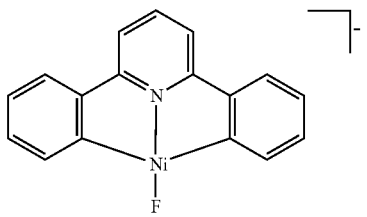
(compound 132)
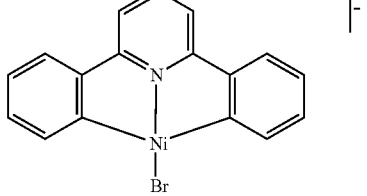
(compound 133)
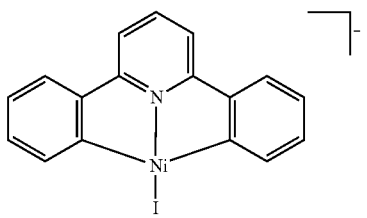
(compound 134)
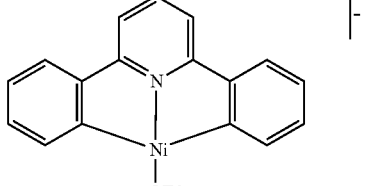
(compound 135)
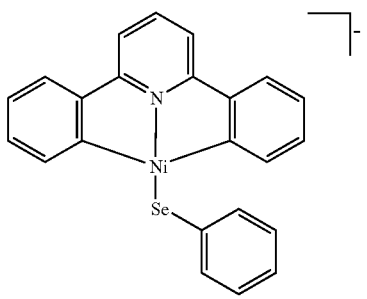

(compound 136)
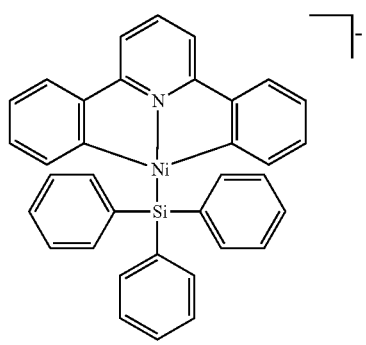
(compound 141)
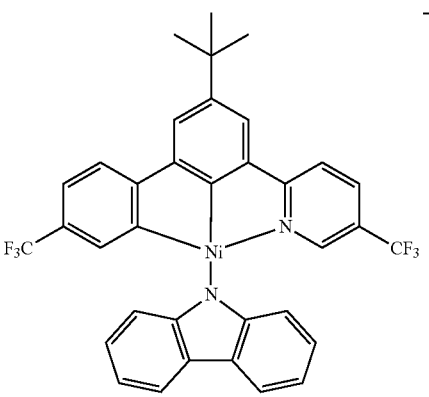
(compound 137)
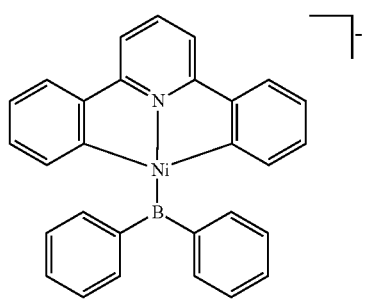
(compound 142)
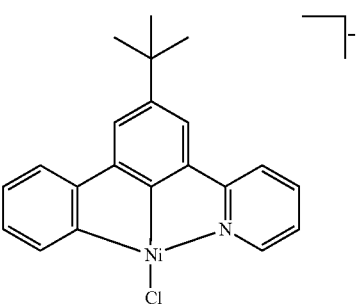
(compound 138)
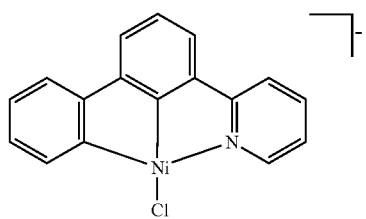
(compound 139)
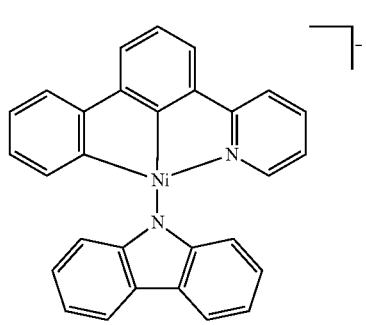
(compound 143)
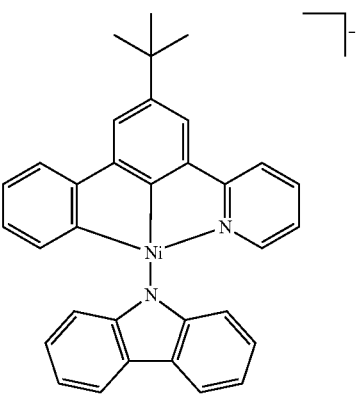
(compound 140)
(compound 144)
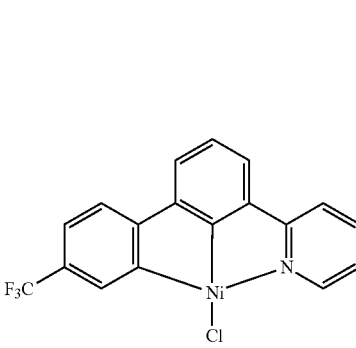

(compound 145)
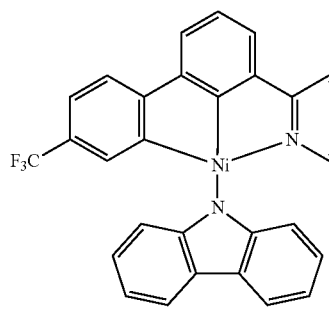
(compound 146)
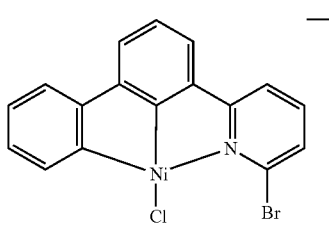
(compound 147)
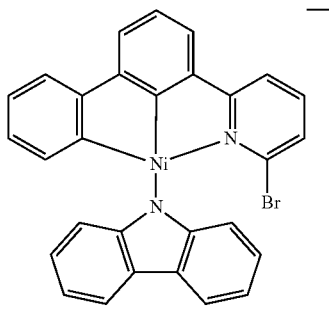
(compound 148)
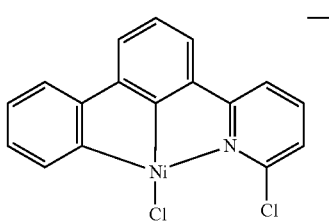
(compound 149)
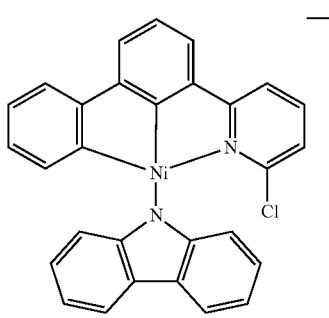
(compound 150)
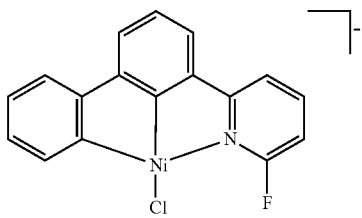
(compound 151)
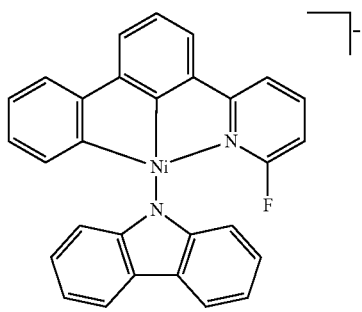
(compound 152)
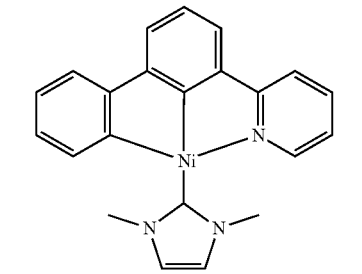
(compound 153)
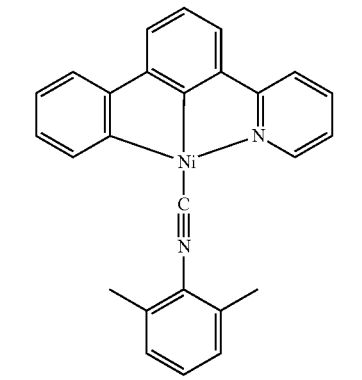
(compound 154)
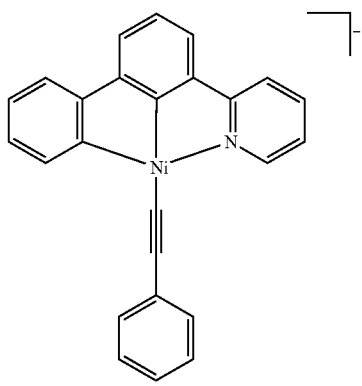

(compound 155)
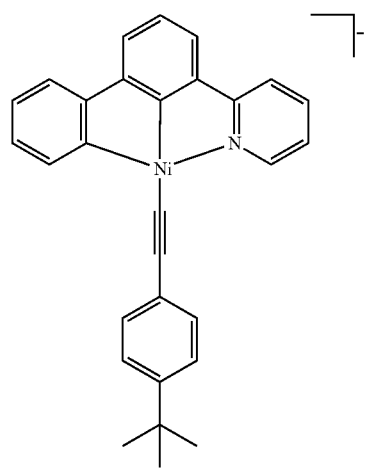
(compound 156)
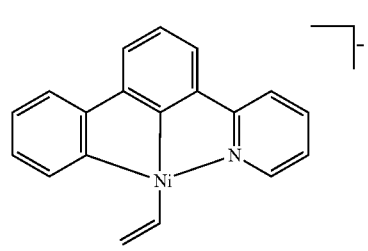
(compound 157)
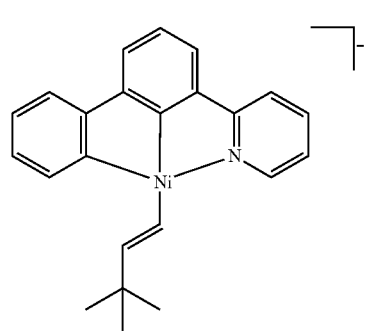
(compound 158)
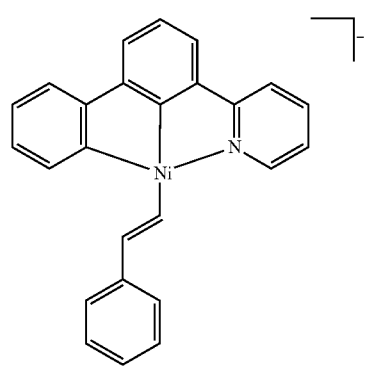
(compound 159)
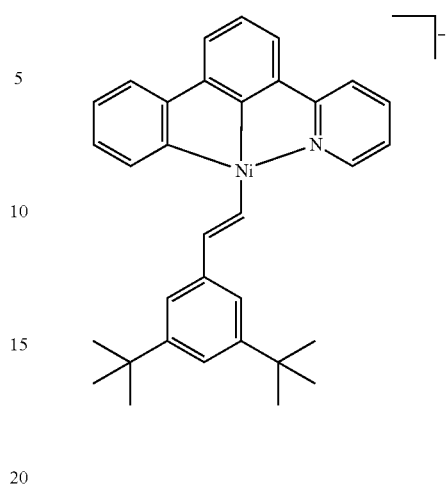
(compound 160)
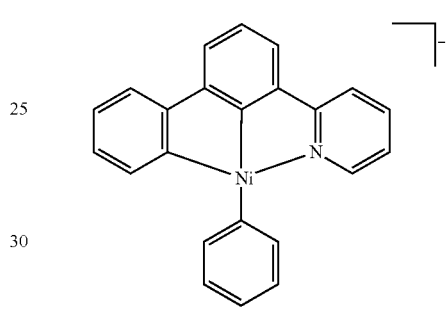
(compound 161)
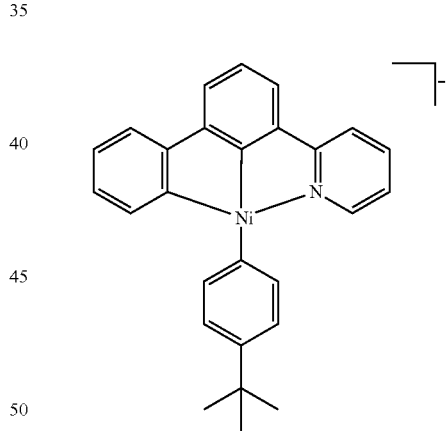
(compound 162)
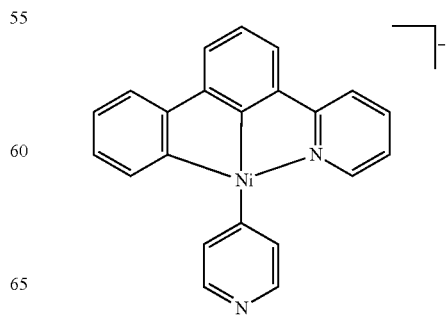

(compound 163)
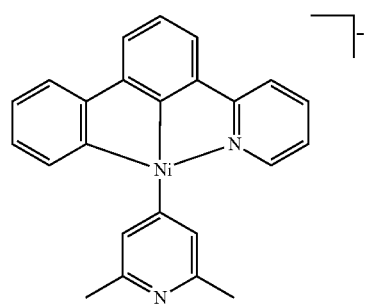
(compound 164)
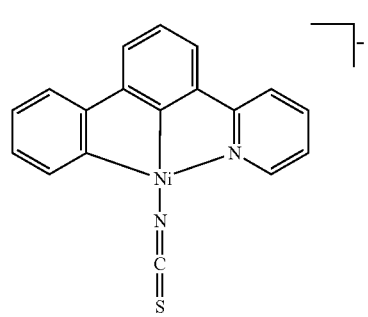
(compound 165)
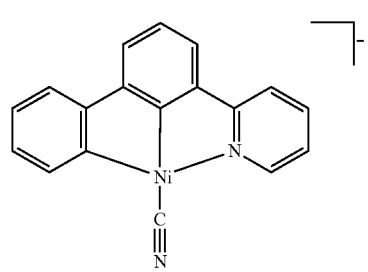
(compound 166)
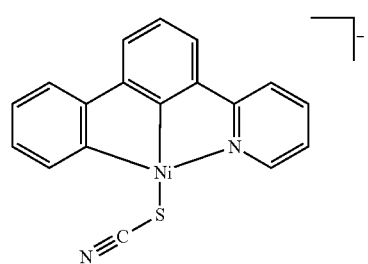
(compound 167)
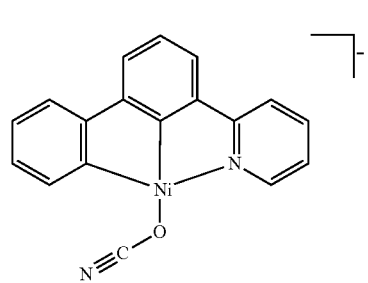
(compound 168)
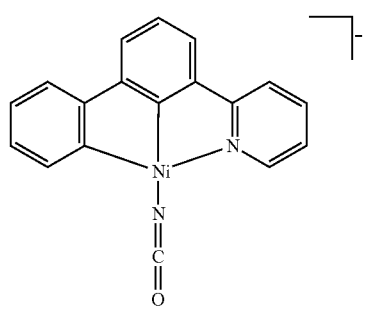
(compound 169)
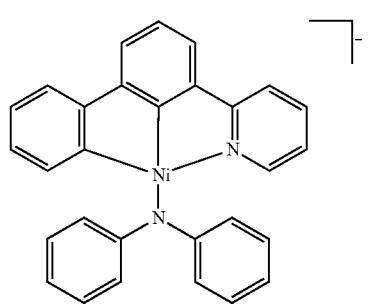
(compound 170)
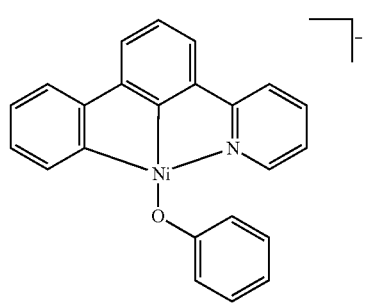
(compound 171)
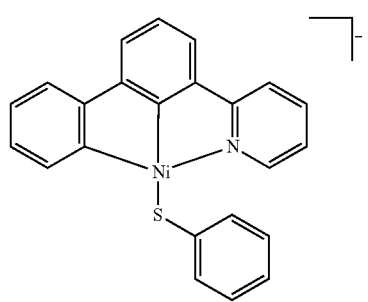
(compound 172)
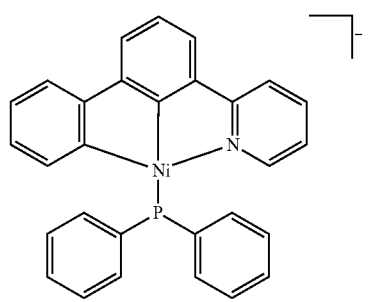

(compound 173)
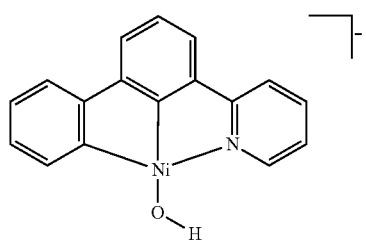
(compound 174)
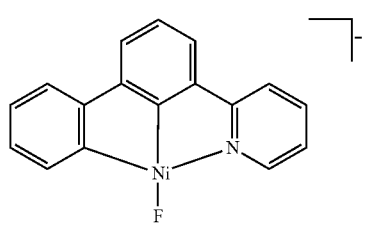
(compound 175)
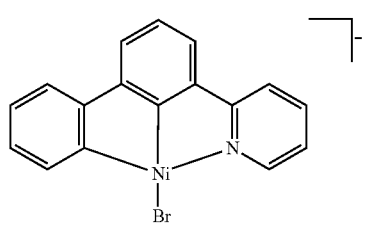
(compound 176)
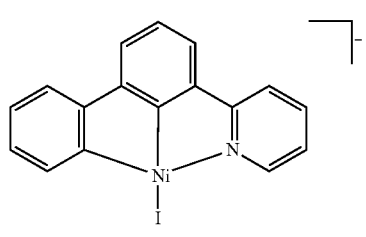
(compound 177)
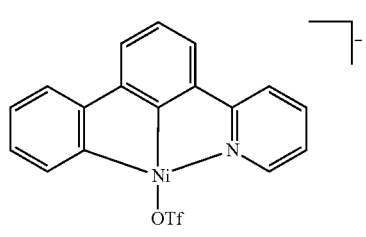
(compound 178)
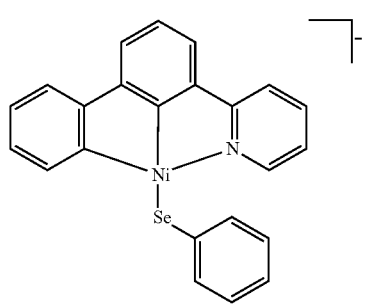
(compound 179)
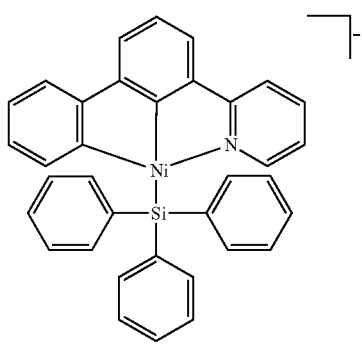
(compound 180)
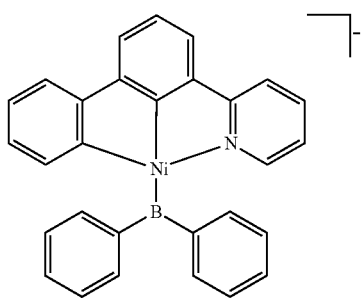
(compound 181)
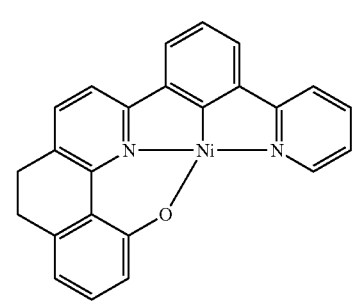
(compound 182)
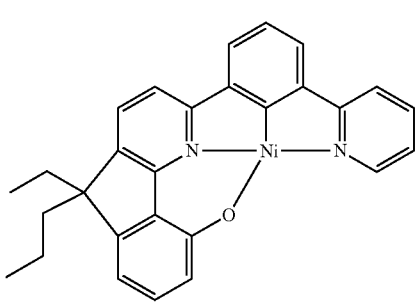
(compound 183)
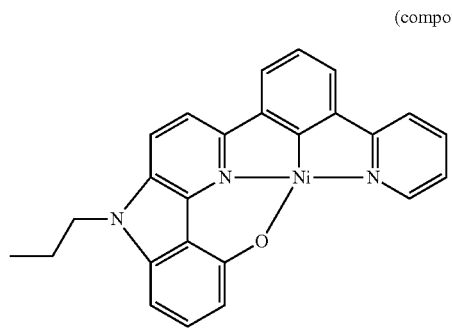

(compound 184)
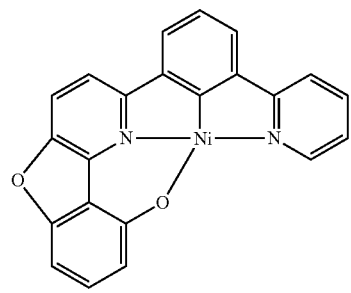
(compound 185)
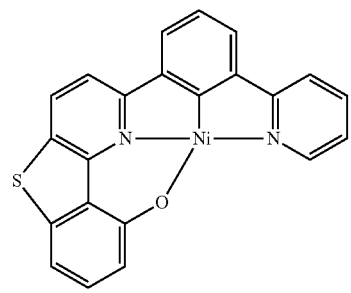
(compound 186)
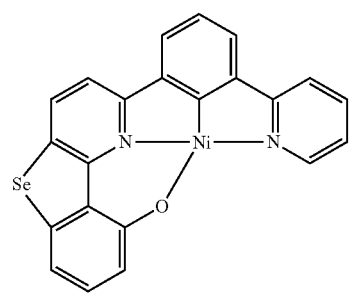
(compound 187)
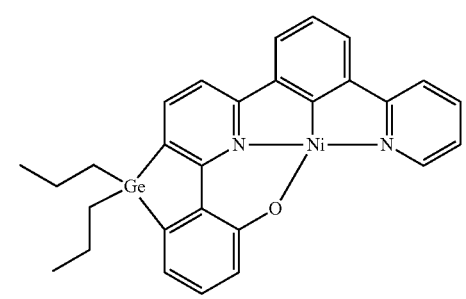
(compound 188)
(compound 189)
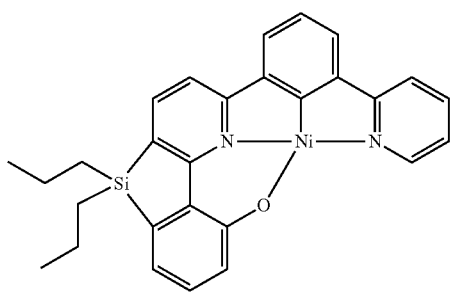
(compound 190)
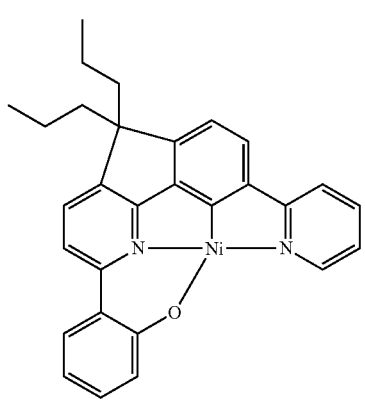
(compound 191)
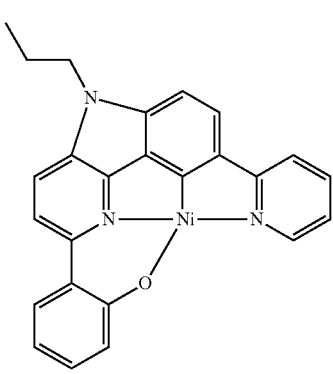
(compound 192)
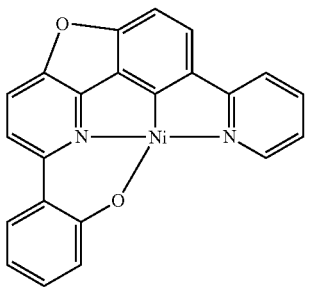

-continued
(compound 193)
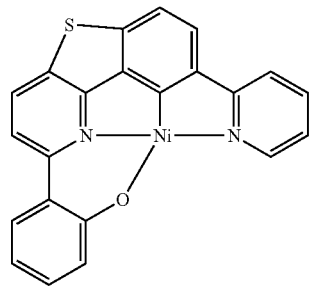
(compound 194)
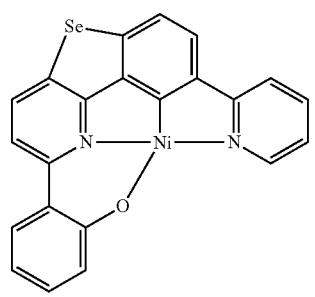
(compound 195)
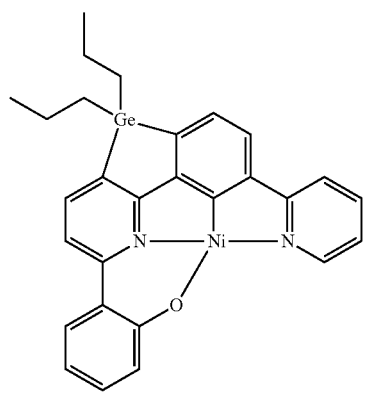
(compound 196)
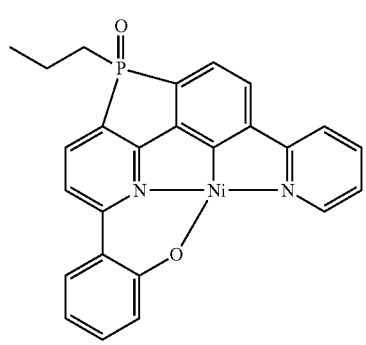
-continued
(compound 197)
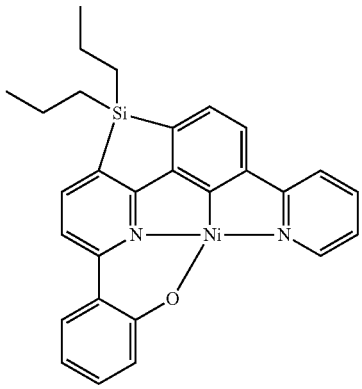
(compound 198)
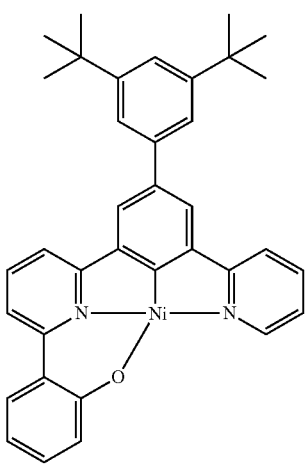
(compound 199)
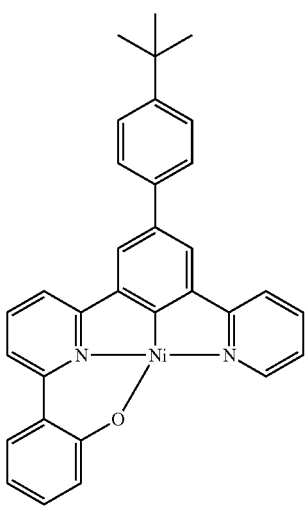

(compound 200)
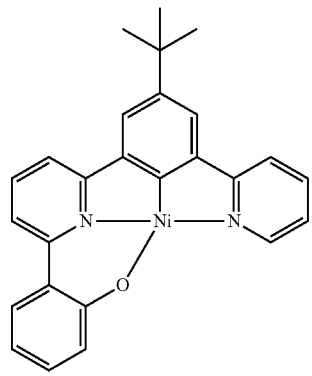
(compound 204)
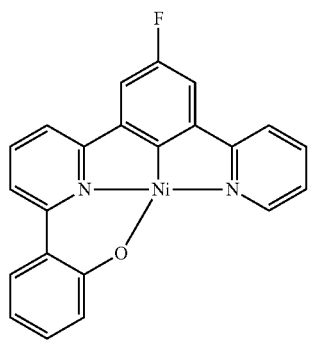
(compound 201)
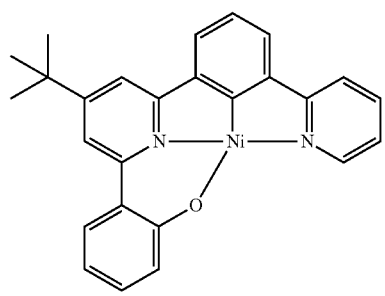
(compound 205)
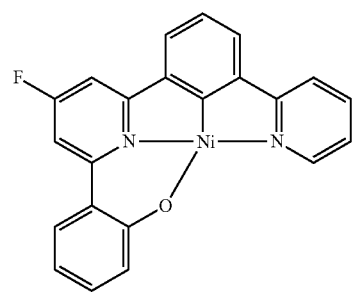
(compound 202)
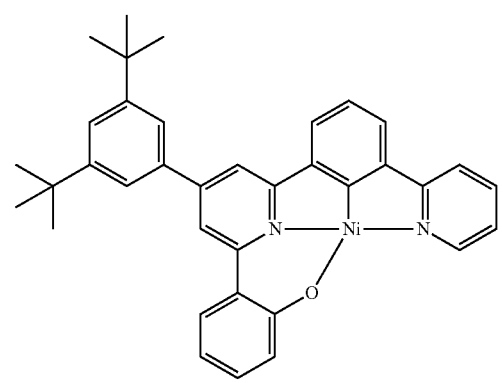
(compound 206)
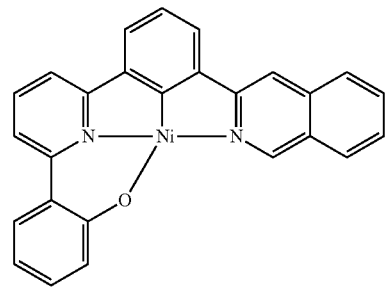
(compound 207)
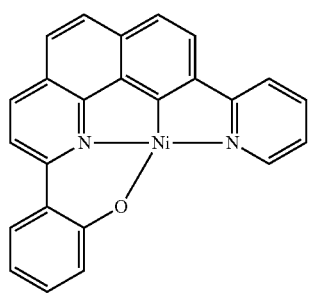
(compound 203)
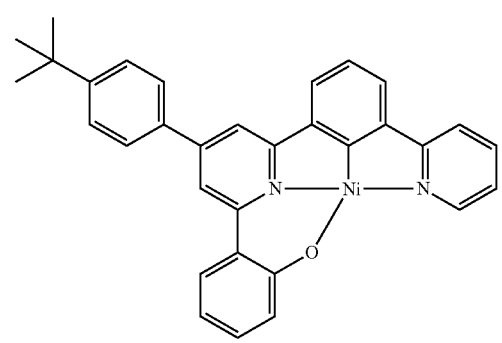
(compound 208)
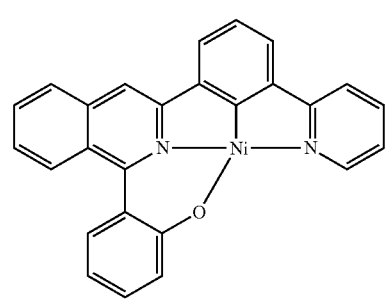

(compound 209)
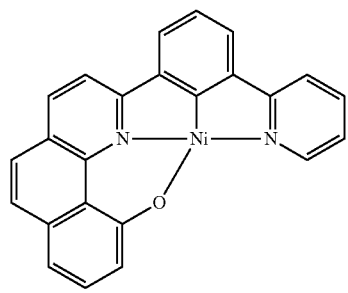
(compound 210)
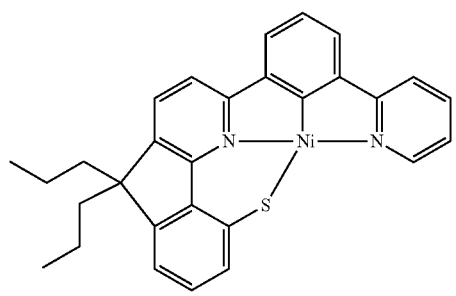
(compound 211)
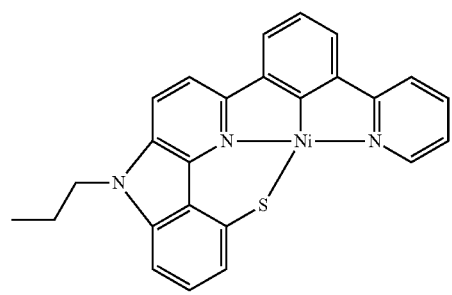
(compound 212)
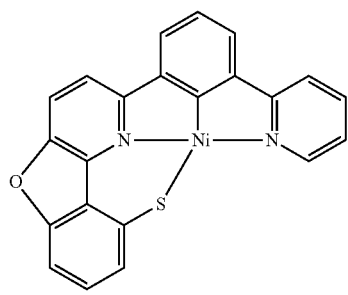
(compound 213)
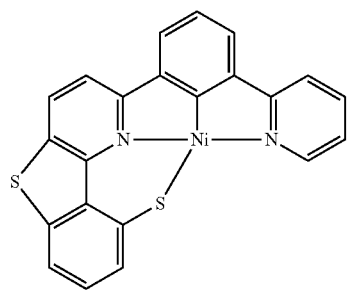
(compound 214)
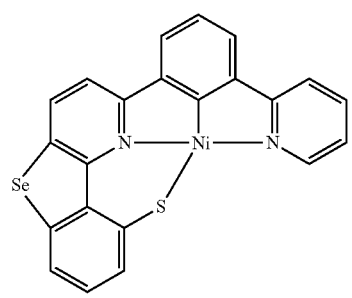
(compound 215)
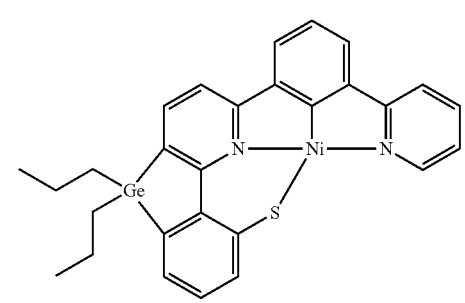
(compound 216)
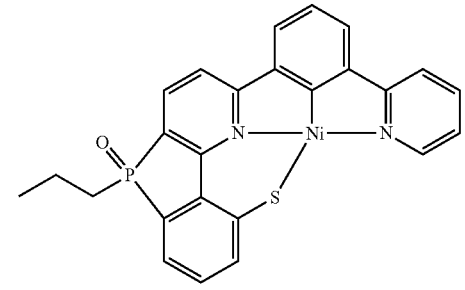
(compound 217)
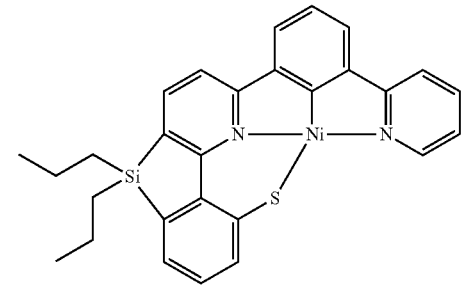
(compound 218)
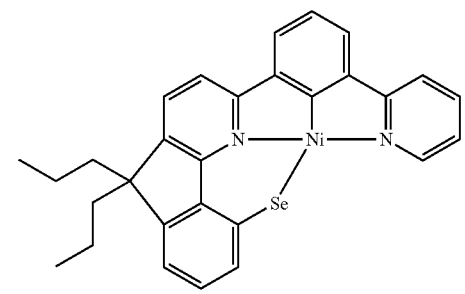

(compound 219)
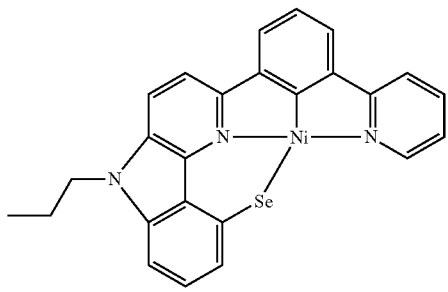
(compound 220)
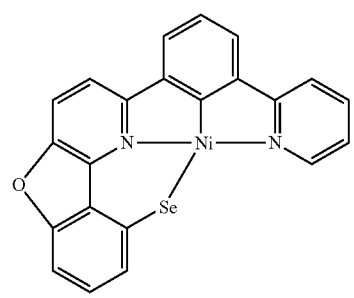
(compound 221)
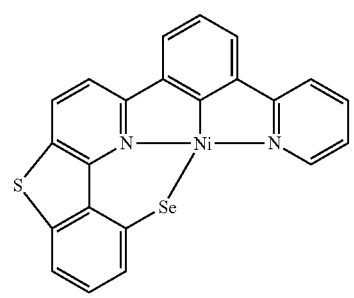
(compound 222)
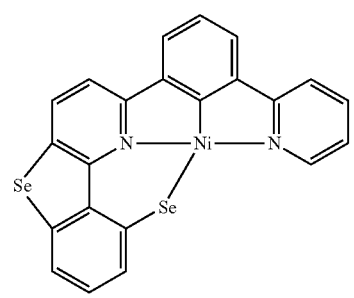
(compound 223)
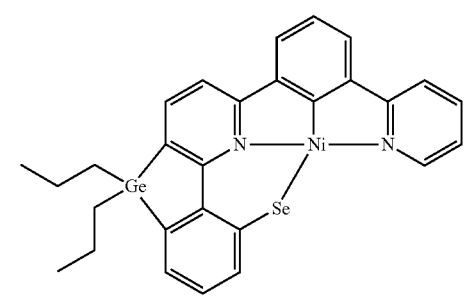
(compound 224)
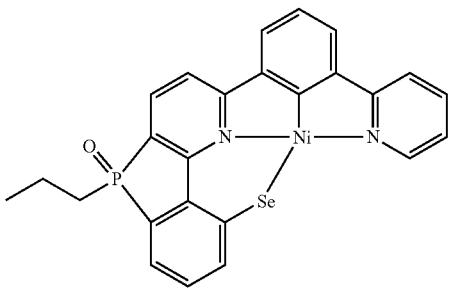
(compound 225)
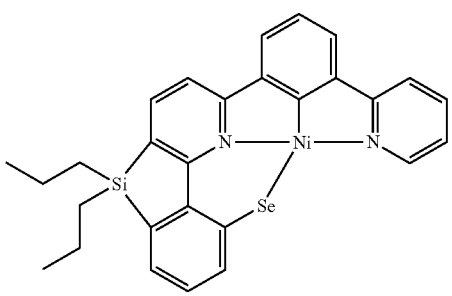
(compound 226)
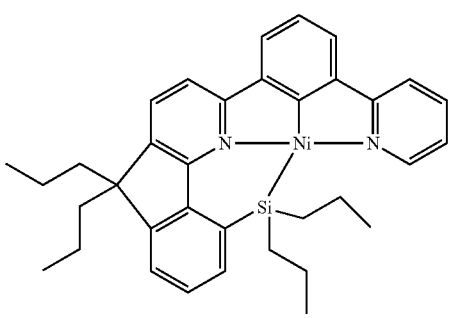
(compound 227)
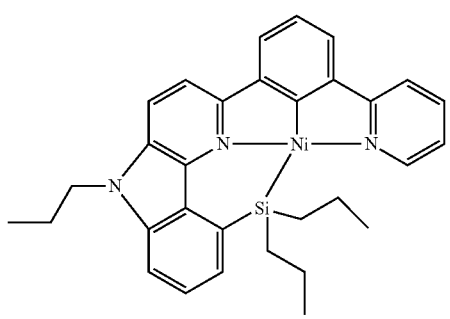
(compound 228)
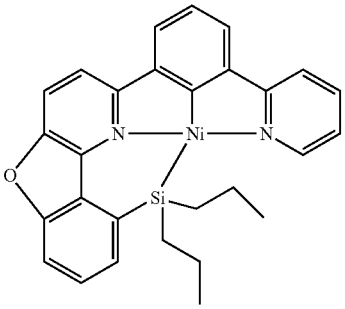

(compound 229)
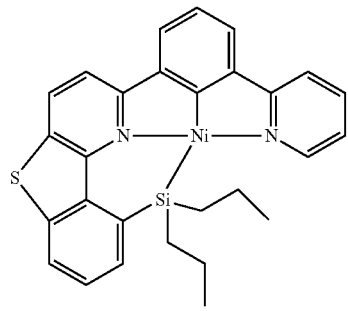
(compound 230)
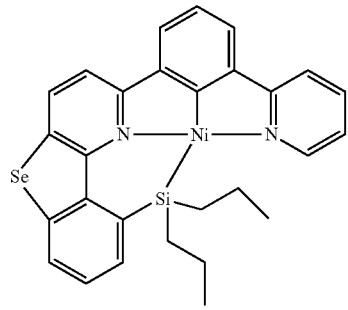
(compound 231)
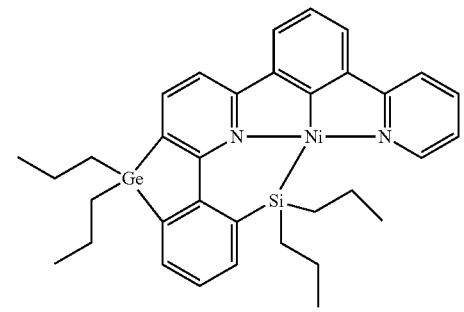
(compound 232)
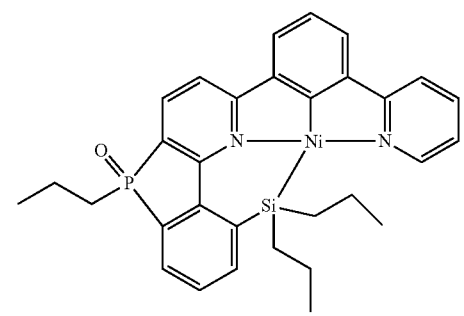
(compound 233)
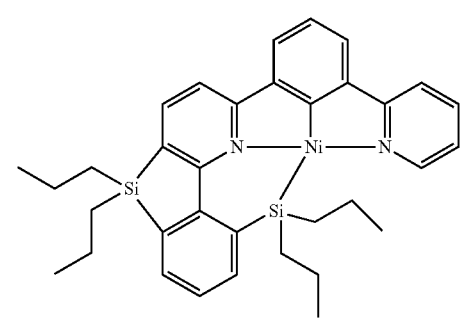
(compound 234)
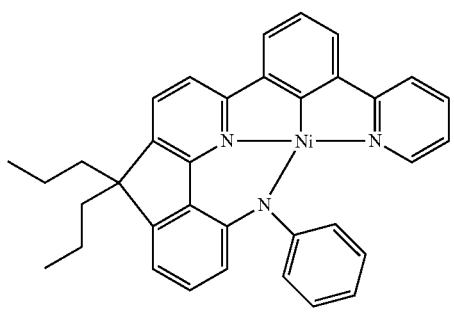
(compound 235)
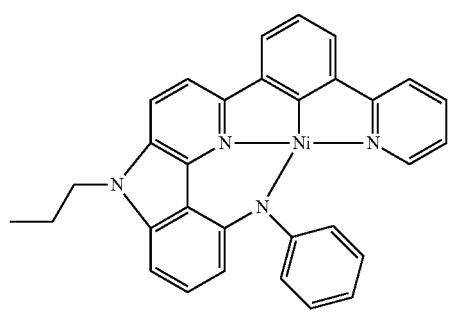
(compound 236)
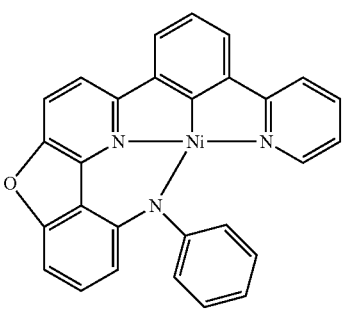
(compound 237)
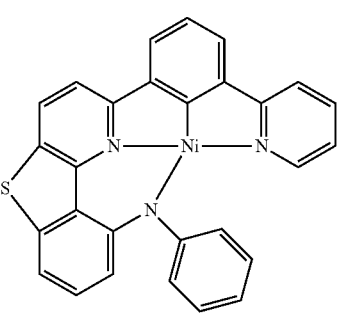
(compound 238)
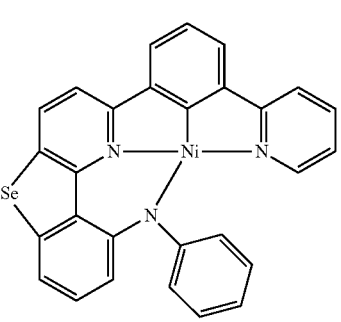

(compound 239)
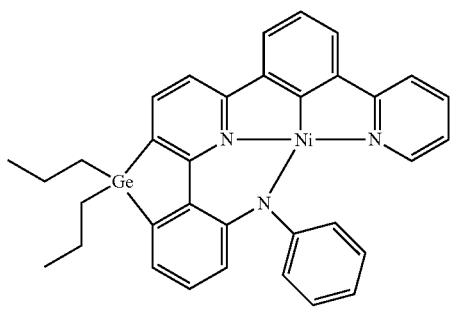
(compound 240)
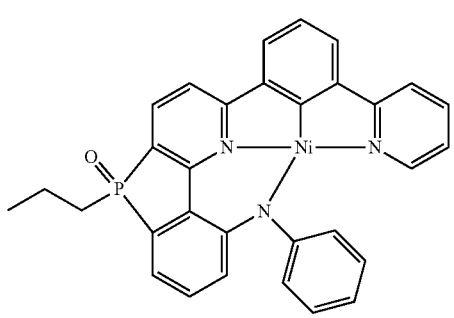
(compound 241)
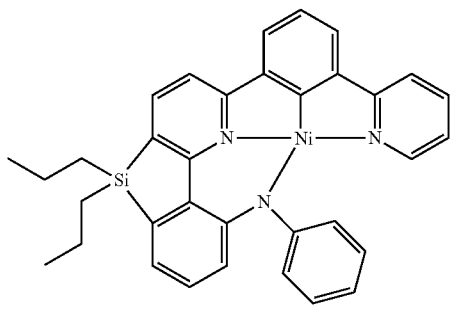
(compound 242)
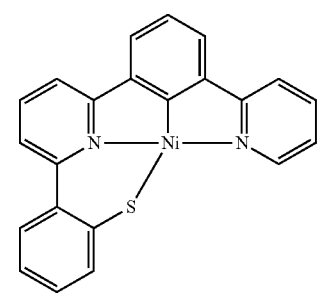
(compound 243)
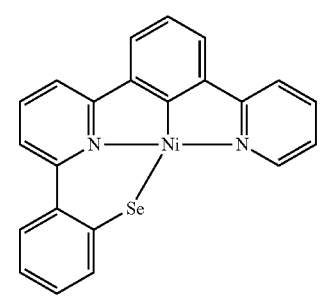
(compound 244)
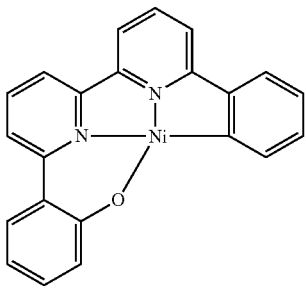
(compound 245)
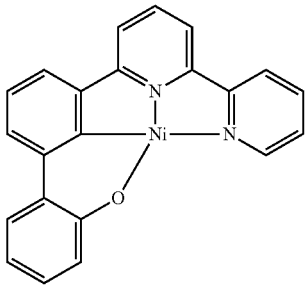
(compound 246)
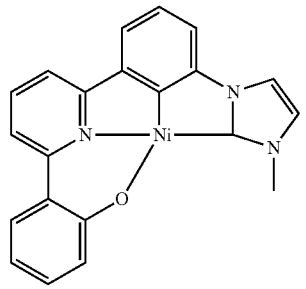
(compound 247)
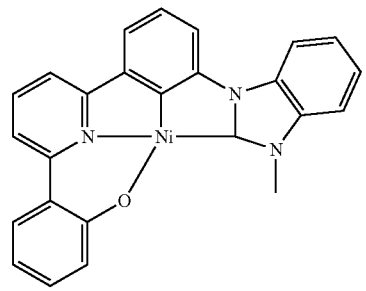
(compound 248)
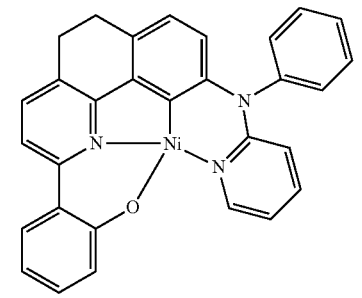

(compound 249)
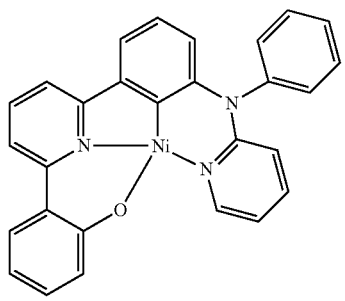
(compound 250)
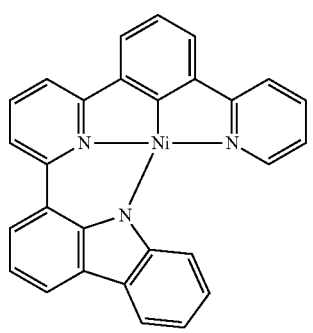
(compound 251)
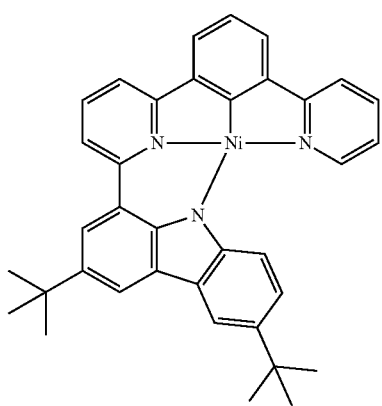
(compound 252)
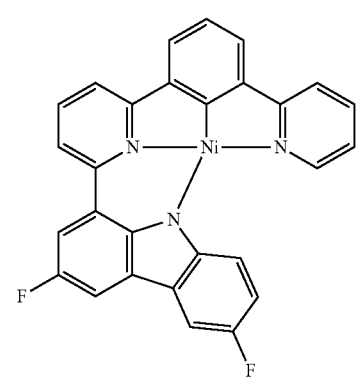
(compound 253)
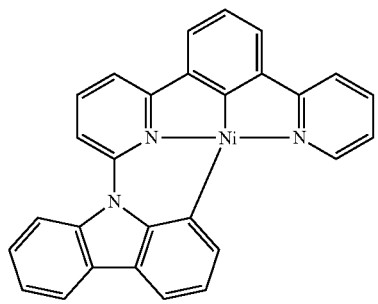
(compound 254)
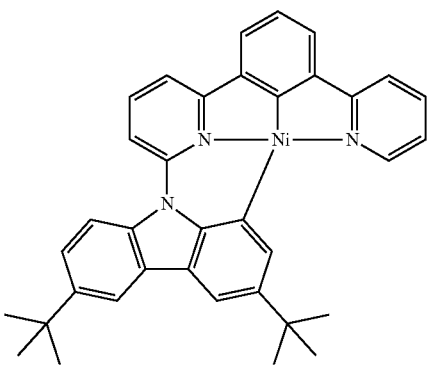
(compound 255)
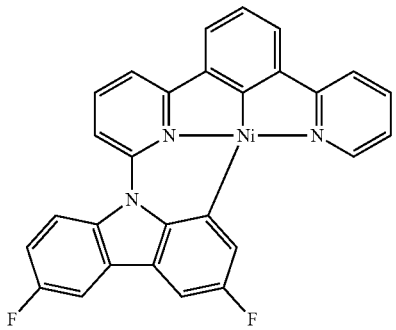
(compound 256)
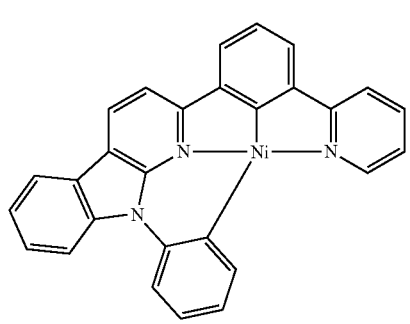

-continued
(compound 257)
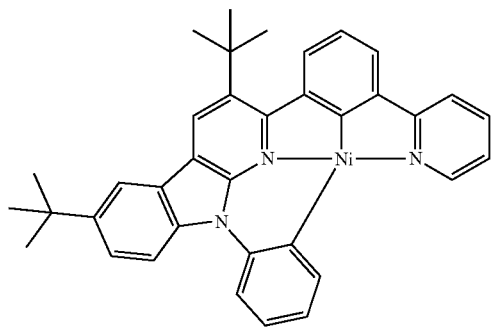
(compound 261)
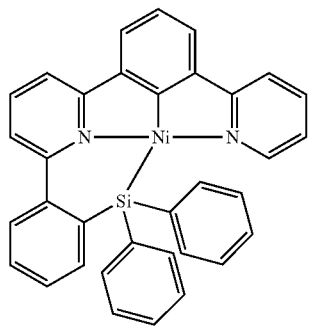
(compound 258)
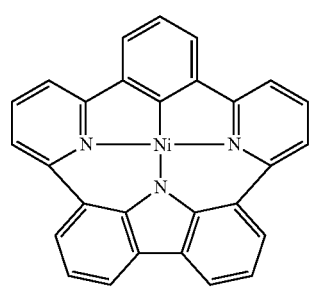
(compound 262)
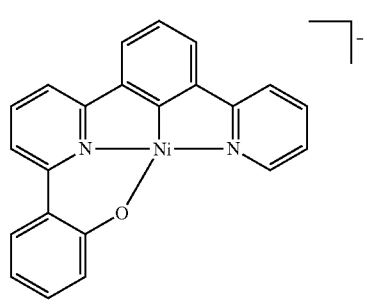
(compound 259)
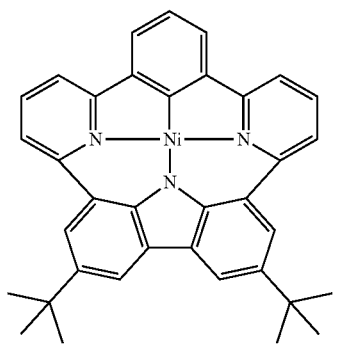
(compound 263)
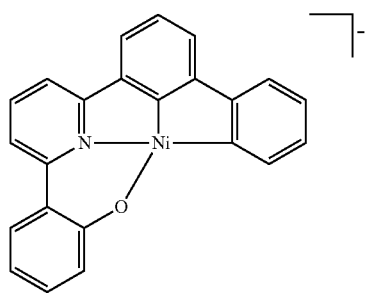
(compound 264)
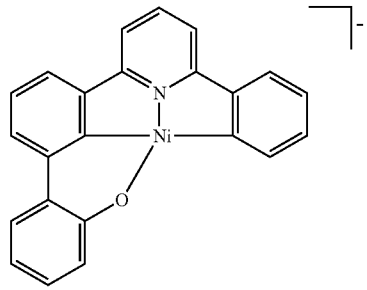
(compound 260)
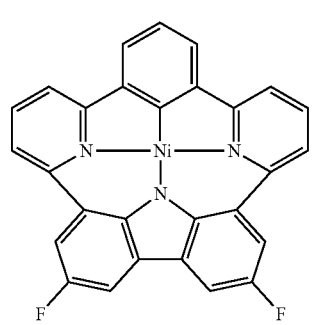
(compound 265)
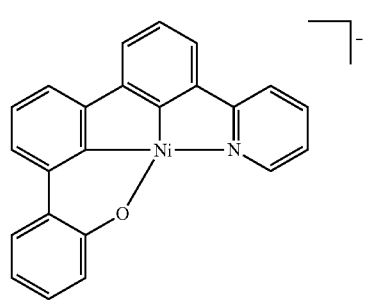

-continued

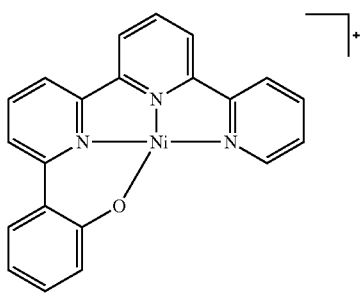
(compound 266)

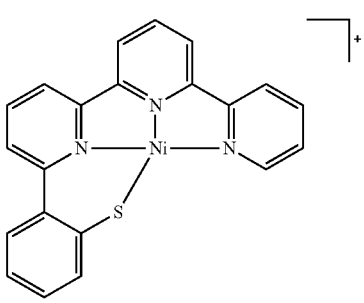
(compound 267)

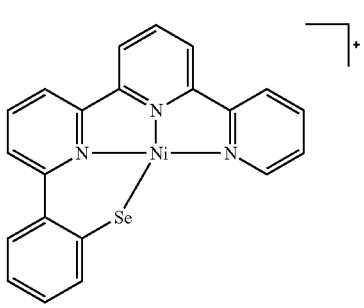
(compound 268)

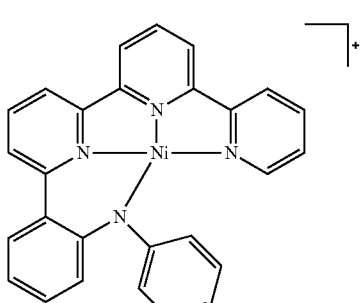
(compound 269)

17. A light-emitting device comprising an anode, a light-emitting layer, and a cathode, wherein the light-emitting layer comprises the luminescent compound of any one of paragraphs 1 to 16, and optionally a host compound.

18. The light-emitting device of paragraph 17, further comprising an electron-transporting layer and a hole-transporting layer.

19. The light-emitting device of paragraph 17 or 18, wherein the light-emitting layer comprises the luminescent compound as a dopant of the host compound, wherein the dopant has a percent composition between about 5 wt % and 50 wt %, such as 10 wt %, of the light-emitting layer.

20. The light-emitting device of any one of paragraphs 17 to 19, wherein the host compound is selected from 1,3-bis(carbazol-9-yl)benzene (MCP), 4,4'-bis(carbazol-9-yl)biphenyl (CBP), 4,4',4''-tris(carbazol-9-yl)-triphenylamine (TCTA), 3-(4-biphenylyl)-4-phenyl-5-tert-butylphenyl-1,2,butylphenyl-1,2,4-triazole (TAZ), p-bis(triphenylsilyl)benzene (UGH2) and diphenyl-4-triphenylsilylphenyl-phosphine oxide (TSPO1), and combinations thereof.

21. The light-emitting device of any one of paragraphs 17 to 20, wherein the light-emitting layer has a thickness between about 10 nm and 60 nm, such as 30 nm.

22. The light-emitting device of any one of paragraphs 18 to 21, wherein the hole-transporting layer comprises 4,4'-bis[N-(1-naphthyl)-N-phenylamino]biphenyl (NPB), 4,4'-bis[N-(3-methylphenyl)-N-phenylamino]biphenyl (TPD), 4,4',4''-tris[(3-methylphenyl)phenylamino] triphenylamine (MTDATA), and di-[4-(N,N-ditolyl-amino)phenyl]cyclohexane (TAPC). In addition, polymeric hole-transporting materials can be used including poly(N-vinylcarbazole) (PVK), polythiophene, polypyrrole, polyaniline, and copolymers including poly(3,4-ethylenedioxythiophene):poly(4-styrene-sulfonate) (PEDOT:PSS), and mixtures thereof.

23. The light-emitting device of any one of paragraphs 18 to 22, wherein the hole-transporting layer has a thickness between about 10 nm and 70 nm, such as 40 nm.

24. The light-emitting device of any one of paragraphs 18 to 23, wherein the electron-transporting layer comprises 1,3,5-tris(phenyl-2-benzimidazolyl)-benzene (TPBI), 1,3,5-tri[(3-pyridyl)-phen-3-yl] benzene (TmPyPB), bathocuproine (BCP), bathophenanthroline (BPhen) and bis(2-methyl-8-quinolinolate)-4-(phenylphenolate)-aluminum (BAlq), tris-[2,4,6-trimethyl-3-(pyridin-3-yl)phenyl]borane (3TPYMB), 1,3,5-tri[(3-pyridyl)-phen-3-yl]benzene (TmPyPB),1,3-bis[3,5-di(pyridin-3-yl)-phenyl]benzene (BmPyPhB) and 1,3,5-tris(6-(3-(pyridin-3-yl)phenyl)pyridin-2-yl)benzene (Tm3PyP26PyB), and mixtures thereof.

25. The light-emitting device of any one of paragraphs 18 to 24, wherein the electron-transporting layer has a thickness between about 10 nm and 60 nm, such as 40 nm.

26. The light-emitting device of any one of paragraphs 17 to 25, further comprising a carrier confinement layer.

27. The light-emitting device of paragraph 26, wherein the carrier confinement layer comprises an organic compound, such as tris(2,4,6-trimethyl-3-(pyridin-3-yl)phenyl)borane (3TPYMB).

28. The light-emitting device of paragraph 26 or 27, wherein the carrier confinement layer has a thickness between about 5 nm and about 50 nm, such as 10 nm.

29. The light-emitting device of any one of paragraphs 17 to 28, wherein the anode comprises indium tin oxide-coated glass.

30. The light-emitting device of any one of paragraphs 17 to 29, wherein the cathode comprises lithium fluoride, aluminium, or a combination thereof.

31. The light-emitting device paragraph 30, wherein the lithium fluoride forms a layer having a thickness between about 0.05 nm and 5 nm, such as 1 nm.

32. The light-emitting device of paragraph 30 or 31, wherein the aluminium forms a layer having a thickness between about 50 nm and about 250 nm, such as 150 nm.

33. The light-emitting device of any one of paragraphs 17 to 32, wherein the light-emitting layer is prepared using a vacuum deposition or solution processing technique.
34. The light-emitting device of any one of paragraphs 26 to 33, wherein the light-emitting layer, the electron-transporting layer, hole-transporting layer, and carrier confinement layer are located between the anode and the cathode.

EXAMPLES

Example 1: Synthesis and Characterization of Compounds

Materials and Methods

2-Bromopyridine (Sigma-Aldrich), 1,3-dibromobenzene (Sigma-Aldrich), zinc bromide (Sigma-Aldrich), lithium chloride (Sigma-Aldrich), tetrakis(triphenylphosphine)palladium (Sigma-Aldrich), carbazole (Sigma-Aldrich), n-butyllithium (Sigma-Aldrich), sodium hydroxide (J&K Chemical), 2-(tributyl stannyl)pyridine (Sigma-Aldrich), nickel(II) chloride (Sigma-Aldrich), nickel(II) acetate (Sigma-Aldrich), mercury(II) acetate (Sigma-Aldrich), 7-bromo-1-tetralone (Sigma-Aldrich), potassium tert-butoxide (Sigma-Aldrich), ammonium acetate (Sigma-Aldrich), sodium fluoride (NaF) (Sigma-Aldrich) and boron tribromide ($BBr_3$) (Alfa Aesar) were purchased from the corresponding chemical companies.

(i) Synthesis and Characterization of Compounds

A schematic for the synthesis of tridentate and tetradentate compounds are shown in scheme 1 and 2, respectively.

Scheme 1

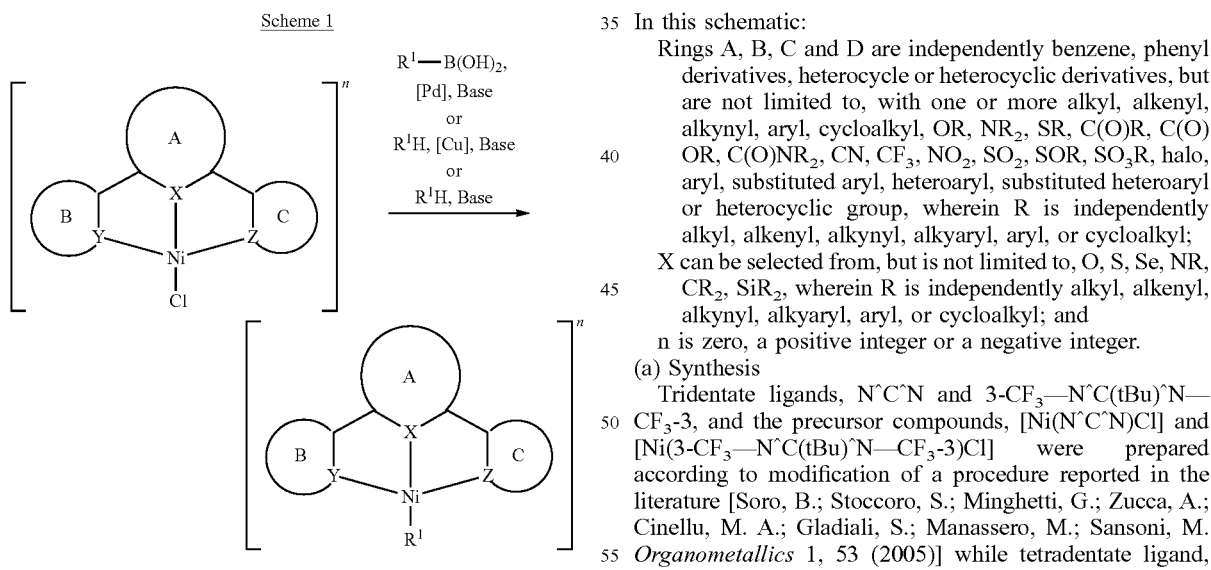

In this schematic:
- $R^1$ can be selected from, but is not limited to, alkyl, substituted alkyl, aryl, substituted aryl, heteroaryl, substituted heteroaryl, heterocyclic aryl, substituted heterocyclic aryl, alkynyl or substituted alkynyl. $R^1$ could also be a group with heteroatom as the donor atom and is selected from, but not limited to, nitrogen, oxygen, sulfur or phosphorus;
- rings A, B, and C are independently benzene, phenyl derivatives, heterocycle or heterocyclic derivatives, but are not limited to, with one or more alkyl, alkenyl, alkynyl, aryl, cycloalkyl, OR, $NR_2$, SR, C(O)R, C(O)OR, C(O)$NR_2$, CN, $CF_3$, $NO_2$, $SO_2$, SOR, $SO_3$R, halo, aryl, substituted aryl, heteroaryl, substituted heteroaryl or heterocyclic group, wherein R is independently alkyl, alkenyl, alkynyl, alkyaryl, aryl, or cycloalkyl; and
- n is zero, a positive integer or a negative integer.

Scheme 2

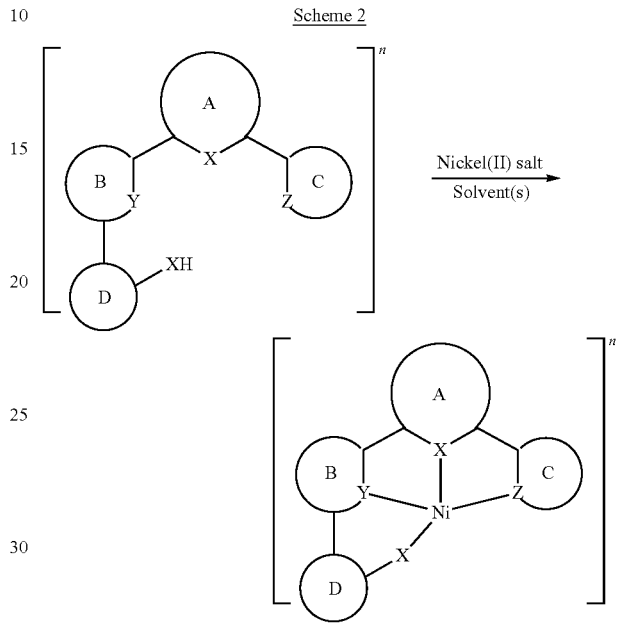

In this schematic:
- Rings A, B, C and D are independently benzene, phenyl derivatives, heterocycle or heterocyclic derivatives, but are not limited to, with one or more alkyl, alkenyl, alkynyl, aryl, cycloalkyl, OR, $NR_2$, SR, C(O)R, C(O)OR, C(O)$NR_2$, CN, $CF_3$, $NO_2$, $SO_2$, SOR, $SO_3$R, halo, aryl, substituted aryl, heteroaryl, substituted heteroaryl or heterocyclic group, wherein R is independently alkyl, alkenyl, alkynyl, alkyaryl, aryl, or cycloalkyl;
- X can be selected from, but is not limited to, O, S, Se, NR, $CR_2$, $SiR_2$, wherein R is independently alkyl, alkenyl, alkynyl, alkyaryl, aryl, or cycloalkyl; and
- n is zero, a positive integer or a negative integer.

(a) Synthesis

Tridentate ligands, N^C^N and 3-$CF_3$—N^C(tBu)^N—$CF_3$-3, and the precursor compounds, [Ni(N^C^N)Cl] and [Ni(3-$CF_3$—N^C(tBu)^N—$CF_3$-3)Cl] were prepared according to modification of a procedure reported in the literature [Soro, B.; Stoccoro, S.; Minghetti, G.; Zucca, A.; Cinellu, M. A.; Gladiali, S.; Manassero, M.; Sansoni, M. *Organometallics* 1, 53 (2005)] while tetradentate ligand, N^C^N^O, was prepared according to modification of a procedure reported in the literature [Cheng, G.; Kui, S. C. F.; Ang, W.-H.; Ko, M.-Y.; Chow, P.-K.; Kwong, C.-L.; Kwok, C.-C.; Ma, C.; Guan, X.; Low, K.-H.; Su, S.-J.; Che, C.-M. *Chem. Sci.* 5, 4819 (2014)]. For tridentate complexes, the target compounds were synthesized by the reaction of [Ni(N^C^N)Cl] with the corresponding carbazole ligand in the presence of base in organic solvents. For example, compound 2 as shown herein was synthesized by stirring a mixture of [Ni(N^C^N)Cl] (100 mg, 0.31 mmol), carbazole (103 mg, 0.62 mmol) and NaOH (61.7 mg, 1.55 mmol) in MeOH/$CH_2Cl_2$ (1:1, v/v) overnight at 80° C. under inert atmosphere. The orange suspension was then isolated by filtration and the solid was washed successively with deionized water, methanol and diethyl ether to give a yellowish-orange solid. Recrystallization of the product was performed by diffusion of diethyl ether vapor into a concentrated dichloromethane solution to give a yellow solid. Yield: 0.11 g, 80%. For tetradentate complexes, the target compounds were synthesized by the reaction of tetradentate ligand with nickel(II) acetate in the presence of acetic acid under reflux. The chemical structures of compounds 1-269 are shown herein.

(b) Characterization

Compounds 1-4 where characterized as follows:

Compound 1: [Ni(N^C^N)Cl]. Yellow solid. Yield: 90 mg, 60%. $^1$H NMR (400 MHz, acetone-$d_6$, 298 K, δ/ppm): δ 9.06 (d, J=8.0 Hz, 2H), 8.04 (t, J=8.0 Hz, 2H), 7.84 (d, J=8.0 Hz, 2H), 7.52 (d, J=8.0 Hz, 2H), 7.32 (t, J=8.0 Hz, 2H), 7.21 (t, J=8.0 Hz, 2H). $^{13}$C{$^1$H} NMR (150 MHz, acetone-$d_6$, 298 K, δ/ppm): δ 172.07, 164.28, 154.54, 145.55, 140.75, 125.97, 123.73, 123.57, 119.35. Positive-ion MALDI-MS: m/z 289.031 [M−Cl]$^+$, 323.997 [M]$^+$, 366.054 [M+CH$_3$CN+H]$^+$.

Compound 2: [Ni(N^C^N)(Cbz)]. Yellow solid. Yield: 110 mg, 80%. $^1$H NMR (400 MHz, acetone-$d_6$, 298 K, δ/ppm): δ 8.21 (d, J=8.0 Hz, 2H), 8.15 (t, J=8.0 Hz, 2H), 7.76 (dt, J=8.0 Hz, 2H), 7.61 (d, J=8.0 Hz, 2H), 7.44 (d, J=4.0 Hz, 2H), 7.24-7.31 (m, 3H), 7.03 (dt, J=8.0 Hz, 2H), 6.95-6.97 (m, 2H), 6.70-6.74 (m, 2H). $^{13}$C{$^1$H} NMR (150 MHz, acetone-$d_6$, 298 K, δ/ppm): δ 175.76, 164.93, 153.28, 150.72, 145.47, 139.66, 126.23, 125.76, 124.18, 123.53, 122.83, 120.14, 118.71, 115.56, 114.91. Positive-ion MALDI-MS: m/z 454.951 [M]$^+$, 497.063 [M+CH$_3$CN+H]$^+$.

Compound 3: [Ni(3-CF$_3$—N^C($^t$Bu)^N—CF$_3$-3)Cl]. Red solid. Yield: 98 mg, 70%. $^1$H NMR (400 MHz, dichloromethane-$d_2$, 298 K, δ/ppm): δ 9.37 (s, 2H), 8.05 (dd, J=8.0 Hz, 2H), 7.68 (d, J=8.0 Hz, 2H), 7.47 (s, 2H), 1.41 (s, 9H). $^{13}$C{$^1$H}NMR (150 MHz, acetone-$d_6$, 298 K, δ/ppm): δ 169.64, 165.96, 151.21, 149.49, 142.85, 136.16, 125.73, 125.46, 123.63, 121.71, 121.46, 117.58, 35.16, 31.49. Positive-ion MALDI-MS: m/z 497.063 [M−Cl]$^+$.

Compound 4: [Ni(N^C^N^O)]. Red solid. Yield: 110 mg, 50%. $^1$H NMR (500 MHz, dichloromethane-$d_2$, 298 K, δ/ppm): δ 8.73 (d, J=7.8 Hz, 1H), 7.96 (d, J=7.4 Hz, 1H), 7.88-7.84 (m, 2H), 7.66 (d, J=8.4 Hz, 1H), 7.54 (d, J=7.8 Hz, 1H), 7.28-7.24 (m, 2H), 7.21 (t, J=7.4 Hz, 1H), 7.12 (d, J=7.8 Hz, 1H), 6.86 (d, J=7.4 Hz, 1H), 6.66 (t, J=7.4 Hz, 1H), 3.18-3.14 (m, 2H), 3.08-3.04 (m, 2H). $^{13}$C{$^1$H} NMR (150 MHz, dichloromethane-$d_2$, 298 K, δ/ppm): δ 176.41, 165.27, 164.70, 158.88, 153.26, 150.44, 141.96, 141.53, 139.31, 136.75, 135.42, 131.30, 127.89, 125.91, 124.92, 122.79, 122.30, 122.23, 120.23, 119.13, 118.67, 114.54, 27.07, 26.25. Positive-ion HR-ESI-MS: m/z 406.0589 [M]$^+$. Elemental analysis calcd (%) for $C_{24}H_{16}N_2NiO \cdot 2CH_2Cl_2$: C, 54.13; H, 3.49; N, 4.86. Found: C, 54.57; H, 3.55; N, 5.13.

Example 2: Absorption Properties of Compounds

Materials and Methods

Spectroscopic grade dichloromethane (J&K Chemical) and spectroscopic grade toluene (Sigma-Aldrich) were purchased and used without further purification.

The UV-vis absorption data of compounds 1-4 in dichloromethane at 298 K have been summarized in TABLE 1. The UV-vis absorption spectra of compounds 1 and 3 in dichloromethane at 298 K feature a broad and intense absorption band at ca. 270-320 nm with extinction coefficients (ε) on the order of $10^4$ dm$^3$ mol$^{-1}$ cm$^{-1}$, as shown in FIG. 1. This absorption band is tentatively assigned as the intraligand (IL) π→π* transition of the cyclometalating N^C^N ligand. A moderately intense absorption band at ca. 350-450 nm is also observed, which is tentatively assigned as a predominantly metal-to-ligand charge transfer (MLCT) [dπ(Ni)→π*(N^C^N)] with some halide-to-N^C^N ligand-to-ligand charge transfer (LLCT) character [Shields, B. J.; Kudisch, B.; Scholes, G. D.; Doyle, A. G. J. Am. Chem. Soc. 140, 3035 (2018); Klein, A.; Rausch, B.; Kaiser, A.; Vogt, N.; Krest, A. J. Organomet. Chem. 774, 86 (2014)]. On the other hand, the carbazolylnickel(II) complex 2 exhibits intense absorption bands at ca. 270-350 nm, which are attributed to IL π→π* transition of the cyclometalating N^C^N ligands. A moderately intense absorption band at ca. 350-470 nm is also observed. This absorption band is assigned as predominantly MLCT [dπ(Ni)→π*(N^C^N)] with some mixing of LLCT [π(carbazolate)→π*(N^C^N)] transitions. For 4, similar to 1 and 2, intense absorption bands at around 270-350 nm are observed and the absorption bands at λ≤350 nm are attributed to the spin-allowed intraligand IL [π→π*] transition of the cyclometalating N^C^N^O ligand of 4. A moderately intense absorption band at about 350-400 nm is observed for 4, which is tentatively assigned as the MLCT [dπ(Ni)π→π*(N^C^N^O)] transition with mixing of an intraligand charge transfer (ILCT) transition from the phenolate to the pyridine moieties of the N^C^N^O ligand whereas the lowest-energy absorption bands can be assigned as the admixture of the metal-centered (MC) and ILCT transitions transition from the phenolic to the pyridyl moieties of the N^C^N^O ligand.

TABLE 1

Absorption data for compounds 1-4

| Compound | Medium (T/K) | Absorption λ$_{max}$/nm (ε$_{max}$/dm$^3$ mol$^{-1}$ cm$^{-1}$) |
|---|---|---|
| 1 | CH$_2$Cl$_2$ (298) | 278 (16390), 309 sh (6510), 335 (3990), 407 (3820), 431 (3565) |
| 2 | CH$_2$Cl$_2$ (298) | 281 (32910), 290 sh (59370), 310 (9525), 333(6445), 368 sh (2980), 385 (3935), 425 (2750) |
| 3 | CH$_2$Cl$_2$ (298) | 288 (29560), 322 sh (10615), 340 (6615), 423 (6335), 449 (7400) |
| 4 | CH$_2$Cl$_2$ (298) | 305 (17670), 318 (17025), 400 (8300), 436 (4970) |

Example 3: Emission Properties of Compounds

Materials and Methods

Spectroscopic grade dichloromethane (J&K chemical) and spectroscopic grade toluene (Sigma-Aldrich) were purchased and used without further purification.

Figure 2:
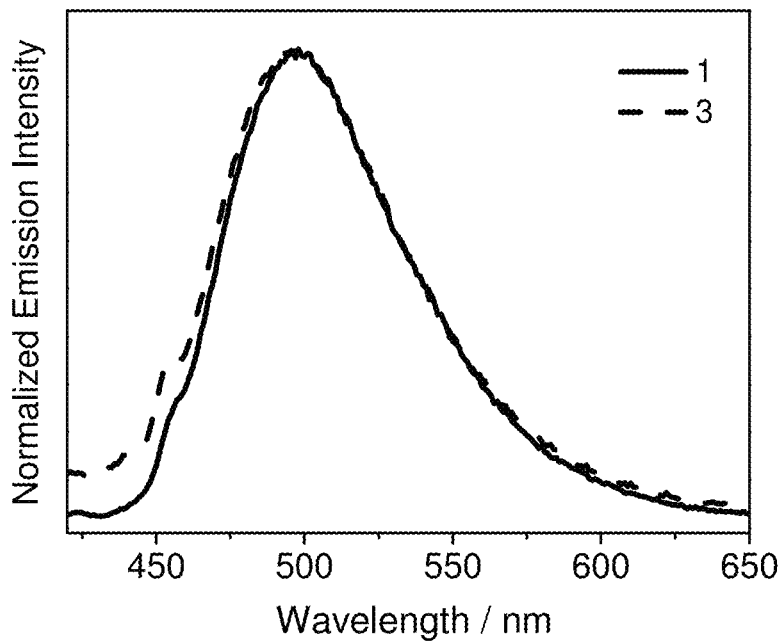
FIG. 2 shows the normalized photoluminescence spectrum of compounds 1 and 3 in dichloromethane at 298 K, in accordance with one or more embodiments herein.
Figure 3:
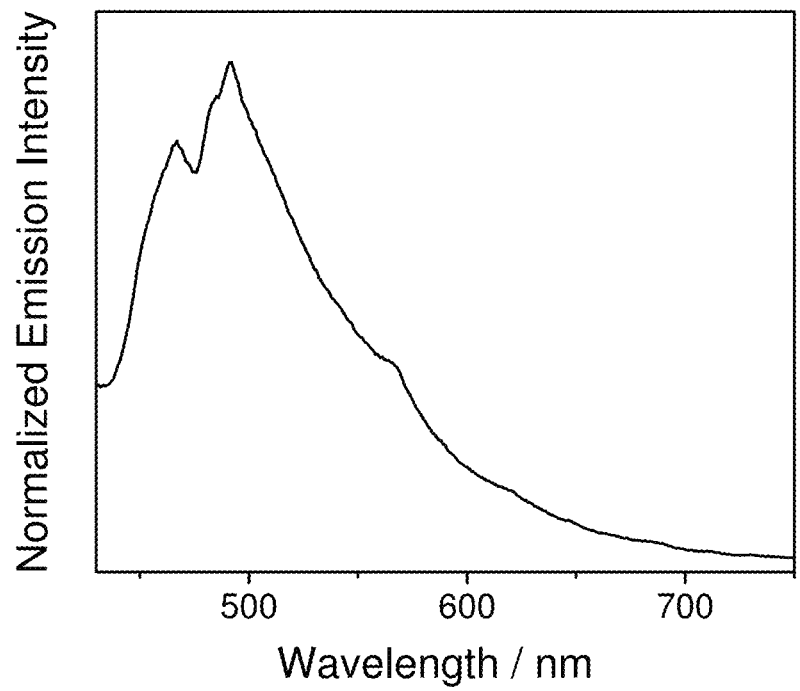
FIG. 3 shows the normalized photoluminescence spectrum of compound 2 in a degassed toluene at 298 K, in accordance with one or more embodiments herein.
Figure 4:
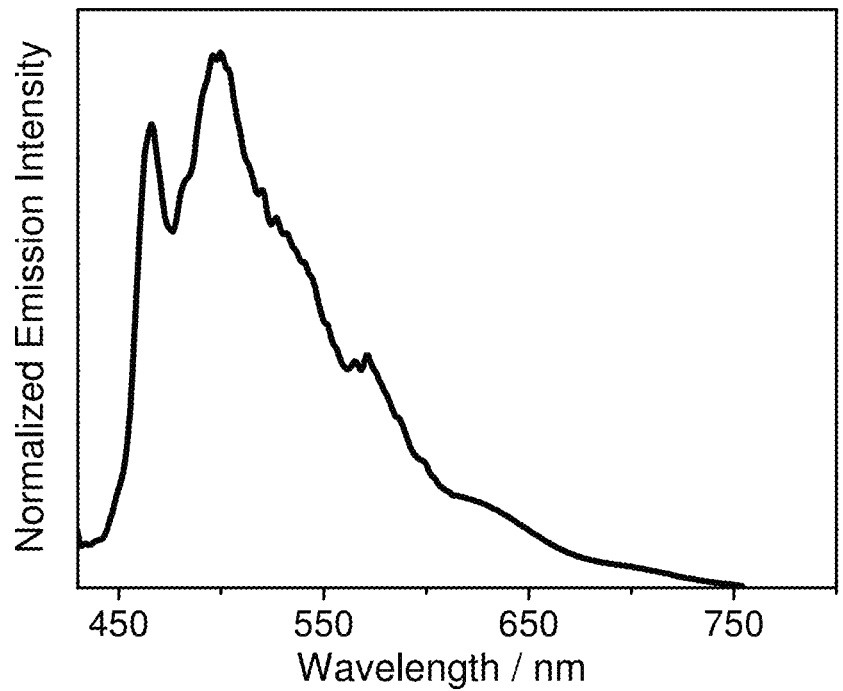
FIG. 4 shows the normalized photoluminescence spectrum of compound 2 in a solid state at 77 K.
Figure 5:
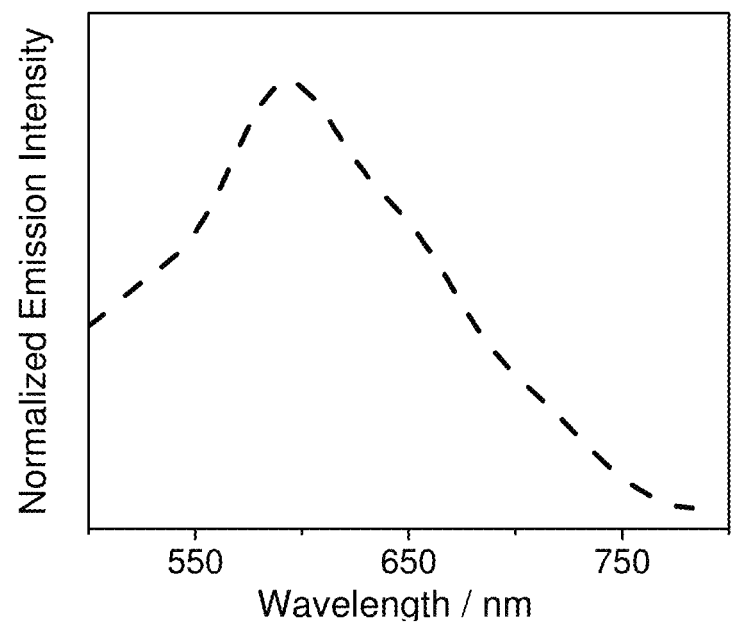
FIG. 5 shows the normalized photoluminescence spectrum of compound 2 in a solid state at 298 K.
Figure 6:
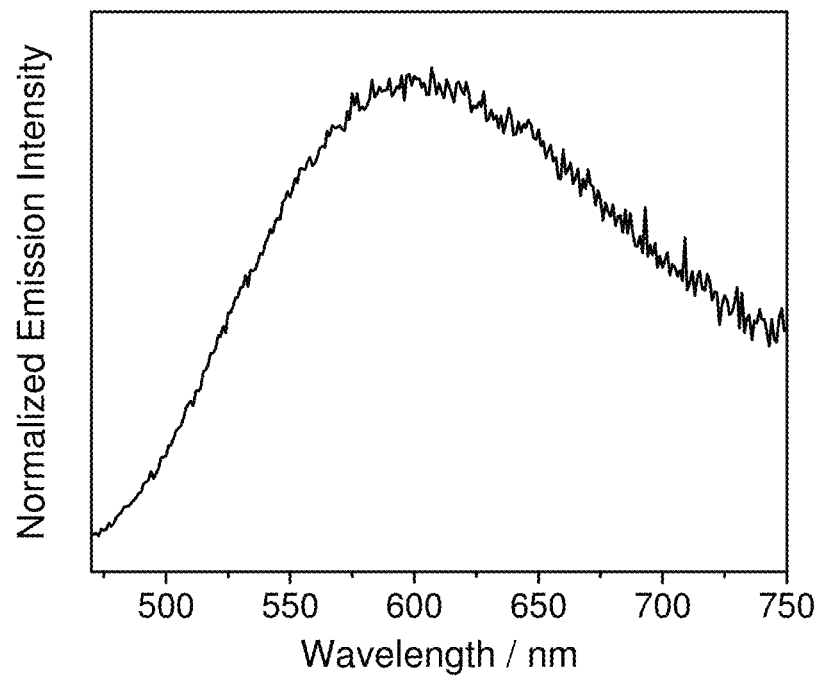
FIG. 6 shows the normalized photoluminescence spectrum of thin films of 10 wt % compound 2 doped into 1,3-bis(carbazol-9-yl)benzene (MCP) at 298 K.

The emission properties of compounds 1-4 have been summarized in TABLE 2. Unlike most of the other square planar nickel(II) compounds which are non-emissive even at low temperatures [Shields, B. J.; Kudisch, B.; Scholes, G. D.; Doyle, A. G. J. Am. Chem. Soc. 140, 3035 (2018); Klein, A.; Rausch, B.; Kaiser, A.; Vogt, N.; Krest, A. J. Organomet. Chem. 774, 86 (2014)], compounds 1-3 display luminescence in solution at room temperature. The emission spectra of compounds 1 and 3 in degassed dichloromethane solution are shown in FIG. 2. Upon excitation at λ=400 nm in dichloromethane solution at 298 K, structureless emission bands with peak maxima at ca. 500 nm for 1 and 3 are observed, in which the broad and structureless emission bands are tentatively assigned as $^3$MLCT excited state. Upon excitation at λ=360 nm at 298 K, compound 2 in degassed toluene solution exhibits vibronic-structured emission bands with peak maximum at ca. 500 nm, with the vibrational progressional spacings of ca. 1300 cm$^{-1}$ that match well with the ν(C≡C) and ν(C≡N) stretching modes of the tridentate ligand, suggesting a metal-perturbed $^3$IL π→π* state for the emission, as shown in FIG. 3. In addition, compound 2 features vibronic-structured emission band in the solid state at 77 K and structureless emission band in the solid state at 298 K, upon excitation at λ=360 nm, as shown in FIG. 4 and FIG. 5, respectively. For 77 K, the emission energy shows excellent resemblance to that in degassed toluene solution at 298 K. Furthermore, the emission property of compound 2 has been studied in the solid-state MCP thin film. FIG. 6 depicts the normalized photoluminescence spectra of thin films of 10 wt % of compound 2 doped into MCP at 298 K, where compound 2 shows a structureless emission band with peak maximum at ca. 600 nm.

TABLE 2

Emission data for compounds 1-4

| Compound | Medium (T/K) | Emission $\lambda_{max}$/nm |
|---|---|---|
| 1 | CH$_2$Cl$_2$ (298) | 500 |
| 2 | Toluene (298) | 467, 495, 568 |
|   | Solid (298) | 600 |
|   | Solid (77) | 466, 500, 570 |
|   | Thin film (298) 10% in MCP | 600 |
| 3 | CH$_2$Cl$_2$ (298) | 500 |
| 4 | CH$_2$Cl$_2$ (298) | Non-emissive |
|   | Glass (77) | Non-emissive |
|   | Solid (77) | Non-emissive |

Example 4: Organic Light-Emitting Device

Materials and Methods

PEDOT:PSS (Clevious AI4083) was purchased from Heraeus Ltd and had been filtered by using 0.2 m nylon filter before use. 3TPyMB, MCP, TmPyPB were purchased from Luminescence Technology Corp., while LiF and Al were purchased from Sigma-Aldrich and Good Fellow, respectively. All the materials were used without further purification.

Solution-processable OLEDs were constructed in the following manner:

(a) A transparent anode indium tin oxide (ITO)-coated borosilicate glass substrate (38 mm×38 mm) with sheet resistance of 30Ω per square was ultrasonicated in the commercial detergent Decon 90, rinsed in deionized water having a resistivity of 18.2 MΩ for 15 minutes, and then dried in an oven at 120° C. for at least an hour. The substrate was next subjected to an UV-ozone treatment in a Jelight 42-220 UVO-Cleaner equipped with a mercury grid lamp for 15 minutes in order to increase the work function of the ITO-coated glass substrate for better hole injection into an organic layer.

(b) A 40-nm thick PEDOT:PSS hole-transporting layer was spin-coated by using a Laurell WS-400Ez-6NPP-Lit2 single wafer spin processor at 7000 rpm for 30 seconds onto the ITO-coated glass substrate of step (a) and baked at 110° C. for 10 minutes in air.

(c) A 30-nm thick light-emitting layer was spin-coated by using a Laurell WS-400Ez-6NPP-Lit2 single wafer spin processor at 6000 rpm for 25 seconds onto PEDOT:PSS layer of step (b), and baked at 80 degree C. for 10 minutes in air, in which 10 wt % compound 2 was doped into light-emitting MCP layer.

(d) The substrate was put into a vacuum chamber, and the chamber was pumped down from 1 bar to 5×10$^{-6}$ mbar.

(e) A 5-nm thick 3TPYMB carrier confinement layer was deposited by thermal evaporation on doped MCP light-emitting layer of step (c).

(f) A 40-nm TmPyPB electron-transporting layer was deposited by thermal evaporation on the 3TPYMB layer of step (e).

(g) A 1-nm thick LiF layer and a 150 nm thick Al layer were deposited by thermal evaporation on the TmPyPB layer of step (f) to form an electron-injecting cathode.

FIG. 7 depicts the EL spectrum for device based on 10 wt % compound 2 doped in MCP as light-emitting layer. Remarkably, a broad EL spectrum with emission peak at ca. 600 nm is observed with increasing operating voltage. Such red emission is in good agreement with the photoluminescence spectrum in thin film and is coming from compound 2. Although undesirable exciplex emission at ~440 nm is noted, which may be due to the poor energy transfer from MCP to the nickel(II) compound, this finding demonstrates the first class of luminescent nickel(II) compounds that emit at room temperature and their potential applications in OLEDs.

Unless defined otherwise, all technical and scientific terms used herein have the same meanings as commonly understood by one of skill in the art to which the disclosed invention belongs. Publications cited herein and the materials for which they are cited are specifically incorporated by reference.

Those skilled in the art will recognize, or be able to ascertain using no more than routine experimentation, many equivalents to the specific embodiments of the invention described herein. Such equivalents are intended to be encompassed by the following claims.

We claim:

1. A luminescent compound having the formula:

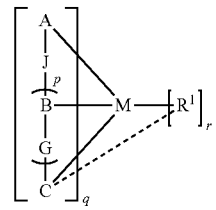

Formula I wherein:
- (A) when p is 1 and a ligand formed by A-J-B-G-C chelates M via a C^N^N coordinating motif, R$^1$ is phenylethynyl or 4-tert-butyl phenylethynyl; or
- (B) when p is 1 and a ligand formed by A-J-B-G-C chelates M via a C^N^N coordinating motif, R$^1$ is not alkylalkynyl, unsubstituted arylalkynyl, or substituted arylalkynyl;

the compound has an overall negative, neutral, or positive charge;

M is Ni or a first-row transition metal atom with d-d splitting energy comparable to Ni;

M has an oxidation state between 0 and +7 inclusive;

A, B, and C are each independently unsubstituted heteroaryl, substituted heteroaryl, unsubstituted aryl, substituted aryl, unsubstituted polyaryl, substituted polyaryl, unsubstituted polyheteroaryl, substituted polyheteroaryl, substituted $C_3$-$C_{20}$ cycloalkyl, unsubstituted $C_3$-$C_{20}$ cycloalkyl, substituted $C_3$-$C_{20}$ heterocyclyl, unsubstituted $C_3$-$C_{20}$ heterocyclyl, substituted $C_3$-$C_{20}$ cycloalkenyl, unsubstituted $C_3$-$C_{20}$ cycloalkenyl, substituted $C_3$-$C_{20}$ cycloalkynyl, or unsubstituted $C_3$-$C_{20}$ cycloalkynyl, wherein at least one of A, B, and C is a substituted aryl or unsubstituted aryl, and another of A, B, and C is a substituted heteroaryl or unsubstituted heteroaryl;

q is 1 or 2;

p is 1, 2, or 3;

G and J are each independently a bond, absent, oxygen, sulfur, unsubstituted amino, substituted amino, unsubstituted alkylene, substituted alkylene, unsubstituted alkyl, substituted alkyl, substituted carbonyl, unsubstituted carbonyl, substituted carboxyl, unsubstituted carboxyl, substituted amido, unsubstituted amido, substituted sulfonyl, unsubstituted sulfonyl, substituted sulfonic acid, unsubstituted sulfonic acid, substituted phosphoryl, unsubstituted phosphoryl, substituted phosphonyl, or unsubstituted phosphonyl;

$R^1$ is carbon donor ligand, heteroatom donor ligand, halide, or pseudohalide, which could be either monoanionic or neutral;

r is 0, 1, or 2; and optionally wherein substituted means substituted with one or more substituents selected from unsubstituted alkyl, alkyl having one or more alkyl substituents, alkyl having one or more halogen substituents, halogen, unsubstituted aryl, aryl having one or more alkyl substituents, substituted aryl, unsubstituted heteroaryl, substituted heteroaryl, substituted $C_3$-$C_{20}$ cycloalkyl, unsubstituted $C_3$-$C_{20}$ cycloalkyl, substituted $C_3$-$C_{20}$ heterocyclyl, unsubstituted $C_3$-$C_{20}$ heterocyclyl, substituted $C_3$-$C_{20}$ cycloalkenyl, unsubstituted $C_3$-$C_{20}$ cycloalkenyl, substituted $C_3$-$C_{20}$ cycloalkynyl, or unsubstituted $C_3$-$C_{20}$ cycloalkynyl, OR, $NR_2$, SR, C(O)R, C(O)OR, C(O)$NR_2$, CN, $CF_3$, $NO_2$, $SO_2$, SOR, and $SO_3R$, wherein R is independently unsubstituted alkyl, unsubstituted alkenyl, unsubstituted alkynyl, unsubstituted alkylaryl, unsubstituted aryl, unsubstituted $C_3$-$C_{20}$ cycloalkyl, unsubstituted $C_3$-$C_{20}$ heterocyclyl, unsubstituted $C_3$-$C_{20}$ cycloalkenyl, or unsubstituted $C_3$-$C_{20}$ cycloalkynyl, and wherein, (i) when p is 1 and C is linked to $R^1$, and either J and G are both single bonds or J is a single bond and G is a substituted amino, then one or more of B and C are not substituted polyheteroaryl, unsubstituted polyheteroaryl, substituted polyaryl, or unsubstituted polyaryl; or (ii) when p is 1 and C is linked to $R^1$, M is cobalt, copper, nickel, manganese, or zinc, and either J and G are both single bonds or J is a single bond and G is a substituted amino, then one or more of B and C are not substituted polyheteroaryl, unsubstituted polyheteroaryl, substituted polyaryl, or unsubstituted polyaryl.

2. A light-emitting device comprising an anode, a light-emitting layer, and a cathode, wherein the light-emitting layer comprises the luminescent compound of claim 1, and optionally a host compound.

3. The light-emitting device of claim 2, further comprising an electron-transporting layer and a hole-transporting layer.

4. The light-emitting device of claim 3, wherein the hole-transporting layer comprises 4,4'-bis[N-(1-naphthyl)-N-phenylamino]biphenyl (NPB), 4,4'-bis[N-(3-methylphenyl)-N-phenylamino]biphenyl (TPD), 4,4',4"-tris[(3-methylphenyl)phenylamino] triphenylamine (MTDATA), di-[4-(N,N-ditolyl-amino)phenyl]cyclohexane (TAPC), polymeric hole-transporting materials, or mixtures thereof.

5. The light-emitting device of claim 3, wherein the hole-transporting layer has a thickness between about 10 nm and 70 nm.

6. The light-emitting device of claim 3, wherein the electron-transporting layer comprises 1,3,5-tris(phenyl-2-benzimidazolyl)-benzene (TPBI), 1,3,5-tri[(3-pyridyl)-phen-3-yl] benzene (TmPyPB), bathocuproine (BCP), bathophenanthroline (BPhen) and bis(2-methyl-8-quinolinolate)-4-(phenylphenolate)-aluminum (BAlq), tris-[2,4,6-trimethyl-3-(pyridin-3-yl)phenyl]borane (3TPYMB), 1,3,5-tri[(3-pyridyl)-phen-3-yl]benzene (TmPyPB),1,3-bis[3,5-di(pyridin-3-yl)-phenyl]benzene (BmPyPhB) and 1,3,5-tris(6-(3-(pyridin-3-yl)phenyl)pyridin-2-yl)benzene (Tm3PyP26PyB), or mixtures thereof.

7. The light-emitting device of claim 3, wherein the electron-transporting layer has a thickness between about 10 nm and 60 nm.

8. The light-emitting device of claim 2, further comprising a carrier confinement layer.

9. The light-emitting device of claim 8, wherein the carrier confinement layer comprises an organic compound.

10. The light-emitting device of claim 8, wherein the carrier confinement layer has a thickness between about 5 nm and about 50 nm.

11. The light-emitting device of claim 8, wherein the light-emitting layer, the electron-transporting layer, hole-transporting layer, and carrier confinement layer are located between the anode and the cathode.

12. The light-emitting device of claim 2, wherein the cathode comprises lithium fluoride, aluminium, or a combination thereof.

13. The light-emitting device claim 12, wherein the lithium fluoride forms a layer having a thickness between about 0.05 nm and 5 nm.

14. The light-emitting device of claim 12, wherein the aluminium forms a layer having a thickness between about 50 nm and about 250 nm.

15. The light-emitting device of claim 2, wherein the light-emitting layer comprises the luminescent compound as a dopant of the host compound, wherein the dopant has a percent composition between about 5 wt % and 50 wt %, such as 10 wt %, of the light-emitting layer.

16. The light-emitting device of claim 2, wherein the host compound is selected from 1,3-bis(carbazol-9-yl)benzene (MCP), 4,4'-bis(carbazol-9-yl)biphenyl (CBP), 4,4',4"-tris(carbazol-9-yl)-triphenylamine (TCTA), 3-(4-biphenylyl)-4-phenyl-5-tert-butylphenyl-1,2,butylphenyl-1,2,4-triazole (TAZ), p-bis(triphenylsilyl)benzene (UGH2) and diphenyl-4-triphenylsilylphenyl-phosphine oxide (TSPO1), and combinations thereof.

17. The light-emitting device of claim 2, wherein the light-emitting layer has a thickness between about 10 nm and 60 nm.

18. The light-emitting device of claim 2, wherein the anode comprises indium tin oxide-coated glass.

19. The light-emitting device of claim 2, wherein the light-emitting layer is prepared using a vacuum deposition or solution processing technique.

20. The luminescent compound of claim 1 having the formula:

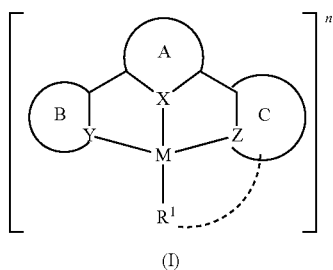

Formula II (I)

wherein:
M is Ni or a first-row transition metal atom with d-d splitting energy comparable to Ni;
X, Y and Z are independently nitrogen or carbon;
A, B, and C are cyclic structure derivatives of phenyl groups, unsubstituted heteroaryl groups, substituted heteroaryl groups, unsubstituted heterocyclic groups, or substituted heterocyclic groups, wherein the dashed line indicates that $R^1$ is optionally linked or unlinked to C;
$R^1$ is any carbon donor ligand, heteroatom donor ligand, halide or pseudohalide, which could be either anionic or neutral; and
n is zero, a positive integer, or a negative integer.

21. The luminescent compound of claim 20, wherein:
M is scandium, titanium, vanadium, chromium, manganese, iron, cobalt, nickel, copper, and zinc,
A, B, and C are independently benzene, phenyl derivatives, unsubstituted heteroaryl, substituted heteroaryl groups, heteroaryl derivatives, unsubstituted heterocycle, substituted heterocycle, or heterocyclic derivatives, and
$R^1$ is selected from unsubstituted alkyl, substituted alkyl, unsubstituted aryl, substituted aryl, unsubstituted heteroaryl, substituted heteroaryl, unsubstituted polyaryl, substituted polyaryl, unsubstituted alkynyl, substituted alkynyl, unsubstituted alkoxy, amide, thiolate, phosphide, chloride, bromide, iodide, cyanate, thiocyanate, cyanide, isocyanide, or N-heterocyclic carbene.

22. The luminescent compound of claim 1, wherein M has a $d^6$, $d^7$, or $d^8$ electron configuration.

23. The luminescent compound of claim 1, wherein M has an oxidation state of 0, 1, +2, or +3.

24. The luminescent compound of claim 1, wherein M is nickel.

25. The luminescent compound of claim 1, wherein A, B, and C are each independently unsubstituted heteroaryl, substituted heteroaryl, unsubstituted aryl, substituted aryl, unsubstituted polyheteroaryl, substituted polyheteroaryl, unsubstituted polyaryl, substituted polyaryl, substituted cycloalkyl, unsubstituted cycloalkyl, substituted heterocyclyl, unsubstituted heterocyclyl, substituted cycloalkenyl, unsubstituted cycloalkenyl, substituted cycloalkynyl, or unsubstituted cycloalkynyl.

26. The luminescent compound of claim 1, wherein A, B, and C are independently unsubstituted heteroaryl, substituted heteroaryl, unsubstituted aryl, or substituted aryl.

27. The luminescent compound of claim 1, displaying photoluminescence or electroluminescence.

28. The luminescent compound of claim 1, having a square-planar geometry.

29. The luminescent compound of claim 1, wherein the luminescent compound emits light at room temperature, low temperature, or both.

30. The luminescent compound of claim 1, wherein the compound is in a solid, liquid, glassy, or solution state.

31. The luminescent compound of claim 1, wherein the luminescent compound has photoluminescent properties in a spectral range between 380 nm and 1050 nm, inclusive.

32. The luminescent compound of claim 1, wherein the luminescent compound emits light in response to (i) the passage of an electric current or (ii) to an electric field.

33. The luminescent compound of claim 1, wherein the luminescent compound emits light independent of its concentration.

34. The luminescent compound of claim 1, wherein C is not linked to $R^1$.

35. The luminescent compound of claim 1, selected from

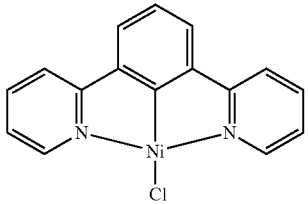

(compound 1)

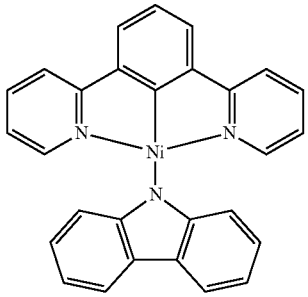

(compound 2)

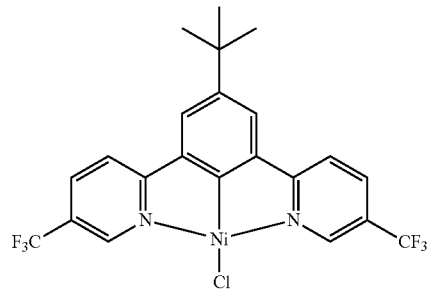

(compound 3)

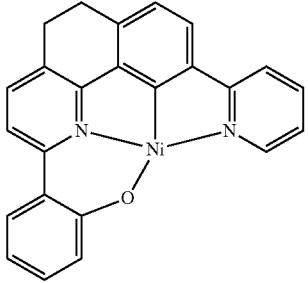

(compound 4)

(compound 5)
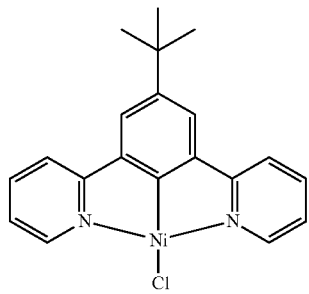
(compound 6)
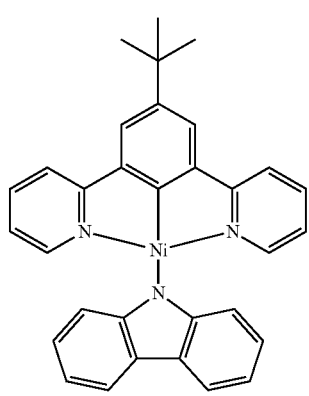
(compound 7)
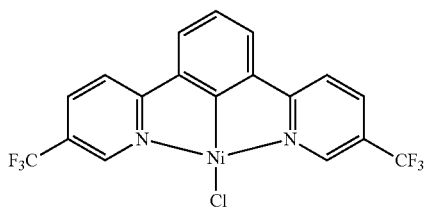
(compound 8)
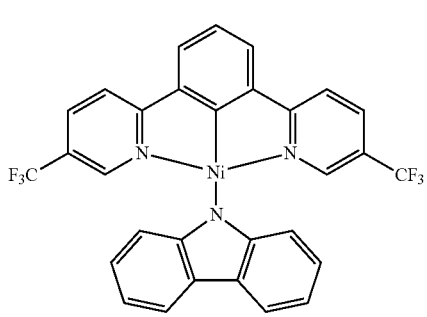
(compound 9)
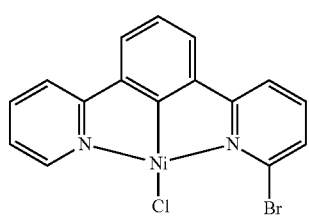
(compound 10)
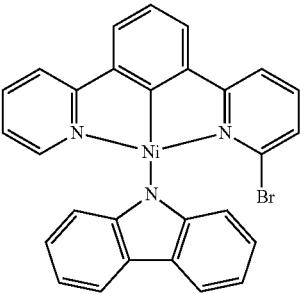
(compound 11)
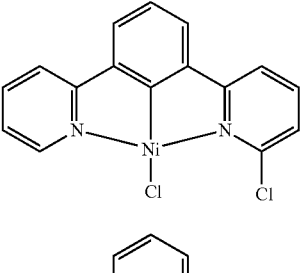
(compound 12)
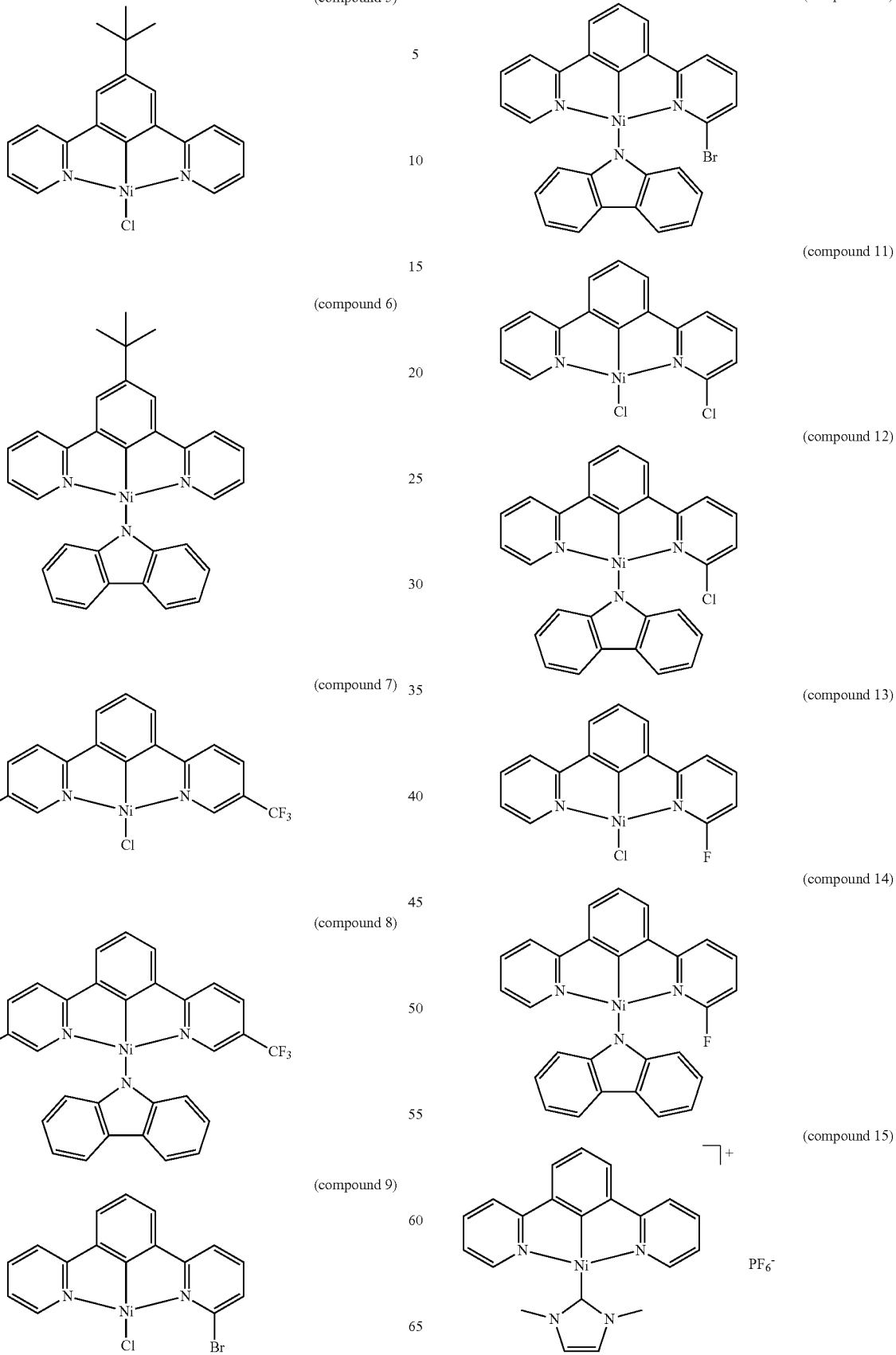
(compound 13)
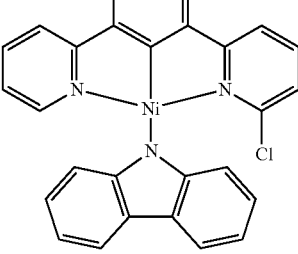
(compound 14)
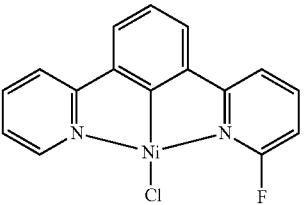
(compound 15)
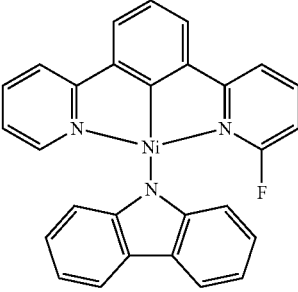

(compound 16)
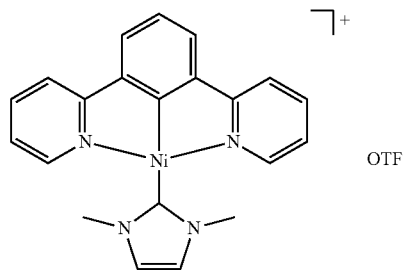
OTf⁻
(compound 17)
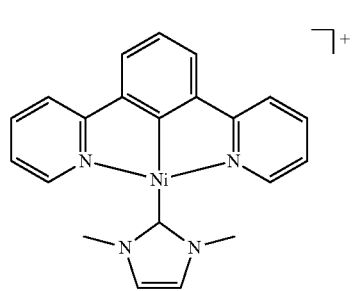
ClO₄⁻
(compound 18)
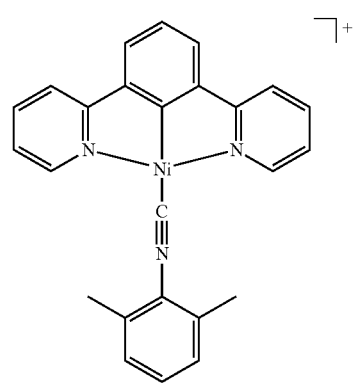
PF₆⁻
(compound 19)
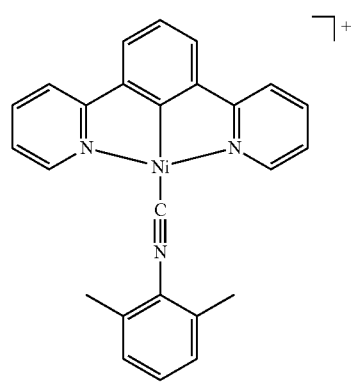
OTf⁻
(compound 20)
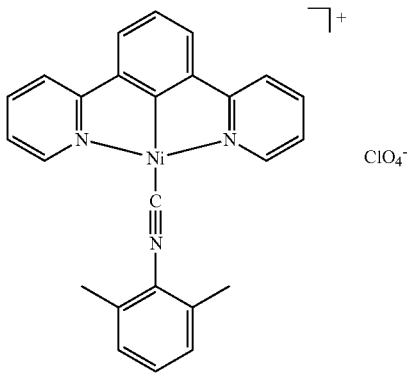
ClO₄⁻
(compound 21)
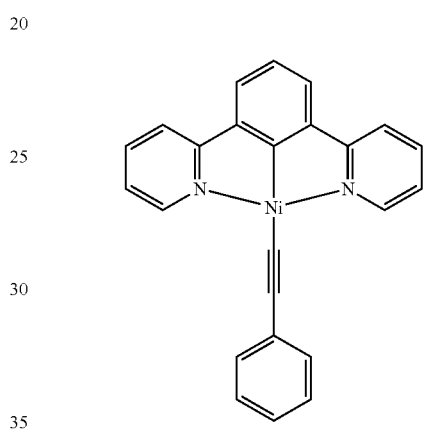
(compound 22)
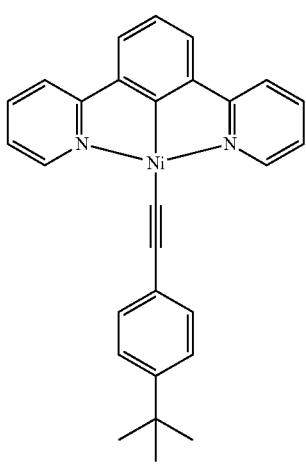
(compound 23)
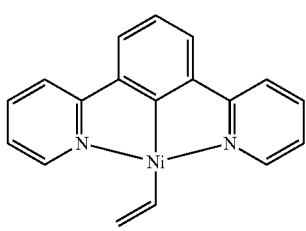

(compound 24)
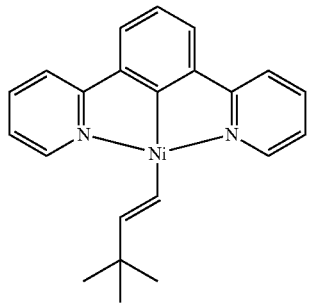
(compound 28)
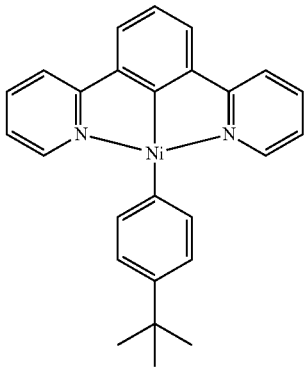
(compound 25)
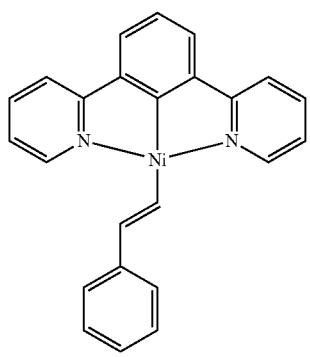
(compound 29)
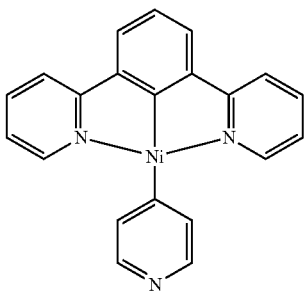
(compound 26)
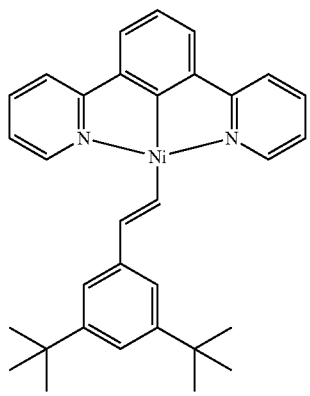
(compound 30)
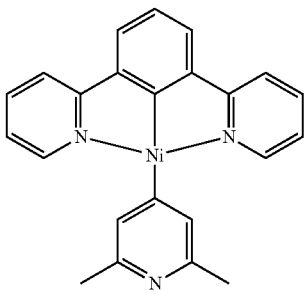
(compound 31)
(compound 27)
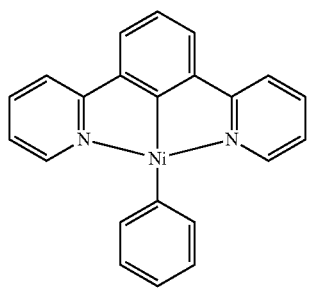
(compound 32)
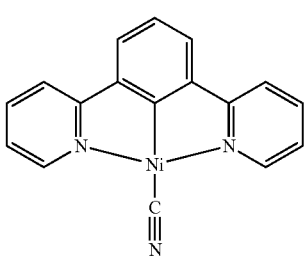

-continued
(compound 33)
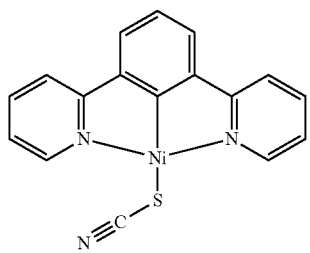
(compound 34)
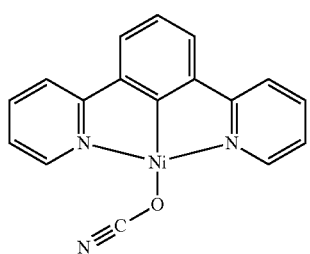
(compound 35)
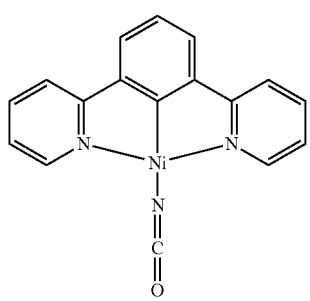
(compound 36)
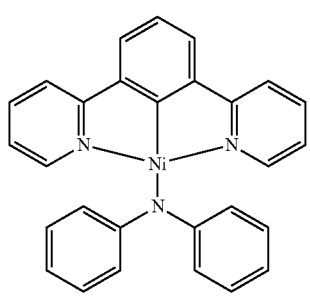
(compound 37)
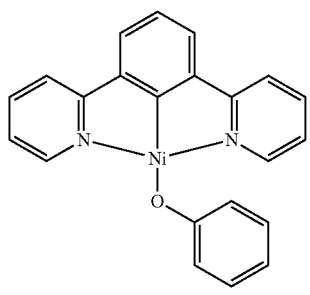
-continued
(compound 38)
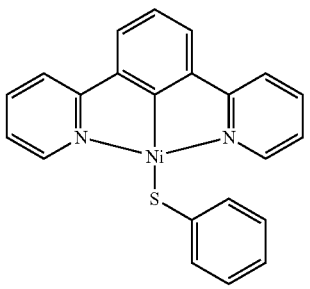
(compound 39)
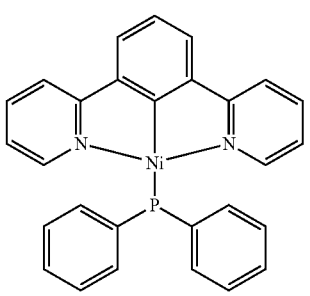
(compound 40)
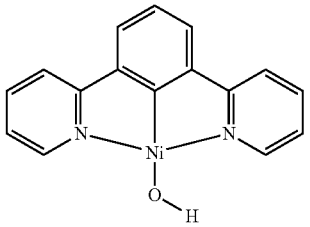
(compound 41)
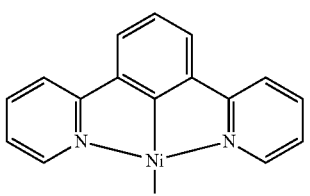
(compound 42)
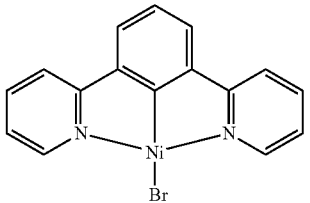
(compound 43)
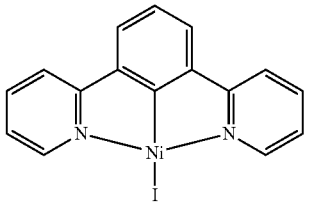

(compound 44)
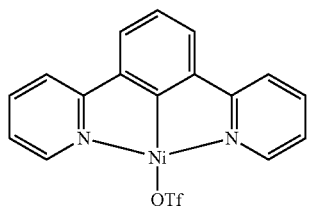
(compound 45)
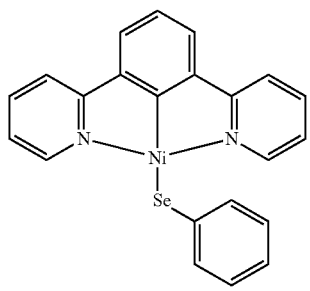
(compound 46)
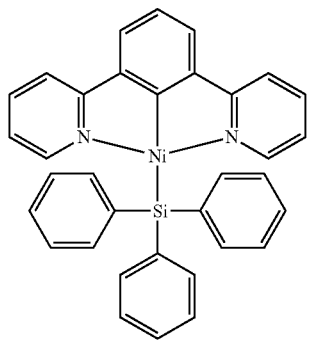
(compound 47)
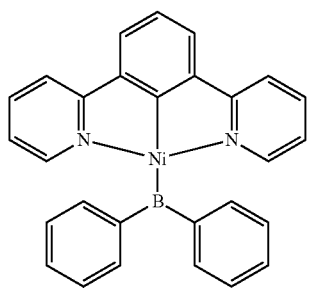
(compound 48)
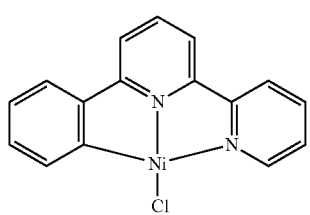
(compound 49)
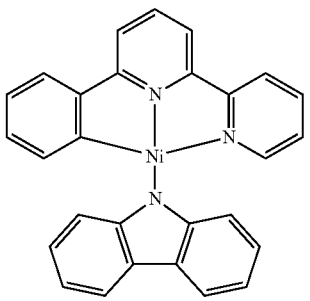
(compound 50)
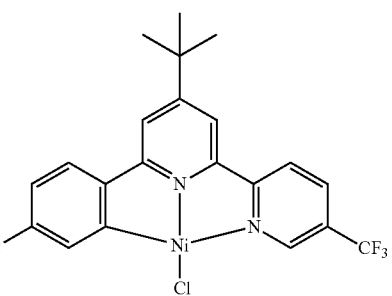
(compound 51)
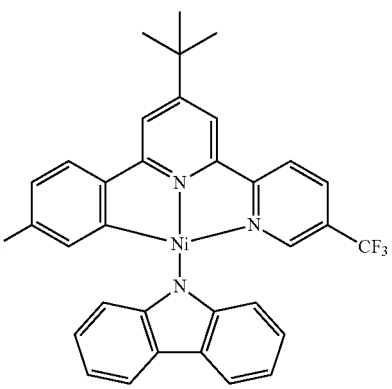
(compound 52)
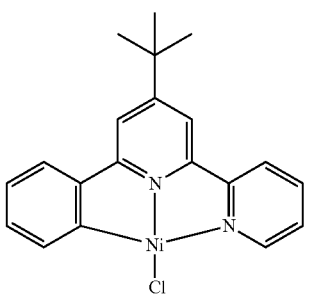

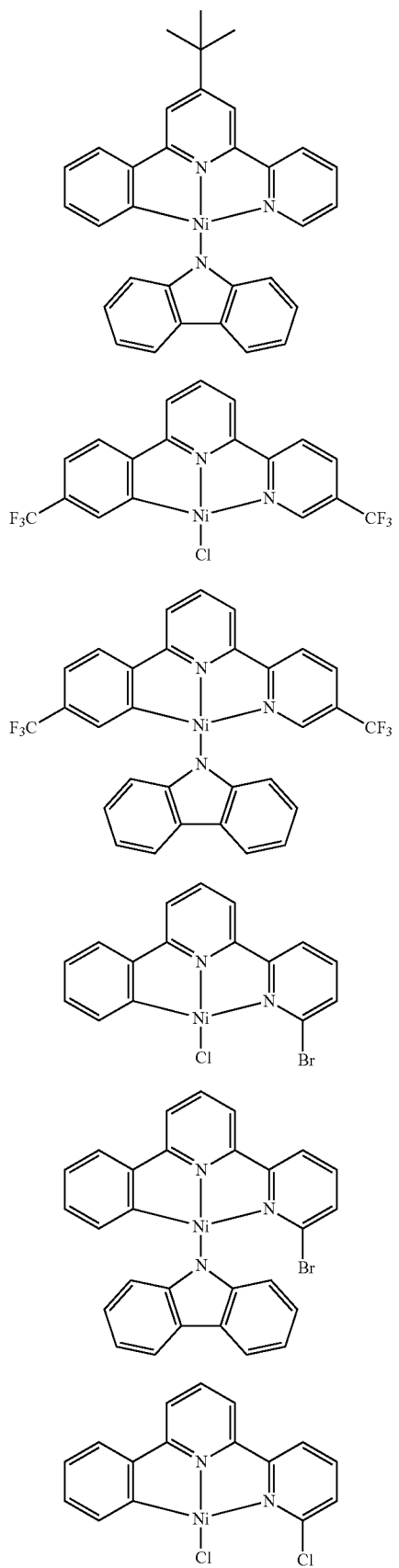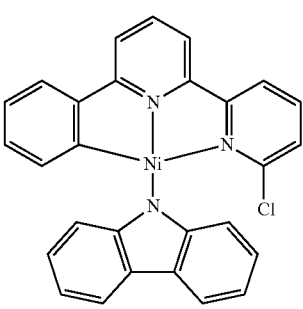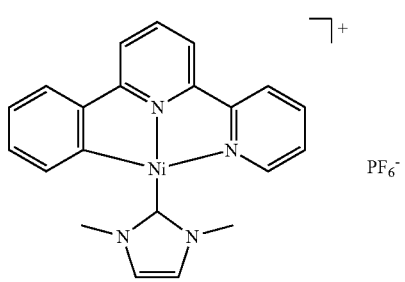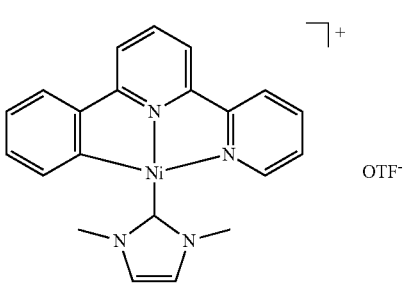

(compound 64)
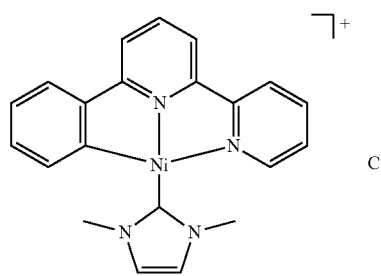
ClO4−
(compound 65)
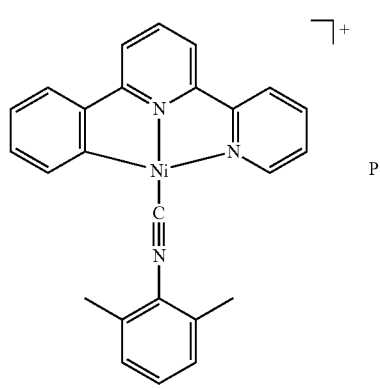
PF6−
(compound 66)
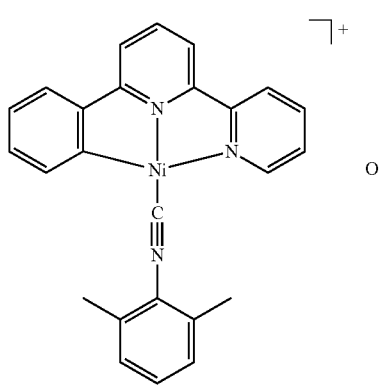
OTf−
(compound 67)
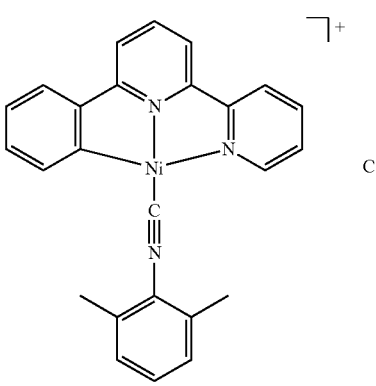
ClO4−
(compound 68)
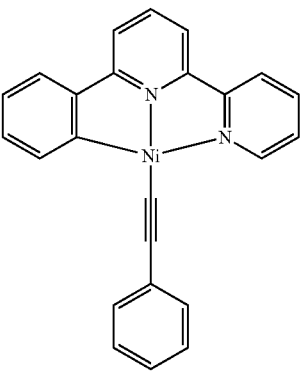
(compound 69)
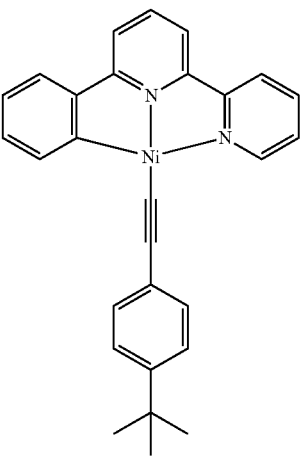
(compound 70)
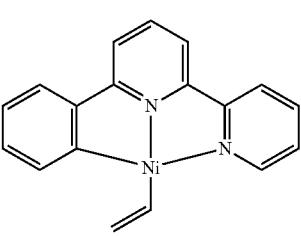
(compound 71)
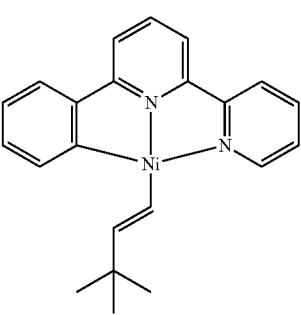

(compound 72)
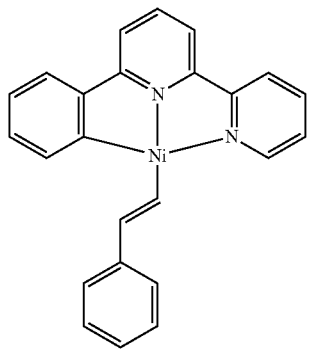
(compound 73)
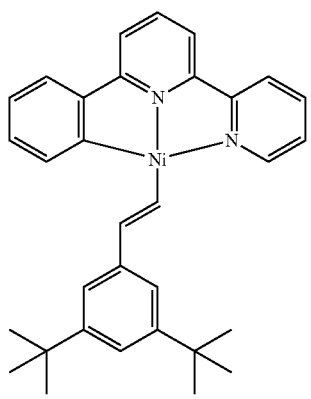
(compound 74)
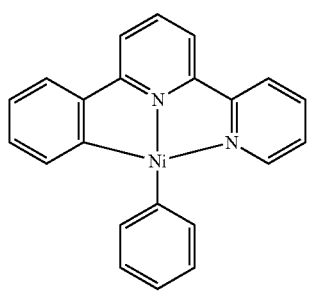
(compound 75)
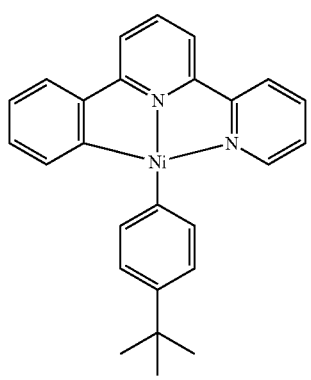
(compound 76)
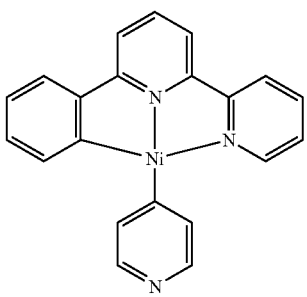
(compound 77)
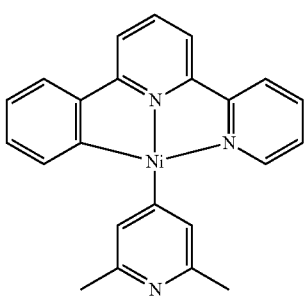
(compound 78)
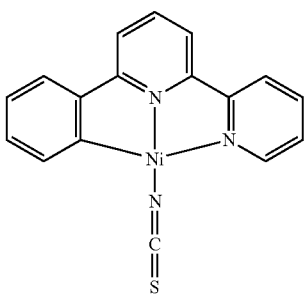
(compound 79)
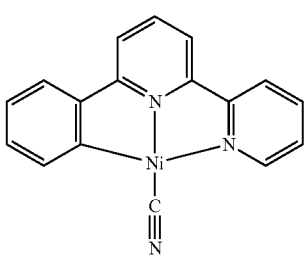
(compound 80)
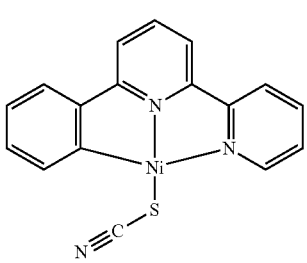

(compound 81)
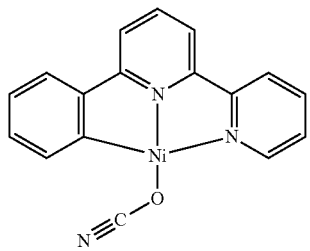
(compound 82)
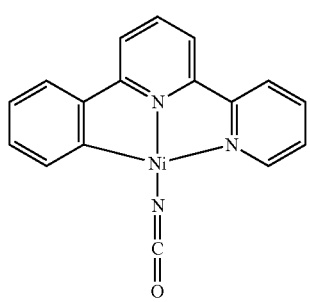
(compound 83)
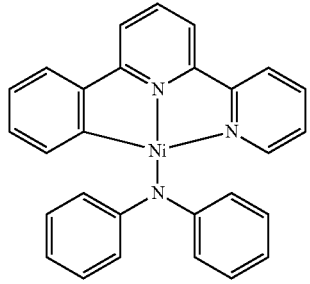
(compound 84)
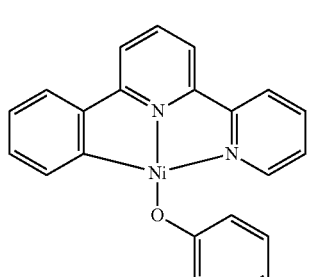
(compound 85)
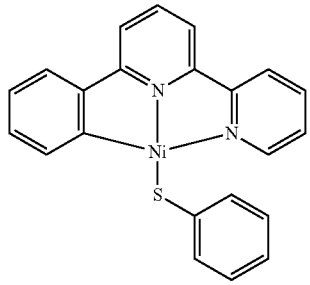
(compound 86)
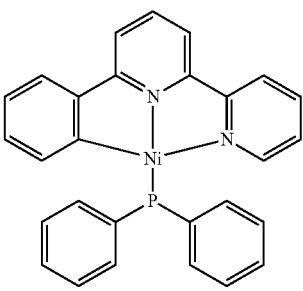
(compound 87)
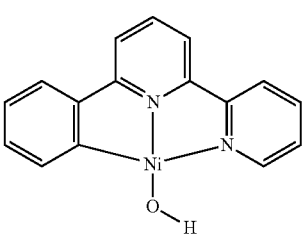
(compound 88)
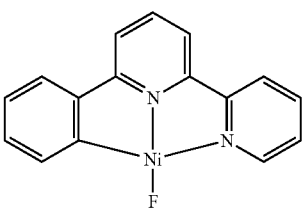
(compound 89)
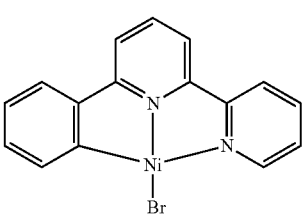
(compound 90)
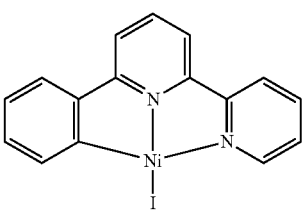
(compound 91)
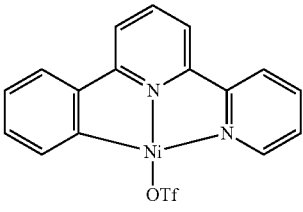

(compound 92)
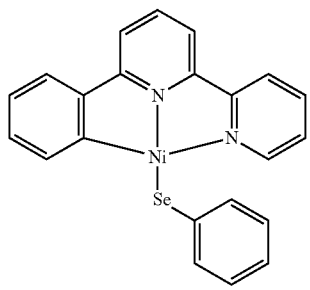
(compound 93)
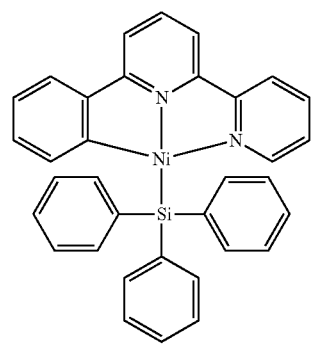
(compound 94)
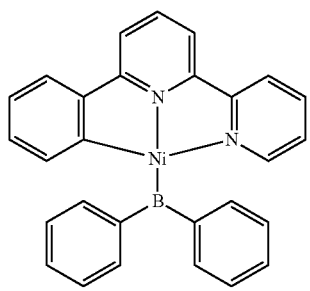
(compound 95)
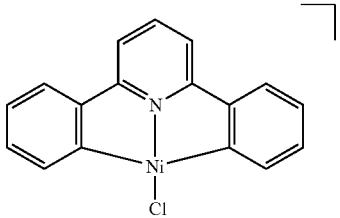
(compound 96)
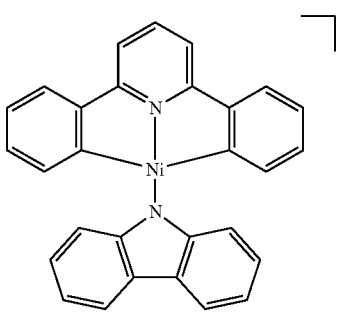
(compound 97)
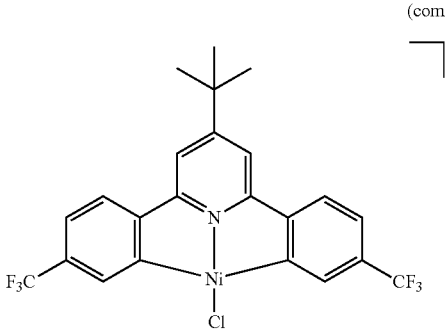
(compound 98)
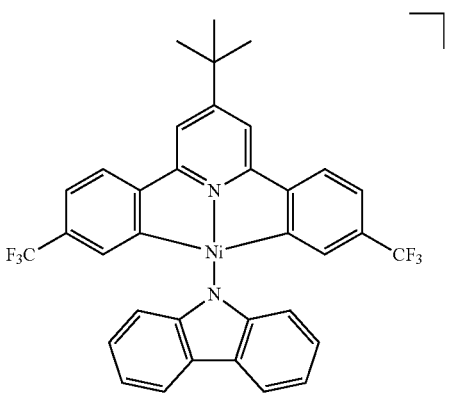
(compound 99)
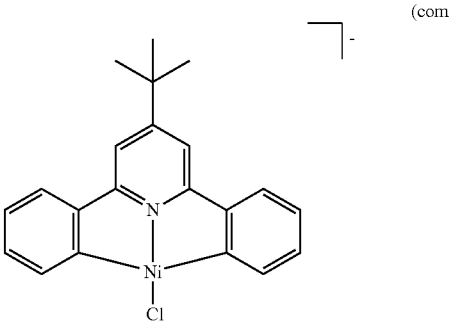
(compound 100)
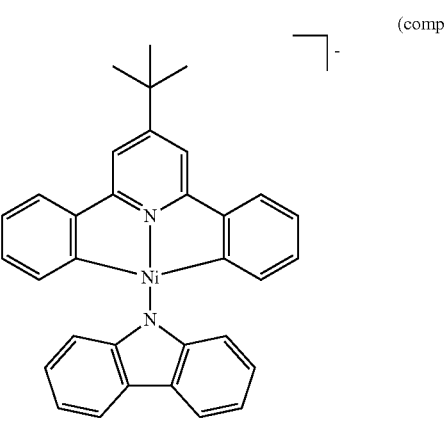

(compound 101)
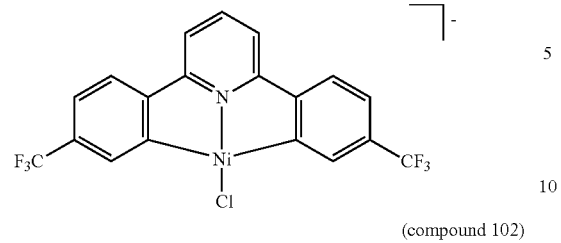
(compound 102)
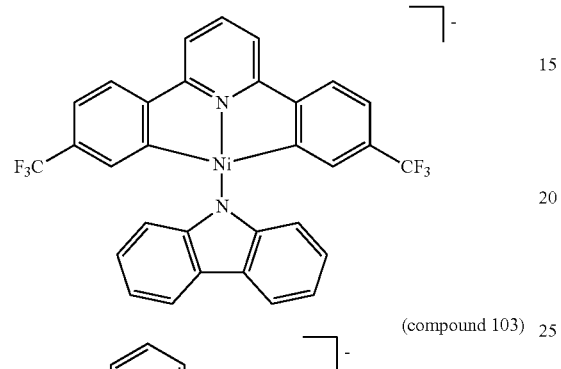
(compound 103)
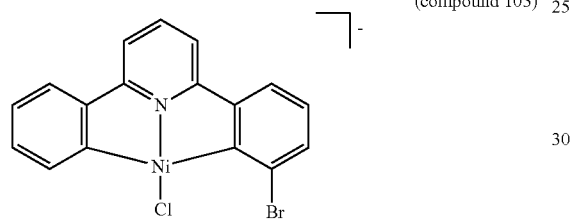
(compound 104)
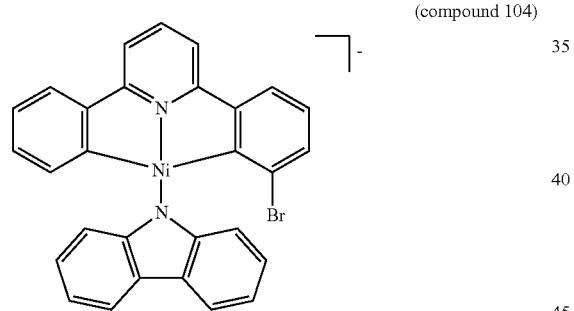
(compound 105)
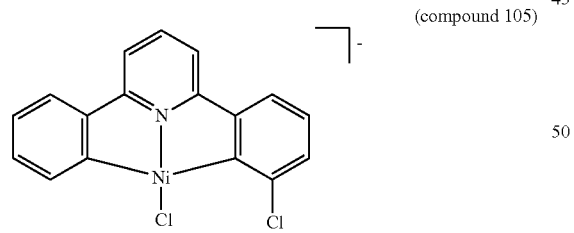
(compound 106)
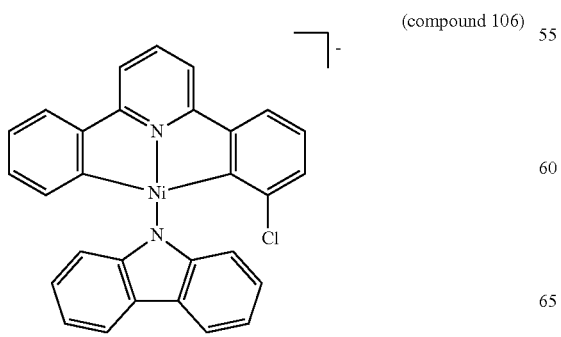
(compound 107)
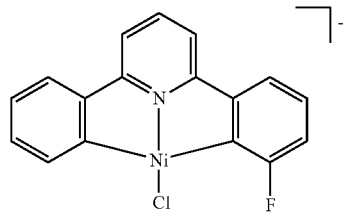
(compound 108)
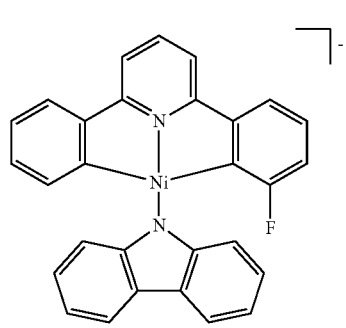
(compound 109)
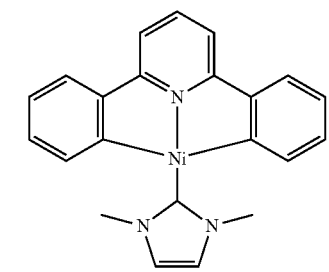
(compound 110)
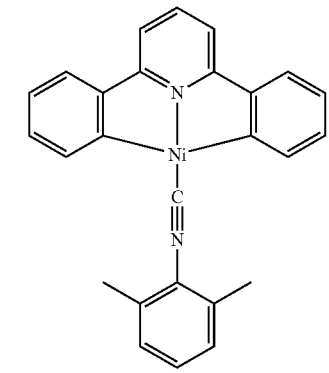
(compound 111)
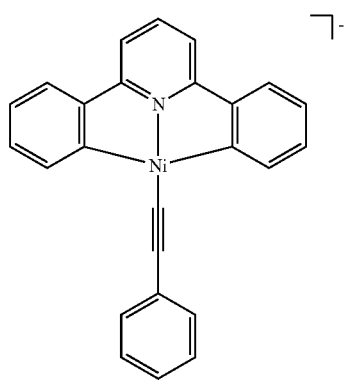

(compound 112)
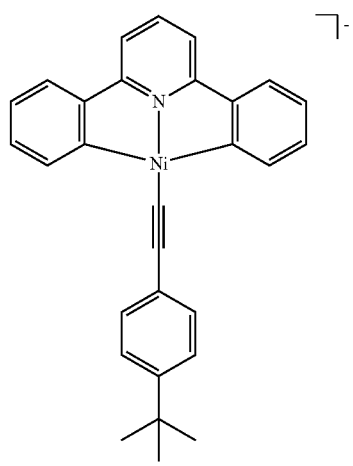
(compound 113)
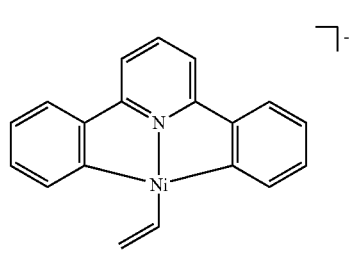
(compound 114)
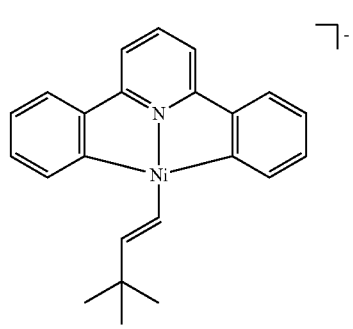
(compound 115)
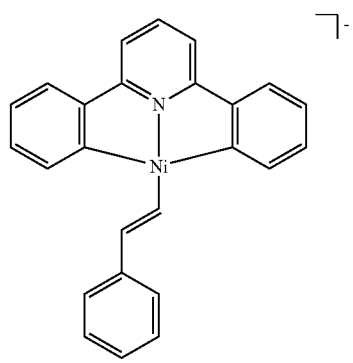
(compound 116)
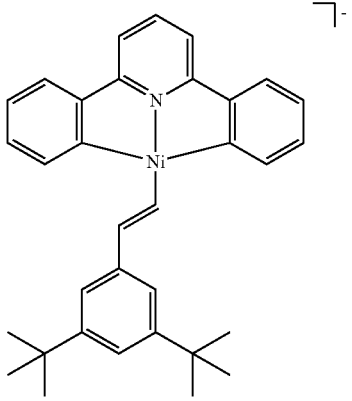
(compound 117)
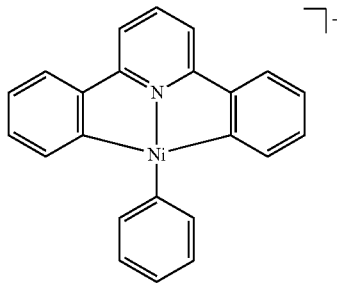
(compound 118)
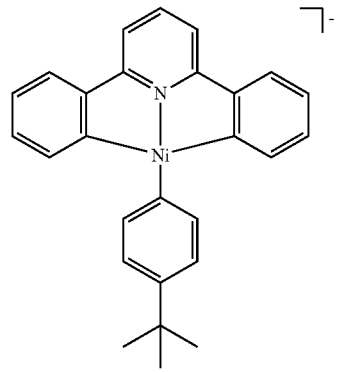
(compound 119)
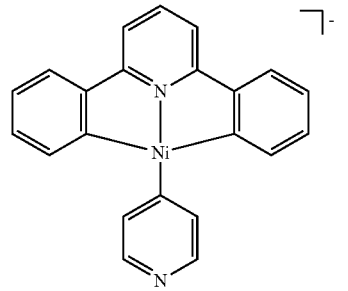

-continued
(compound 120)
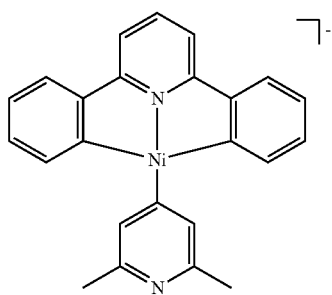
(compound 121)
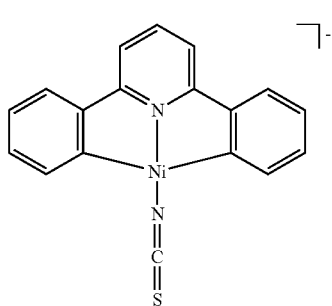
(compound 122)
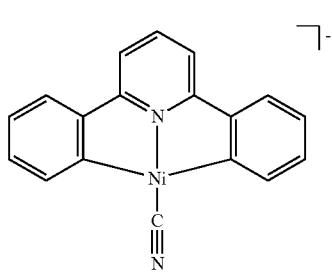
(compound 123)
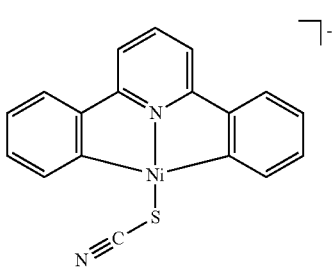
(compound 124)
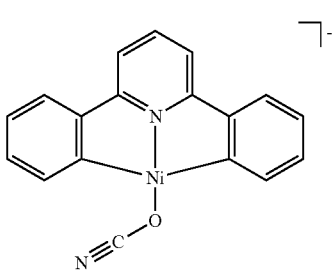
-continued
(compound 125)
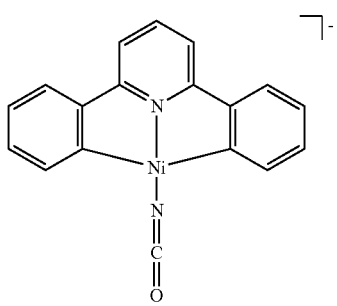
(compound 126)
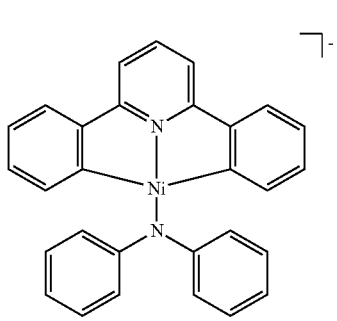
(compound 127)
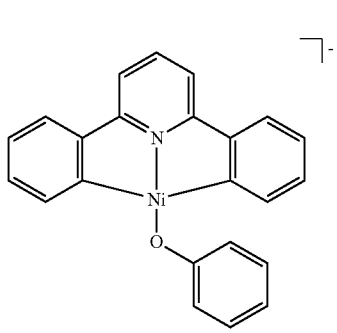
(compound 128)
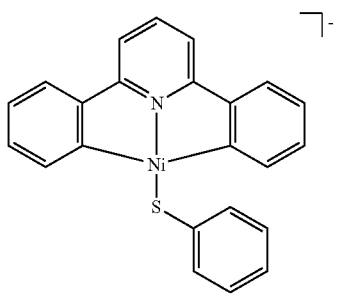
(compound 129)
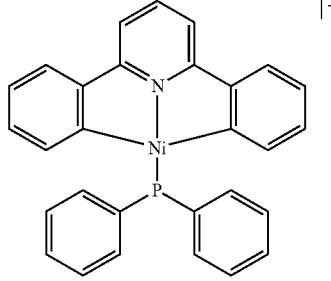

(compound 130)
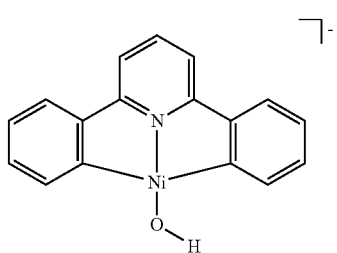
(compound 131)
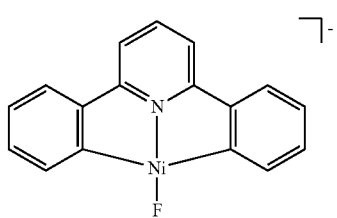
(compound 132)
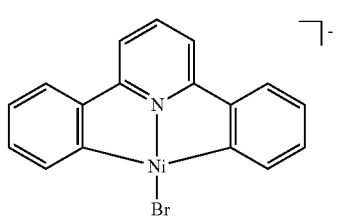
(compound 133)
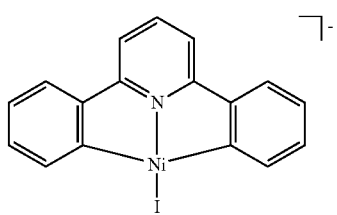
(compound 134)
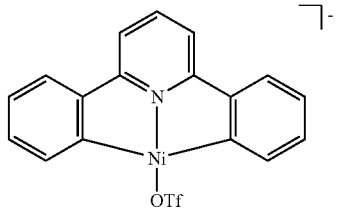
(compound 135)
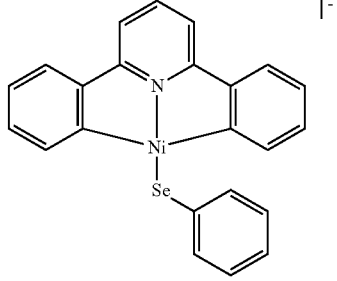
(compound 136)
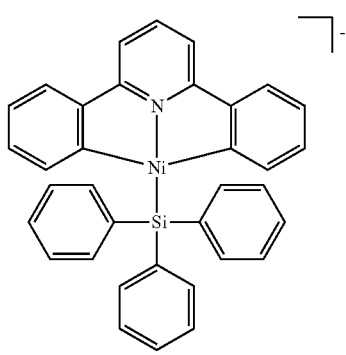
(compound 137)
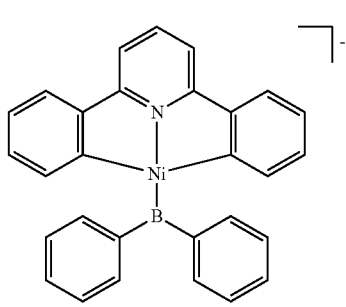
(compound 138)
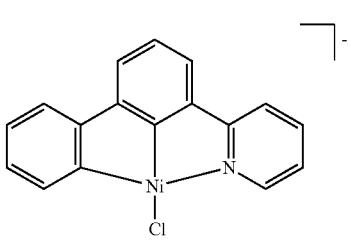
(compound 139)
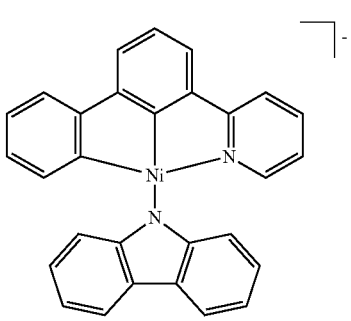
(compound 140)
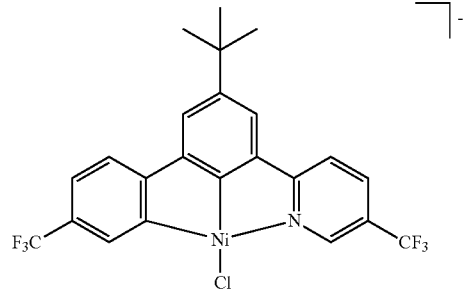

(compound 141)
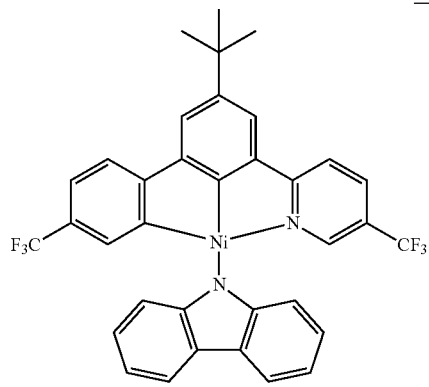
(compound 142)
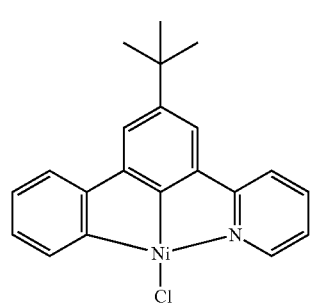
(compound 143)
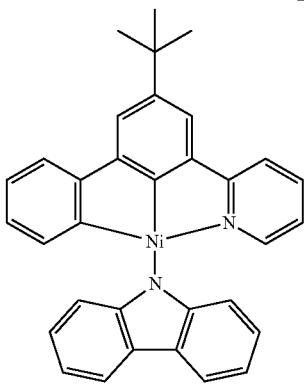
(compound 144)
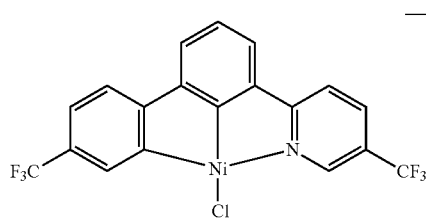
(compound 145)
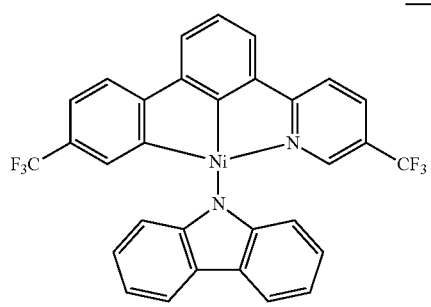
(compound 146)
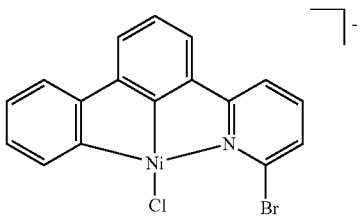
(compound 147)
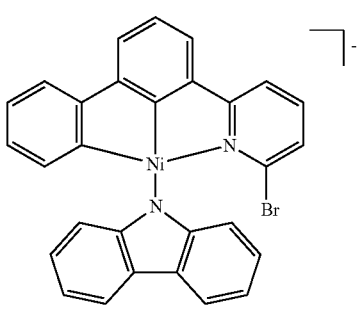
(compound 148)
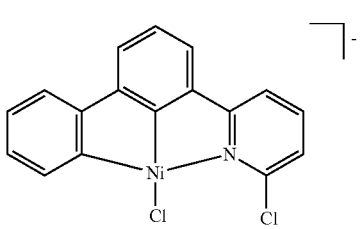
(compound 149)
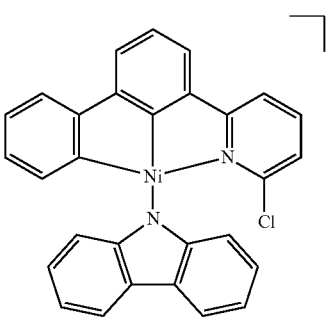
(compound 150)
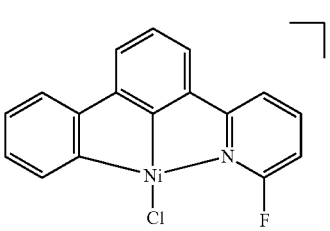

(compound 151)
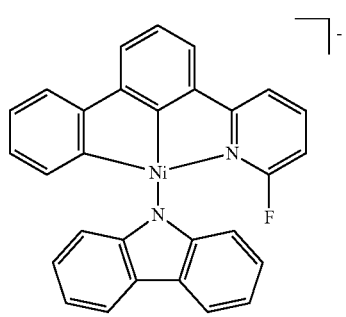
(compound 152)
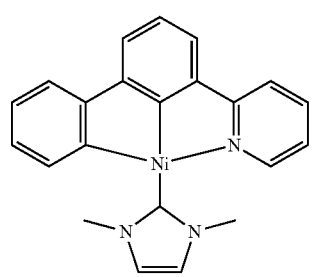
(compound 153)
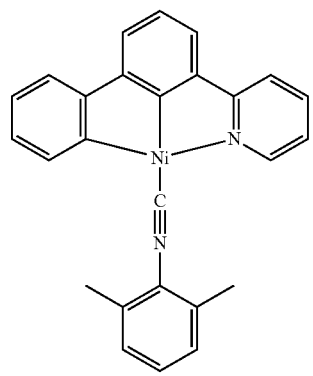
(compound 154)
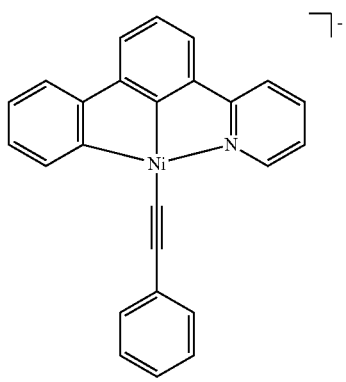
(compound 155)
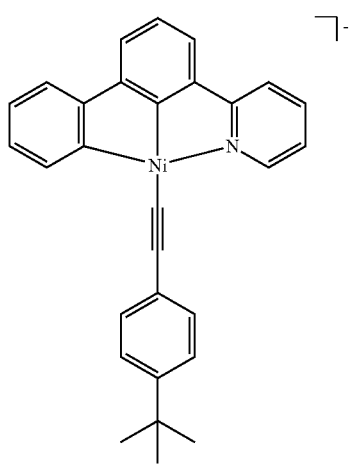
(compound 156)
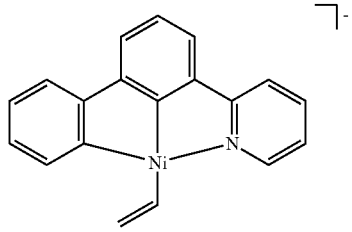
(compound 157)
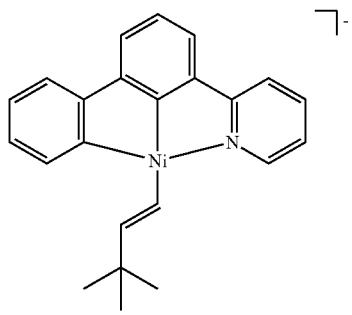
(compound 158)
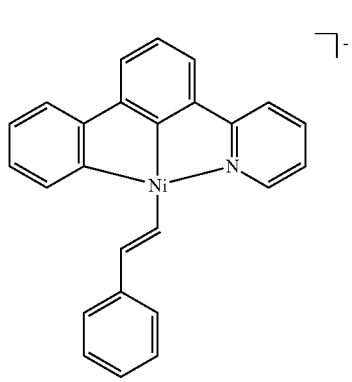

(compound 159)
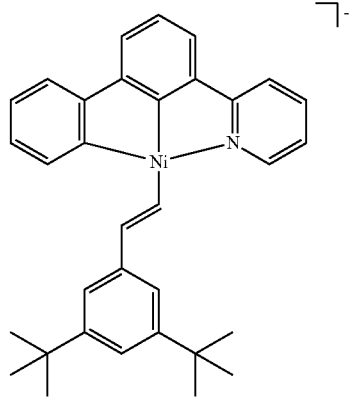
(compound 160)
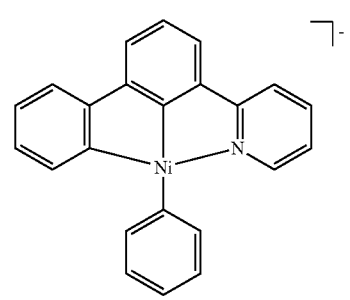
(compound 161)
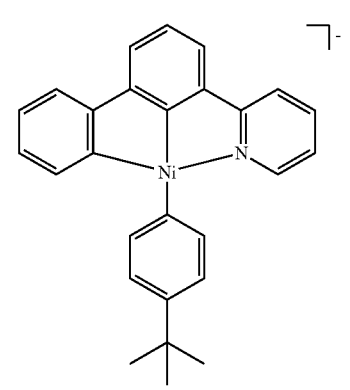
(compound 162)
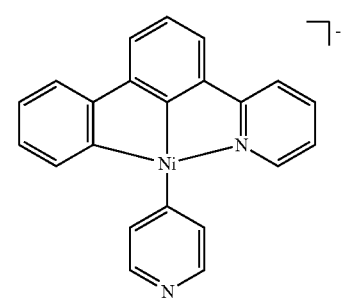
(compound 163)
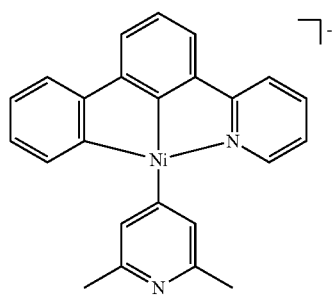
(compound 164)
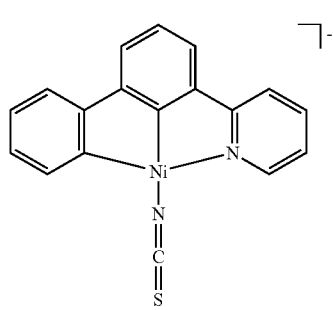
(compound 165)
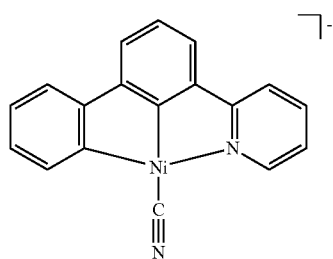
(compound 166)
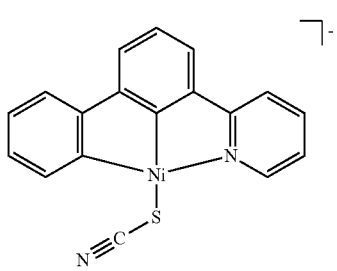
(compound 167)
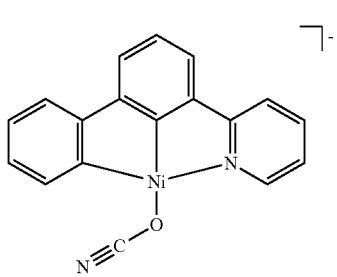

-continued
(compound 168)
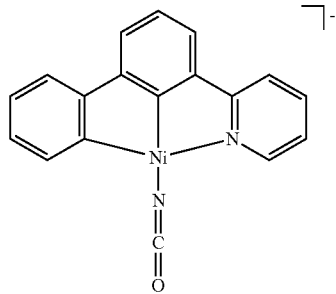
(compound 169)
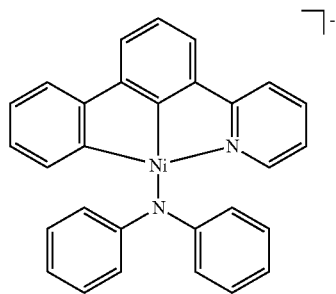
(compound 170)
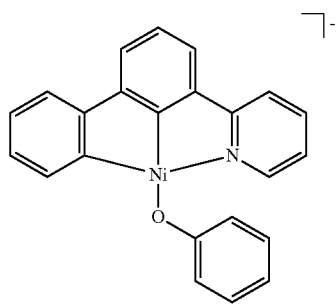
(compound 171)
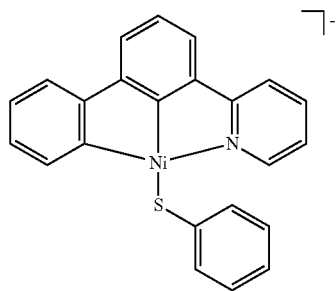
(compound 172)
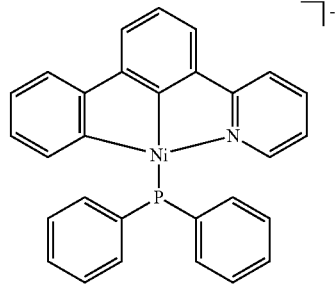
-continued
(compound 173)
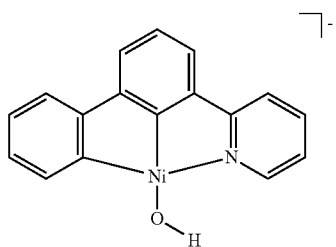
(compound 174)
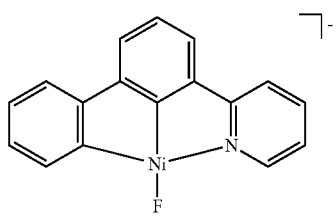
(compound 175)
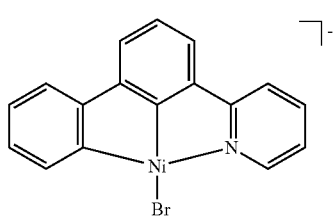
(compound 176)
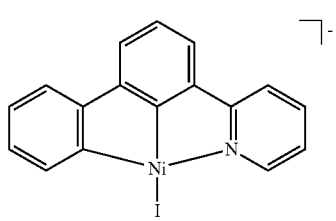
(compound 177)
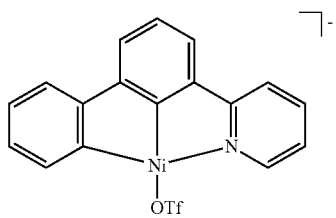
(compound 178)
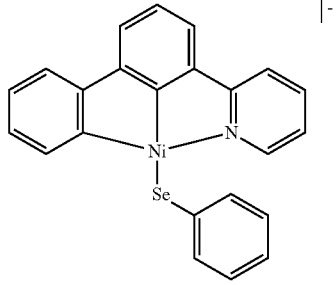

-continued
(compound 179)
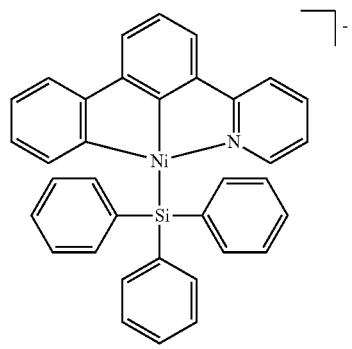
(compound 180)
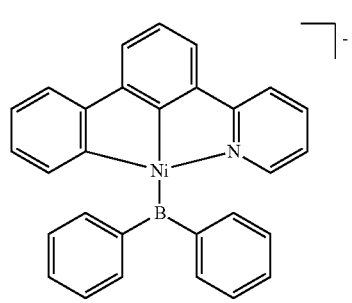
(compound 181)
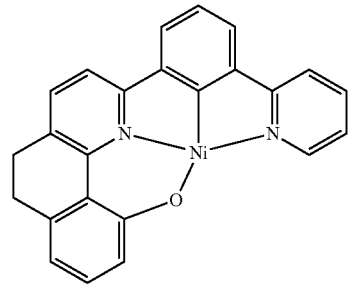
(compound 182)
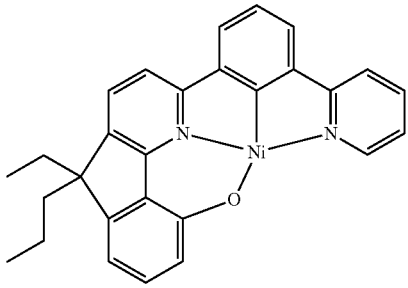
(compound 183)
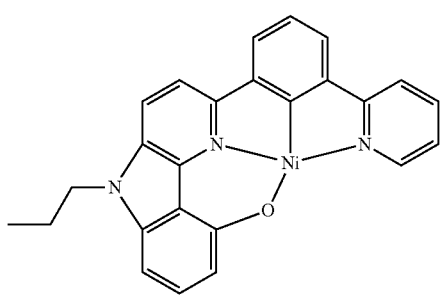
-continued
(compound 184)
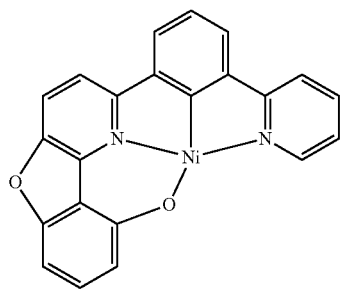
(compound 185)
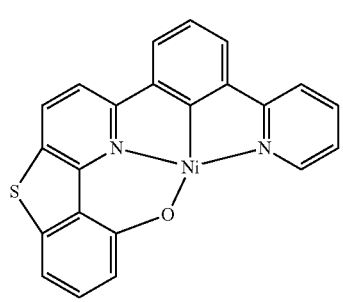
(compound 186)
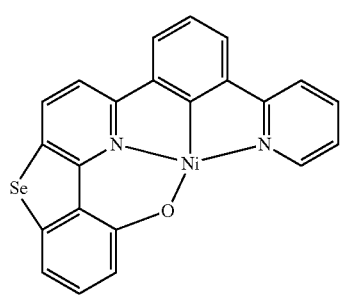
(compound 187)
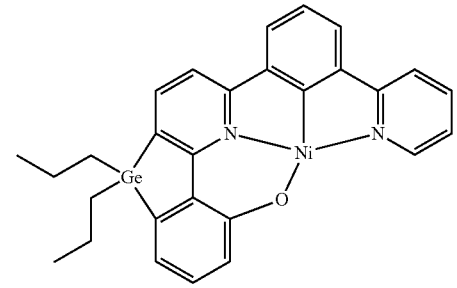
(compound 188)
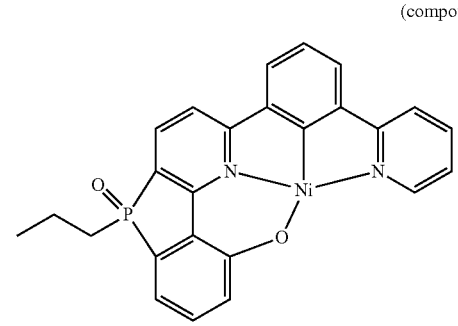

-continued
(compound 189)
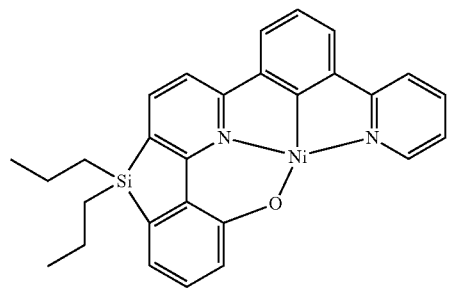
(compound 190)
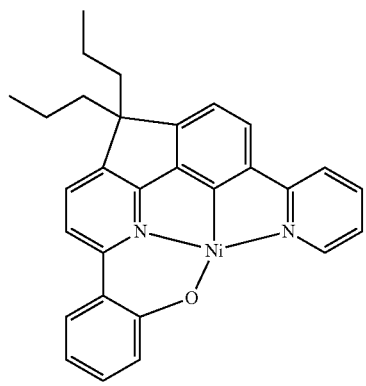
(compound 191)
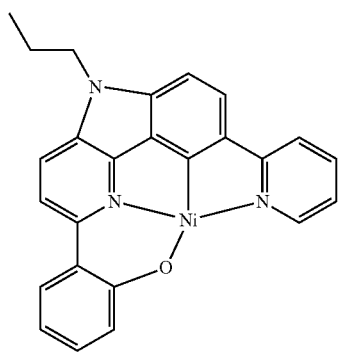
(compound 192)
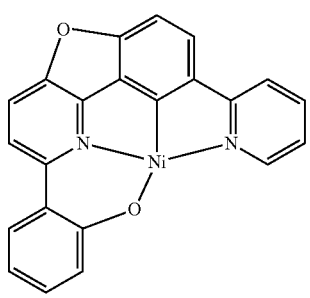
(compound 193)
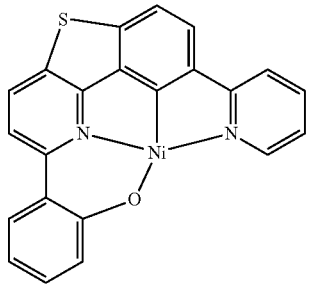
(compound 194)
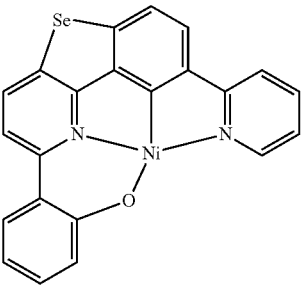
(compound 195)
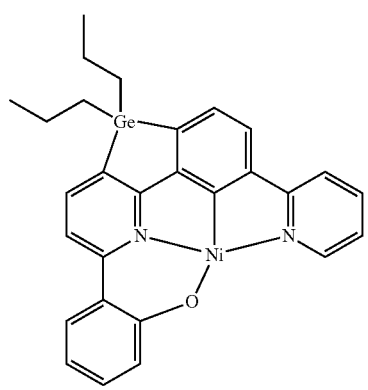
(compound 196)
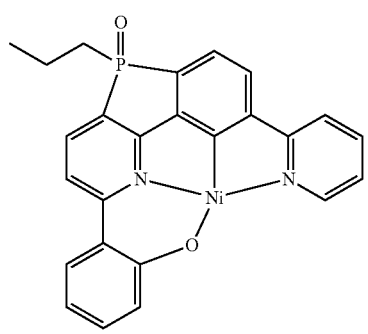
(compound 197)
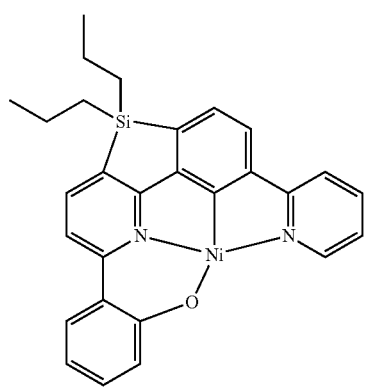

-continued
(compound 198)
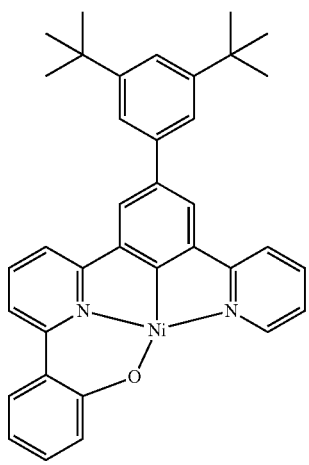
(compound 199)
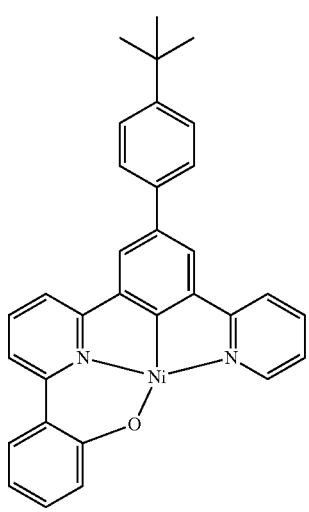
(compound 200)
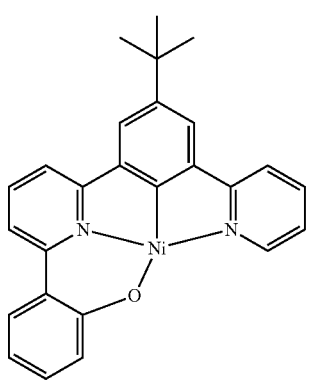
(compound 201)
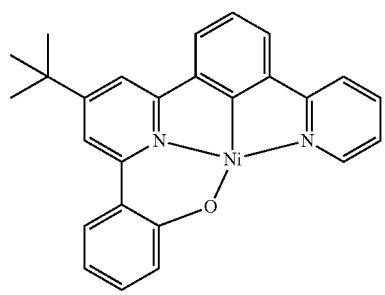
-continued
(compound 202)
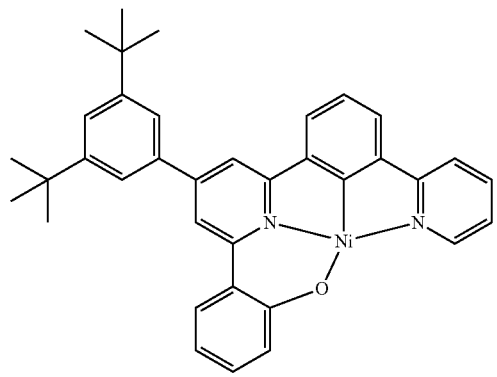
(compound 203)
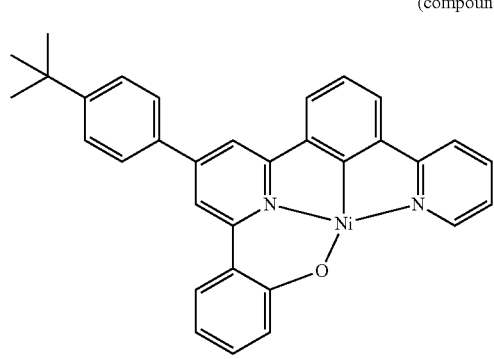
(compound 204)
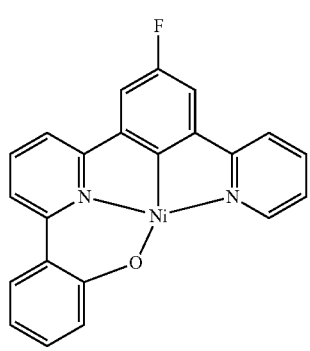
(compound 205)
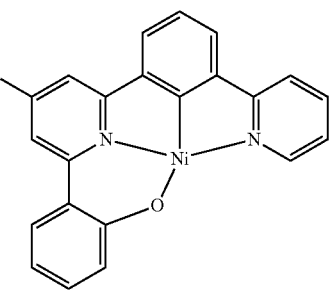

(compound 206)
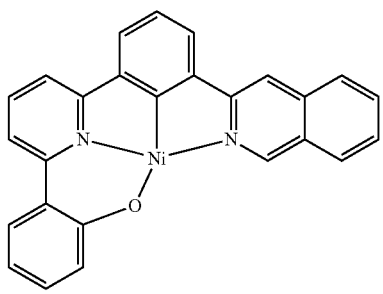
(compound 207)
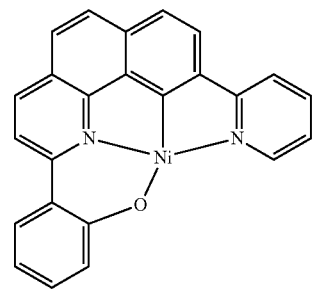
(compound 208)
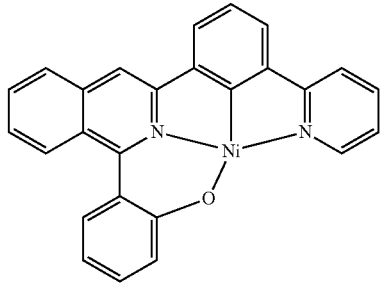
(compound 209)
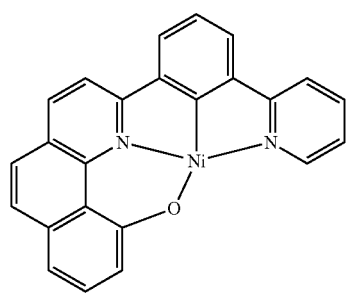
(compound 210)
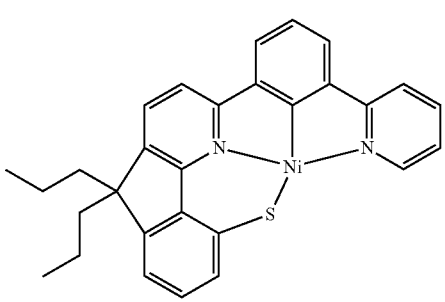
(compound 211)
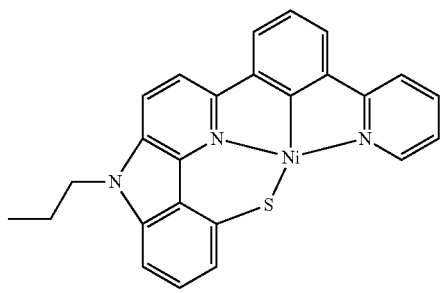
(compound 212)
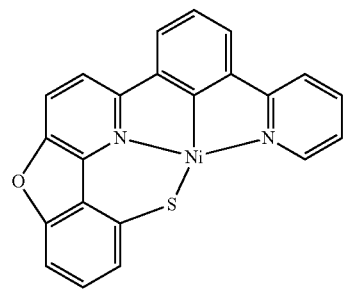
(compound 213)
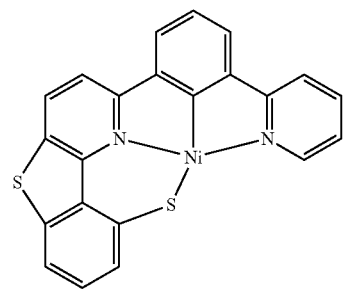
(compound 214)
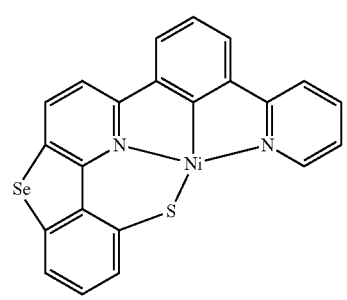
(compound 215)
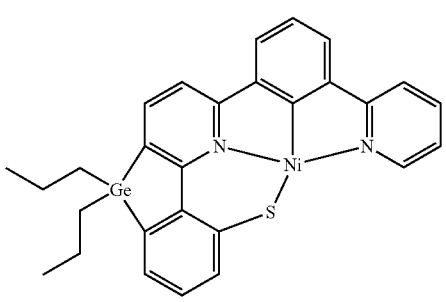

(compound 216)
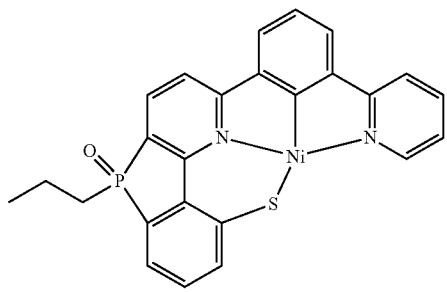
(compound 217)
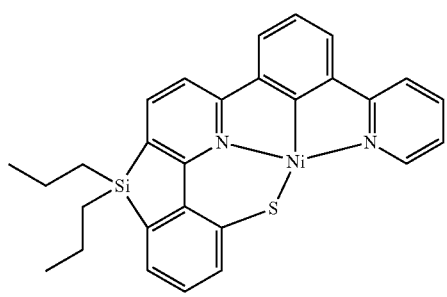
(compound 218)
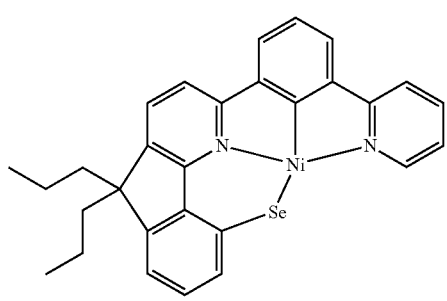
(compound 219)
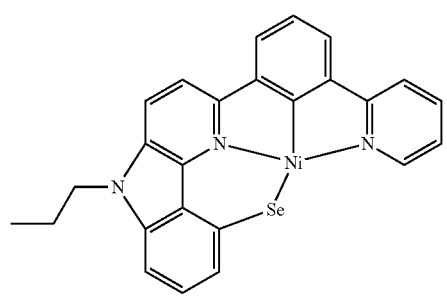
(compound 220)
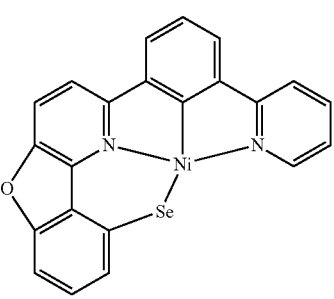
(compound 221)
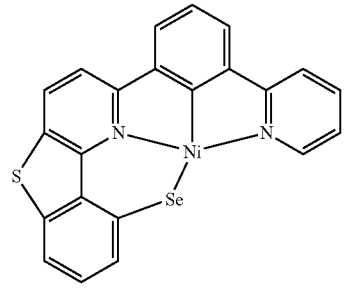
(compound 222)
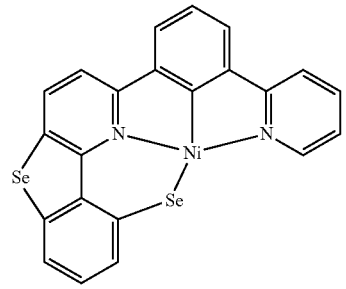
(compound 223)
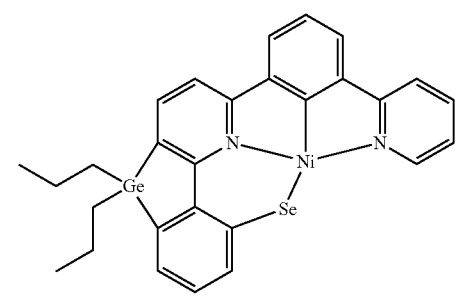
(compound 224)
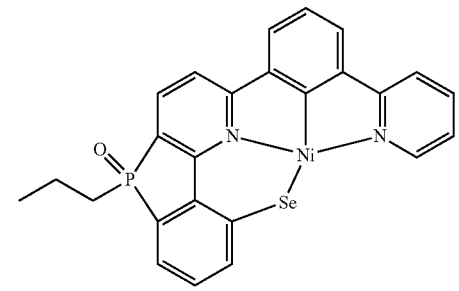
(compound 225)
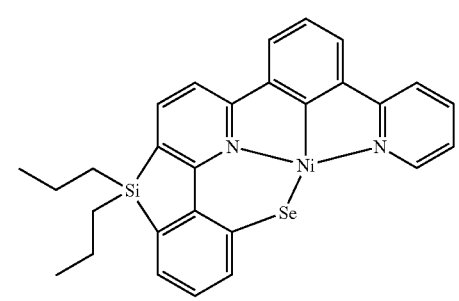

(compound 226)
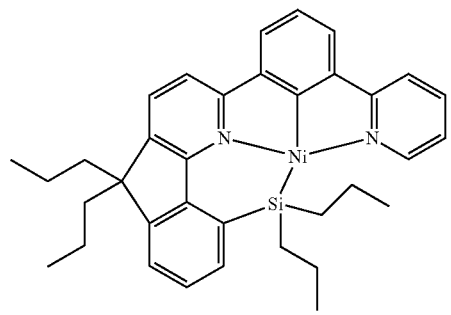
(compound 227)
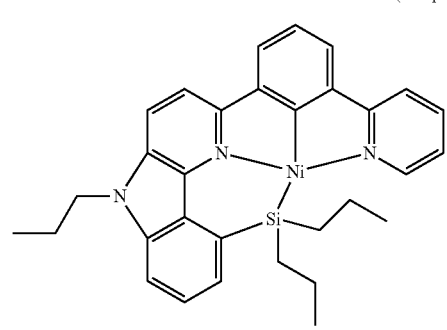
(compound 228)
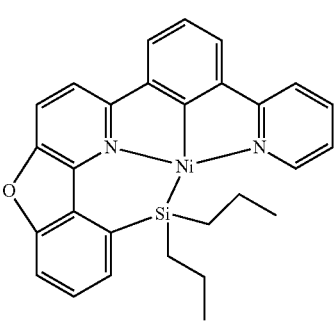
(compound 229)
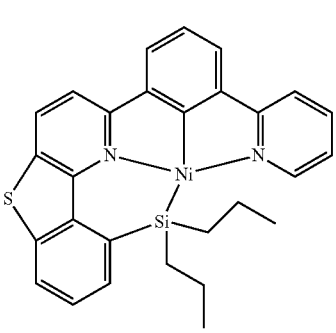
(compound 230)
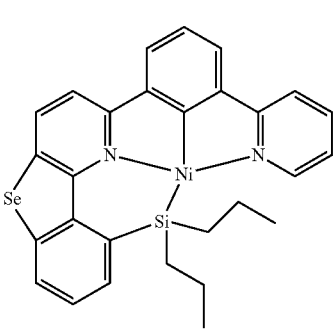
(compound 231)
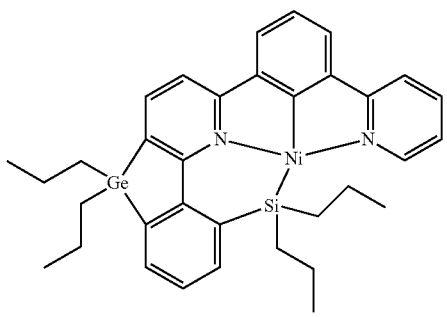
(compound 232)
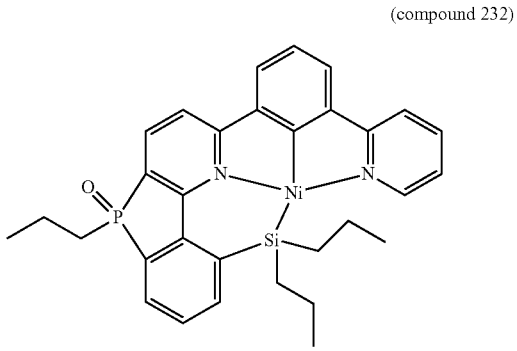
(compound 233)
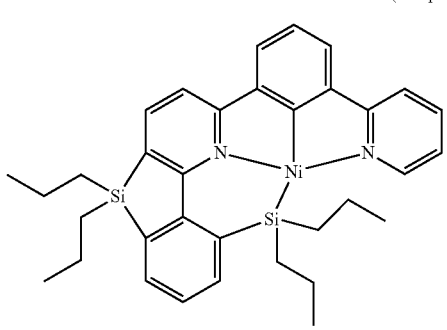
(compound 234)
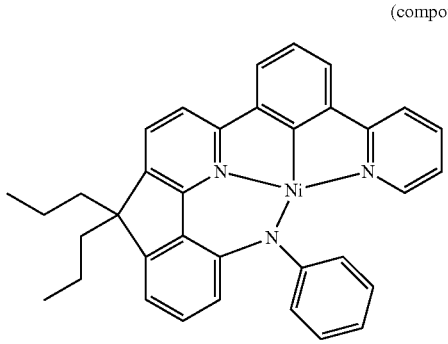

(compound 235)
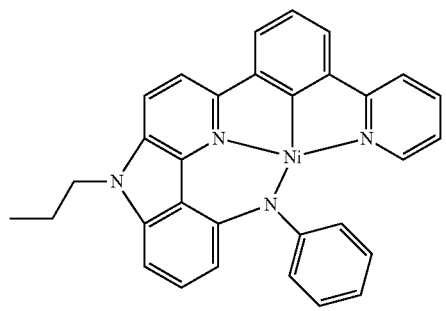
(compound 236)
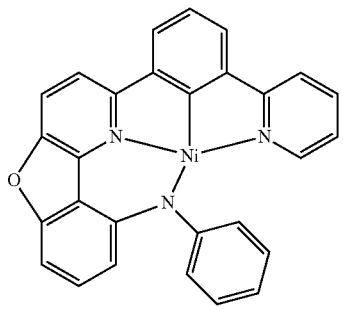
(compound 237)
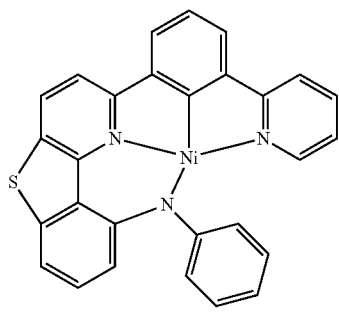
(compound 238)
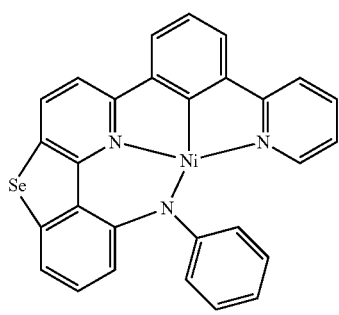
(compound 239)
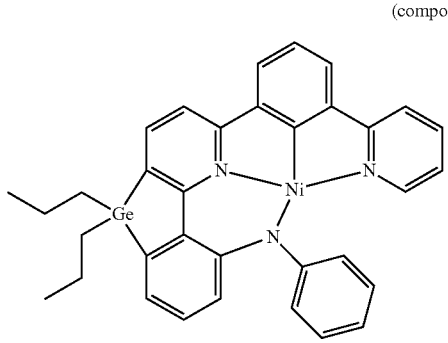
(compound 240)
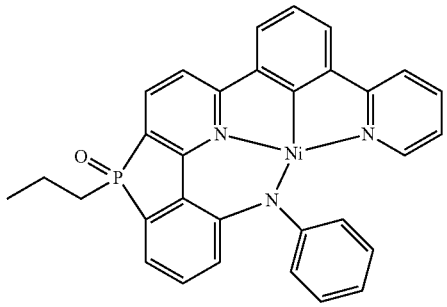
(compound 241)
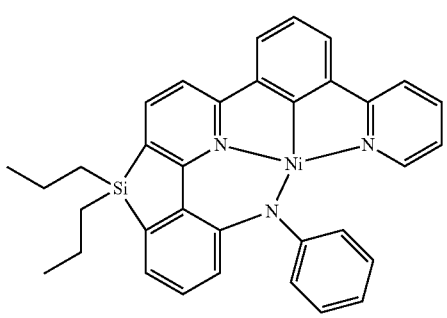
(compound 242)
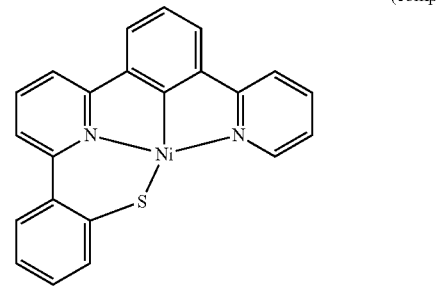
(compound 243)
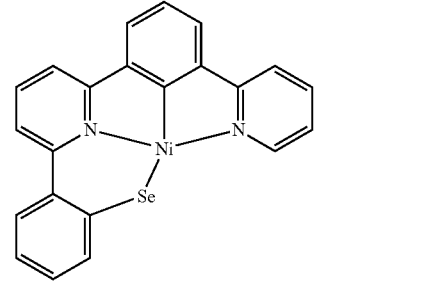
(compound 244)
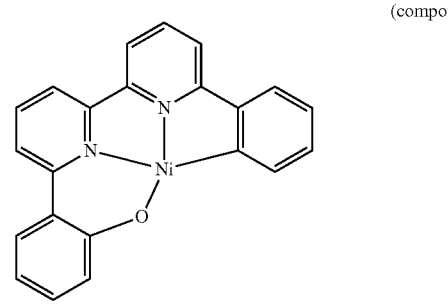

(compound 245)
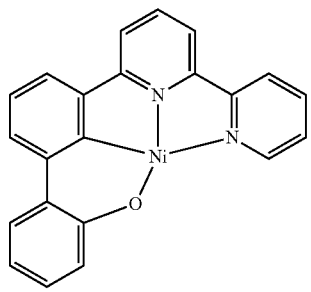
(compound 246)
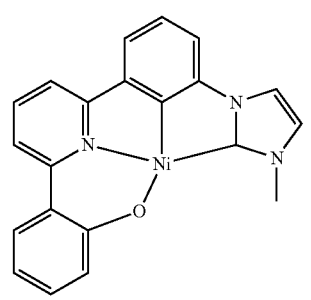
(compound 247)
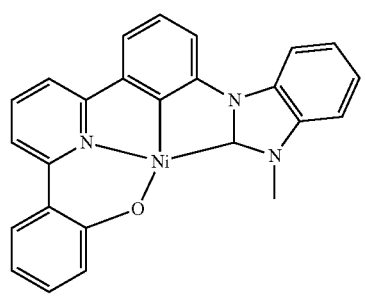
(compound 248)
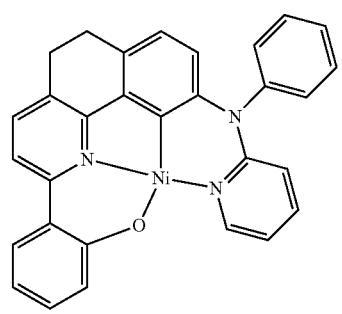
(compound 249)
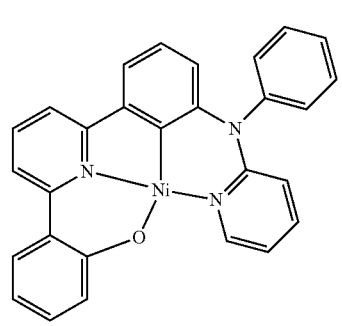
(compound 250)
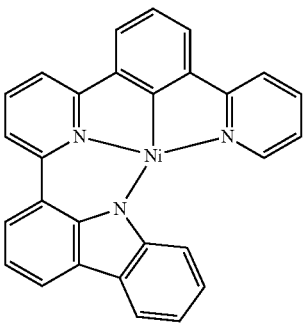
(compound 251)
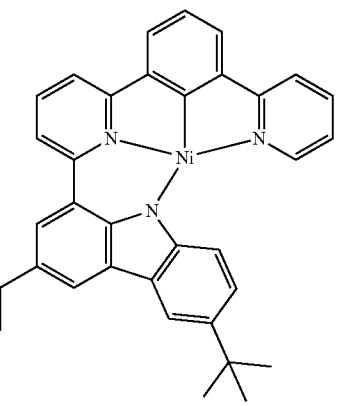
(compound 252)
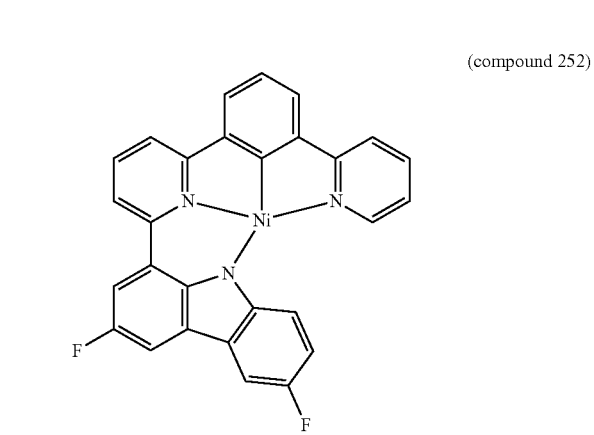
(compound 253)
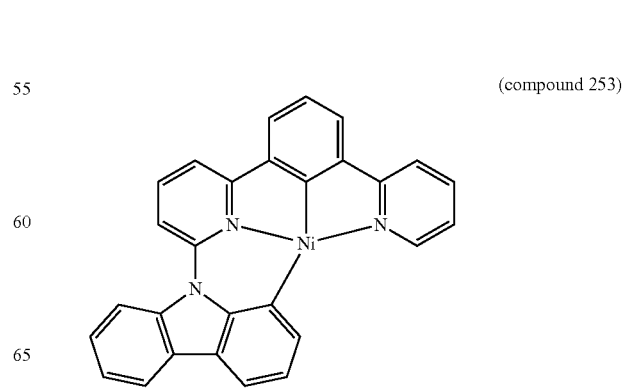

(compound 254)
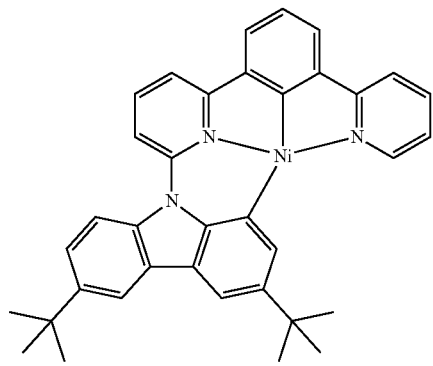
(compound 255)
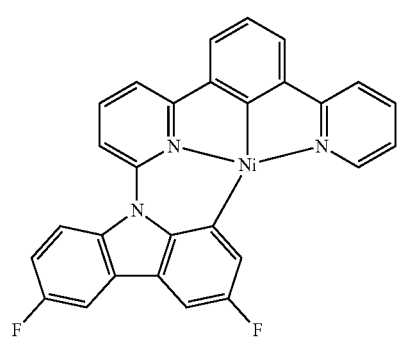
(compound 256)
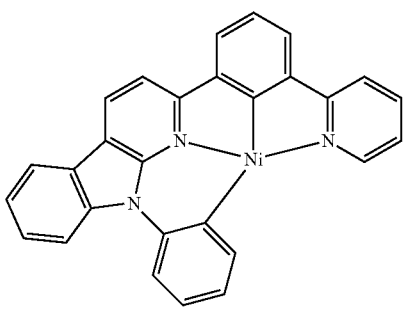
(compound 257)
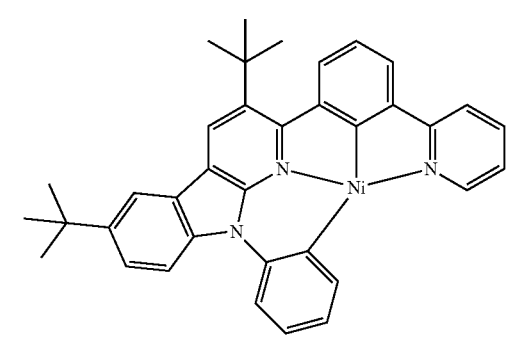
(compound 258)
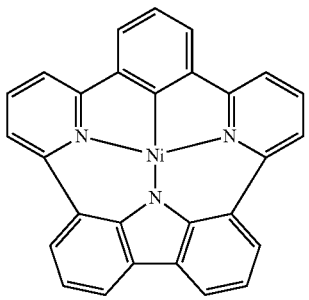
(compound 259)
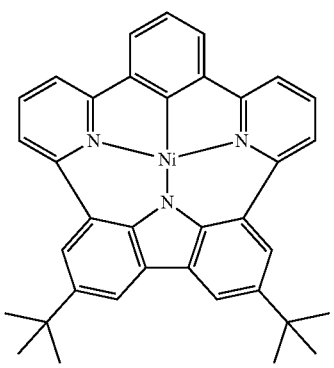
(compound 260)
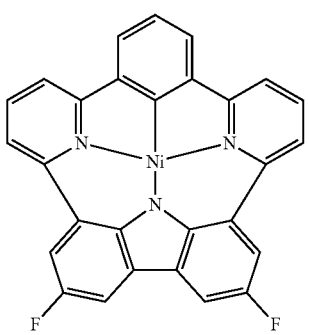
(compound 261)
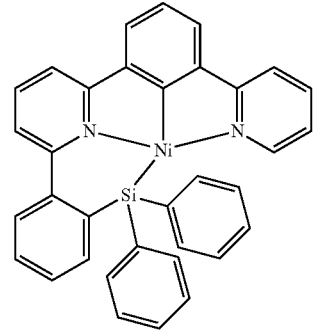
(compound 262)
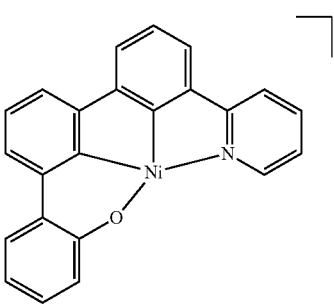

(compound 263)

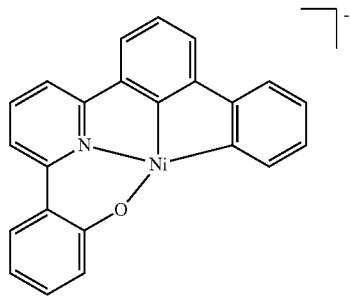

(compound 264)

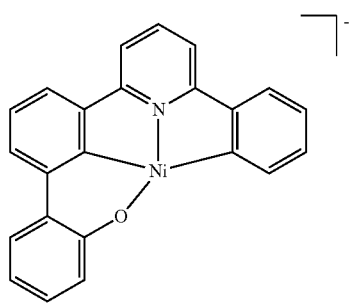

(compound 265)

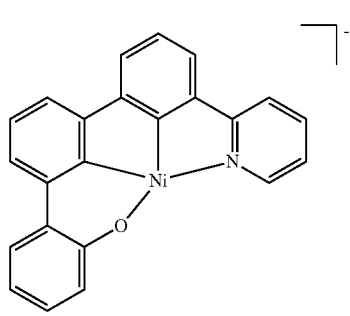

(compound 266)

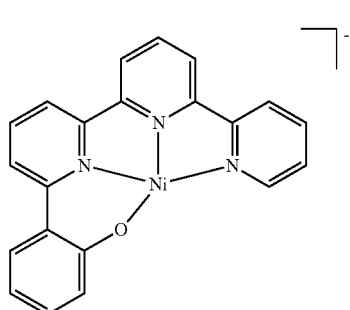

(compound 267)

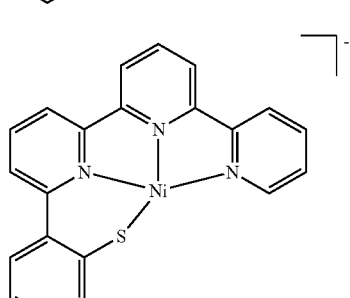

(compound 268)

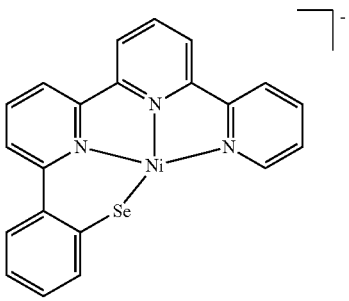

(compound 269)

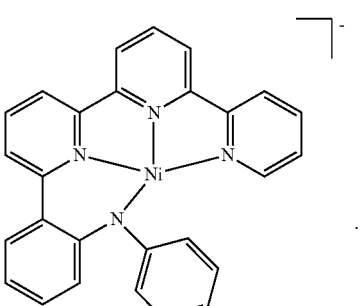

36. The luminescent compound of claim 1, wherein:

M is nickel, copper, iron, or cobalt, q is 1, p is 1 or 2,

G and J are each a single bond, $R^1$ is unsubstituted heteroaryl, substituted heteroaryl, unsubstituted polyaryl, substituted polyaryl, unsubstituted polyheteroaryl, substituted polyheteroaryl, substituted aryl, unsubstituted aryl, substituted $C_3$-$C_{20}$ heterocyclyl, unsubstituted $C_3$-$C_{20}$ heterocyclyl, substituted N-alkylidynearylaminium, unsubstituted N-alkylidynearylaminium, unsubstituted arylalkynyl, substituted arylalkynyl, unsubstituted alkyl, substituted alkyl, unsubstituted alkynyl, substituted alkynyl, unsubstituted alkenyl, substituted alkenyl, unsubstituted arylalkenyl, substituted arylalkenyl, unsubstituted heteroaryl, substituted heteroaryl, halogen, cyano, substituted cyano, cyanate, isocyanate, thioisocyanate, thiocyanate, substituted amino, unsubstituted amino, phosphide, substituted phosphino, unsubstituted phosphino, hydroxy, unsubstituted alkoxy, substituted alkoxy, unsubstituted amide, substituted amide, unsubstituted aroxy, substituted aroxy, unsubstituted arylthio, substituted arylthio, unsubstituted arylselenyl, substituted arylselenyl, unsubstituted arylsilyl, substituted arylsilyl, unsubstituted arylboraneyl, substituted arylboraneyl, unsubstituted alkylboranyl, substituted alkylboranyl, unsubstituted boranyl, substituted boranyl, sulfonate, or N-heterocylic carbene, and r is 1.

* * * * *